(12) United States Patent
Kim et al.

(10) Patent No.: US 12,459,995 B2
(45) Date of Patent: Nov. 4, 2025

(54) USE OF ANTI-FAM19A5 ANTIBODIES

(71) Applicant: NEURACLE SCIENCE CO., LTD., Seoul (KR)

(72) Inventors: Bongcheol Kim, Seongnam-si (KR); Dong Sik Kim, Seoul (KR); Soon-Gu Kwon, Seoul (KR)

(73) Assignee: NEURACLE SCIENCE CO., LTD., Seoul (KR)

( * ) Notice: Subject to any disclaimer, the term of this patent is extended or adjusted under 35 U.S.C. 154(b) by 1149 days.

(21) Appl. No.: 17/285,861

(22) PCT Filed: Oct. 15, 2019

(86) PCT No.: PCT/IB2019/058794
§ 371 (c)(1),
(2) Date: Apr. 15, 2021

(87) PCT Pub. No.: WO2020/079595
PCT Pub. Date: Mar. 23, 2020

(65) Prior Publication Data
US 2021/0347872 A1    Nov. 11, 2021

Related U.S. Application Data

(60) Provisional application No. 62/746,194, filed on Oct. 16, 2018.

(51) Int. Cl.
*C07K 16/24* (2006.01)
*A61K 39/395* (2006.01)
*A61P 27/02* (2006.01)
*A61K 39/00* (2006.01)

(52) U.S. Cl.
CPC .............. *C07K 16/24* (2013.01); *A61P 27/02* (2018.01); *A61K 2039/505* (2013.01); *C07K 2317/33* (2013.01); *C07K 2317/56* (2013.01); *C07K 2317/76* (2013.01); *C07K 2317/92* (2013.01)

(58) Field of Classification Search
CPC ..... A61P 27/02; A61K 9/0048; A61K 39/395; A61K 2039/505; C07K 16/24; C07K 2317/56; C07K 2317/76; C07K 2317/92
See application file for complete search history.

(56) References Cited

U.S. PATENT DOCUMENTS

| | | |
|---|---|---|
| 4,044,126 A | 8/1977 | Cook et al. |
| 4,364,923 A | 12/1982 | Cook et al. |
| 4,414,209 A | 11/1983 | Cook et al. |
| 5,693,780 A | 12/1997 | Newman et al. |
| 5,709,874 A | 1/1998 | Hanson et al. |
| 5,759,542 A | 6/1998 | Gurewich |
| 5,840,674 A | 11/1998 | Yatvin et al. |
| 5,860,957 A | 1/1999 | Jacobsen et al. |
| 5,900,252 A | 5/1999 | Calanchi et al. |
| 5,948,433 A | 9/1999 | Burton et al. |
| 5,972,366 A | 10/1999 | Haynes et al. |
| 5,983,134 A | 11/1999 | Ostrow |
| 5,985,307 A | 11/1999 | Hanson et al. |
| 5,985,317 A | 11/1999 | Venkateshwaran et al. |
| 6,004,534 A | 12/1999 | Langer et al. |
| 6,010,715 A | 1/2000 | Wick et al. |
| 6,024,975 A | 2/2000 | D'Angelo et al. |
| 6,039,975 A | 3/2000 | Shah et al. |
| 6,048,736 A | 4/2000 | Kosak |
| 6,060,082 A | 5/2000 | Chen et al. |
| 6,071,495 A | 6/2000 | Unger et al. |
| 6,120,751 A | 9/2000 | Unger |
| 6,131,570 A | 10/2000 | Schuster et al. |
| 6,139,865 A | 10/2000 | Friend et al. |
| 6,167,301 A | 12/2000 | Flower et al. |
| 6,253,872 B1 | 7/2001 | Neumann |
| 6,256,533 B1 | 7/2001 | Yuzhakov et al. |
| 6,261,595 B1 | 7/2001 | Stanley et al. |
| 6,267,983 B1 | 7/2001 | Fujii et al. |
| 6,271,359 B1 | 8/2001 | Norris et al. |
| 6,274,552 B1 | 8/2001 | Tamarkin et al. |
| 6,316,652 B1 | 11/2001 | Steliou |
| 9,579,398 B2 | 2/2017 | Seong et al. |
| 10,640,557 B2 | 5/2020 | Seong et al. |
| 11,155,613 B2 | 10/2021 | Kim et al. |
| 11,332,521 B2 | 5/2022 | Kim et al. |
| 11,560,425 B2 | 1/2023 | Kim et al. |
| 11,618,783 B2 | 4/2023 | Kim et al. |

(Continued)

FOREIGN PATENT DOCUMENTS

| | | |
|---|---|---|
| CN | 104254343 A | 12/2014 |
| CN | 107019800 A | 8/2017 |

(Continued)

OTHER PUBLICATIONS

Liu et al., Recent Advances in Anti-cancer Protein/Peptide Delivery, Bioconjugate Chemistry, 2019, 30:305-324. (Year: 2019).*
Hueso et al., ncRNAs in Therapeutics: Challenges and Limitations in Nucleic Acid-Based Drug Delivery, Int. J. Mol. Sci., 2021, 22:11596, pp. 1-15. (Year: 2021).*
Yu et al., RNA Drugs and RNA Targets for Small Molecules: Principles, Progress, and Challenges, Pharmacological Reviews, 2020, 72:862-898. (Year: 2020).*
Hollevoet et al., State of play and clinical prospects of antibody gene transfer, J Transl Med 2017, 15:131, pp. 1-19. (Year: 2017).*
Eisele et al., Blocking the PD-1/PD-L1 Signaling Pathway in Malignant Glioma: Current and Future Perspectives Contemporary Oncology, Aug. 2015, 7(3): 1-5. (Year: 2015).*
Almagro et al., Front. Immunol. 2018; 8:1751.*
Herold et. al., Sci Rep. Sep. 25, 2017;7(1):12276.*

(Continued)

*Primary Examiner* — Hong Sang
(74) *Attorney, Agent, or Firm* — Sterne, Kessler, Goldstein & Fox P.L.L.C.

(57) ABSTRACT

The present disclosure relates to the pharmaceutical use of antagonists (e.g., an antibody or antigen-binding portion thereof) that specifically bind to FAM19A5 to treat a retinopathy (e.g., diabetic retinopathy) and/or maculopathy (e.g., age-related macular degeneration) in a subject in need thereof.

17 Claims, 18 Drawing Sheets

Specification includes a Sequence Listing.

(56) References Cited

U.S. PATENT DOCUMENTS

| | | | |
|---|---|---|---|
| 11,634,484 B2* | 4/2023 | Kim | A61P 25/04 |
| | | | 424/133.1 |
| 11,739,141 B2 | 8/2023 | Seong et al. | |
| 11,746,149 B2* | 9/2023 | Kim | C07K 16/24 |
| | | | 530/387.3 |
| 2004/0014194 A1 | 1/2004 | Beyer et al. | |
| 2009/0221670 A1 | 9/2009 | Borglum et al. | |
| 2012/0100140 A1 | 4/2012 | Reyes et al. | |
| 2015/0118230 A1* | 4/2015 | Seong | A61P 25/28 |
| | | | 435/6.12 |
| 2019/0300599 A1* | 10/2019 | Kim | G01N 33/563 |
| 2021/0388382 A1* | 12/2021 | Kim | C12N 15/86 |
| 2022/0064277 A1* | 3/2022 | Kim | C07K 16/24 |
| 2022/0144932 A1* | 5/2022 | Kim | C07K 16/24 |

FOREIGN PATENT DOCUMENTS

| | | | | |
|---|---|---|---|---|
| KR | 20160101786 A | 8/2016 | | |
| WO | WO-9712622 A1 | 4/1997 | | |
| WO | WO-9817815 A1 | 4/1998 | | |
| WO | WO-9817816 A1 | 4/1998 | | |
| WO | WO-9818934 A1 | 5/1998 | | |
| WO | WO-9931251 A1 | 6/1999 | | |
| WO | WO-2013122408 A1 | 8/2013 | | |
| WO | WO-2015015003 A1 * | 2/2015 | | A61K 45/06 |
| WO | WO-2018083538 A1 | 5/2018 | | |
| WO | WO-2020079595 A1 | 4/2020 | | |

OTHER PUBLICATIONS

Murphy et al., Journal of Immunological Methods, vol. 463, p. 127-133, 2018.*

An, Z., et al., "IgG2m4, an Engineered Antibody Isotype With Reduced Fc Function," MAbs, 6, 572-579, Taylor & Francis, United States (Nov.-Dec. 2009).

Bird, R.E., et al., "Single-chain Antigen-binding Proteins," Science 242(4877):423-426, Association for the Advancement of Science, United States (Oct. 1988).

Bricogne, G., "Bayesian Statistical Viewpoint on Structure Determination: Basic Concepts and Examples," Methods in Enzymology 276:361-423, Academic Press, United States (1997).

Bricogne, G., et al., "Direct phase determination by entropy maximization and likelihood ranking: status report and perspectives," Acta Crystallogr D. Biol. Crystallogr 49(1):37-60, Wiley Online Library, United States (1993).

Champe, M., et al., "Monoclonal Antibodies that Block the Activity of Leukocyte Function-Associated Antigen 1 Recognize Three Discrete Epitopes in the Inserted Domain of CD11a," The Journal of Biological Chemistry 270 (3):1388-1394, American Society for Biochemistry and Molecular Biology, United States (1995).

Chayen, N.E., et al., "The Role of Oil in Macromolecular Crystallization," Structure 5(10):1269-1274, Cell Press, United States (1997).

Cheung, R.C., et al., "Epitope-specific Antibody Response to the Surface Antigen of Duck Hepatitis B Virus in Infected Ducks," Virology 176(2):546-552, Academic Press, United States (1990).

Chothia, C. and Lesk, A.M., "Canonical Structures for the Hypervariable Regions of Immunoglobulins," Journal of Molecular Biology 196(4):901-917, Elsevier Science, United States (Aug. 1987).

Corinna Lau, et al., "Chimeric Anti-CD14 IGG2/4 Hybrid Antibodies for Therapeutic Intervention in Pig and Human Models of Inflammation," Journal of Immunology 91(9):4769-4777, American Association of Immunologists, United States (Nov. 2013).

Cunningham, B.C. and Wells, J.A., "High-resolution Epitope Mapping of hGH-receptor Interactions by Alanine-scanning Mutagenesis," Science 244(4908):1081-1085, American Association for the Advancement of Science, United States (Jun. 1989).

Edelman, G.M. et al., "The Covalent Structure of an Entire gammaG Immunoglobulin Molecule," Proceedings of the National Academy of Sciences USA 63(1):78-85, National Academy of Sciences, United States (1969).

Gheorghe A., et al., "Age-Related Macular Degeneration," Romanian Journal of Ophthalmology, 59(2):74-77, Romanian Society of Ophthalmology, Romania (2016).

Giege, R., et al., "Crystallogenesis of biological macromolecules: facts and perspectives," Acta Crystallographica. Section D, Biological Crystallography 50(Pt4):339-350, Wiley-Blackwell, United States (1994).

Harlow, E. and Lane D., "Epitope Mapping by Competition Assay," CSH protocols 2006(2), Cold Spring Harbor Laboratory, United States (2006).

Harmsen, M.M., et al., "Properties, Production, and Applications of Camelid Single-Domain Antibody Fragments," Applied Microbiology and Biotechnology 77(1):13-22, Springer International, Germany (Nov. 2007).

Holz, F.G., et al., "Recent Developments in the Treatment of Age-Related Macular Degeneration," The Journal of Clinical Investigation, 124(4):1430-1438, American Society for Clinical Investigation, United States (Apr. 2014).

Huston, J.S., et al., "Protein Engineering of Antibody Binding Sites: Recovery of Specific Activity in an Anti-digoxin Single-chain Fv Analogue Produced in *Escherichia coli*," Proceedings of the National Academy of Sciences of the United States of America 85(16):5879-5883, National Academy of Sciences, United States (Aug. 1988).

International Search Report and Written Opinion for Application No. PCT/IB2019/058794, International Bureau, mailed on Jan. 22, 2020, 8 pages.

Jefferis, R., et al., "Human Immunoglobulin Allotypes: Possible Implications for Immunogenicity," Mabs 1(4):332-338, Taylor & Francis, United States (Jul.-Aug. 2009).

Kabat, E.A & Wu, T.T., "Attempts to Locate Complementarity-Determining Residues in the Variable Positions of Light and Heavy Chains," Annals of the New York Academy of Sciences, 190: 382-391, New York Academy of Sciences, United States (Dec. 1971).

Kirkland, T.N., et al., "Analysis of the Fine Specificity and Cross-reactivity of Monoclonal Anti-lipid A Antibodies," Journal of Microbiology 137(11):3614-3619, Microbiological Society of Korea, Korea (1986).

Kostelny, S.A., et al., "Formation of a Bispecific Antibody by the Use of Leucine Zippers," The Journal of Immunology 148(5):1547-1553, American Association of Immunologists, United States (Mar. 1992).

Lee, R., et al., "Epidemiology of Diabetic Retinopathy, Diabetic Macular Edema and Related Vision Loss," Eye and Vision, 2:17, BioMed Central, United Kingdom (Sep. 2015).

Lefranc, M.P., et al., "IMGT Unique Numbering for Immunoglobulin and T Cell Receptor Variable Domains and Ig Superfamily V-like Domains," Developmental and Comparative Immunology 27(1):55-77, Elsevier Science, United States (Jan. 2003).

Lonberg, N., "Human Antibodies From Transgenic Animals," Nature Biotechnology, 23(9):1117-1125, Nature America Publishing, United States (Sep. 2005).

McCafferty, J., et al., "Phage Antibodies: Filamentous Phage Displaying Antibody Variable Domains," Nature 348(6301):552-554, Nature Publishing Group, United Kingdom (Dec. 1990).

McPherson, A., "Crystallization of Proteins From Polyethylene Glycol," The Journal of Biological Chemistry 251(20):6300-6303, American Society for Biochemistry and Molecular Biology, United States (1976).

McPherson, A., "Current Approaches to Macromolecular Crystallization," European Journal of Biochemistry 189(1):1-23, Blackwell Science Ltd, United Kingdom (1990).

Moldenhauer, G, et al., "Identity of HML-1 Antigen on Intestinal Intraepithelial T Cells and of B-ly7 Antigen on Hairy Cell Leukaemia," Scandinavian Journal of Immunology 32(2):77-82, Blackwell Scientific Publications, United Kingdom (Aug. 1990).

Morel, G.A., et al., "Monoclonal Antibodies to Bovine Serum Albumin: Affinity and Specificity Determinations," Molecular Immunology 25(1):7-15, Pergamon Press, United Kingdom (1988).

Nentwich, M.M and ULBIG,M.W., "Diabetic Retinopathy—Ocular Complications of Diabetes Mellitus," World Journal of Diabetes, 6(3):489-499, Baishideng Publishing Group, United States (Apr. 2015).

(56) References Cited

OTHER PUBLICATIONS

Pennington K.L and Deangelis M.M., "Epidemiology of Age-Related Macular Degeneration (AMD): Associations With Cardiovascular Disease Phenotypes and Lipid Factors," Eye and Vision, 3:34, BioMed Central, United Kingdom (Dec. 2016).
Roux, K.H., et al., "Comparisons of the Ability of Human IgG3 Hinge Mutants, IgM, IgE, and IgA2, to form Small Immune Complexes: A Role for Flexibility and Geometry," The Journal of Immunology 161(8):4083-4090, American Association of Immunologists, United States (Oct. 1998).
Roversi, P., et al., "Modelling Prior Distributions of Atoms for Macromolecular Refinement and Completion," Acta Crystallographica. Section D, Biological Crystallography 56(Pt10):1316-1323, International Union of Crystallography by Munksgaard, United States (2000).
Schluter, A., et al., "CD31 and VEGF Are Prognostic Biomarkers in Early-Stage, but Not in Late-Stage, Laryngeal Squamous Cell Carcinoma," BMC Cancer, 18(1):272, BioMed Central, United Kingdom (Mar. 2018).
Songsivilai, S. and Lachmann, P.J., "Bispecific Antibody: A Tool for Diagnosis and Treatment of Disease," Clinical and Experimental Immunology 79(3):315-321, Blackwell Scientific Publications, United Kingdom (1990).
Stahli, C., et al., "Distinction of Epitopes by Monoclonal Antibodies," Methods in Enzymology 92:242-253, Academic Press, United States (1983).
Tang, T.Y., et al., "TAFA: A Novel Secreted Family With Conserved Cysteine Residues and Restricted Expression in the Brain," Genomics 83(4):727-734, Academic Press, United States (Apr. 2004).
Vidarsson G, et al., "Igg Subclasses and Allotypes: From Structure to Effector Functions," Front Immunology 5:520, Frontiers Research Foundation, Switzerland (Oct. 2014).
Yilmaz, G., et al., "Induction of Neuro-protective/regenerative Genes in Stem Cells Infiltrating Post-ischemic Brain Tissue," Experimental & Translational Stroke Medicine, 2(11):1-10, BioMed Central, United Kingdom (May 2010).

Virgili, G and Bini, A., "Laser Photocoagulation for Neovascular Age-Related Macular Degeneration," The Cochrane Database of Systematic Reviews, 3:CD004763, Wiley, United Kingdom (Jul. 2007).
Wang, Y. et al., "Novel Adipokine, FAM19A5, Inhibits Neointima Formation After Injury Through Sphingosine-1-phosphate Receptor 2", Circulation 138:48-63, Lippincott Williams & Wilkins, United States (Jul. 2018).
Ward, E.S., et al., "Binding Activities of a Repertoire of Single Immunoglobulin Variable Domains Secreted from *Escherichia coli*," Nature 341(6242):544-546, Nature Publishing Group, United Kingdom (Oct. 1989).
Wilsey, L.J. and Fortune, B., "Electroretinography in Glaucoma Diagnosis," Current Opinion in Ophthalmology 27(2):118-124, Lippincott Williams & Wilkins, United States (Mar. 2016).
Wong, W.L., et al., "Global Prevalence of Age-related Macular Degeneration and Disease Burden Projection for 2020 and 2040: A Systematic Review and Meta-Analysis," The Lancet. Global Health, 2(2):e106-116, Elsevier, United Kingdom (Feb. 2014).
Wu, L., et al., "Classification of Diabetic Retinopathy and Diabetic Macular Edema," World Journal of Diabetes, 4(6):290-294, Baishideng Publishing Group, United States (Dec. 2013).
Mitchell, P., et al., "Age-related macular degeneration," Lancet 392(10153):1147-1159, Elsevier, Netherlands (Sep. 2018).
Saito, M., et al., "Efficacy of intravitreal aflibercept in Japanese patients with exudative age-related macular degeneration," Jpn J Ophthalmol 61(1):74-83, Springer Japan, Japan (Jan. 2017).
Kawashima, Y., et al., "Effects of aflibercept for ranibizumab-resistant neovascular age-related macular degeneration and polypoidal choroidal vasculopathy," Graefes Arch Clin Exp Ophthalmol 253(9):1471-1477, Springer Verlag, Germany (Sep. 2015).
Han, K.M., et al., "Serum FAM19A5 levels: A novel biomarker for neuroinflammation and neurodegeneration in major depressive disorder," Brain Behav Immun 87:852-859, Elsevier, Netherlands (Jul. 2020).
Huang, S., et al., "FAM19A5/TAFA5, a novel neurokine, plays a crucial role in depressive-like and spatial memory-related behaviors in mice," Mol Psychiatry 26(6):2363-2379, Nature Portfolio, Germany (Jun. 2021).

\* cited by examiner

SEQUENCE LISTING

<160> NUMBER OF SEQ ID NOS: 301

<210> SEQ ID NO 1
<211> LENGTH: 132
<212> TYPE: PRT

<213> ORGANISM: Homo Sapiens

<400> SEQUENCE: 1

Met Ala Pro Ser Pro Arg Thr Gly Ser Arg Gln Asp Ala Thr Ala Leu
1               5                   10                  15

Pro Ser Met Ser Ser Thr Phe Trp Ala Phe Met Ile Leu Ala Ser Leu
            20                  25                  30

Leu Ile Ala Tyr Cys Ser Gln Leu Ala Ala Gly Thr Cys Glu Ile Val
        35                  40                  45

Thr Leu Asp Arg Asp Ser Ser Gln Pro Arg Arg Thr Ile Ala Arg Gln
    50                  55                  60

Thr Ala Arg Cys Ala Cys Arg Lys Gly Gln Ile Ala Gly Thr Thr Arg
65                  70                  75                  80

Ala Arg Pro Ala Cys Val Asp Ala Arg Ile Ile Lys Thr Lys Gln Trp
                85                  90                  95

Cys Asp Met Leu Pro Cys Leu Glu Gly Glu Gly Cys Asp Leu Leu Ile
            100                 105                 110

Asn Arg Ser Gly Trp Thr Cys Thr Gln Pro Gly Gly Arg Ile Lys Thr
        115                 120                 125

Thr Thr Val Ser
    130

<210> SEQ ID NO 2
<211> LENGTH: 125
<212> TYPE: PRT
<213> ORGANISM: Homo Sapiens

<400> SEQUENCE: 2

Met Gln Leu Leu Lys Ala Leu Trp Ala Leu Ala Gly Ala Ala Leu Cys
1               5                   10                  15

Cys Phe Leu Val Leu Val Ile His Ala Gln Phe Leu Lys Glu Gly Gln
            20                  25                  30

Leu Ala Ala Gly Thr Cys Glu Ile Val Thr Leu Asp Arg Asp Ser Ser
        35                  40                  45

Gln Pro Arg Arg Thr Ile Ala Arg Gln Thr Ala Arg Cys Ala Cys Arg
    50                  55                  60

Lys Gly Gln Ile Ala Gly Thr Thr Arg Ala Arg Pro Ala Cys Val Asp
65                  70                  75                  80

Ala Arg Ile Ile Lys Thr Lys Gln Trp Cys Asp Met Leu Pro Cys Leu
                85                  90                  95

Glu Gly Glu Gly Cys Asp Leu Leu Ile Asn Arg Ser Gly Trp Thr Cys
            100                 105                 110

Thr Gln Pro Gly Gly Arg Ile Lys Thr Thr Thr Val Ser
        115                 120                 125

<210> SEQ ID NO 3
<211> LENGTH: 53
<212> TYPE: PRT
<213> ORGANISM: Homo Sapiens

<400> SEQUENCE: 3

Met Tyr His His Arg Glu Trp Pro Ala Arg Ile Ile Lys Thr Lys Gln
1               5                   10                  15

Trp Cys Asp Met Leu Pro Cys Leu Glu Gly Glu Gly Cys Asp Leu Leu
            20                  25                  30

Ile Asn Arg Ser Gly Trp Thr Cys Thr Gln Pro Gly Gly Arg Ile Lys
        35                  40                  45

Thr Thr Thr Val Ser
    50

<210> SEQ ID NO 4
<211> LENGTH: 1501
<212> TYPE: DNA
<213> ORGANISM: Homo Sapiens

<400> SEQUENCE: 4
ggcggcggag gatggcgcgc gcggggcccg cacgtggagg ccggcgcggg ggcgcgggca      60
gggccggctg ctgagacgcg ctgctgcccc ccgcgcgggc gccgcggctt caatggcgcc     120
atcgcccagg accggcagcc ggcaagatgc gaccgccctg cccagcatgt cctcaacttt     180
ctgggcgttc atgatcctgg ccagcctgct catcgcctac tgcagtcagc tggccgccgg     240
cacctgtgag attgtgacct tggaccggga cagcagccag cctcggagga cgatcgcccg     300
gcagaccgcc cgctgtgcgt gtagaaaggg gcagatcgcc ggcaccacga gagcccggcc     360
cgcctgtgtg gacgcaagaa tcatcaagac caagcagtgg tgtgacatgc ttccgtgtct     420
ggagggggaa ggctgcgact tgttaatcaa ccggtcaggc tggacgtgca cgcagcccgg     480
cgggaggata aagaccacca cggtctcctg acaaacacag ccctgagggg gccccggga     540
gtggccttgg ctccctggag agcccacgtc tcagccacag ttctccactc gcctcggact     600
tcacccgttc tctgccgccc gcccactccg tttccctgtg gtccgtgaag gacggcctca     660
ggccttggca tcctgagctt cggtctgtcc agccgacccg aggaggccgg actcagacac     720
ataggcgggg gcggcacct ggcatcagca atacgcagtc tgtgggagcc cggccgcgcc      780
cagcccccgc cgaccgtggc gttggccctg ctgtcctcag aggaggagga ggaggaggca     840
gctccggcag ccacagaagg ctgcagccca gcccgcctga cacgacgc ctgccccagg       900
ggactgtcag gcacagaagc ggcctcctcc cgtgcccag actgtccgaa ttgcttttat      960
tttcttatac tttcagtata ctccatagac caaagagcaa aatctatctg aacctggacg    1020
caccctcact gtcagggtcc ctggggtcgc ttgtgcgggc gggagggcaa tggtggcaga    1080
gacatgctgg tggcccccggc ggagcggaga gggcggccgt ggtggaggcc tccaccccag    1140
gagcaccccg cacaccctcg gaggacgggc ttcggctgcg cggaggccgt ggcacacctg    1200
cgggaggcag cgacggcccc cacgcagacg ccggaacgc aggccgcttt attcctctgt      1260
acttagatca acttgaccgt actaaaatcc ctttctgttt taaccagtta acatgcctc      1320
ttctacagct ccattttga tagttggata atccagtatc tgccaagagc atgttgggtc     1380
tcccgtgact gctgcctcat cgataccca tttagctcca gaaagcaaag aaaactcgag      1440
taacacttgt ttgaaagaga tcattaaatg tattttgcaa agcccaaaaa aaaaaaaaaa    1500
a                                                                    1501

<210> SEQ ID NO 5
<211> LENGTH: 14
<212> TYPE: PRT
<213> ORGANISM: Artificial Sequence
<220> FEATURE:
<223> OTHER INFORMATION: Epitope F1

<400> SEQUENCE: 5

Gln Leu Ala Ala Gly Thr Cys Glu Ile Val Thr Leu Asp Arg
1               5                   10

<210> SEQ ID NO 6

```
<211> LENGTH: 20
<212> TYPE: PRT
<213> ORGANISM: Artificial Sequence
<220> FEATURE:
<223> OTHER INFORMATION: Epitope F2

<400> SEQUENCE: 6

Thr Leu Asp Arg Asp Ser Ser Gln Pro Arg Arg Thr Ile Ala Arg Gln
1               5                   10                  15

Thr Ala Arg Cys
            20

<210> SEQ ID NO 7
<211> LENGTH: 20
<212> TYPE: PRT
<213> ORGANISM: Artificial Sequence
<220> FEATURE:
<223> OTHER INFORMATION: Epitope F3

<400> SEQUENCE: 7

Thr Ala Arg Cys Ala Cys Arg Lys Gly Gln Ile Ala Gly Thr Thr Arg
1               5                   10                  15

Ala Arg Pro Ala
            20

<210> SEQ ID NO 8
<211> LENGTH: 20
<212> TYPE: PRT
<213> ORGANISM: Artificial Sequence
<220> FEATURE:
<223> OTHER INFORMATION: Epitope F4

<400> SEQUENCE: 8

Ala Arg Pro Ala Cys Val Asp Ala Arg Ile Ile Lys Thr Lys Gln Trp
1               5                   10                  15

Cys Asp Met Leu
            20

<210> SEQ ID NO 9
<211> LENGTH: 20
<212> TYPE: PRT
<213> ORGANISM: Artificial Sequence
<220> FEATURE:
<223> OTHER INFORMATION: Epitope F5

<400> SEQUENCE: 9

Cys Asp Met Leu Pro Cys Leu Glu Gly Glu Gly Cys Asp Leu Leu Ile
1               5                   10                  15

Asn Arg Ser Gly
            20

<210> SEQ ID NO 10
<211> LENGTH: 20
<212> TYPE: PRT
<213> ORGANISM: Artificial Sequence
<220> FEATURE:
<223> OTHER INFORMATION: Epitope F6

<400> SEQUENCE: 10

Asn Arg Ser Gly Trp Thr Cys Thr Gln Pro Gly Gly Arg Ile Lys Thr
1               5                   10                  15

Thr Thr Val Ser
            20
```

```
<210> SEQ ID NO 11
<211> LENGTH: 5
<212> TYPE: PRT
<213> ORGANISM: Artificial Sequence
<220> FEATURE:
<223> OTHER INFORMATION: 2-13 Antibody VH-CDR1

<400> SEQUENCE: 11

Ser His Gly Met Phe
1               5

<210> SEQ ID NO 12
<211> LENGTH: 17
<212> TYPE: PRT
<213> ORGANISM: Artificial Sequence
<220> FEATURE:
<223> OTHER INFORMATION: 2-13; 2-13D; 2-13D-37; 2-13D-37-1.5W-41;
      2-13D-37-3W-16 VH-CDR2

<400> SEQUENCE: 12

Glu Ile Thr Asn Asp Gly Ser Gly Thr Asn Tyr Gly Ser Ala Val Lys
1               5                   10                  15

Gly

<210> SEQ ID NO 13
<211> LENGTH: 20
<212> TYPE: PRT
<213> ORGANISM: Artificial Sequence
<220> FEATURE:
<223> OTHER INFORMATION: 2-13; 2-13D; 2-13D-37 VH-CDR3

<400> SEQUENCE: 13

Ser Thr Tyr Glu Cys Pro Gly Gly Phe Ser Cys Trp Gly Asp Thr Gly
1               5                   10                  15

Gln Ile Asp Ala
            20

<210> SEQ ID NO 14
<211> LENGTH: 5
<212> TYPE: PRT
<213> ORGANISM: Artificial Sequence
<220> FEATURE:
<223> OTHER INFORMATION: 3-2 Antibody VH-CDR1

<400> SEQUENCE: 14

Ser Phe Asn Met Phe
1               5

<210> SEQ ID NO 15
<211> LENGTH: 17
<212> TYPE: PRT
<213> ORGANISM: Artificial Sequence
<220> FEATURE:
<223> OTHER INFORMATION: 3-2 Antibody VH-CDR2

<400> SEQUENCE: 15

Gln Ile Ser Ser Ser Gly Ser Ser Thr Asn Tyr Ala Pro Ala Val Arg
1               5                   10                  15

Gly

<210> SEQ ID NO 16
<211> LENGTH: 22
<212> TYPE: PRT
<213> ORGANISM: Artificial Sequence
<220> FEATURE:
<223> OTHER INFORMATION: 3-2; 1-7A-IT; Low-PI; 1-30; 1-17; 1-32; 4-11;
```

6-10 VH-CDR3

<400> SEQUENCE: 16

Ser Ser Tyr Asp Cys Pro Tyr Gly His Cys Ser Ser Gly Val Asp Ser
1               5                   10                  15

Ala Gly Glu Ile Asp Ala
            20

<210> SEQ ID NO 17
<211> LENGTH: 5
<212> TYPE: PRT
<213> ORGANISM: Artificial Sequence
<220> FEATURE:
<223> OTHER INFORMATION: 1-65; SS01-13; SS01-13-s5; S5-2.GKNG VH-CDR1

<400> SEQUENCE: 17

Ser Tyr Gln Met Gly
1               5

<210> SEQ ID NO 18
<211> LENGTH: 10
<212> TYPE: PRT
<213> ORGANISM: Artificial Sequence
<220> FEATURE:
<223> OTHER INFORMATION: 1-65; SS01-13 VH-CDR2

<400> SEQUENCE: 18

Val Ile Asn Lys Ser Gly Ser Asp Thr Ser
1               5                   10

<210> SEQ ID NO 19
<211> LENGTH: 13
<212> TYPE: PRT
<213> ORGANISM: Artificial Sequence
<220> FEATURE:
<223> OTHER INFORMATION: 1-65; SS01-13; SS01-13-s5; S5-2.GKNG VH-CDR3

<400> SEQUENCE: 19

Gly Ser Ala Ser Tyr Ile Thr Ala Ala Thr Ile Asp Ala
1               5                   10

<210> SEQ ID NO 20
<211> LENGTH: 8
<212> TYPE: PRT
<213> ORGANISM: Artificial Sequence
<220> FEATURE:
<223> OTHER INFORMATION: 1-28 Antibody VH-CDR1

<400> SEQUENCE: 20

Gly Phe Asp Phe Ser Asp Tyr Gly
1               5

<210> SEQ ID NO 21
<211> LENGTH: 8
<212> TYPE: PRT
<213> ORGANISM: Artificial Sequence
<220> FEATURE:
<223> OTHER INFORMATION: 1-28 Antibody VH-CDR2

<400> SEQUENCE: 21

Ile Arg Ser Asp Gly Ser Asn Pro
1               5

<210> SEQ ID NO 22
<211> LENGTH: 29
<212> TYPE: PRT

```
<213> ORGANISM: Artificial Sequence
<220> FEATURE:
<223> OTHER INFORMATION: 1-28 Antibody VH-CDR3

<400> SEQUENCE: 22

Ala Lys Asp Gly Asn Gly Tyr Cys Ala Leu Asp Ala Tyr Arg Ser Gly
1               5                   10                  15

Gly Tyr Ser Cys Gly Val Tyr Pro Gly Ser Ile Asp Ala
            20                  25

<210> SEQ ID NO 23
<211> LENGTH: 8
<212> TYPE: PRT
<213> ORGANISM: Artificial Sequence
<220> FEATURE:
<223> OTHER INFORMATION: 2-13 Antibody VL-CDR1

<400> SEQUENCE: 23

Ser Gly Gly Ser Tyr Ser Tyr Gly
1               5

<210> SEQ ID NO 24
<211> LENGTH: 7
<212> TYPE: PRT
<213> ORGANISM: Artificial Sequence
<220> FEATURE:
<223> OTHER INFORMATION: 2-13; 2-13D; 2-13D-37; 2-13D-37-1.5W-41;
      2-13D-37-3W-16 VL-CDR2

<400> SEQUENCE: 24

Trp Asp Asp Glu Arg Pro Ser
1               5

<210> SEQ ID NO 25
<211> LENGTH: 11
<212> TYPE: PRT
<213> ORGANISM: Artificial Sequence
<220> FEATURE:
<223> OTHER INFORMATION: 2-13; 2-13D; 2-13D-37; 2-13D-37-1.5W-41;
      2-13D-37-3W-16 VL-CDR3

<400> SEQUENCE: 25

Gly Thr Glu Asp Ile Ser Gly Thr Ala Gly Val
1               5                   10

<210> SEQ ID NO 26
<211> LENGTH: 13
<212> TYPE: PRT
<213> ORGANISM: Artificial Sequence
<220> FEATURE:
<223> OTHER INFORMATION: 3-2; 1-7A-IT; 1-17; 1-32; 4-11; 6-10 VL-CDR1

<400> SEQUENCE: 26

Ser Gly Gly Gly Ser Tyr Ala Gly Ser Tyr Tyr Tyr Gly
1               5                   10

<210> SEQ ID NO 27
<211> LENGTH: 7
<212> TYPE: PRT
<213> ORGANISM: Artificial Sequence
<220> FEATURE:
<223> OTHER INFORMATION: 3-2 Antibody VL-CDR2

<400> SEQUENCE: 27

Glu Ser Asn Lys Arg Pro Ser
1               5
```

```
<210> SEQ ID NO 28
<211> LENGTH: 10
<212> TYPE: PRT
<213> ORGANISM: Artificial Sequence
<220> FEATURE:
<223> OTHER INFORMATION: 3-2; 1-7A-IT VL-CDR3

<400> SEQUENCE: 28

Gly Ser Trp Asp Ser Ser Asn Gly Gly Ile
1               5                   10

<210> SEQ ID NO 29
<211> LENGTH: 11
<212> TYPE: PRT
<213> ORGANISM: Artificial Sequence
<220> FEATURE:
<223> OTHER INFORMATION: 1-65 Antibody VL-CDR1

<400> SEQUENCE: 29

Ser Gly Gly Gly Ser Ser Gly Tyr Gly Tyr Gly
1               5                   10

<210> SEQ ID NO 30
<211> LENGTH: 7
<212> TYPE: PRT
<213> ORGANISM: Artificial Sequence
<220> FEATURE:
<223> OTHER INFORMATION: 1-65 Antibody VL-CDR2

<400> SEQUENCE: 30

Trp Asn Asp Lys Arg Pro Ser
1               5

<210> SEQ ID NO 31
<211> LENGTH: 14
<212> TYPE: PRT
<213> ORGANISM: Artificial Sequence
<220> FEATURE:
<223> OTHER INFORMATION: 1-65; ss01-13; SS01-13-S5; S5-2.GKNG VL-CDR3

<400> SEQUENCE: 31

Gly Asn Asp Asp Tyr Ser Ser Asp Ser Gly Tyr Val Gly Val
1               5                   10

<210> SEQ ID NO 32
<211> LENGTH: 5
<212> TYPE: PRT
<213> ORGANISM: Artificial Sequence
<220> FEATURE:
<223> OTHER INFORMATION: 1-28 Antibody VL-CDR1

<400> SEQUENCE: 32

Gly Tyr Gly Tyr Gly
1               5

<210> SEQ ID NO 33
<211> LENGTH: 3
<212> TYPE: PRT
<213> ORGANISM: Artificial Sequence
<220> FEATURE:
<223> OTHER INFORMATION: 1-28 Antibody VL-CDR2

<400> SEQUENCE: 33

Gln Asn Asp
1
```

```
<210> SEQ ID NO 34
<211> LENGTH: 11
<212> TYPE: PRT
<213> ORGANISM: Artificial Sequence
<220> FEATURE:
<223> OTHER INFORMATION: 1-28 Antibody VL-CDR3

<400> SEQUENCE: 34

Gly Ser Glu Asp Ser Ser Thr Leu Ala Gly Ile
1               5                   10

<210> SEQ ID NO 35
<211> LENGTH: 129
<212> TYPE: PRT
<213> ORGANISM: Artificial Sequence
<220> FEATURE:
<223> OTHER INFORMATION: 2-13 Antibody VH

<400> SEQUENCE: 35

Ala Val Thr Leu Asp Glu Ser Gly Gly Gly Leu Gln Thr Pro Gly Gly
1               5                   10                  15

Ala Leu Ser Leu Val Cys Lys Ala Ser Gly Phe Thr Phe Ser Ser His
            20                  25                  30

Gly Met Phe Trp Val Arg Gln Thr Pro Gly Lys Gly Leu Glu Tyr Val
        35                  40                  45

Ala Glu Ile Thr Asn Asp Gly Ser Gly Thr Asn Tyr Gly Ser Ala Val
    50                  55                  60

Lys Gly Arg Ala Thr Ile Ser Arg Asp Asn Gly Gln Ser Thr Val Arg
65                  70                  75                  80

Leu Gln Leu Asn Asn Leu Arg Ala Glu Asp Thr Gly Thr Tyr Phe Cys
                85                  90                  95

Ala Arg Ser Thr Tyr Glu Cys Pro Gly Gly Phe Ser Cys Trp Gly Asp
            100                 105                 110

Thr Gly Gln Ile Asp Ala Trp Gly His Gly Thr Glu Val Ile Val Ser
        115                 120                 125

Ser

<210> SEQ ID NO 36
<211> LENGTH: 131
<212> TYPE: PRT
<213> ORGANISM: Artificial Sequence
<220> FEATURE:
<223> OTHER INFORMATION: 3-2 Antibody VH

<400> SEQUENCE: 36

Ala Val Thr Leu Asp Glu Ser Gly Gly Gly Leu Gln Thr Pro Gly Gly
1               5                   10                  15

Ala Leu Ser Leu Val Cys Lys Ala Ser Gly Phe Thr Phe Ser Ser Phe
            20                  25                  30

Asn Met Phe Trp Val Arg Gln Ala Pro Gly Lys Gly Leu Glu Tyr Val
        35                  40                  45

Ala Gln Ile Ser Ser Ser Gly Ser Ser Thr Asn Tyr Ala Pro Ala Val
    50                  55                  60

Arg Gly Arg Ala Thr Ile Ser Arg Asp Asn Gly Gln Ser Thr Val Arg
65                  70                  75                  80

Leu Gln Leu Asn Asn Pro Gly Ala Glu Asp Thr Gly Thr Tyr Tyr Cys
                85                  90                  95

Ala Lys Ser Ser Tyr Asp Cys Pro Tyr Gly His Cys Ser Ser Gly Val
            100                 105                 110
```

```
Asp Ser Ala Gly Glu Ile Asp Ala Trp Gly His Gly Thr Glu Val Ile
            115                 120                 125
Val Ser Ser
    130

<210> SEQ ID NO 37
<211> LENGTH: 122
<212> TYPE: PRT
<213> ORGANISM: Artificial Sequence
<220> FEATURE:
<223> OTHER INFORMATION: 1-65 Antibody VH

<400> SEQUENCE: 37

Ala Val Thr Leu Asp Glu Ser Gly Gly Gly Leu Gln Thr Pro Gly Gly
1               5                   10                  15
Ala Leu Ser Leu Val Cys Lys Ala Ser Gly Phe Thr Phe Ser Ser Tyr
            20                  25                  30
Gln Met Gly Trp Val Arg Gln Ala Pro Gly Lys Gly Leu Glu Trp Val
        35                  40                  45
Gly Val Ile Asn Lys Ser Gly Ser Asp Thr Ser Tyr Gly Ser Ala Val
    50                  55                  60
Lys Gly Arg Ala Thr Ile Ser Arg Asp Asn Gly Gln Ser Thr Val Arg
65                  70                  75                  80
Leu Gln Leu Asn Asn Leu Arg Ala Glu Asp Thr Gly Thr Tyr Phe Cys
                85                  90                  95
Ala Lys Gly Ser Ala Ser Tyr Ile Thr Ala Ala Thr Ile Asp Ala Trp
            100                 105                 110
Gly His Gly Thr Glu Val Ile Val Ser Ser
            115                 120

<210> SEQ ID NO 38
<211> LENGTH: 136
<212> TYPE: PRT
<213> ORGANISM: Artificial Sequence
<220> FEATURE:
<223> OTHER INFORMATION: 1-28 Antibody VH

<400> SEQUENCE: 38

Ala Val Thr Leu Asp Glu Ser Gly Gly Gly Leu Gln Thr Pro Gly Gly
1               5                   10                  15
Ala Leu Ser Leu Val Cys Lys Ala Ser Gly Phe Asp Phe Ser Asp Tyr
            20                  25                  30
Gly Met Gly Trp Val Arg Gln Ala Pro Gly Lys Gly Leu Glu Trp Val
        35                  40                  45
Ala Ala Ile Arg Ser Asp Gly Ser Asn Pro Ser Tyr Gly Ser Ala Val
    50                  55                  60
Lys Gly Arg Ala Thr Ile Ser Lys Asp Asn Gly Arg Ser Thr Val Arg
65                  70                  75                  80
Leu Gln Leu Asn Asn Leu Arg Ala Glu Asp Thr Ala Thr Tyr Tyr Cys
                85                  90                  95
Ala Lys Asp Gly Asn Gly Tyr Cys Ala Leu Asp Ala Tyr Arg Ser Gly
            100                 105                 110
Gly Tyr Ser Cys Gly Val Tyr Pro Gly Ser Ile Asp Ala Trp Gly His
            115                 120                 125
Gly Thr Glu Val Ile Val Ser Ser
    130                 135

<210> SEQ ID NO 39
```

```
<211> LENGTH: 104
<212> TYPE: PRT
<213> ORGANISM: Artificial Sequence
<220> FEATURE:
<223> OTHER INFORMATION: 2-13 Antibody VL

<400> SEQUENCE: 39

Ala Leu Thr Gln Pro Ser Ser Val Ser Ala Asn Pro Gly Glu Thr Val
1               5                   10                  15

Lys Ile Thr Cys Ser Gly Gly Ser Tyr Ser Tyr Gly Trp Phe Gln Gln
            20                  25                  30

Lys Ser Pro Gly Ser Ala Leu Val Thr Val Ile Tyr Trp Asp Asp Glu
        35                  40                  45

Arg Pro Ser Asp Ile Pro Ser Arg Phe Ser Gly Ala Leu Ser Gly Ser
    50                  55                  60

Thr Asn Thr Leu Thr Ile Thr Gly Val Gln Ala Asp Asp Glu Ala Val
65                  70                  75                  80

Tyr Phe Cys Gly Thr Glu Asp Ile Ser Gly Thr Ala Gly Val Phe Gly
                85                  90                  95

Ala Gly Thr Thr Leu Thr Val Leu
            100

<210> SEQ ID NO 40
<211> LENGTH: 108
<212> TYPE: PRT
<213> ORGANISM: Artificial Sequence
<220> FEATURE:
<223> OTHER INFORMATION: 3-2 Antibody VL

<400> SEQUENCE: 40

Ala Leu Thr Gln Pro Ser Ser Val Ser Ala Asn Pro Gly Glu Thr Val
1               5                   10                  15

Lys Ile Thr Cys Ser Gly Gly Ser Tyr Ala Gly Ser Tyr Tyr Tyr
            20                  25                  30

Gly Trp Tyr Gln Gln Lys Ala Pro Gly Ser Ala Pro Val Thr Leu Ile
        35                  40                  45

Tyr Glu Ser Asn Lys Arg Pro Ser Asp Ile Pro Ser Arg Phe Ser Gly
    50                  55                  60

Ser Thr Ser Gly Ser Thr Ala Thr Leu Thr Ile Thr Gly Val Gln Ala
65                  70                  75                  80

Asp Asp Glu Ala Ile Tyr Tyr Cys Gly Ser Trp Asp Ser Ser Asn Gly
                85                  90                  95

Gly Ile Phe Gly Ala Gly Thr Thr Leu Thr Val Leu
            100                 105

<210> SEQ ID NO 41
<211> LENGTH: 110
<212> TYPE: PRT
<213> ORGANISM: Artificial Sequence
<220> FEATURE:
<223> OTHER INFORMATION: 1-65 Antibody VL

<400> SEQUENCE: 41

Ala Leu Thr Gln Pro Ser Ser Val Ser Ala Asn Pro Gly Glu Thr Val
1               5                   10                  15

Lys Ile Thr Cys Ser Gly Gly Ser Ser Gly Tyr Gly Tyr Gly Trp
            20                  25                  30

Tyr Gln Gln Lys Ser Pro Ser Ser Ala Pro Leu Thr Val Ile Tyr Trp
        35                  40                  45
```

-continued

```
Asn Asp Lys Arg Pro Ser Asp Ile Pro Ser Arg Phe Ser Gly Ser Lys
 50                  55                  60
Ser Gly Ser Thr His Thr Leu Thr Ile Thr Gly Val Gln Ala Glu Asp
 65                  70                  75                  80
Glu Ala Val Tyr Phe Cys Gly Asn Asp Asp Tyr Ser Ser Asp Ser Gly
                 85                  90                  95
Tyr Val Gly Val Phe Gly Ala Gly Thr Thr Leu Thr Val Leu
            100                 105                 110
```

<210> SEQ ID NO 42
<211> LENGTH: 104
<212> TYPE: PRT
<213> ORGANISM: Artificial Sequence
<220> FEATURE:
<223> OTHER INFORMATION: 1-28 Antibody VL

<400> SEQUENCE: 42

```
Ala Leu Thr Gln Pro Ser Ser Val Ser Ala Asn Leu Gly Thr Val
 1               5                  10                  15
Glu Ile Thr Cys Ser Gly Ser Gly Tyr Gly Tyr Gly Trp Tyr Gln Gln
                 20                  25                  30
Lys Ser Pro Gly Ser Ala Pro Val Thr Val Ile Tyr Gln Asn Asp Lys
             35                  40                  45
Arg Pro Ser Asp Ile Pro Ser Arg Phe Ser Gly Ser Lys Ser Gly Ser
 50                  55                  60
Thr Gly Thr Leu Thr Ile Thr Gly Val Gln Val Glu Asp Glu Ala Val
 65                  70                  75                  80
Tyr Tyr Cys Gly Ser Glu Asp Ser Ser Thr Leu Ala Gly Ile Phe Gly
                 85                  90                  95
Ala Gly Thr Thr Leu Thr Val Leu
            100
```

<210> SEQ ID NO 43
<211> LENGTH: 388
<212> TYPE: DNA
<213> ORGANISM: Artificial Sequence
<220> FEATURE:
<223> OTHER INFORMATION: 2-13 Antibody VH

<400> SEQUENCE: 43

```
gccgtgacgt tggacgagtc cggggggcggc ctccagacgc ccggaggagc gctcagcctc      60
gtctgcaagg cctccgggtt caccttcagc agccatggca tgttctgggt gcgacagacg     120
cccggcaagg ggttggaata tgtcgctgaa attaccaatg atggtagtgg cacaaactac     180
gggtcggcgg tgaagggccg tgccaccatc tcgagggaca cgggcagag cacagtgagg     240 ctgcagctga caaccctcag ggctgaggac accggcacct acttctgcgc cagatctact     300
tatgaatgtc ctggtggttt tagttgttgg ggtgatactg gtcaaataga cgcatggggc     360
cacgggaccg aagtcatcgt ctcctcca                                        388
```

<210> SEQ ID NO 44
<211> LENGTH: 394
<212> TYPE: DNA
<213> ORGANISM: Artificial Sequence
<220> FEATURE:
<223> OTHER INFORMATION: 3-2 Antibody VH

<400> SEQUENCE: 44

```
gccgtgacgt tggacgagtc cggggggcggc ctccagacgc ccggaggagc gctcagcctc      60
```

-continued

```
gtctgcaagg cctccgggtt caccttcagc agcttcaaca tgttctgggt gcgacaggcg    120
cccggcaagg ggctggaata cgtcgctcaa attagcagca gtggtagtag cacaaactac    180
gcacccgcgg tgaggggccg tgccaccatc tcgagggaca cgggcagag cacagtgagg     240 ctgcagctga caaccccgg ggctgaagac accggcacct actactgcgc caaaagtagt     300
tatgactgtc cttacggtca ttgtagtagt ggtgttgata gtgctggtga gatcgacgca    360
tggggccacg ggaccgaagt catcgtctcc tcca                                394
```

<210> SEQ ID NO 45
<211> LENGTH: 366
<212> TYPE: DNA
<213> ORGANISM: Artificial Sequence
<220> FEATURE:
<223> OTHER INFORMATION: 1-65 Antibody VH

<400> SEQUENCE: 45

```
gccgtgacgt tggacgagtc cgggggcggc ctccagacgc ccggaggagc gctcagcctc    60
gtctgcaagg cctccgggtt caccttcagc agctatcaga tgggctgggt gcgacaggcg    120
cccggcaagg ggctggaatg ggtcggtgtt attaacaaga gtggtagtga cacatcatac    180
gggtcggcgg tgaagggccg tgccaccatc tcgagggaca cgggcagag cacagtgagg     240 ctgcagctga caacctcag ggctgaggac accggcacct acttctgcgc caaaggttct    300
gctagttata taactgctgc taccatcgac gcatggggcc acgggaccga agtcatcgtc    360
tcctcc                                                               366
```

<210> SEQ ID NO 46
<211> LENGTH: 408
<212> TYPE: DNA
<213> ORGANISM: Artificial Sequence
<220> FEATURE:
<223> OTHER INFORMATION: 1-28 Antibody VH

<400> SEQUENCE: 46

```
gccgtgacgt tggacgagtc cgggggcggc ctccagacgc ccggaggagc gctcagcctc    60
gtctgcaagg cctccgggtt cgacttcagc gattatggca tgggttgggt gcgacaggct    120
ccaggcaagg ggctggagtg ggttgctgct attagaagtg atggtagtaa cccatcatac    180
gggtcggcgg tgaagggccg tgccaccatc tcgaaggaca cgggcgaag cacagtgagg     240 ctgcagctga caacctcag ggctgaggac accgccacct actactgcgc caaggatggt    300
aatggttact gtgctctcga tgcttatcgt agtggtggtt atagttgtgg tgtttatcct    360
ggtagcatcg acgcatgggg ccacgggacc gaagtcatcg tctcctcc                408
```

<210> SEQ ID NO 47
<211> LENGTH: 315
<212> TYPE: DNA
<213> ORGANISM: Artificial Sequence
<220> FEATURE:
<223> OTHER INFORMATION: 2-13 Antibody VL

<400> SEQUENCE: 47

```
ggccctgact cagccgtcct cggtgtcagc aaacccagga gaaaccgtca agataacctg    60
ctccgggggt agctatagct atggctggtt ccagcagaag tctcctggca gtgcccttgt    120
cactgtgatc tactgggatg atgagagacc ctcggacatc ccttcacgat tctccggtgc    180
cctatccggc tccacaaaca cattaaccat cactgggggtc aagccgacg acgaggctgt    240 ctatttctgt gggactgaag acatcagcgg cactgctggt gtatttgggg ccgggacaac    300
```

-continued

<210> SEQ ID NO 48
<211> LENGTH: 327
<212> TYPE: DNA
<213> ORGANISM: Artificial Sequence
<220> FEATURE:
<223> OTHER INFORMATION: 3-2 Antibody VL

<400> SEQUENCE: 48
ggccctgact cagccgtcct cggtgtcagc aaacccagga gaaaccgtca agatcacctg     60
ctccgggggt ggcagctatg ctggaagtta ctattatggc tggtaccagc agaaggcacc    120
tggcagtgcc cctgtcactc tgatctatga agcaacaag agaccctcgg acatcccttc    180
acgattctcc ggttccacat ctggctccac agccacacta accatcactg ggtccaagc    240 cgatgacgag gctatctatt actgtgggag ctgggacagt agcaatggtg gtatatttgg    300
ggccgggaca accctgaccg tcctagg                                        327

<210> SEQ ID NO 49
<211> LENGTH: 331
<212> TYPE: DNA
<213> ORGANISM: Artificial Sequence
<220> FEATURE:
<223> OTHER INFORMATION: 1-65 Antibody VL

<400> SEQUENCE: 49
ggccctgact cagccgtcct cggtgtcagc aaaccctggg gaaactgtca agatcacctg     60
ctccgggggt ggtagcagtg ctatggtta tggctggtat cagcagaagt cacctagcag    120
tgcccctctc actgtgatct actggaacga caagagaccc tcggacatcc cttcacgatt    180
ctccggttcc aaatccggct ccacacacac attaaccatc actggggtcc aagccgagga    240
cgaggctgta tatttctgtg gaatgatga ctacagcagt gatagtggat atgtcggtgt     300
atttggggcc gggacaaccc tgaccgtcct a                                   331

<210> SEQ ID NO 50
<211> LENGTH: 312
<212> TYPE: DNA
<213> ORGANISM: Artificial Sequence
<220> FEATURE:
<223> OTHER INFORMATION: 1-28 Antibody VL

<400> SEQUENCE: 50
gccctgactc agccgtcctc ggtgtcagca aacctggaag gaaccgtcga gatcacctgc     60
tccgggagtg gctatggtta tggctggtat cagcagaagt ctcctggcag tgcccctgtc    120
actgtgatct atcagaacga caagagaccc tcggacatcc cttcacgatt ctccggttcc    180
aaatccggct ccacgggcac attaaccatc actggggtcc aagtcgagga cgaggctgtc    240
tattactgtg ggagtgaaga cagcagcact cttgctggta tatttggggc cgggacaacc    300
ctgaccgtcc ta                                                        312

<210> SEQ ID NO 51
<211> LENGTH: 100
<212> TYPE: PRT
<213> ORGANISM: Artificial Sequence
<220> FEATURE:
<223> OTHER INFORMATION: M3 mutant

<400> SEQUENCE: 51

```
Gln Phe Leu Lys Glu Gly Gln Leu Ala Ala Gly Thr Cys Glu Ile Val
1               5                   10                  15

Thr Leu Asp Arg Asp Ser Ser Gln Pro Arg Ile Glu Glu Arg Ser Gln
            20                  25                  30

Thr Ala Arg Cys Ala Cys Arg Lys Gly Gln Ile Ala Gly Thr Thr Arg
        35                  40                  45

Ala Arg Pro Ala Cys Val Asp Ala Arg Ile Ile Lys Thr Lys Gln Trp
    50                  55                  60

Cys Asp Met Leu Pro Cys Leu Glu Gly Glu Gly Cys Asp Leu Leu Ile
65                  70                  75                  80

Asn Arg Ser Gly Trp Thr Cys Thr Gln Pro Gly Gly Arg Ile Lys Thr
                85                  90                  95

Thr Thr Val Ser
            100

<210> SEQ ID NO 52
<211> LENGTH: 100
<212> TYPE: PRT
<213> ORGANISM: Artificial Sequence
<220> FEATURE:
<223> OTHER INFORMATION: M4 mutant

<400> SEQUENCE: 52

Gln Phe Leu Lys Glu Gly Gln Leu Ala Ala Gly Thr Cys Glu Ile Val
1               5                   10                  15

Thr Leu Asp Arg Asp Ser Ser Gln Pro Arg Arg Thr Ile Ala Arg Gln
            20                  25                  30

Thr Val Lys Cys Ser Cys Phe Pro Gly Gln Ile Ala Gly Thr Thr Arg
        35                  40                  45

Ala Arg Pro Ala Cys Val Asp Ala Arg Ile Ile Lys Thr Lys Gln Trp
    50                  55                  60

Cys Asp Met Leu Pro Cys Leu Glu Gly Glu Gly Cys Asp Leu Leu Ile
65                  70                  75                  80

Asn Arg Ser Gly Trp Thr Cys Thr Gln Pro Gly Gly Arg Ile Lys Thr
                85                  90                  95

Thr Thr Val Ser
            100

<210> SEQ ID NO 53
<211> LENGTH: 100
<212> TYPE: PRT
<213> ORGANISM: Artificial Sequence
<220> FEATURE:
<223> OTHER INFORMATION: M5 mutant

<400> SEQUENCE: 53

Gln Phe Leu Lys Glu Gly Gln Leu Ala Ala Gly Thr Cys Glu Ile Val
1               5                   10                  15

Thr Leu Asp Arg Asp Ser Ser Gln Pro Arg Arg Thr Ile Ala Arg Gln
            20                  25                  30

Thr Ala Arg Cys Ala Cys Arg Lys Gly Gln Ile Ala Gly Thr Thr Arg
        35                  40                  45

Asn Lys Pro Ser Cys Val Asp Ala Arg Ile Ile Lys Thr Lys Gln Trp
    50                  55                  60

Cys Asp Met Leu Pro Cys Leu Glu Gly Glu Gly Cys Asp Leu Leu Ile
65                  70                  75                  80

Asn Arg Ser Gly Trp Thr Cys Thr Gln Pro Gly Gly Arg Ile Lys Thr
                85                  90                  95
```

-continued

Thr Thr Val Ser
        100

<210> SEQ ID NO 54
<211> LENGTH: 100
<212> TYPE: PRT
<213> ORGANISM: Artificial Sequence
<220> FEATURE:
<223> OTHER INFORMATION: M6 mutant

<400> SEQUENCE: 54

Gln Phe Leu Lys Glu Gly Gln Leu Ala Ala Gly Thr Cys Glu Ile Val
1               5                   10                  15

Thr Leu Asp Arg Asp Ser Ser Gln Pro Arg Arg Thr Ile Ala Arg Gln
            20                  25                  30

Thr Ala Arg Cys Ala Cys Arg Lys Gly Gln Ile Ala Gly Thr Thr Arg
        35                  40                  45

Ala Arg Pro Ala Cys Val Asp Ala Arg Ile Ile Leu Gln Arg Trp Trp
    50                  55                  60

Cys Gln Met Glu Leu Cys Leu Glu Gly Glu Gly Cys Asp Leu Leu Ile
65                  70                  75                  80

Asn Arg Ser Gly Trp Thr Cys Thr Gln Pro Gly Gly Arg Ile Lys Thr
                85                  90                  95

Thr Thr Val Ser
        100

<210> SEQ ID NO 55
<211> LENGTH: 100
<212> TYPE: PRT
<213> ORGANISM: Artificial Sequence
<220> FEATURE:
<223> OTHER INFORMATION: M7 mutant

<400> SEQUENCE: 55

Gln Phe Leu Lys Glu Gly Gln Leu Ala Ala Gly Thr Cys Glu Ile Val
1               5                   10                  15

Thr Leu Asp Arg Asp Ser Ser Gln Pro Arg Arg Thr Ile Ala Arg Gln
            20                  25                  30

Thr Ala Arg Cys Ala Cys Arg Lys Gly Gln Ile Ala Gly Thr Thr Arg
        35                  40                  45

Ala Arg Pro Ala Cys Val Asp Ala Arg Ile Ile Lys Thr Lys Gln Trp
    50                  55                  60

Cys Asp Met Leu Pro Cys Leu Glu Gly Glu Cys Lys Thr Leu Pro
65                  70                  75                  80

Asp Asn Ser Gly Trp Thr Cys Thr Gln Pro Gly Gly Arg Ile Lys Thr
                85                  90                  95

Thr Thr Val Ser
        100

<210> SEQ ID NO 56
<211> LENGTH: 101
<212> TYPE: PRT
<213> ORGANISM: Artificial Sequence
<220> FEATURE:
<223> OTHER INFORMATION: M8 mutant

<400> SEQUENCE: 56

Gln Phe Leu Lys Glu Gly Gln Leu Ala Ala Gly Thr Cys Glu Ile Val
1               5                   10                  15

```
Thr Leu Asp Arg Asp Ser Ser Gln Pro Arg Arg Thr Ile Ala Arg Gln
            20                  25                  30

Thr Ala Arg Cys Ala Cys Arg Lys Gly Gln Ile Ala Gly Thr Thr Arg
        35                  40                  45

Ala Arg Pro Ala Cys Val Asp Ala Arg Ile Ile Lys Thr Lys Gln Trp
    50                  55                  60

Cys Asp Met Leu Pro Cys Leu Glu Gly Glu Gly Cys Asp Leu Leu Ile
65                  70                  75                  80

Asn Arg Ser Gly Trp Thr Cys Ser Cys Ser Ser Gly Asn Lys Ile Lys
                85                  90                  95

Thr Thr Thr Val Ser
            100

<210> SEQ ID NO 57
<211> LENGTH: 459
<212> TYPE: PRT
<213> ORGANISM: Artificial Sequence
<220> FEATURE:
<223> OTHER INFORMATION: 2-13 Antibody HC

<400> SEQUENCE: 57

Ala Val Thr Leu Asp Glu Ser Gly Gly Gly Leu Gln Thr Pro Gly Gly
1               5                   10                  15

Ala Leu Ser Leu Val Cys Lys Ala Ser Gly Phe Thr Phe Ser Ser His
            20                  25                  30

Gly Met Phe Trp Val Arg Gln Thr Pro Gly Lys Gly Leu Glu Tyr Val
        35                  40                  45

Ala Glu Ile Thr Asn Asp Gly Ser Gly Thr Asn Tyr Gly Ser Ala Val
    50                  55                  60

Lys Gly Arg Ala Thr Ile Ser Arg Asp Asn Gly Gln Ser Thr Val Arg
65                  70                  75                  80

Leu Gln Leu Asn Asn Leu Arg Ala Glu Asp Thr Gly Thr Tyr Phe Cys
                85                  90                  95

Ala Arg Ser Thr Tyr Glu Cys Pro Gly Gly Phe Ser Cys Trp Gly Asp
            100                 105                 110

Thr Gly Gln Ile Asp Ala Trp Gly His Gly Thr Glu Val Ile Val Ser
        115                 120                 125

Ser Ala Ser Thr Lys Gly Pro Ser Val Phe Pro Leu Ala Pro Ser Ser
    130                 135                 140

Lys Ser Thr Ser Gly Gly Thr Ala Ala Leu Gly Cys Leu Val Lys Asp
145                 150                 155                 160

Tyr Phe Pro Glu Pro Val Thr Val Ser Trp Asn Ser Gly Ala Leu Thr
                165                 170                 175

Ser Gly Val His Thr Phe Pro Ala Val Leu Gln Ser Ser Gly Leu Tyr
            180                 185                 190

Ser Leu Ser Ser Val Val Thr Val Pro Ser Ser Ser Leu Gly Thr Gln
        195                 200                 205

Thr Tyr Ile Cys Asn Val Asn His Lys Pro Ser Asn Thr Lys Val Asp
    210                 215                 220

Lys Lys Val Glu Pro Lys Ser Cys Asp Lys Thr His Thr Cys Pro Pro
225                 230                 235                 240

Cys Pro Ala Pro Glu Leu Leu Gly Gly Pro Ser Val Phe Leu Phe Pro
                245                 250                 255

Pro Lys Pro Lys Asp Thr Leu Met Ile Ser Arg Thr Pro Glu Val Thr
            260                 265                 270
```

```
Cys Val Val Asp Val Ser His Glu Asp Pro Glu Val Lys Phe Asn
            275                 280                 285

Trp Tyr Val Asp Gly Val Glu Val His Asn Ala Lys Thr Lys Pro Arg
290                 295                 300

Glu Glu Gln Tyr Asn Ser Thr Tyr Arg Val Val Ser Val Leu Thr Val
305                 310                 315                 320

Leu His Gln Asp Trp Leu Asn Gly Lys Glu Tyr Lys Cys Lys Val Ser
                325                 330                 335

Asn Lys Ala Leu Pro Ala Pro Ile Glu Lys Thr Ile Ser Lys Ala Lys
                340                 345                 350

Gly Gln Pro Arg Glu Pro Gln Val Tyr Thr Leu Pro Pro Ser Arg Glu
            355                 360                 365

Glu Met Thr Lys Asn Gln Val Ser Leu Thr Cys Leu Val Lys Gly Phe
    370                 375                 380

Tyr Pro Ser Asp Ile Ala Val Glu Trp Glu Ser Asn Gly Gln Pro Glu
385                 390                 395                 400

Asn Asn Tyr Lys Thr Thr Pro Pro Val Leu Asp Ser Asp Gly Ser Phe
                405                 410                 415

Phe Leu Tyr Ser Lys Leu Thr Val Asp Lys Ser Arg Trp Gln Gln Gly
                420                 425                 430

Asn Val Phe Ser Cys Ser Val Met His Glu Ala Leu His Asn His Tyr
            435                 440                 445

Thr Gln Lys Ser Leu Ser Leu Ser Pro Gly Lys
    450                 455

<210> SEQ ID NO 58
<211> LENGTH: 461
<212> TYPE: PRT
<213> ORGANISM: Artificial Sequence
<220> FEATURE:
<223> OTHER INFORMATION: 3-2 Antibody HC

<400> SEQUENCE: 58

Ala Val Thr Leu Asp Glu Ser Gly Gly Gly Leu Gln Thr Pro Gly Gly
1               5                   10                  15

Ala Leu Ser Leu Val Cys Lys Ala Ser Gly Phe Thr Phe Ser Ser Phe
                20                  25                  30

Asn Met Phe Trp Val Arg Gln Ala Pro Gly Lys Gly Leu Glu Tyr Val
            35                  40                  45

Ala Gln Ile Ser Ser Ser Gly Ser Ser Thr Asn Tyr Ala Pro Ala Val
    50                  55                  60

Arg Gly Arg Ala Thr Ile Ser Arg Asp Asn Gly Gln Ser Thr Val Arg
65                  70                  75                  80

Leu Gln Leu Asn Asn Pro Gly Ala Glu Asp Thr Gly Thr Tyr Tyr Cys
                85                  90                  95

Ala Lys Ser Ser Tyr Asp Cys Pro Tyr Gly His Cys Ser Ser Gly Val
                100                 105                 110

Asp Ser Ala Gly Glu Ile Asp Ala Trp Gly His Gly Thr Glu Val Ile
            115                 120                 125

Val Ser Ser Ala Ser Thr Lys Gly Pro Ser Val Phe Pro Leu Ala Pro
    130                 135                 140

Ser Ser Lys Ser Thr Ser Gly Gly Thr Ala Ala Leu Gly Cys Leu Val
145                 150                 155                 160

Lys Asp Tyr Phe Pro Glu Pro Val Thr Val Ser Trp Asn Ser Gly Ala
                165                 170                 175
```

```
Leu Thr Ser Gly Val His Thr Phe Pro Ala Val Leu Gln Ser Ser Gly
            180                 185                 190

Leu Tyr Ser Leu Ser Ser Val Val Thr Val Pro Ser Ser Ser Leu Gly
        195                 200                 205

Thr Gln Thr Tyr Ile Cys Asn Val Asn His Lys Pro Ser Asn Thr Lys
    210                 215                 220

Val Asp Lys Lys Val Glu Pro Lys Ser Cys Asp Lys Thr His Thr Cys
225                 230                 235                 240

Pro Pro Cys Pro Ala Pro Glu Leu Leu Gly Gly Pro Ser Val Phe Leu
                245                 250                 255

Phe Pro Pro Lys Pro Lys Asp Thr Leu Met Ile Ser Arg Thr Pro Glu
            260                 265                 270

Val Thr Cys Val Val Val Asp Val Ser His Glu Asp Pro Glu Val Lys
        275                 280                 285

Phe Asn Trp Tyr Val Asp Gly Val Glu Val His Asn Ala Lys Thr Lys
    290                 295                 300

Pro Arg Glu Glu Gln Tyr Asn Ser Thr Tyr Arg Val Val Ser Val Leu
305                 310                 315                 320

Thr Val Leu His Gln Asp Trp Leu Asn Gly Lys Glu Tyr Lys Cys Lys
                325                 330                 335

Val Ser Asn Lys Ala Leu Pro Ala Pro Ile Glu Lys Thr Ile Ser Lys
            340                 345                 350

Ala Lys Gly Gln Pro Arg Glu Pro Gln Val Tyr Thr Leu Pro Pro Ser
        355                 360                 365

Arg Glu Glu Met Thr Lys Asn Gln Val Ser Leu Thr Cys Leu Val Lys
    370                 375                 380

Gly Phe Tyr Pro Ser Asp Ile Ala Val Glu Trp Glu Ser Asn Gly Gln
385                 390                 395                 400

Pro Glu Asn Asn Tyr Lys Thr Thr Pro Pro Val Leu Asp Ser Asp Gly
                405                 410                 415

Ser Phe Phe Leu Tyr Ser Lys Leu Thr Val Asp Lys Ser Arg Trp Gln
            420                 425                 430

Gln Gly Asn Val Phe Ser Cys Ser Val Met His Glu Ala Leu His Asn
        435                 440                 445

His Tyr Thr Gln Lys Ser Leu Ser Leu Ser Pro Gly Lys
    450                 455                 460

<210> SEQ ID NO 59
<211> LENGTH: 452
<212> TYPE: PRT
<213> ORGANISM: Artificial Sequence
<220> FEATURE:
<223> OTHER INFORMATION: 1-65 Antibody HC

<400> SEQUENCE: 59

Ala Val Thr Leu Asp Glu Ser Gly Gly Gly Leu Gln Thr Pro Gly Gly
1               5                   10                  15

Ala Leu Ser Leu Val Cys Lys Ala Ser Gly Phe Thr Phe Ser Ser Tyr
            20                  25                  30

Gln Met Gly Trp Val Arg Gln Ala Pro Gly Lys Gly Leu Glu Trp Val
        35                  40                  45

Gly Val Ile Asn Lys Ser Gly Ser Asp Thr Ser Tyr Gly Ser Ala Val
    50                  55                  60

Lys Gly Arg Ala Thr Ile Ser Arg Asp Asn Gly Gln Ser Thr Val Arg
65                  70                  75                  80
```

```
Leu Gln Leu Asn Asn Leu Arg Ala Glu Asp Thr Gly Thr Tyr Phe Cys
                85                  90                  95

Ala Lys Gly Ser Ala Ser Tyr Ile Thr Ala Ala Thr Ile Asp Ala Trp
            100                 105                 110

Gly His Gly Thr Glu Val Ile Val Ser Ser Ala Ser Thr Lys Gly Pro
            115                 120                 125

Ser Val Phe Pro Leu Ala Pro Ser Ser Lys Ser Thr Ser Gly Gly Thr
        130                 135                 140

Ala Ala Leu Gly Cys Leu Val Lys Asp Tyr Phe Pro Glu Pro Val Thr
145                 150                 155                 160

Val Ser Trp Asn Ser Gly Ala Leu Thr Ser Gly Val His Thr Phe Pro
                165                 170                 175

Ala Val Leu Gln Ser Ser Gly Leu Tyr Ser Leu Ser Ser Val Val Thr
            180                 185                 190

Val Pro Ser Ser Ser Leu Gly Thr Gln Thr Tyr Ile Cys Asn Val Asn
            195                 200                 205

His Lys Pro Ser Asn Thr Lys Val Asp Lys Lys Val Glu Pro Lys Ser
        210                 215                 220

Cys Asp Lys Thr His Thr Cys Pro Pro Cys Pro Ala Pro Glu Leu Leu
225                 230                 235                 240

Gly Gly Pro Ser Val Phe Leu Phe Pro Pro Lys Pro Lys Asp Thr Leu
                245                 250                 255

Met Ile Ser Arg Thr Pro Glu Val Thr Cys Val Val Val Asp Val Ser
            260                 265                 270

His Glu Asp Pro Glu Val Lys Phe Asn Trp Tyr Val Asp Gly Val Glu
            275                 280                 285

Val His Asn Ala Lys Thr Lys Pro Arg Glu Glu Gln Tyr Asn Ser Thr
290                 295                 300

Tyr Arg Val Val Ser Val Leu Thr Val Leu His Gln Asp Trp Leu Asn
305                 310                 315                 320

Gly Lys Glu Tyr Lys Cys Lys Val Ser Asn Lys Ala Leu Pro Ala Pro
                325                 330                 335

Ile Glu Lys Thr Ile Ser Lys Ala Lys Gly Gln Pro Arg Glu Pro Gln
            340                 345                 350

Val Tyr Thr Leu Pro Pro Ser Arg Glu Glu Met Thr Lys Asn Gln Val
            355                 360                 365

Ser Leu Thr Cys Leu Val Lys Gly Phe Tyr Pro Ser Asp Ile Ala Val
        370                 375                 380

Glu Trp Glu Ser Asn Gly Gln Pro Glu Asn Asn Tyr Lys Thr Thr Pro
385                 390                 395                 400

Pro Val Leu Asp Ser Asp Gly Ser Phe Phe Leu Tyr Ser Lys Leu Thr
                405                 410                 415

Val Asp Lys Ser Arg Trp Gln Gln Gly Asn Val Phe Ser Cys Ser Val
            420                 425                 430

Met His Glu Ala Leu His Asn His Tyr Thr Gln Lys Ser Leu Ser Leu
            435                 440                 445

Ser Pro Gly Lys
        450

<210> SEQ ID NO 60
<211> LENGTH: 466
<212> TYPE: PRT
<213> ORGANISM: Artificial Sequence
<220> FEATURE:
<223> OTHER INFORMATION: 1-28 Antibody HC
```

<400> SEQUENCE: 60

```
Ala Val Thr Leu Asp Glu Ser Gly Gly Leu Gln Thr Pro Gly Gly
1               5                   10                  15

Ala Leu Ser Leu Val Cys Lys Ala Ser Gly Phe Asp Phe Ser Asp Tyr
            20                  25                  30

Gly Met Gly Trp Val Arg Gln Ala Pro Gly Lys Gly Leu Glu Trp Val
        35                  40                  45

Ala Ala Ile Arg Ser Asp Gly Ser Asn Pro Ser Tyr Gly Ser Ala Val
50                  55                  60

Lys Gly Arg Ala Thr Ile Ser Lys Asp Asn Gly Arg Ser Thr Val Arg
65                  70                  75                  80

Leu Gln Leu Asn Asn Leu Arg Ala Glu Asp Thr Ala Thr Tyr Tyr Cys
                85                  90                  95

Ala Lys Asp Gly Asn Gly Tyr Cys Ala Leu Asp Ala Tyr Arg Ser Gly
            100                 105                 110

Gly Tyr Ser Cys Gly Val Tyr Pro Gly Ser Ile Asp Ala Trp Gly His
        115                 120                 125

Gly Thr Glu Val Ile Val Ser Ser Ala Ser Thr Lys Gly Pro Ser Val
130                 135                 140

Phe Pro Leu Ala Pro Ser Ser Lys Ser Thr Ser Gly Gly Thr Ala Ala
145                 150                 155                 160

Leu Gly Cys Leu Val Lys Asp Tyr Phe Pro Glu Pro Val Thr Val Ser
                165                 170                 175

Trp Asn Ser Gly Ala Leu Thr Ser Gly Val His Thr Phe Pro Ala Val
            180                 185                 190

Leu Gln Ser Ser Gly Leu Tyr Ser Leu Ser Ser Val Val Thr Val Pro
        195                 200                 205

Ser Ser Ser Leu Gly Thr Gln Thr Tyr Ile Cys Asn Val Asn His Lys
210                 215                 220

Pro Ser Asn Thr Lys Val Asp Lys Lys Val Glu Pro Lys Ser Cys Asp
225                 230                 235                 240

Lys Thr His Thr Cys Pro Pro Cys Pro Ala Pro Glu Leu Leu Gly Gly
                245                 250                 255

Pro Ser Val Phe Leu Phe Pro Pro Lys Pro Lys Asp Thr Leu Met Ile
            260                 265                 270

Ser Arg Thr Pro Glu Val Thr Cys Val Val Val Asp Val Ser His Glu
        275                 280                 285

Asp Pro Glu Val Lys Phe Asn Trp Tyr Val Asp Gly Val Glu Val His
290                 295                 300

Asn Ala Lys Thr Lys Pro Arg Glu Glu Gln Tyr Asn Ser Thr Tyr Arg
305                 310                 315                 320

Val Val Ser Val Leu Thr Val Leu His Gln Asp Trp Leu Asn Gly Lys
                325                 330                 335

Glu Tyr Lys Cys Lys Val Ser Asn Lys Ala Leu Pro Ala Pro Ile Glu
            340                 345                 350

Lys Thr Ile Ser Lys Ala Lys Gly Gln Pro Arg Glu Pro Gln Val Tyr
        355                 360                 365

Thr Leu Pro Pro Ser Arg Glu Glu Met Thr Lys Asn Gln Val Ser Leu
370                 375                 380

Thr Cys Leu Val Lys Gly Phe Tyr Pro Ser Asp Ile Ala Val Glu Trp
385                 390                 395                 400

Glu Ser Asn Gly Gln Pro Glu Asn Asn Tyr Lys Thr Thr Pro Pro Val
```

-continued

```
                405                 410                 415
Leu Asp Ser Asp Gly Ser Phe Phe Leu Tyr Ser Lys Leu Thr Val Asp
            420                 425                 430

Lys Ser Arg Trp Gln Gln Gly Asn Val Phe Ser Cys Ser Val Met His
        435                 440                 445

Glu Ala Leu His Asn His Tyr Thr Gln Lys Ser Leu Ser Leu Ser Pro
    450                 455                 460

Gly Lys
465

<210> SEQ ID NO 61
<211> LENGTH: 211
<212> TYPE: PRT
<213> ORGANISM: Artificial Sequence
<220> FEATURE:
<223> OTHER INFORMATION: 2-13 Antibody LC

<400> SEQUENCE: 61

Ala Leu Thr Gln Pro Ser Ser Val Ser Ala Asn Pro Gly Glu Thr Val
1               5                   10                  15

Lys Ile Thr Cys Ser Gly Gly Ser Tyr Ser Tyr Gly Trp Phe Gln Gln
            20                  25                  30

Lys Ser Pro Gly Ser Ala Leu Val Thr Val Ile Tyr Trp Asp Asp Glu
        35                  40                  45

Arg Pro Ser Asp Ile Pro Ser Arg Phe Ser Gly Ala Leu Ser Gly Ser
    50                  55                  60

Thr Asn Thr Leu Thr Ile Thr Gly Val Gln Ala Asp Asp Glu Ala Val
65                  70                  75                  80

Tyr Phe Cys Gly Thr Glu Asp Ile Ser Gly Thr Ala Gly Val Phe Gly
                85                  90                  95

Ala Gly Thr Thr Leu Thr Val Leu Arg Ser Val Ala Ala Pro Ser Val
            100                 105                 110

Phe Ile Phe Pro Pro Ser Asp Glu Gln Leu Lys Ser Gly Thr Ala Ser
        115                 120                 125

Val Val Cys Leu Leu Asn Asn Phe Tyr Pro Arg Glu Ala Lys Val Gln
    130                 135                 140

Trp Lys Val Asp Asn Ala Leu Gln Ser Gly Asn Ser Gln Glu Ser Val
145                 150                 155                 160

Thr Glu Gln Asp Ser Lys Asp Ser Thr Tyr Ser Leu Ser Ser Thr Leu
                165                 170                 175

Thr Leu Ser Lys Ala Asp Tyr Glu Lys His Lys Val Tyr Ala Cys Glu
            180                 185                 190

Val Thr His Gln Gly Leu Ser Ser Pro Val Thr Lys Ser Phe Asn Arg
        195                 200                 205

Gly Glu Cys
    210

<210> SEQ ID NO 62
<211> LENGTH: 215
<212> TYPE: PRT
<213> ORGANISM: Artificial Sequence
<220> FEATURE:
<223> OTHER INFORMATION: 3-2 Antibody LC

<400> SEQUENCE: 62

Ala Leu Thr Gln Pro Ser Ser Val Ser Ala Asn Pro Gly Glu Thr Val
1               5                   10                  15
```

Lys Ile Thr Cys Ser Gly Gly Gly Ser Tyr Ala Gly Ser Tyr Tyr Tyr
            20                  25                  30

Gly Trp Tyr Gln Gln Lys Ala Pro Gly Ser Ala Pro Val Thr Leu Ile
            35                  40                  45

Tyr Glu Ser Asn Lys Arg Pro Ser Asp Ile Pro Ser Arg Phe Ser Gly
 50                  55                  60

Ser Thr Ser Gly Ser Thr Ala Thr Leu Thr Ile Thr Gly Val Gln Ala
 65                  70                  75                  80

Asp Asp Glu Ala Ile Tyr Tyr Cys Gly Ser Trp Asp Ser Ser Asn Gly
                85                  90                  95

Gly Ile Phe Gly Ala Gly Thr Thr Leu Thr Val Leu Arg Ser Val Ala
            100                 105                 110

Ala Pro Ser Val Phe Ile Phe Pro Pro Ser Asp Glu Gln Leu Lys Ser
            115                 120                 125

Gly Thr Ala Ser Val Val Cys Leu Leu Asn Asn Phe Tyr Pro Arg Glu
            130                 135                 140

Ala Lys Val Gln Trp Lys Val Asp Asn Ala Leu Gln Ser Gly Asn Ser
145                 150                 155                 160

Gln Glu Ser Val Thr Glu Gln Asp Ser Lys Asp Ser Thr Tyr Ser Leu
                165                 170                 175

Ser Ser Thr Leu Thr Leu Ser Lys Ala Asp Tyr Glu Lys His Lys Val
            180                 185                 190

Tyr Ala Cys Glu Val Thr His Gln Gly Leu Ser Ser Pro Val Thr Lys
            195                 200                 205

Ser Phe Asn Arg Gly Glu Cys
            210                 215

<210> SEQ ID NO 63
<211> LENGTH: 217
<212> TYPE: PRT
<213> ORGANISM: Artificial Sequence
<220> FEATURE:
<223> OTHER INFORMATION: 1-65 Antibody LC

<400> SEQUENCE: 63

Ala Leu Thr Gln Pro Ser Ser Val Ser Ala Asn Pro Gly Glu Thr Val
 1                   5                  10                  15

Lys Ile Thr Cys Ser Gly Gly Gly Ser Ser Gly Tyr Gly Tyr Gly Trp
            20                  25                  30

Tyr Gln Gln Lys Ser Pro Ser Ser Ala Pro Leu Thr Val Ile Tyr Trp
            35                  40                  45

Asn Asp Lys Arg Pro Ser Asp Ile Pro Ser Arg Phe Ser Gly Ser Lys
 50                  55                  60

Ser Gly Ser Thr His Thr Leu Thr Ile Thr Gly Val Gln Ala Glu Asp
 65                  70                  75                  80

Glu Ala Val Tyr Phe Cys Gly Asn Asp Tyr Ser Ser Asp Ser Gly
                85                  90                  95

Tyr Val Gly Val Phe Gly Ala Gly Thr Thr Leu Thr Val Leu Arg Ser
            100                 105                 110

Val Ala Ala Pro Ser Val Phe Ile Phe Pro Pro Ser Asp Glu Gln Leu
            115                 120                 125

Lys Ser Gly Thr Ala Ser Val Val Cys Leu Leu Asn Asn Phe Tyr Pro
130                 135                 140

Arg Glu Ala Lys Val Gln Trp Lys Val Asp Asn Ala Leu Gln Ser Gly
145                 150                 155                 160

Asn Ser Gln Glu Ser Val Thr Glu Gln Asp Ser Lys Asp Ser Thr Tyr
            165                 170                 175

Ser Leu Ser Ser Thr Leu Thr Leu Ser Lys Ala Asp Tyr Glu Lys His
            180                 185                 190

Lys Val Tyr Ala Cys Glu Val Thr His Gln Gly Leu Ser Ser Pro Val
            195                 200                 205

Thr Lys Ser Phe Asn Arg Gly Glu Cys
            210                 215

<210> SEQ ID NO 64
<211> LENGTH: 211
<212> TYPE: PRT
<213> ORGANISM: Artificial Sequence
<220> FEATURE:
<223> OTHER INFORMATION: 1-28 Antibody LC

<400> SEQUENCE: 64

Ala Leu Thr Gln Pro Ser Ser Val Ser Ala Asn Leu Glu Gly Thr Val
1               5                   10                  15

Glu Ile Thr Cys Ser Gly Ser Gly Tyr Gly Tyr Gly Trp Tyr Gln Gln
            20                  25                  30

Lys Ser Pro Gly Ser Ala Pro Val Thr Val Ile Tyr Gln Asn Asp Lys
            35                  40                  45

Arg Pro Ser Asp Ile Pro Ser Arg Phe Ser Gly Ser Lys Ser Gly Ser
    50                  55                  60

Thr Gly Thr Leu Thr Ile Thr Gly Val Gln Val Glu Asp Glu Ala Val
65                  70                  75                  80

Tyr Tyr Cys Gly Ser Glu Asp Ser Ser Thr Leu Ala Gly Ile Phe Gly
                85                  90                  95

Ala Gly Thr Thr Leu Thr Val Leu Arg Ser Val Ala Ala Pro Ser Val
            100                 105                 110

Phe Ile Phe Pro Pro Ser Asp Glu Gln Leu Lys Ser Gly Thr Ala Ser
            115                 120                 125

Val Val Cys Leu Leu Asn Asn Phe Tyr Pro Arg Glu Ala Lys Val Gln
            130                 135                 140

Trp Lys Val Asp Asn Ala Leu Gln Ser Gly Asn Ser Gln Glu Ser Val
145                 150                 155                 160

Thr Glu Gln Asp Ser Lys Asp Ser Thr Tyr Ser Leu Ser Ser Thr Leu
                165                 170                 175

Thr Leu Ser Lys Ala Asp Tyr Glu Lys His Lys Val Tyr Ala Cys Glu
            180                 185                 190

Val Thr His Gln Gly Leu Ser Ser Pro Val Thr Lys Ser Phe Asn Arg
            195                 200                 205

Gly Glu Cys
        210

<210> SEQ ID NO 65
<211> LENGTH: 5
<212> TYPE: PRT
<213> ORGANISM: Artificial Sequence
<220> FEATURE:
<223> OTHER INFORMATION: EP1 Epitope

<400> SEQUENCE: 65

Ile Val Thr Leu Asp
1               5

<210> SEQ ID NO 66

```
<211> LENGTH: 5
<212> TYPE: PRT
<213> ORGANISM: Artificial Sequence
<220> FEATURE:
<223> OTHER INFORMATION: EP2 Epitope

<400> SEQUENCE: 66

Asp Ser Ser Gln Pro
1               5

<210> SEQ ID NO 67
<211> LENGTH: 5
<212> TYPE: PRT
<213> ORGANISM: Artificial Sequence
<220> FEATURE:
<223> OTHER INFORMATION: EP3 Epitope

<400> SEQUENCE: 67

Arg Thr Ile Ala Arg
1               5

<210> SEQ ID NO 68
<211> LENGTH: 7
<212> TYPE: PRT
<213> ORGANISM: Artificial Sequence
<220> FEATURE:
<223> OTHER INFORMATION: EP4 Epitope

<400> SEQUENCE: 68

Ala Arg Cys Ala Cys Arg Lys
1               5

<210> SEQ ID NO 69
<211> LENGTH: 4
<212> TYPE: PRT
<213> ORGANISM: Artificial Sequence
<220> FEATURE:
<223> OTHER INFORMATION: EP5 Epitope

<400> SEQUENCE: 69

Ala Arg Pro Ala
1

<210> SEQ ID NO 70
<211> LENGTH: 9
<212> TYPE: PRT
<213> ORGANISM: Artificial Sequence
<220> FEATURE:
<223> OTHER INFORMATION: EP6 Epitope

<400> SEQUENCE: 70

Lys Thr Lys Gln Trp Cys Asp Met Leu
1               5

<210> SEQ ID NO 71
<211> LENGTH: 8
<212> TYPE: PRT
<213> ORGANISM: Artificial Sequence
<220> FEATURE:
<223> OTHER INFORMATION: EP7 Epitope

<400> SEQUENCE: 71

Gly Cys Asp Leu Leu Ile Asn Arg
1               5

<210> SEQ ID NO 72
<211> LENGTH: 8
```

```
<212> TYPE: PRT
<213> ORGANISM: Artificial Sequence
<220> FEATURE:
<223> OTHER INFORMATION: EP8 Epitope

<400> SEQUENCE: 72

Thr Cys Thr Gln Pro Gly Gly Arg
1               5

<210> SEQ ID NO 73
<211> LENGTH: 20
<212> TYPE: PRT
<213> ORGANISM: Artificial Sequence
<220> FEATURE:
<223> OTHER INFORMATION: F2-01-BSA (#1)

<400> SEQUENCE: 73

Thr Ala Asp Arg Asp Ser Ser Gln Pro Arg Arg Thr Ile Ala Arg Gln
1               5                   10                  15

Thr Ala Arg Cys
            20

<210> SEQ ID NO 74
<211> LENGTH: 20
<212> TYPE: PRT
<213> ORGANISM: Artificial Sequence
<220> FEATURE:
<223> OTHER INFORMATION: F2-02-BSA (#2)

<400> SEQUENCE: 74

Thr Leu Ala Arg Asp Ser Ser Gln Pro Arg Arg Thr Ile Ala Arg Gln
1               5                   10                  15

Thr Ala Arg Cys
            20

<210> SEQ ID NO 75
<211> LENGTH: 20
<212> TYPE: PRT
<213> ORGANISM: Artificial Sequence
<220> FEATURE:
<223> OTHER INFORMATION: F2-03-BSA (#3)

<400> SEQUENCE: 75

Thr Leu Asp Arg Ala Ser Ser Gln Pro Arg Arg Thr Ile Ala Arg Gln
1               5                   10                  15

Thr Ala Arg Cys
            20

<210> SEQ ID NO 76
<211> LENGTH: 20
<212> TYPE: PRT
<213> ORGANISM: Artificial Sequence
<220> FEATURE:
<223> OTHER INFORMATION: F2-04-BSA (#4)

<400> SEQUENCE: 76

Thr Leu Asp Arg Asp Ala Ser Gln Pro Arg Arg Thr Ile Ala Arg Gln
1               5                   10                  15

Thr Ala Arg Cys
            20

<210> SEQ ID NO 77
<211> LENGTH: 20
<212> TYPE: PRT
<213> ORGANISM: Artificial Sequence
```

<220> FEATURE:
<223> OTHER INFORMATION: F2-05-BSA (#5)

<400> SEQUENCE: 77

Thr Leu Asp Arg Asp Ser Ala Gln Pro Arg Arg Thr Ile Ala Arg Gln
1               5                   10                  15

Thr Ala Arg Cys
            20

<210> SEQ ID NO 78
<211> LENGTH: 20
<212> TYPE: PRT
<213> ORGANISM: Artificial Sequence
<220> FEATURE:
<223> OTHER INFORMATION: F2-06-BSA (#6)

<400> SEQUENCE: 78

Thr Leu Asp Arg Asp Ser Ser Ala Pro Arg Arg Thr Ile Ala Arg Gln
1               5                   10                  15

Thr Ala Arg Cys
            20

<210> SEQ ID NO 79
<211> LENGTH: 20
<212> TYPE: PRT
<213> ORGANISM: Artificial Sequence
<220> FEATURE:
<223> OTHER INFORMATION: F2-07-BSA (#7)

<400> SEQUENCE: 79

Thr Leu Asp Arg Asp Ser Ser Gln Ala Arg Arg Thr Ile Ala Arg Gln
1               5                   10                  15

Thr Ala Arg Cys
            20

<210> SEQ ID NO 80
<211> LENGTH: 20
<212> TYPE: PRT
<213> ORGANISM: Artificial Sequence
<220> FEATURE:
<223> OTHER INFORMATION: F2-08-BSA (#8)

<400> SEQUENCE: 80

Thr Leu Asp Arg Asp Ser Ser Gln Pro Arg Ala Thr Ile Ala Arg Gln
1               5                   10                  15

Thr Ala Arg Cys
            20

<210> SEQ ID NO 81
<211> LENGTH: 20
<212> TYPE: PRT
<213> ORGANISM: Artificial Sequence
<220> FEATURE:
<223> OTHER INFORMATION: F2-09-BSA (#9)

<400> SEQUENCE: 81

Thr Leu Asp Arg Asp Ser Ser Gln Pro Arg Arg Ala Ile Ala Arg Gln
1               5                   10                  15

Thr Ala Arg Cys
            20

<210> SEQ ID NO 82
<211> LENGTH: 20
<212> TYPE: PRT

```
<213> ORGANISM: Artificial Sequence
<220> FEATURE:
<223> OTHER INFORMATION: F2-10-BSA (#10)

<400> SEQUENCE: 82

Thr Leu Asp Arg Asp Ser Ser Gln Pro Arg Arg Thr Ala Ala Arg Gln
1               5                   10                  15

Thr Ala Arg Cys
            20

<210> SEQ ID NO 83
<211> LENGTH: 20
<212> TYPE: PRT
<213> ORGANISM: Artificial Sequence
<220> FEATURE:
<223> OTHER INFORMATION: F2-11-BSA (#11)

<400> SEQUENCE: 83

Thr Leu Asp Arg Asp Ser Ser Gln Pro Arg Arg Thr Ile Arg Arg Gln
1               5                   10                  15

Thr Ala Arg Cys
            20

<210> SEQ ID NO 84
<211> LENGTH: 20
<212> TYPE: PRT
<213> ORGANISM: Artificial Sequence
<220> FEATURE:
<223> OTHER INFORMATION: F2-12-BSA (#12)

<400> SEQUENCE: 84

Thr Leu Asp Arg Asp Ser Ser Gln Pro Arg Arg Thr Ile Ala Ala Gln
1               5                   10                  15

Thr Ala Arg Cys
            20

<210> SEQ ID NO 85
<211> LENGTH: 20
<212> TYPE: PRT
<213> ORGANISM: Artificial Sequence
<220> FEATURE:
<223> OTHER INFORMATION: F2-12-BSA (#13)

<400> SEQUENCE: 85

Thr Leu Asp Arg Asp Ser Ser Gln Pro Arg Arg Thr Ile Ala Arg Gln
1               5                   10                  15

Thr Val Arg Cys
            20

<210> SEQ ID NO 86
<211> LENGTH: 100
<212> TYPE: PRT
<213> ORGANISM: Artificial Sequence
<220> FEATURE:
<223> OTHER INFORMATION: Wild-type FAM19A5 Isoform 2 (without signal
      peptide)

<400> SEQUENCE: 86

Gln Phe Leu Lys Glu Gly Gln Leu Ala Ala Gly Thr Cys Glu Ile Val
1               5                   10                  15

Thr Leu Asp Arg Asp Ser Ser Gln Pro Arg Arg Thr Ile Ala Arg Gln
                20                  25                  30

Thr Ala Arg Cys Ala Cys Arg Lys Gly Gln Ile Ala Gly Thr Thr Arg
            35                  40                  45
```

```
Ala Arg Pro Ala Cys Val Asp Ala Arg Ile Ile Lys Thr Lys Gln Trp
         50                  55                  60

Cys Asp Met Leu Pro Cys Leu Glu Gly Glu Gly Cys Asp Leu Leu Ile
 65                  70                  75                  80

Asn Arg Ser Gly Trp Thr Cys Thr Gln Pro Gly Gly Arg Ile Lys Thr
                 85                  90                  95

Thr Thr Val Ser
            100

<210> SEQ ID NO 87
<211> LENGTH: 100
<212> TYPE: PRT
<213> ORGANISM: Artificial Sequence
<220> FEATURE:
<223> OTHER INFORMATION: M1 mutant

<400> SEQUENCE: 87

Gln Phe Leu Lys Glu Gly Gln Leu Ala Ala Gly Thr Cys Glu Val Ile
  1               5                  10                  15

Ala Ala His Arg Asp Ser Ser Gln Pro Arg Arg Thr Ile Ala Arg Gln
             20                  25                  30

Thr Ala Arg Cys Ala Cys Arg Lys Gly Gln Ile Ala Gly Thr Thr Arg
         35                  40                  45

Ala Arg Pro Ala Cys Val Asp Ala Arg Ile Ile Lys Thr Lys Gln Trp
         50                  55                  60

Cys Asp Met Leu Pro Cys Leu Glu Gly Glu Gly Cys Asp Leu Leu Ile
 65                  70                  75                  80

Asn Arg Ser Gly Trp Thr Cys Thr Gln Pro Gly Gly Arg Ile Lys Thr
                 85                  90                  95

Thr Thr Val Ser
            100

<210> SEQ ID NO 88
<211> LENGTH: 100
<212> TYPE: PRT
<213> ORGANISM: Artificial Sequence
<220> FEATURE:
<223> OTHER INFORMATION: M2 mutant

<400> SEQUENCE: 88

Gln Phe Leu Lys Glu Gly Gln Leu Ala Ala Gly Thr Cys Glu Ile Val
  1               5                  10                  15

Thr Leu Asp Arg Cys Cys Asn Lys Asn Arg Arg Thr Ile Ala Arg Gln
             20                  25                  30

Thr Ala Arg Cys Ala Cys Arg Lys Gly Gln Ile Ala Gly Thr Thr Arg
         35                  40                  45

Ala Arg Pro Ala Cys Val Asp Ala Arg Ile Ile Lys Thr Lys Gln Trp
         50                  55                  60

Cys Asp Met Leu Pro Cys Leu Glu Gly Glu Gly Cys Asp Leu Leu Ile
 65                  70                  75                  80

Asn Arg Ser Gly Trp Thr Cys Thr Gln Pro Gly Gly Arg Ile Lys Thr
                 85                  90                  95

Thr Thr Val Ser
            100

<210> SEQ ID NO 89
<211> LENGTH: 5
<212> TYPE: PRT
```

```
<213> ORGANISM: Artificial Sequence
<220> FEATURE:
<223> OTHER INFORMATION: P2-C12 antibodyVH CDR1

<400> SEQUENCE: 89

Thr Tyr Ala Val Thr
1               5

<210> SEQ ID NO 90
<211> LENGTH: 16
<212> TYPE: PRT
<213> ORGANISM: Artificial Sequence
<220> FEATURE:
<223> OTHER INFORMATION: P2-C12antibodyVH CDR2

<400> SEQUENCE: 90

Tyr Ile Asn Trp Arg Gly Gly Thr Ser Tyr Ala Asn Trp Ala Lys Gly
1               5                   10                  15

<210> SEQ ID NO 91
<211> LENGTH: 15
<212> TYPE: PRT
<213> ORGANISM: Artificial Sequence
<220> FEATURE:
<223> OTHER INFORMATION: P2-C12antibodyVH CDR3

<400> SEQUENCE: 91

Asp Ala Ser Ser Gly Ala Ala Phe Gly Ser Tyr Gly Met Asp Pro
1               5                   10                  15

<210> SEQ ID NO 92
<211> LENGTH: 11
<212> TYPE: PRT
<213> ORGANISM: Artificial Sequence
<220> FEATURE:
<223> OTHER INFORMATION: P2-C12 antibodyVL CDR1

<400> SEQUENCE: 92

Gln Ala Ser Gln Ser Ile Ser Ser Tyr Leu Ser
1               5                   10

<210> SEQ ID NO 93
<211> LENGTH: 7
<212> TYPE: PRT
<213> ORGANISM: Artificial Sequence
<220> FEATURE:
<223> OTHER INFORMATION: P2-C12antibodyVL CDR2

<400> SEQUENCE: 93

Glu Ala Ser Lys Leu Ala Ser
1               5

<210> SEQ ID NO 94
<211> LENGTH: 12
<212> TYPE: PRT
<213> ORGANISM: Artificial Sequence
<220> FEATURE:
<223> OTHER INFORMATION: P2-C12antibodyVL CDR3

<400> SEQUENCE: 94

Gln Gln Gly Tyr Ser Ser Thr Asn Val Trp Asn Ala
1               5                   10

<210> SEQ ID NO 95
<211> LENGTH: 6
<212> TYPE: PRT
<213> ORGANISM: Artificial Sequence
```

```
<220> FEATURE:
<223> OTHER INFORMATION: 13B4antibodyVH CDR1

<400> SEQUENCE: 95

Ser Ser Asn Trp Trp Ser
1               5

<210> SEQ ID NO 96
<211> LENGTH: 16
<212> TYPE: PRT
<213> ORGANISM: Artificial Sequence
<220> FEATURE:
<223> OTHER INFORMATION: 13B4antibodyVH CDR2

<400> SEQUENCE: 96

Glu Ile Tyr His Gly Gly Thr Thr Asn Tyr Asn Pro Ser Leu Lys Gly
1               5                   10                  15

<210> SEQ ID NO 97
<211> LENGTH: 9
<212> TYPE: PRT
<213> ORGANISM: Artificial Sequence
<220> FEATURE:
<223> OTHER INFORMATION: 13B4antibodyVH CDR3

<400> SEQUENCE: 97

Trp Gln Leu Val Gly Gly Leu Asp Val
1               5

<210> SEQ ID NO 98
<211> LENGTH: 11
<212> TYPE: PRT
<213> ORGANISM: Artificial Sequence
<220> FEATURE:
<223> OTHER INFORMATION: 13B4antibodyVL CDR1

<400> SEQUENCE: 98

Ser Gly Asp Lys Leu Gly Asn Val Tyr Ala Ser
1               5                   10

<210> SEQ ID NO 99
<211> LENGTH: 7
<212> TYPE: PRT
<213> ORGANISM: Artificial Sequence
<220> FEATURE:
<223> OTHER INFORMATION: 13B4antibodyVL CDR2

<400> SEQUENCE: 99

Gln Asp Asn Lys Arg Pro Ser
1               5

<210> SEQ ID NO 100
<211> LENGTH: 9
<212> TYPE: PRT
<213> ORGANISM: Artificial Sequence
<220> FEATURE:
<223> OTHER INFORMATION: 13B4antibodyVL CDR3

<400> SEQUENCE: 100

Gln Ala Trp Asp Ser Ser Thr Ala Val
1               5

<210> SEQ ID NO 101
<211> LENGTH: 5
<212> TYPE: PRT
<213> ORGANISM: Artificial Sequence
<220> FEATURE:
```

```
<223> OTHER INFORMATION: 13F7antibodyVH CDR1

<400> SEQUENCE: 101

Gly Tyr Ser Trp Thr
1               5

<210> SEQ ID NO 102
<211> LENGTH: 16
<212> TYPE: PRT
<213> ORGANISM: Artificial Sequence
<220> FEATURE:
<223> OTHER INFORMATION: 13F7antibodyVH CDR2

<400> SEQUENCE: 102

Glu Ile Ser His Phe Gly Ser Ala Asn Tyr Asn Pro Ser Leu Lys Ser
1               5                   10                  15

<210> SEQ ID NO 103
<211> LENGTH: 15
<212> TYPE: PRT
<213> ORGANISM: Artificial Sequence
<220> FEATURE:
<223> OTHER INFORMATION: 13F7antibodyVH CDR3

<400> SEQUENCE: 103

Ala Leu Arg Gly Thr Tyr Ser Arg Phe Tyr Tyr Gly Met Asp Val
1               5                   10                  15

<210> SEQ ID NO 104
<211> LENGTH: 16
<212> TYPE: PRT
<213> ORGANISM: Artificial Sequence
<220> FEATURE:
<223> OTHER INFORMATION: 13F7antibodyVL CDR1

<400> SEQUENCE: 104

Arg Ser Ser Gln Ser Leu Leu His Ser Asn Gly Tyr Asn Tyr Leu Asp
1               5                   10                  15

<210> SEQ ID NO 105
<211> LENGTH: 7
<212> TYPE: PRT
<213> ORGANISM: Artificial Sequence
<220> FEATURE:
<223> OTHER INFORMATION: 13F7antibodyVL CDR2

<400> SEQUENCE: 105

Leu Gly Ser Asn Arg Ala Ser
1               5

<210> SEQ ID NO 106
<211> LENGTH: 9
<212> TYPE: PRT
<213> ORGANISM: Artificial Sequence
<220> FEATURE:
<223> OTHER INFORMATION: 13F7antibodyVL CDR3

<400> SEQUENCE: 106

Met Gln Ala Arg Gln Thr Pro Leu Thr
1               5

<210> SEQ ID NO 107
<211> LENGTH: 5
<212> TYPE: PRT
<213> ORGANISM: Artificial Sequence
<220> FEATURE:
<223> OTHER INFORMATION: 15A9antibodyVH CDR1
```

```
<400> SEQUENCE: 107

Ser Tyr Tyr Trp Ser
1               5

<210> SEQ ID NO 108
<211> LENGTH: 16
<212> TYPE: PRT
<213> ORGANISM: Artificial Sequence
<220> FEATURE:
<223> OTHER INFORMATION: 15A9antibodyVH CDR2

<400> SEQUENCE: 108

Tyr Ile Tyr Pro Ser Gly Ser Thr Asn Tyr Asn Pro Ser Leu Lys Ser
1               5                   10                  15

<210> SEQ ID NO 109
<211> LENGTH: 12
<212> TYPE: PRT
<213> ORGANISM: Artificial Sequence
<220> FEATURE:
<223> OTHER INFORMATION: 15A9antibodyVH CDR3

<400> SEQUENCE: 109

Val Asn Pro Phe Gly Tyr Tyr Tyr Ala Met Asp Val
1               5                   10

<210> SEQ ID NO 110
<211> LENGTH: 11
<212> TYPE: PRT
<213> ORGANISM: Artificial Sequence
<220> FEATURE:
<223> OTHER INFORMATION: 15A9antibodyVL CDR1

<400> SEQUENCE: 110

Arg Ala Ser Gln Ser Ile Ser Thr Ser Leu Asn
1               5                   10

<210> SEQ ID NO 111
<211> LENGTH: 7
<212> TYPE: PRT
<213> ORGANISM: Artificial Sequence
<220> FEATURE:
<223> OTHER INFORMATION: 15A9antibodyVL CDR2

<400> SEQUENCE: 111

Gly Ala Ser Thr Leu Gln Ser
1               5

<210> SEQ ID NO 112
<211> LENGTH: 9
<212> TYPE: PRT
<213> ORGANISM: Artificial Sequence
<220> FEATURE:
<223> OTHER INFORMATION: 15A9antibodyVL CDR3

<400> SEQUENCE: 112

Gln Glu Ser Ala Ser Ile Pro Arg Thr
1               5

<210> SEQ ID NO 113
<211> LENGTH: 5
<212> TYPE: PRT
<213> ORGANISM: Artificial Sequence
<220> FEATURE:
<223> OTHER INFORMATION: P1-A03antibodyVH CDR1
```

<400> SEQUENCE: 113

Ser Asp Tyr Met Ser
1               5

<210> SEQ ID NO 114
<211> LENGTH: 16
<212> TYPE: PRT
<213> ORGANISM: Artificial Sequence
<220> FEATURE:
<223> OTHER INFORMATION: P1-A03antibodyVH CDR2

<400> SEQUENCE: 114

Ile Ile Tyr Pro Ser Thr Thr Thr Tyr Tyr Ala Ser Trp Ala Lys Gly
1               5                   10                  15

<210> SEQ ID NO 115
<211> LENGTH: 10
<212> TYPE: PRT
<213> ORGANISM: Artificial Sequence
<220> FEATURE:
<223> OTHER INFORMATION: P1-A03antibodyVH CDR3

<400> SEQUENCE: 115

Gly Ser Asn Trp Ser Ser Gly Met Asn Leu
1               5                   10

<210> SEQ ID NO 116
<211> LENGTH: 11
<212> TYPE: PRT
<213> ORGANISM: Artificial Sequence
<220> FEATURE:
<223> OTHER INFORMATION: P1-A03antibodyVL CDR1

<400> SEQUENCE: 116

Leu Ala Ser Glu Asp Ile Tyr Ser Gly Ile Ser
1               5                   10

<210> SEQ ID NO 117
<211> LENGTH: 7
<212> TYPE: PRT
<213> ORGANISM: Artificial Sequence
<220> FEATURE:
<223> OTHER INFORMATION: P1-A03antibodyVL CDR2

<400> SEQUENCE: 117

Gly Ala Ser Asn Leu Glu Ser
1               5

<210> SEQ ID NO 118
<211> LENGTH: 12
<212> TYPE: PRT
<213> ORGANISM: Artificial Sequence
<220> FEATURE:
<223> OTHER INFORMATION: P1-A03antibodyVL CDR3

<400> SEQUENCE: 118

Leu Gly Gly Tyr Ser Tyr Ser Ser Thr Gly Leu Thr
1               5                   10

<210> SEQ ID NO 119
<211> LENGTH: 5
<212> TYPE: PRT
<213> ORGANISM: Artificial Sequence
<220> FEATURE:
<223> OTHER INFORMATION: P1-A08antibodyVH CDR1

<400> SEQUENCE: 119

Thr Tyr Tyr Met Ser
1               5

<210> SEQ ID NO 120
<211> LENGTH: 16
<212> TYPE: PRT
<213> ORGANISM: Artificial Sequence
<220> FEATURE:
<223> OTHER INFORMATION: P1-A08antibodyVH CDR2

<400> SEQUENCE: 120

Ile Val Tyr Pro Ser Gly Thr Thr Tyr Ala Asn Trp Ala Lys Gly
1               5                   10                  15

<210> SEQ ID NO 121
<211> LENGTH: 8
<212> TYPE: PRT
<213> ORGANISM: Artificial Sequence
<220> FEATURE:
<223> OTHER INFORMATION: P1-A08antibodyVH CDR3

<400> SEQUENCE: 121

Gly Asp Ser Phe Gly Tyr Gly Leu
1               5

<210> SEQ ID NO 122
<211> LENGTH: 11
<212> TYPE: PRT
<213> ORGANISM: Artificial Sequence
<220> FEATURE:
<223> OTHER INFORMATION: P1-A08antibodyVL CDR1

<400> SEQUENCE: 122

Thr Ala Asp Thr Leu Ser Arg Ser Tyr Ala Ser
1               5                   10

<210> SEQ ID NO 123
<211> LENGTH: 7
<212> TYPE: PRT
<213> ORGANISM: Artificial Sequence
<220> FEATURE:
<223> OTHER INFORMATION: P1-A08antibodyVL CDR2

<400> SEQUENCE: 123

Arg Asp Thr Ser Arg Pro Ser
1               5

<210> SEQ ID NO 124
<211> LENGTH: 13
<212> TYPE: PRT
<213> ORGANISM: Artificial Sequence
<220> FEATURE:
<223> OTHER INFORMATION: P1-A08antibodyVL CDR3

<400> SEQUENCE: 124

Ala Thr Ser Asp Gly Ser Gly Ser Asn Tyr Gln Tyr Val
1               5                   10

<210> SEQ ID NO 125
<211> LENGTH: 5
<212> TYPE: PRT
<213> ORGANISM: Artificial Sequence
<220> FEATURE:
<223> OTHER INFORMATION: P1-F02antibodyVH CDR1

<400> SEQUENCE: 125

```
Asn Tyr Tyr Met Gly
1               5

<210> SEQ ID NO 126
<211> LENGTH: 16
<212> TYPE: PRT
<213> ORGANISM: Artificial Sequence
<220> FEATURE:
<223> OTHER INFORMATION: P1-F02antibodyVH CDR2

<400> SEQUENCE: 126

Ile Ile Tyr Ala Ser Gly Ser Thr Tyr Tyr Ala Ser Trp Ala Lys Gly
1               5                   10                  15

<210> SEQ ID NO 127
<211> LENGTH: 17
<212> TYPE: PRT
<213> ORGANISM: Artificial Sequence
<220> FEATURE:
<223> OTHER INFORMATION: P1-F02antibodyVH CDR3

<400> SEQUENCE: 127

Ile Asp Ile Gly Val Gly Asp Tyr Gly Trp Ala Tyr Asp Arg Leu Asp
1               5                   10                  15

Leu

<210> SEQ ID NO 128
<211> LENGTH: 11
<212> TYPE: PRT
<213> ORGANISM: Artificial Sequence
<220> FEATURE:
<223> OTHER INFORMATION: P1-F02antibodyVL CDR1

<400> SEQUENCE: 128

Leu Ala Ser Glu Asp Ile Tyr Ser Gly Ile Ser
1               5                   10

<210> SEQ ID NO 129
<211> LENGTH: 7
<212> TYPE: PRT
<213> ORGANISM: Artificial Sequence
<220> FEATURE:
<223> OTHER INFORMATION: P1-F02antibodyVL CDR2

<400> SEQUENCE: 129

Gly Ala Ser Asn Leu Glu Ser
1               5

<210> SEQ ID NO 130
<211> LENGTH: 10
<212> TYPE: PRT
<213> ORGANISM: Artificial Sequence
<220> FEATURE:
<223> OTHER INFORMATION: P1-F02antibodyVL CDR3

<400> SEQUENCE: 130

Leu Gly Gly Tyr Ser Tyr Ser Ser Ile Thr
1               5                   10

<210> SEQ ID NO 131
<211> LENGTH: 5
<212> TYPE: PRT
<213> ORGANISM: Artificial Sequence
<220> FEATURE:
<223> OTHER INFORMATION: P2-A01antibodyVH CDR1

<400> SEQUENCE: 131
```

Gly Tyr Tyr Met Ser
1               5

<210> SEQ ID NO 132
<211> LENGTH: 16
<212> TYPE: PRT
<213> ORGANISM: Artificial Sequence
<220> FEATURE:
<223> OTHER INFORMATION: P2-A01antibodyVH CDR2

<400> SEQUENCE: 132

Ile Ile Tyr Pro Ser Gly Ser Thr Asp Tyr Ala Ser Trp Ala Lys Gly
1               5                   10                  15

<210> SEQ ID NO 133
<211> LENGTH: 15
<212> TYPE: PRT
<213> ORGANISM: Artificial Sequence
<220> FEATURE:
<223> OTHER INFORMATION: P2-A01antibodyVH CDR3

<400> SEQUENCE: 133

Val Ala Gly Tyr Val Gly Tyr Gly Tyr Glu Thr Phe Phe Asp Ile
1               5                   10                  15

<210> SEQ ID NO 134
<211> LENGTH: 11
<212> TYPE: PRT
<213> ORGANISM: Artificial Sequence
<220> FEATURE:
<223> OTHER INFORMATION: P2-A01antibodyVL CDR1

<400> SEQUENCE: 134

Leu Ala Ser Glu Asp Ile Tyr Ser Gly Ile Ser
1               5                   10

<210> SEQ ID NO 135
<211> LENGTH: 7
<212> TYPE: PRT
<213> ORGANISM: Artificial Sequence
<220> FEATURE:
<223> OTHER INFORMATION: P2-A01antibodyVL CDR2

<400> SEQUENCE: 135

Gly Ala Ser Asn Leu Glu Ser
1               5

<210> SEQ ID NO 136
<211> LENGTH: 14
<212> TYPE: PRT
<213> ORGANISM: Artificial Sequence
<220> FEATURE:
<223> OTHER INFORMATION: P2-A01antibodyVL CDR3

<400> SEQUENCE: 136

Leu Gly Gly Val Thr Tyr Ser Ser Thr Gly Thr His Leu Thr
1               5                   10

<210> SEQ ID NO 137
<211> LENGTH: 5
<212> TYPE: PRT
<213> ORGANISM: Artificial Sequence
<220> FEATURE:
<223> OTHER INFORMATION: P2-A03antibodyVH CDR1

<400> SEQUENCE: 137

Asn Tyr Asp Met Ser
1               5

<210> SEQ ID NO 138
<211> LENGTH: 16
<212> TYPE: PRT
<213> ORGANISM: Artificial Sequence
<220> FEATURE:
<223> OTHER INFORMATION: P2-A03antibodyVH CDR2

<400> SEQUENCE: 138

Phe Met Asp Thr Asp Gly Ser Ala Tyr Tyr Ala Thr Trp Ala Lys Gly
1               5                   10                  15

<210> SEQ ID NO 139
<211> LENGTH: 11
<212> TYPE: PRT
<213> ORGANISM: Artificial Sequence
<220> FEATURE:
<223> OTHER INFORMATION: P2-A03antibodyVH CDR3

<400> SEQUENCE: 139

Arg Gly Ser Ser Tyr Tyr Gly Gly Ile Asp Ile
1               5                   10

<210> SEQ ID NO 140
<211> LENGTH: 11
<212> TYPE: PRT
<213> ORGANISM: Artificial Sequence
<220> FEATURE:
<223> OTHER INFORMATION: P2-A03antibodyVL CDR1

<400> SEQUENCE: 140

Gln Ala Ser Gln Ser Ile Gly Gly Asn Leu Ala
1               5                   10

<210> SEQ ID NO 141
<211> LENGTH: 7
<212> TYPE: PRT
<213> ORGANISM: Artificial Sequence
<220> FEATURE:
<223> OTHER INFORMATION: P2-A03antibodyVL CDR2

<400> SEQUENCE: 141

Arg Ala Ser Thr Leu Ala Ser
1               5

<210> SEQ ID NO 142
<211> LENGTH: 14
<212> TYPE: PRT
<213> ORGANISM: Artificial Sequence
<220> FEATURE:
<223> OTHER INFORMATION: P2-A03antibodyVL CDR3

<400> SEQUENCE: 142

Gln Ser Pro Ala Tyr Asp Pro Ala Ala Tyr Val Gly Asn Ala
1               5                   10

<210> SEQ ID NO 143
<211> LENGTH: 5
<212> TYPE: PRT
<213> ORGANISM: Artificial Sequence
<220> FEATURE:
<223> OTHER INFORMATION: P2-F07antibodyVH CDR1

<400> SEQUENCE: 143

Ser Tyr Tyr Met Asn

```
<210> SEQ ID NO 144
<211> LENGTH: 16
<212> TYPE: PRT
<213> ORGANISM: Artificial Sequence
<220> FEATURE:
<223> OTHER INFORMATION: P2-F07antibodyVH CDR2

<400> SEQUENCE: 144

Ile Ile Tyr Pro Ser Gly Thr Thr Tyr Tyr Ala Gly Trp Ala Lys Gly
1               5                   10                  15

<210> SEQ ID NO 145
<211> LENGTH: 8
<212> TYPE: PRT
<213> ORGANISM: Artificial Sequence
<220> FEATURE:
<223> OTHER INFORMATION: P2-F07antibodyVH CDR3

<400> SEQUENCE: 145

Thr Val Ser Gly Tyr Phe Asp Ile
1               5

<210> SEQ ID NO 146
<211> LENGTH: 11
<212> TYPE: PRT
<213> ORGANISM: Artificial Sequence
<220> FEATURE:
<223> OTHER INFORMATION: P2-F07antibodyVL CDR1

<400> SEQUENCE: 146

Leu Ala Ser Glu Asp Ile Tyr Ser Ala Leu Ala
1               5                   10

<210> SEQ ID NO 147
<211> LENGTH: 7
<212> TYPE: PRT
<213> ORGANISM: Artificial Sequence
<220> FEATURE:
<223> OTHER INFORMATION: P2-F07antibodyVL CDR2

<400> SEQUENCE: 147

Gly Thr Ser Asn Leu Glu Ser
1               5

<210> SEQ ID NO 148
<211> LENGTH: 9
<212> TYPE: PRT
<213> ORGANISM: Artificial Sequence
<220> FEATURE:
<223> OTHER INFORMATION: P2-F07antibodyVL CDR3

<400> SEQUENCE: 148

Gln Gly Tyr Ser Ser Tyr Pro Leu Thr
1               5

<210> SEQ ID NO 149
<211> LENGTH: 5
<212> TYPE: PRT
<213> ORGANISM: Artificial Sequence
<220> FEATURE:
<223> OTHER INFORMATION: P2-F11antibodyVH CDR1

<400> SEQUENCE: 149

Ser Tyr Gly Val Ser
1               5
```

<210> SEQ ID NO 150
<211> LENGTH: 16
<212> TYPE: PRT
<213> ORGANISM: Artificial Sequence
<220> FEATURE:
<223> OTHER INFORMATION: P2-F11antibodyVH CDR2

<400> SEQUENCE: 150

Tyr Ile Ala Asn Asn Tyr Asn Pro His Tyr Ala Ser Trp Ala Lys Gly
1               5                   10                  15

<210> SEQ ID NO 151
<211> LENGTH: 7
<212> TYPE: PRT
<213> ORGANISM: Artificial Sequence
<220> FEATURE:
<223> OTHER INFORMATION: P2-F11antibodyVH CDR3

<400> SEQUENCE: 151

Asp Asn Tyr Gly Met Asp Pro
1               5

<210> SEQ ID NO 152
<211> LENGTH: 13
<212> TYPE: PRT
<213> ORGANISM: Artificial Sequence
<220> FEATURE:
<223> OTHER INFORMATION: P2-F11antibodyVL CDR1

<400> SEQUENCE: 152

Gln Ala Ser Gln Ser Val Tyr Asn Asn Lys Asn Leu Ala
1               5                   10

<210> SEQ ID NO 153
<211> LENGTH: 7
<212> TYPE: PRT
<213> ORGANISM: Artificial Sequence
<220> FEATURE:
<223> OTHER INFORMATION: P2-F11antibodyVL CDR2

<400> SEQUENCE: 153

Ala Ala Ser Thr Leu Ala Ser
1               5

<210> SEQ ID NO 154
<211> LENGTH: 13
<212> TYPE: PRT
<213> ORGANISM: Artificial Sequence
<220> FEATURE:
<223> OTHER INFORMATION: P2-F11antibodyVL CDR3

<400> SEQUENCE: 154

Gln Gly Glu Phe Ser Cys Ser Ser Ala Asp Cys Asn Ala
1               5                   10

<210> SEQ ID NO 155
<211> LENGTH: 121
<212> TYPE: PRT
<213> ORGANISM: Artificial Sequence
<220> FEATURE:
<223> OTHER INFORMATION: P2-C12antibodyVH

<400> SEQUENCE: 155

Gln Ser Leu Glu Glu Ser Gly Gly Arg Leu Val Thr Pro Gly Thr Pro
1               5                   10                  15

```
Leu Thr Leu Thr Cys Thr Val Ser Gly Phe Ser Leu Ser Thr Tyr Ala
            20                  25                  30

Val Thr Trp Val Arg Gln Ala Pro Gly Lys Gly Leu Glu Trp Ile Gly
        35                  40                  45

Tyr Ile Asn Trp Arg Gly Gly Thr Ser Tyr Ala Asn Trp Ala Lys Gly
    50                  55                  60

Arg Phe Thr Ile Ser Lys Thr Ser Ser Thr Val Asp Leu Lys Met
65                  70                  75                  80

Thr Ser Pro Thr Thr Glu Asp Thr Ala Thr Tyr Phe Cys Ala Arg Asp
                85                  90                  95

Ala Ser Ser Gly Ala Ala Phe Gly Ser Tyr Gly Met Asp Pro Trp Gly
            100                 105                 110

Pro Gly Thr Leu Val Thr Val Ser Ser
        115                 120

<210> SEQ ID NO 156
<211> LENGTH: 118
<212> TYPE: PRT
<213> ORGANISM: Artificial Sequence
<220> FEATURE:
<223> OTHER INFORMATION: 13B4antibodyVH

<400> SEQUENCE: 156

Gln Val Gln Leu Gln Glu Ser Gly Pro Gly Leu Val Lys Pro Ser Gly
1               5                   10                  15

Thr Leu Ser Leu Asn Cys Ala Val Ser Gly Ser Ile Ser Ser Ser
            20                  25                  30

Asn Trp Trp Ser Trp Val Arg Gln Pro Pro Gly Lys Gly Leu Glu Trp
        35                  40                  45

Ile Gly Glu Ile Tyr His Gly Gly Thr Thr Asn Tyr Asn Pro Ser Leu
    50                  55                  60

Lys Gly Arg Val Thr Met Ser Val Asp Lys Ser Lys Asn Gln Phe Ser
65                  70                  75                  80

Leu Arg Leu Ser Ser Val Thr Ala Val Asp Thr Ala Val Tyr Tyr Cys
                85                  90                  95

Ala Arg Trp Gln Leu Val Gly Gly Leu Asp Val Trp Gly Gln Gly Thr
            100                 105                 110

Thr Val Thr Val Ser Ser
        115

<210> SEQ ID NO 157
<211> LENGTH: 123
<212> TYPE: PRT
<213> ORGANISM: Artificial Sequence
<220> FEATURE:
<223> OTHER INFORMATION: 13F7antibodyVH

<400> SEQUENCE: 157

Gln Val Gln Leu Gln Glu Trp Gly Ala Gly Leu Leu Lys Pro Ser Glu
1               5                   10                  15

Thr Leu Ser Leu Thr Cys Ala Ile Asn Ala Glu Ser Phe Asn Gly Tyr
            20                  25                  30

Ser Trp Thr Trp Ile Arg Gln Thr Pro Gly Lys Gly Leu Glu Trp Ile
        35                  40                  45

Gly Glu Ile Ser His Phe Gly Ser Ala Asn Tyr Asn Pro Ser Leu Lys
    50                  55                  60

Ser Arg Ala Thr Ile Ser Ala Asp Lys Ser Lys Asn Gln Phe Ser Leu
65                  70                  75                  80
```

```
Lys Leu Thr Ser Val Thr Ala Val Asp Thr Ala Val Tyr Tyr Cys Ala
            85                  90                  95

Arg Ala Leu Arg Gly Thr Tyr Ser Arg Phe Tyr Tyr Gly Met Asp Val
            100                 105                 110

Trp Gly Gln Gly Thr Thr Val Thr Val Ser Ser
            115                 120

<210> SEQ ID NO 158
<211> LENGTH: 120
<212> TYPE: PRT
<213> ORGANISM: Artificial Sequence
<220> FEATURE:
<223> OTHER INFORMATION: 15A9antibodyVH

<400> SEQUENCE: 158

Gln Val Gln Leu Gln Glu Ser Gly Pro Gly Leu Val Lys Pro Ser Glu
1               5                   10                  15

Thr Leu Ser Leu Thr Cys Thr Val Ser Gly Gly Ser Ile Ser Ser Tyr
            20                  25                  30

Tyr Trp Ser Trp Ile Arg Gln Pro Pro Gly Lys Gly Leu Glu Trp Ile
        35                  40                  45

Gly Tyr Ile Tyr Pro Ser Gly Ser Thr Asn Tyr Asn Pro Ser Leu Lys
    50                  55                  60

Ser Arg Val Thr Ile Ser Val Asp Thr Ser Lys Asn Gln Phe Ser Leu
65                  70                  75                  80

Asn Leu Lys Ser Val Thr Ala Val Asp Thr Ala Val Tyr Tyr Cys Ala
            85                  90                  95

Arg Val Asn Pro Phe Gly Tyr Tyr Tyr Ala Met Asp Val Trp Gly Gln
            100                 105                 110

Gly Thr Thr Val Thr Val Ser Ser
            115                 120

<210> SEQ ID NO 159
<211> LENGTH: 116
<212> TYPE: PRT
<213> ORGANISM: Artificial Sequence
<220> FEATURE:
<223> OTHER INFORMATION: P1-A03antibodyVH

<400> SEQUENCE: 159

Gln Ser Val Glu Glu Ser Gly Gly Arg Leu Val Thr Pro Gly Thr Pro
1               5                   10                  15

Leu Thr Leu Thr Cys Thr Val Ser Gly Phe Ser Leu Ser Ser Asp Tyr
            20                  25                  30

Met Ser Trp Val Arg Gln Ala Pro Gly Glu Gly Leu Glu Trp Ile Gly
        35                  40                  45

Ile Ile Tyr Pro Ser Thr Thr Thr Tyr Tyr Ala Ser Trp Ala Lys Gly
    50                  55                  60

Arg Phe Thr Ile Ser Lys Thr Ser Thr Thr Val Glu Leu Lys Met
65                  70                  75                  80

Thr Ser Leu Thr Thr Glu Asp Thr Ala Thr Tyr Phe Cys Ala Arg Gly
            85                  90                  95

Ser Asn Trp Ser Ser Gly Met Asn Leu Trp Gly Pro Gly Thr Leu Val
            100                 105                 110

Thr Val Ser Ser
            115
```

```
<210> SEQ ID NO 160
<211> LENGTH: 113
<212> TYPE: PRT
<213> ORGANISM: Artificial Sequence
<220> FEATURE:
<223> OTHER INFORMATION: P1-A08antibodyVH

<400> SEQUENCE: 160

Gln Ser Leu Glu Glu Ser Gly Gly Arg Leu Val Thr Pro Gly Thr Pro
1               5                   10                  15

Leu Thr Leu Thr Cys Thr Ala Ser Gly Phe Ser Leu Ser Thr Tyr Tyr
                20                  25                  30

Met Ser Trp Val Arg Gln Ala Pro Gly Lys Gly Leu Glu Trp Ile Gly
            35                  40                  45

Ile Val Tyr Pro Ser Gly Thr Thr Tyr Tyr Ala Asn Trp Ala Lys Gly
        50                  55                  60

Arg Phe Thr Ile Ser Thr Ala Ser Thr Thr Val Asp Leu Met Ile Thr
65                  70                  75                  80

Ser Pro Thr Thr Glu Asp Thr Ala Thr Tyr Phe Cys Ala Arg Gly Asp
                85                  90                  95

Ser Phe Gly Tyr Gly Leu Trp Gly Pro Gly Thr Leu Val Thr Val Ser
                100                 105                 110

Ser

<210> SEQ ID NO 161
<211> LENGTH: 122
<212> TYPE: PRT
<213> ORGANISM: Artificial Sequence
<220> FEATURE:
<223> OTHER INFORMATION: P1-F02antibodyVH

<400> SEQUENCE: 161

Gln Ser Leu Glu Glu Ser Gly Gly Arg Leu Val Thr Pro Gly Thr Pro
1               5                   10                  15

Leu Thr Leu Thr Cys Thr Ala Ser Gly Phe Ser Leu Ser Asn Tyr Tyr
                20                  25                  30

Met Gly Trp Val Arg Gln Ala Pro Gly Glu Gly Leu Glu Trp Ile Gly
            35                  40                  45

Ile Ile Tyr Ala Ser Gly Ser Thr Tyr Tyr Ala Ser Trp Ala Lys Gly
        50                  55                  60

Arg Phe Thr Ile Ser Lys Thr Ser Thr Thr Val Asp Leu Lys Met Thr
65                  70                  75                  80

Ser Leu Thr Thr Glu Asp Thr Ala Thr Tyr Phe Cys Ala Arg Ile Asp
                85                  90                  95

Ile Gly Val Gly Asp Tyr Gly Trp Ala Tyr Asp Arg Leu Asp Leu Trp
                100                 105                 110

Gly Gln Gly Thr Leu Val Thr Val Ser Ser
            115                 120

<210> SEQ ID NO 162
<211> LENGTH: 121
<212> TYPE: PRT
<213> ORGANISM: Artificial Sequence
<220> FEATURE:
<223> OTHER INFORMATION: P2-A01antibodyVH

<400> SEQUENCE: 162

Gln Glu Gln Leu Val Glu Ser Gly Gly Arg Leu Val Thr Pro Gly Thr
1               5                   10                  15
```

```
Pro Leu Thr Leu Ser Cys Thr Ala Ser Gly Phe Phe Leu Ser Gly Tyr
            20                  25                  30

Tyr Met Ser Trp Val Arg Gln Ala Pro Gly Lys Gly Leu Glu Trp Ile
        35                  40                  45

Gly Ile Ile Tyr Pro Ser Gly Ser Thr Asp Tyr Ala Ser Trp Ala Lys
    50                  55                  60

Gly Arg Phe Thr Ile Ser Lys Thr Ser Thr Thr Val Asp Leu Lys Ile
65                  70                  75                  80

Thr Thr Pro Thr Thr Glu Asp Thr Ala Thr Tyr Phe Cys Ala Arg Val
                85                  90                  95

Ala Gly Tyr Val Gly Tyr Gly Tyr Glu Thr Phe Phe Asp Ile Trp Gly
            100                 105                 110

Pro Gly Thr Leu Val Thr Val Ser Leu
        115                 120

<210> SEQ ID NO 163
<211> LENGTH: 116
<212> TYPE: PRT
<213> ORGANISM: Artificial Sequence
<220> FEATURE:
<223> OTHER INFORMATION: P2-A03antibodyVH

<400> SEQUENCE: 163

Gln Ser Val Glu Glu Ser Gly Gly Arg Leu Val Thr Pro Gly Thr Pro
1               5                   10                  15

Leu Thr Leu Thr Cys Thr Val Ser Gly Phe Ser Leu Asn Asn Tyr Asp
            20                  25                  30

Met Ser Trp Val Arg Gln Ala Pro Gly Lys Gly Leu Glu Tyr Ile Gly
        35                  40                  45

Phe Met Asp Thr Asp Gly Ser Ala Tyr Tyr Ala Thr Trp Ala Lys Gly
    50                  55                  60

Arg Phe Thr Ile Ser Arg Thr Ser Thr Thr Val Asp Leu Lys Met Thr
65                  70                  75                  80

Ser Pro Thr Thr Glu Asp Thr Ala Thr Tyr Phe Cys Ala Arg Arg Gly
                85                  90                  95

Ser Ser Tyr Gly Gly Ile Asp Ile Trp Gly Pro Gly Thr Pro Val Thr
            100                 105                 110

Thr Val Ser Leu
        115

<210> SEQ ID NO 164
<211> LENGTH: 113
<212> TYPE: PRT
<213> ORGANISM: Artificial Sequence
<220> FEATURE:
<223> OTHER INFORMATION: P2-F07antibodyVH

<400> SEQUENCE: 164

Gln Ser Leu Glu Glu Ser Gly Gly Arg Leu Val Thr Pro Gly Thr Pro
1               5                   10                  15

Leu Thr Leu Thr Cys Thr Ala Ser Gly Phe Ser Leu Ser Ser Tyr Tyr
            20                  25                  30

Met Asn Trp Val Arg Gln Ala Pro Gly Lys Gly Leu Glu Trp Ile Gly
        35                  40                  45

Ile Ile Tyr Pro Ser Gly Thr Thr Tyr Tyr Ala Gly Trp Ala Lys Gly
    50                  55                  60

Arg Phe Thr Ile Ser Lys Thr Ser Thr Thr Val Asp Leu Lys Ile Thr
65                  70                  75                  80
```

Ser Pro Thr Ser Glu Asp Thr Ala Thr Tyr Phe Cys Ala Arg Thr Val
                85                  90                  95

Ser Gly Tyr Phe Asp Ile Trp Gly Pro Gly Thr Leu Val Thr Val Ser
            100                 105                 110

Leu

<210> SEQ ID NO 165
<211> LENGTH: 114
<212> TYPE: PRT
<213> ORGANISM: Artificial Sequence
<220> FEATURE:
<223> OTHER INFORMATION: P2-F11antibodyVH

<400> SEQUENCE: 165

Gln Glu Gln Leu Val Glu Ser Gly Gly Arg Leu Val Thr Pro Gly Thr
1               5                   10                  15

Thr Leu Thr Leu Thr Cys Thr Val Ser Gly Phe Ser Leu Ser Ser Tyr
                20                  25                  30

Gly Val Ser Trp Val Arg Gln Ala Pro Gly Lys Gly Leu Glu Trp Ile
            35                  40                  45

Gly Tyr Ile Ala Asn Asn Tyr Asn Pro His Tyr Ala Ser Trp Ala Lys
        50                  55                  60

Gly Arg Phe Thr Ile Ser Lys Thr Ser Thr Thr Val Asp Leu Lys
65                  70                  75                  80

Met Thr Ser Leu Thr Thr Glu Asp Thr Ala Thr Tyr Phe Cys Ala Arg
                85                  90                  95

Asp Asn Tyr Gly Met Asp Pro Trp Gly Pro Gly Thr Leu Val Thr Val
            100                 105                 110

Ser Ser

<210> SEQ ID NO 166
<211> LENGTH: 110
<212> TYPE: PRT
<213> ORGANISM: Artificial Sequence
<220> FEATURE:
<223> OTHER INFORMATION: P2-C12antibodyVL

<400> SEQUENCE: 166

Glu Leu Asp Met Thr Gln Thr Pro Ser Ser Val Ser Ala Ala Val Gly
1               5                   10                  15

Gly Thr Val Thr Ile Lys Cys Gln Ala Ser Gln Ser Ile Ser Ser Tyr
                20                  25                  30

Leu Ser Trp Tyr Gln Gln Lys Pro Gly Gln Pro Pro Lys Leu Leu Ile
            35                  40                  45

Tyr Glu Ala Ser Lys Leu Ala Ser Gly Val Pro Ser Arg Phe Ser Gly
        50                  55                  60

Ser Gly Tyr Gly Thr Glu Phe Thr Leu Thr Ile Ser Asp Leu Glu Cys
65                  70                  75                  80

Ala Asp Ala Ala Thr Tyr Tyr Cys Gln Gln Gly Tyr Ser Ser Thr Asn
                85                  90                  95

Val Trp Asn Ala Phe Gly Gly Gly Thr Asn Val Glu Ile Lys
            100                 105                 110

<210> SEQ ID NO 167
<211> LENGTH: 106
<212> TYPE: PRT
<213> ORGANISM: Artificial Sequence
<220> FEATURE:

<223> OTHER INFORMATION: 13B4antibodyVL

<400> SEQUENCE: 167

Ser Tyr Glu Leu Thr Gln Pro Leu Ser Val Ser Pro Gly Gln
1               5                   10                  15

Thr Ala Ser Ile Thr Cys Ser Gly Asp Lys Leu Gly Asn Val Tyr Ala
            20                  25                  30

Ser Trp Tyr Gln Gln Lys Pro Gly Gln Ser Pro Thr Leu Val Ile Tyr
        35                  40                  45

Gln Asp Asn Lys Arg Pro Ser Gly Ile Pro Glu Arg Phe Ser Gly Ser
    50                  55                  60

Asn Ser Gly Lys Thr Ala Thr Leu Thr Ile Ser Gly Thr Gln Ala Leu
65                  70                  75                  80

Asp Glu Ala Asp Tyr Tyr Cys Gln Ala Trp Asp Ser Ser Thr Ala Val
                85                  90                  95

Phe Gly Gly Gly Thr Lys Leu Thr Val Leu
            100                 105

<210> SEQ ID NO 168
<211> LENGTH: 112
<212> TYPE: PRT
<213> ORGANISM: Artificial Sequence
<220> FEATURE:
<223> OTHER INFORMATION: 13F7antibodyVL

<400> SEQUENCE: 168

Asp Ile Val Met Thr Gln Thr Pro Leu Ser Leu Pro Val Ala Pro Gly
1               5                   10                  15

Glu Pro Ala Ser Ile Ser Cys Arg Ser Ser Gln Ser Leu Leu His Ser
            20                  25                  30

Asn Gly Tyr Asn Tyr Leu Asp Trp Tyr Val Gln Lys Pro Gly Gln Pro
        35                  40                  45

Pro Gln Leu Leu Ile Tyr Leu Gly Ser Asn Arg Ala Ser Gly Val Pro
    50                  55                  60

Asp Arg Phe Ser Gly Ser Gly Ser Gly Thr Asp Phe Thr Leu Lys Ile
65                  70                  75                  80

Ser Arg Val Glu Ala Glu Asp Val Gly Val Tyr Tyr Cys Met Gln Ala
                85                  90                  95

Arg Gln Thr Pro Leu Thr Phe Gly Gly Gly Thr Lys Val Glu Ile Lys
            100                 105                 110

<210> SEQ ID NO 169
<211> LENGTH: 107
<212> TYPE: PRT
<213> ORGANISM: Artificial Sequence
<220> FEATURE:
<223> OTHER INFORMATION: 15A9antibodyVL

<400> SEQUENCE: 169

Asp Ile Gln Met Thr Gln Ser Pro Ser Ser Leu Ser Ala Ser Val Gly
1               5                   10                  15

Asp Arg Ile Thr Ile Ser Cys Arg Ala Ser Gln Ser Ile Ser Thr Ser
            20                  25                  30

Leu Asn Trp Tyr Gln Gln Thr Pro Gly Lys Ala Pro Arg Leu Leu Ile
        35                  40                  45

Tyr Gly Ala Ser Thr Leu Gln Ser Gly Val Pro Ser Arg Phe Ser Gly
    50                  55                  60

Gly Gly Ser Gly Thr Asp Phe Ser Leu Thr Ile Thr Ser Leu Gln Pro

```
                65                  70                  75                  80
Glu Asp Phe Ala Thr Tyr Tyr Cys Gln Glu Ser Ala Ser Ile Pro Arg
                    85                  90                  95

Thr Phe Gly Gln Gly Thr Lys Leu Asp Ile Lys
            100                 105

<210> SEQ ID NO 170
<211> LENGTH: 110
<212> TYPE: PRT
<213> ORGANISM: Artificial Sequence
<220> FEATURE:
<223> OTHER INFORMATION: P1-A03antibodyVL

<400> SEQUENCE: 170

Glu Leu Val Met Thr Gln Thr Pro Pro Ser Leu Ser Ala Ser Val Gly
1               5                   10                  15

Glu Thr Val Arg Ile Arg Cys Leu Ala Ser Glu Asp Ile Tyr Ser Gly
                20                  25                  30

Ile Ser Trp Tyr Gln Gln Lys Pro Glu Lys Pro Thr Leu Leu Ile
            35                  40                  45

Ser Gly Ala Ser Asn Leu Glu Ser Gly Val Pro Pro Arg Phe Ser Gly
        50                  55                  60

Ser Gly Ser Gly Thr Asp Tyr Thr Leu Thr Ile Gly Gly Val Gln Ala
65                  70                  75                  80

Glu Asp Ala Ala Thr Tyr Tyr Cys Leu Gly Gly Tyr Ser Tyr Ser Ser
                85                  90                  95

Thr Gly Leu Thr Phe Gly Ala Gly Thr Asn Val Glu Ile Lys
            100                 105                 110

<210> SEQ ID NO 171
<211> LENGTH: 110
<212> TYPE: PRT
<213> ORGANISM: Artificial Sequence
<220> FEATURE:
<223> OTHER INFORMATION: P1-A08antibodyVL

<400> SEQUENCE: 171

Glu Leu Val Leu Thr Gln Ser Pro Ser Val Gln Val Asn Leu Gly Gln
1               5                   10                  15

Thr Val Ser Leu Thr Cys Thr Ala Asp Thr Leu Ser Arg Ser Tyr Ala
                20                  25                  30

Ser Trp Tyr Gln Gln Lys Pro Gly Gln Ala Pro Val Leu Leu Ile Tyr
            35                  40                  45

Arg Asp Thr Ser Arg Pro Ser Gly Val Pro Asp Arg Phe Ser Gly Ser
        50                  55                  60

Ser Ser Gly Asn Thr Ala Thr Leu Thr Ile Ser Gly Ala Gln Ala Gly
65                  70                  75                  80

Asp Glu Ala Asp Tyr Tyr Cys Ala Thr Ser Asp Gly Ser Gly Ser Asn
                85                  90                  95

Tyr Gln Tyr Val Phe Gly Gly Gly Thr Gln Leu Thr Val Thr
            100                 105                 110

<210> SEQ ID NO 172
<211> LENGTH: 108
<212> TYPE: PRT
<213> ORGANISM: Artificial Sequence
<220> FEATURE:
<223> OTHER INFORMATION: P1-F02antibodyVL

<400> SEQUENCE: 172
```

```
Glu Leu Asp Met Thr Gln Thr Pro Ser Leu Ser Ala Ser Val Gly
1               5                   10                  15

Glu Thr Val Arg Ile Arg Cys Leu Ala Ser Glu Asp Ile Tyr Ser Gly
            20                  25                  30

Ile Ser Trp Tyr Gln Gln Lys Pro Gly Lys Pro Thr Leu Leu Ile
        35                  40                  45

Tyr Gly Ala Ser Asn Leu Glu Ser Gly Val Pro Pro Arg Phe Ser Gly
    50                  55                  60

Ser Gly Ser Gly Thr Asp Tyr Thr Leu Thr Ile Gly Gly Val Gln Ala
65              70                  75                  80

Glu Asp Ala Ala Thr Tyr Tyr Cys Leu Gly Gly Tyr Ser Tyr Ser Ser
                85                  90                  95

Ile Thr Phe Gly Ala Gly Thr Asn Val Glu Ile Lys
            100                 105
```

<210> SEQ ID NO 173
<211> LENGTH: 112
<212> TYPE: PRT
<213> ORGANISM: Artificial Sequence
<220> FEATURE:
<223> OTHER INFORMATION: P2-A01antibodyVL

<400> SEQUENCE: 173

```
Glu Leu Val Met Thr Gln Thr Pro Ser Leu Ser Ala Ser Val Gly
1               5                   10                  15

Glu Thr Val Arg Ile Arg Cys Leu Ala Ser Glu Asp Ile Tyr Ser Gly
            20                  25                  30

Ile Ser Trp Tyr Gln Gln Lys Pro Gly Lys Pro Thr Leu Leu Ile
        35                  40                  45

Tyr Gly Ala Ser Asn Leu Glu Ser Gly Val Pro Pro Arg Phe Ser Gly
    50                  55                  60

Ser Gly Ser Gly Ser Asp Tyr Thr Leu Thr Ile Gly Gly Val Gln Ala
65              70                  75                  80

Glu Asp Ala Ala Thr Tyr Tyr Cys Leu Gly Gly Val Thr Tyr Ser Ser
                85                  90                  95

Thr Gly Thr His Leu Thr Phe Gly Ala Gly Thr Asn Val Glu Ile Lys
            100                 105                 110
```

<210> SEQ ID NO 174
<211> LENGTH: 112
<212> TYPE: PRT
<213> ORGANISM: Artificial Sequence
<220> FEATURE:
<223> OTHER INFORMATION: P2-A03antibodyVL

<400> SEQUENCE: 174

```
Glu Leu Asp Leu Thr Gln Thr Pro Ala Ser Val Ser Glu Pro Val Gly
1               5                   10                  15

Gly Thr Val Thr Ile Lys Cys Gln Ala Ser Gln Ser Ile Gly Gly Asn
            20                  25                  30

Leu Ala Trp Tyr Gln Gln Lys Pro Gly Gln Pro Pro Lys Leu Leu Ile
        35                  40                  45

Tyr Arg Ala Ser Thr Leu Ala Ser Gly Val Pro Ser Arg Phe Lys Gly
    50                  55                  60

Ser Gly Ser Gly Thr Asp Phe Thr Leu Thr Ile Ser Asp Leu Glu Cys
65              70                  75                  80

Ala Asp Ala Ala Thr Tyr Tyr Cys Gln Ser Pro Ala Tyr Asp Pro Ala
```

85                  90                  95
Ala Tyr Val Gly Asn Ala Phe Gly Gly Gly Thr Glu Leu Glu Ile Leu
                100                 105                 110

<210> SEQ ID NO 175
<211> LENGTH: 107
<212> TYPE: PRT
<213> ORGANISM: Artificial Sequence
<220> FEATURE:
<223> OTHER INFORMATION: P2-F07antibodyVL

<400> SEQUENCE: 175

Glu Leu Asp Leu Thr Gln Thr Pro Pro Ser Leu Ser Ala Ser Val Gly
1               5                   10                  15

Gly Thr Val Thr Ile Asn Cys Leu Ala Ser Glu Asp Ile Tyr Ser Ala
            20                  25                  30

Leu Ala Trp Tyr Gln Gln Lys Pro Gly Lys Pro Thr Leu Leu Ile
        35                  40                  45

Ser Gly Thr Ser Asn Leu Glu Ser Gly Val Pro Pro Arg Phe Ser Gly
    50                  55                  60
Ser Gly Ser Gly Thr Asp Tyr Thr Leu Thr Ile Gly Val Gln Ala
65                  70                  75                  80

Glu Asp Ala Ala Thr Tyr Phe Cys Gln Gly Tyr Ser Ser Tyr Pro Leu
                85                  90                  95

Thr Phe Gly Ala Gly Thr Asn Val Glu Ile Lys
                100                 105

<210> SEQ ID NO 176
<211> LENGTH: 113
<212> TYPE: PRT
<213> ORGANISM: Artificial Sequence
<220> FEATURE:
<223> OTHER INFORMATION: P2-F11antibodyVL

<400> SEQUENCE: 176

Glu Leu Asp Leu Thr Gln Thr Pro Ser Ser Val Ser Ala Ala Val Gly
1               5                   10                  15

Gly Thr Val Thr Ile Asn Cys Gln Ala Ser Gln Ser Val Tyr Asn Asn
            20                  25                  30

Lys Asn Leu Ala Trp Tyr Gln Gln Lys Pro Gly Gln Pro Lys Leu
        35                  40                  45

Leu Ile Tyr Ala Ala Ser Thr Leu Ala Ser Gly Val Ser Ser Arg Phe
    50                  55                  60

Lys Gly Ser Gly Ser Gly Thr Gln Phe Thr Leu Thr Ile Ser Asp Val
65                  70                  75                  80

Gln Cys Asp Asp Ala Ala Thr Tyr Tyr Cys Gln Gly Glu Phe Ser Cys
                85                  90                  95

Ser Ser Ala Asp Cys Asn Ala Phe Gly Gly Gly Thr Glu Leu Glu Ile
                100                 105                 110

Leu

<210> SEQ ID NO 177
<211> LENGTH: 363
<212> TYPE: DNA
<213> ORGANISM: Artificial Sequence
<220> FEATURE:
<223> OTHER INFORMATION: P2-C12antibodyVH

<400> SEQUENCE: 177

```
cagtcgctgg aggagtccgg gggtcgcctg gtcacgcctg ggacacccct gacactcacc    60
tgcaccgtct ctggattctc cctcagtacc tatgcagtga cctgggtccg ccaggctcca   120
gggaaggggc tggaatggat cggatacatt aattggcgtg gtgggacatc ctacgcgaac   180
tgggcgaaag gccgattcac catctccaaa acctcgtcga ccacggtgga tctgaaaatg   240
accagtccga caaccgagga cacggccacc tatttctgtg ccagagatgc tagtagtggt   300
gctgcttttg ggtcttacgg catggacccc tggggcccag ggaccctcgt caccgtctct   360
tca                                                                 363
```

<210> SEQ ID NO 178
<211> LENGTH: 330
<212> TYPE: DNA
<213> ORGANISM: Artificial Sequence
<220> FEATURE:
<223> OTHER INFORMATION: P2-C12antibodyVL

<400> SEQUENCE: 178

```
gagctcgata tgacccagac tccatcctcc gtgtctgcag ctgtgggagg cacagtcacc    60
atcaagtgcc aggccagtca gagcattagt agctacttat cctggtatca gcagaaacca   120
gggcagcctc ccaagctcct gatctatgaa gcatccaaac tggcctctgg ggtcccatcg   180
cggttcagcg gcagtggata tgggacagag ttcactctca ccatcagcga cctggagtgt   240
gccgatgctg ccacttacta ctgtcaacag ggttatagta gtactaatgt ttggaatgct   300
ttcggcggag gcaccaatgt ggaaatcaaa                                    330
```

<210> SEQ ID NO 179
<211> LENGTH: 451
<212> TYPE: PRT
<213> ORGANISM: Artificial Sequence
<220> FEATURE:
<223> OTHER INFORMATION: P2-C12HC

<400> SEQUENCE: 179

```
Gln Ser Leu Glu Glu Ser Gly Gly Arg Leu Val Thr Pro Gly Thr Pro
1               5                   10                  15

Leu Thr Leu Thr Cys Thr Val Ser Gly Phe Ser Leu Ser Thr Tyr Ala
            20                  25                  30

Val Thr Trp Val Arg Gln Ala Pro Gly Lys Gly Leu Glu Trp Ile Gly
        35                  40                  45

Tyr Ile Asn Trp Arg Gly Gly Thr Ser Tyr Ala Asn Trp Ala Lys Gly
    50                  55                  60

Arg Phe Thr Ile Ser Lys Thr Ser Ser Thr Thr Val Asp Leu Lys Met
65                  70                  75                  80

Thr Ser Pro Thr Thr Glu Asp Thr Ala Thr Tyr Phe Cys Ala Arg Asp
                85                  90                  95

Ala Ser Ser Gly Ala Ala Phe Gly Ser Tyr Gly Met Asp Pro Trp Gly
            100                 105                 110

Pro Gly Thr Leu Val Thr Val Ser Ser Ala Ser Thr Lys Gly Pro Ser
        115                 120                 125

Val Phe Pro Leu Ala Pro Ser Ser Lys Ser Thr Ser Gly Gly Thr Ala
    130                 135                 140

Ala Leu Gly Cys Leu Val Lys Asp Tyr Phe Pro Glu Pro Val Thr Val
145                 150                 155                 160

Ser Trp Asn Ser Gly Ala Leu Thr Ser Gly Val His Thr Phe Pro Ala
                165                 170                 175
```

Val Leu Gln Ser Ser Gly Leu Tyr Ser Leu Ser Ser Val Val Thr Val
                180                 185                 190

Pro Ser Ser Ser Leu Gly Thr Gln Thr Tyr Ile Cys Asn Val Asn His
            195                 200                 205

Lys Pro Ser Asn Thr Lys Val Asp Lys Lys Val Glu Pro Lys Ser Cys
        210                 215                 220

Asp Lys Thr His Thr Cys Pro Pro Cys Pro Ala Pro Glu Leu Leu Gly
225                 230                 235                 240

Gly Pro Ser Val Phe Leu Phe Pro Pro Lys Pro Lys Asp Thr Leu Met
                245                 250                 255

Ile Ser Arg Thr Pro Glu Val Thr Cys Val Val Val Asp Val Ser His
            260                 265                 270

Glu Asp Pro Glu Val Lys Phe Asn Trp Tyr Val Asp Gly Val Glu Val
        275                 280                 285

His Asn Ala Lys Thr Lys Pro Arg Glu Glu Gln Tyr Asn Ser Thr Tyr
    290                 295                 300

Arg Val Val Ser Val Leu Thr Val Leu His Gln Asp Trp Leu Asn Gly
305                 310                 315                 320

Lys Glu Tyr Lys Cys Lys Val Ser Asn Lys Ala Leu Pro Ala Pro Ile
                325                 330                 335

Glu Lys Thr Ile Ser Lys Ala Lys Gly Gln Pro Arg Glu Pro Gln Val
            340                 345                 350

Tyr Thr Leu Pro Pro Ser Arg Glu Glu Met Thr Lys Asn Gln Val Ser
        355                 360                 365

Leu Thr Cys Leu Val Lys Gly Phe Tyr Pro Ser Asp Ile Ala Val Glu
    370                 375                 380

Trp Glu Ser Asn Gly Gln Pro Glu Asn Asn Tyr Lys Thr Thr Pro Pro
385                 390                 395                 400

Val Leu Asp Ser Asp Gly Ser Phe Phe Leu Tyr Ser Lys Leu Thr Val
                405                 410                 415

Asp Lys Ser Arg Trp Gln Gln Gly Asn Val Phe Ser Cys Ser Val Met
            420                 425                 430

His Glu Ala Leu His Asn His Tyr Thr Gln Lys Ser Leu Ser Leu Ser
        435                 440                 445

Pro Gly Lys
    450

<210> SEQ ID NO 180
<211> LENGTH: 448
<212> TYPE: PRT
<213> ORGANISM: Artificial Sequence
<220> FEATURE:
<223> OTHER INFORMATION: 13B4HC

<400> SEQUENCE: 180

Gln Val Gln Leu Gln Glu Ser Gly Pro Gly Leu Val Lys Pro Ser Gly
1               5                   10                  15

Thr Leu Ser Leu Asn Cys Ala Val Ser Gly Gly Ser Ile Ser Ser Ser
            20                  25                  30

Asn Trp Trp Ser Trp Val Arg Gln Pro Pro Gly Lys Gly Leu Glu Trp
        35                  40                  45

Ile Gly Glu Ile Tyr His Gly Gly Thr Thr Asn Tyr Asn Pro Ser Leu
    50                  55                  60

Lys Gly Arg Val Thr Met Ser Val Asp Lys Thr Lys Asn Gln Phe Ser
65                  70                  75                  80

```
Leu Arg Leu Ser Ser Val Thr Ala Val Asp Thr Ala Val Tyr Tyr Cys
                85                  90                  95

Ala Arg Trp Gln Leu Val Gly Gly Leu Asp Val Trp Gly Gln Gly Thr
            100                 105                 110

Thr Val Thr Val Ser Ser Ala Ser Thr Lys Gly Pro Ser Val Phe Pro
        115                 120                 125

Leu Ala Pro Ser Ser Lys Ser Thr Ser Gly Gly Thr Ala Ala Leu Gly
    130                 135                 140

Cys Leu Val Lys Asp Tyr Phe Pro Glu Pro Val Thr Val Ser Trp Asn
145                 150                 155                 160

Ser Gly Ala Leu Thr Ser Gly Val His Thr Phe Pro Ala Val Leu Gln
                165                 170                 175

Ser Ser Gly Leu Tyr Ser Leu Ser Ser Val Val Thr Val Pro Ser Ser
            180                 185                 190

Ser Leu Gly Thr Gln Thr Tyr Ile Cys Asn Val Asn His Lys Pro Ser
        195                 200                 205

Asn Thr Lys Val Asp Lys Lys Val Glu Pro Lys Ser Cys Asp Lys Thr
    210                 215                 220

His Thr Cys Pro Pro Cys Pro Ala Pro Glu Leu Leu Gly Gly Pro Ser
225                 230                 235                 240

Val Phe Leu Phe Pro Pro Lys Pro Lys Asp Thr Leu Met Ile Ser Arg
                245                 250                 255

Thr Pro Glu Val Thr Cys Val Val Val Asp Val Ser His Glu Asp Pro
            260                 265                 270

Glu Val Lys Phe Asn Trp Tyr Val Asp Gly Val Glu Val His Asn Ala
        275                 280                 285

Lys Thr Lys Pro Arg Glu Glu Gln Tyr Asn Ser Thr Tyr Arg Val Val
    290                 295                 300

Ser Val Leu Thr Val Leu His Gln Asp Trp Leu Asn Gly Lys Glu Tyr
305                 310                 315                 320

Lys Cys Lys Val Ser Asn Lys Ala Leu Pro Ala Pro Ile Glu Lys Thr
                325                 330                 335

Ile Ser Lys Ala Lys Gly Gln Pro Arg Glu Pro Gln Val Tyr Thr Leu
            340                 345                 350

Pro Pro Ser Arg Glu Glu Met Thr Lys Asn Gln Val Ser Leu Thr Cys
        355                 360                 365

Leu Val Lys Gly Phe Tyr Pro Ser Asp Ile Ala Val Glu Trp Glu Ser
    370                 375                 380

Asn Gly Gln Pro Glu Asn Asn Tyr Lys Thr Thr Pro Pro Val Leu Asp
385                 390                 395                 400

Ser Asp Gly Ser Phe Phe Leu Tyr Ser Lys Leu Thr Val Asp Lys Ser
                405                 410                 415

Arg Trp Gln Gln Gly Asn Val Phe Ser Cys Ser Val Met His Glu Ala
            420                 425                 430

Leu His Asn His Tyr Thr Gln Lys Ser Leu Ser Leu Ser Pro Gly Lys
        435                 440                 445

<210> SEQ ID NO 181
<211> LENGTH: 453
<212> TYPE: PRT
<213> ORGANISM: Artificial Sequence
<220> FEATURE:
<223> OTHER INFORMATION: 13F7HC

<400> SEQUENCE: 181
```

-continued

```
Gln Val Gln Leu Gln Glu Trp Gly Ala Gly Leu Leu Lys Pro Ser Glu
1               5                   10                  15

Thr Leu Ser Leu Thr Cys Ala Ile Asn Ala Glu Ser Phe Asn Gly Tyr
            20                  25                  30

Ser Trp Thr Trp Ile Arg Gln Thr Pro Gly Lys Gly Leu Glu Trp Ile
        35                  40                  45

Gly Glu Ile Ser His Phe Gly Ser Ala Asn Tyr Asn Pro Ser Leu Lys
    50                  55                  60

Ser Arg Ala Thr Ile Ser Ala Asp Lys Ser Lys Asn Gln Phe Ser Leu
65                  70                  75                  80

Lys Leu Thr Ser Val Thr Ala Val Asp Thr Ala Val Tyr Tyr Cys Ala
                85                  90                  95

Arg Ala Leu Arg Gly Thr Tyr Ser Arg Phe Tyr Tyr Gly Met Asp Val
                100                 105                 110

Trp Gly Gln Gly Thr Thr Val Thr Val Ser Ser Ala Ser Thr Lys Gly
            115                 120                 125

Pro Ser Val Phe Pro Leu Ala Pro Ser Ser Lys Ser Thr Ser Gly Gly
            130                 135                 140

Thr Ala Ala Leu Gly Cys Leu Val Lys Asp Tyr Phe Pro Glu Pro Val
145                 150                 155                 160

Thr Val Ser Trp Asn Ser Gly Ala Leu Thr Ser Gly Val His Thr Phe
                165                 170                 175

Pro Ala Val Leu Gln Ser Ser Gly Leu Tyr Ser Leu Ser Ser Val Val
                180                 185                 190

Thr Val Pro Ser Ser Ser Leu Gly Thr Gln Thr Tyr Ile Cys Asn Val
                195                 200                 205

Asn His Lys Pro Ser Asn Thr Lys Val Asp Lys Lys Val Glu Pro Lys
                210                 215                 220

Ser Cys Asp Lys Thr His Thr Cys Pro Pro Cys Pro Ala Pro Glu Leu
225                 230                 235                 240

Leu Gly Gly Pro Ser Val Phe Leu Phe Pro Pro Lys Pro Lys Asp Thr
                245                 250                 255

Leu Met Ile Ser Arg Thr Pro Glu Val Thr Cys Val Val Val Asp Val
                260                 265                 270

Ser His Glu Asp Pro Glu Val Lys Phe Asn Trp Tyr Val Asp Gly Val
                275                 280                 285

Glu Val His Asn Ala Lys Thr Lys Pro Arg Glu Glu Gln Tyr Asn Ser
                290                 295                 300

Thr Tyr Arg Val Val Ser Val Leu Thr Val Leu His Gln Asp Trp Leu
305                 310                 315                 320

Asn Gly Lys Glu Tyr Lys Cys Lys Val Ser Asn Lys Ala Leu Pro Ala
                325                 330                 335

Pro Ile Glu Lys Thr Ile Ser Lys Ala Lys Gly Gln Pro Arg Glu Pro
                340                 345                 350

Gln Val Tyr Thr Leu Pro Pro Ser Arg Glu Glu Met Thr Lys Asn Gln
                355                 360                 365

Val Ser Leu Thr Cys Leu Val Lys Gly Phe Tyr Pro Ser Asp Ile Ala
                370                 375                 380

Val Glu Trp Glu Ser Asn Gly Gln Pro Glu Asn Asn Tyr Lys Thr Thr
385                 390                 395                 400

Pro Pro Val Leu Asp Ser Asp Gly Ser Phe Phe Leu Tyr Ser Lys Leu
                405                 410                 415

Thr Val Asp Lys Ser Arg Trp Gln Gln Gly Asn Val Phe Ser Cys Ser
```

```
                    420                 425                 430
Val Met His Glu Ala Leu His Asn His Tyr Thr Gln Lys Ser Leu Ser
                435                 440                 445
Leu Ser Pro Gly Lys
        450

<210> SEQ ID NO 182
<211> LENGTH: 450
<212> TYPE: PRT
<213> ORGANISM: Artificial Sequence
<220> FEATURE:
<223> OTHER INFORMATION: 15A9HC

<400> SEQUENCE: 182

Gln Val Gln Leu Gln Glu Ser Gly Pro Gly Leu Val Lys Pro Ser Glu
1               5                   10                  15

Thr Leu Ser Leu Thr Cys Thr Val Ser Gly Gly Ser Ile Ser Ser Tyr
            20                  25                  30

Tyr Trp Ser Trp Ile Arg Gln Pro Pro Gly Lys Gly Leu Glu Trp Ile
        35                  40                  45

Gly Tyr Ile Tyr Pro Ser Gly Ser Thr Asn Tyr Asn Pro Ser Leu Lys
    50                  55                  60

Ser Arg Val Thr Ile Ser Val Asp Thr Ser Lys Asn Gln Phe Ser Leu
65                  70                  75                  80

Asn Leu Lys Ser Val Thr Ala Val Asp Thr Ala Val Tyr Tyr Cys Ala
                85                  90                  95

Arg Val Asn Pro Phe Gly Tyr Tyr Tyr Ala Met Asp Val Trp Gly Gln
            100                 105                 110

Gly Thr Thr Val Thr Val Ser Ser Ala Ser Thr Lys Gly Pro Ser Val
        115                 120                 125

Phe Pro Leu Ala Pro Ser Ser Lys Ser Thr Ser Gly Gly Thr Ala Ala
    130                 135                 140

Leu Gly Cys Leu Val Lys Asp Tyr Phe Pro Glu Pro Val Thr Val Ser
145                 150                 155                 160

Trp Asn Ser Gly Ala Leu Thr Ser Gly Val His Thr Phe Pro Ala Val
                165                 170                 175

Leu Gln Ser Ser Gly Leu Tyr Ser Leu Ser Ser Val Val Thr Val Pro
            180                 185                 190

Ser Ser Ser Leu Gly Thr Gln Thr Tyr Ile Cys Asn Val Asn His Lys
        195                 200                 205

Pro Ser Asn Thr Lys Val Asp Lys Lys Val Glu Pro Lys Ser Cys Asp
    210                 215                 220

Lys Thr His Thr Cys Pro Pro Cys Pro Ala Pro Glu Leu Leu Gly Gly
225                 230                 235                 240

Pro Ser Val Phe Leu Phe Pro Pro Lys Pro Lys Asp Thr Leu Met Ile
                245                 250                 255

Ser Arg Thr Pro Glu Val Thr Cys Val Val Val Asp Val Ser His Glu
            260                 265                 270

Asp Pro Glu Val Lys Phe Asn Trp Tyr Val Asp Gly Val Glu Val His
        275                 280                 285

Asn Ala Lys Thr Lys Pro Arg Glu Glu Gln Tyr Asn Ser Thr Tyr Arg
    290                 295                 300

Val Val Ser Val Leu Thr Val Leu His Gln Asp Trp Leu Asn Gly Lys
305                 310                 315                 320

Glu Tyr Lys Cys Lys Val Ser Asn Lys Ala Leu Pro Ala Pro Ile Glu
```

```
            325                 330                 335
Lys Thr Ile Ser Lys Ala Lys Gly Gln Pro Arg Glu Pro Gln Val Tyr
            340                 345                 350

Thr Leu Pro Pro Ser Arg Glu Glu Met Thr Lys Asn Gln Val Ser Leu
            355                 360                 365

Thr Cys Leu Val Lys Gly Phe Tyr Pro Ser Asp Ile Ala Val Glu Trp
            370                 375                 380

Glu Ser Asn Gly Gln Pro Glu Asn Asn Tyr Lys Thr Thr Pro Pro Val
385                 390                 395                 400

Leu Asp Ser Asp Gly Ser Phe Phe Leu Tyr Ser Lys Leu Thr Val Asp
                405                 410                 415

Lys Ser Arg Trp Gln Gln Gly Asn Val Phe Ser Cys Ser Val Met His
                420                 425                 430

Glu Ala Leu His Asn His Tyr Thr Gln Lys Ser Leu Ser Leu Ser Pro
                435                 440                 445

Gly Lys
    450

<210> SEQ ID NO 183
<211> LENGTH: 446
<212> TYPE: PRT
<213> ORGANISM: Artificial Sequence
<220> FEATURE:
<223> OTHER INFORMATION: P1-A03HC

<400> SEQUENCE: 183

Gln Ser Val Glu Glu Ser Gly Gly Arg Leu Val Thr Pro Gly Thr Pro
1               5                   10                  15

Leu Thr Leu Thr Cys Thr Val Ser Gly Phe Ser Leu Ser Ser Asp Tyr
            20                  25                  30

Met Ser Trp Val Arg Gln Ala Pro Gly Glu Gly Leu Glu Trp Ile Gly
        35                  40                  45

Ile Ile Tyr Pro Ser Thr Thr Thr Tyr Ala Ser Trp Ala Lys Gly
    50                  55                  60

Arg Phe Thr Ile Ser Lys Thr Ser Ser Thr Val Glu Leu Lys Met
65                  70                  75              80

Thr Ser Leu Thr Thr Glu Asp Thr Ala Thr Tyr Phe Cys Ala Arg Gly
                85                  90                  95

Ser Asn Trp Ser Ser Gly Met Asn Leu Trp Gly Pro Gly Thr Leu Val
            100                 105                 110

Thr Val Ser Ser Ala Ser Thr Lys Gly Pro Ser Val Phe Pro Leu Ala
        115                 120                 125

Pro Ser Ser Lys Ser Thr Ser Gly Gly Thr Ala Ala Leu Gly Cys Leu
    130                 135                 140

Val Lys Asp Tyr Phe Pro Glu Pro Val Thr Val Ser Trp Asn Ser Gly
145                 150                 155                 160

Ala Leu Thr Ser Gly Val His Thr Phe Pro Ala Val Leu Gln Ser Ser
                165                 170                 175

Gly Leu Tyr Ser Leu Ser Ser Val Val Thr Val Pro Ser Ser Ser Leu
            180                 185                 190

Gly Thr Gln Thr Tyr Ile Cys Asn Val Asn His Lys Pro Ser Asn Thr
        195                 200                 205

Lys Val Asp Lys Lys Val Glu Pro Lys Ser Cys Asp Lys Thr His Thr
    210                 215                 220

Cys Pro Pro Cys Pro Ala Pro Glu Leu Leu Gly Gly Pro Ser Val Phe
```

```
                225                 230                 235                 240
Leu Phe Pro Pro Lys Pro Lys Asp Thr Leu Met Ile Ser Arg Thr Pro
                    245                 250                 255

Glu Val Thr Cys Val Val Val Asp Val Ser His Glu Asp Pro Glu Val
                    260                 265                 270

Lys Phe Asn Trp Tyr Val Asp Gly Val Glu Val His Asn Ala Lys Thr
                    275                 280                 285

Lys Pro Arg Glu Glu Gln Tyr Asn Ser Thr Tyr Arg Val Val Ser Val
                290                 295                 300

Leu Thr Val Leu His Gln Asp Trp Leu Asn Gly Lys Glu Tyr Lys Cys
305                 310                 315                 320

Lys Val Ser Asn Lys Ala Leu Pro Ala Pro Ile Glu Lys Thr Ile Ser
                    325                 330                 335

Lys Ala Lys Gly Gln Pro Arg Glu Pro Gln Val Tyr Thr Leu Pro Pro
                    340                 345                 350

Ser Arg Glu Glu Met Thr Lys Asn Gln Val Ser Leu Thr Cys Leu Val
                    355                 360                 365

Lys Gly Phe Tyr Pro Ser Asp Ile Ala Val Glu Trp Glu Ser Asn Gly
                    370                 375                 380

Gln Pro Glu Asn Asn Tyr Lys Thr Thr Pro Pro Val Leu Asp Ser Asp
385                 390                 395                 400

Gly Ser Phe Phe Leu Tyr Ser Lys Leu Thr Val Asp Lys Ser Arg Trp
                    405                 410                 415

Gln Gln Gly Asn Val Phe Ser Cys Ser Val Met His Glu Ala Leu His
                    420                 425                 430

Asn His Tyr Thr Gln Lys Ser Leu Ser Leu Ser Pro Gly Lys
                    435                 440                 445

<210> SEQ ID NO 184
<211> LENGTH: 443
<212> TYPE: PRT
<213> ORGANISM: Artificial Sequence
<220> FEATURE:
<223> OTHER INFORMATION: P1-A08HC

<400> SEQUENCE: 184

Gln Ser Leu Glu Glu Ser Gly Gly Arg Leu Val Thr Pro Gly Thr Pro
1               5                   10                  15

Leu Thr Leu Thr Cys Thr Ala Ser Gly Phe Ser Leu Ser Thr Tyr Tyr
                    20                  25                  30

Met Ser Trp Val Arg Gln Ala Pro Gly Lys Gly Leu Glu Trp Ile Gly
                    35                  40                  45

Ile Val Tyr Pro Ser Gly Thr Thr Tyr Ala Asn Trp Ala Lys Gly
                50                  55                  60

Arg Phe Thr Ile Ser Thr Ala Ser Thr Thr Val Asp Leu Met Ile Thr
65                  70                  75                  80

Ser Pro Thr Thr Glu Asp Thr Ala Thr Tyr Phe Cys Ala Arg Gly Asp
                    85                  90                  95

Ser Phe Gly Tyr Gly Leu Trp Gly Pro Gly Thr Leu Val Thr Val Ser
                    100                 105                 110

Ser Ala Ser Thr Lys Gly Pro Ser Val Phe Pro Leu Ala Pro Ser Ser
                    115                 120                 125

Lys Ser Thr Ser Gly Gly Thr Ala Ala Leu Gly Cys Leu Val Lys Asp
                130                 135                 140

Tyr Phe Pro Glu Pro Val Thr Val Ser Trp Asn Ser Gly Ala Leu Thr
```

```
            145                 150                 155                 160
        Ser Gly Val His Thr Phe Pro Ala Val Leu Gln Ser Ser Gly Leu Tyr
                    165                 170                 175

Ser Leu Ser Ser Val Val Thr Val Pro Ser Ser Ser Leu Gly Thr Gln
                    180                 185                 190

Thr Tyr Ile Cys Asn Val Asn His Lys Pro Ser Asn Thr Lys Val Asp
                    195                 200                 205

Lys Lys Val Glu Pro Lys Ser Cys Asp Lys Thr His Thr Cys Pro Pro
                    210                 215                 220

Cys Pro Ala Pro Glu Leu Leu Gly Gly Pro Ser Val Phe Leu Phe Pro
        225                 230                 235                 240

Pro Lys Pro Lys Asp Thr Leu Met Ile Ser Arg Thr Pro Glu Val Thr
                    245                 250                 255

Cys Val Val Val Asp Val Ser His Glu Asp Pro Glu Val Lys Phe Asn
                    260                 265                 270

Trp Tyr Val Asp Gly Val Glu Val His Asn Ala Lys Thr Lys Pro Arg
                    275                 280                 285

Glu Glu Gln Tyr Asn Ser Thr Tyr Arg Val Val Ser Val Leu Thr Val
                    290                 295                 300

Leu His Gln Asp Trp Leu Asn Gly Lys Glu Tyr Lys Cys Lys Val Ser
        305                 310                 315                 320

Asn Lys Ala Leu Pro Ala Pro Ile Glu Lys Thr Ile Ser Lys Ala Lys
                    325                 330                 335

Gly Gln Pro Arg Glu Pro Gln Val Tyr Thr Leu Pro Pro Ser Arg Glu
                    340                 345                 350

Glu Met Thr Lys Asn Gln Val Ser Leu Thr Cys Leu Val Lys Gly Phe
                    355                 360                 365

Tyr Pro Ser Asp Ile Ala Val Glu Trp Glu Ser Asn Gly Gln Pro Glu
                    370                 375                 380

Asn Asn Tyr Lys Thr Thr Pro Pro Val Leu Asp Ser Asp Gly Ser Phe
        385                 390                 395                 400

Phe Leu Tyr Ser Lys Leu Thr Val Asp Lys Ser Arg Trp Gln Gln Gly
                    405                 410                 415

Asn Val Phe Ser Cys Ser Val Met His Glu Ala Leu His Asn His Tyr
                    420                 425                 430

Thr Gln Lys Ser Leu Ser Leu Ser Pro Gly Lys
                    435                 440

<210> SEQ ID NO 185
<211> LENGTH: 452
<212> TYPE: PRT
<213> ORGANISM: Artificial Sequence
<220> FEATURE:
<223> OTHER INFORMATION: P1-F02HC

<400> SEQUENCE: 185

Gln Ser Leu Glu Glu Ser Gly Gly Arg Leu Val Thr Pro Gly Thr Pro
        1               5                   10                  15

Leu Thr Leu Thr Cys Thr Ala Ser Gly Phe Ser Leu Ser Asn Tyr Tyr
                    20                  25                  30

Met Gly Trp Val Arg Gln Ala Pro Gly Glu Gly Leu Glu Trp Ile Gly
                    35                  40                  45

Ile Ile Tyr Ala Ser Gly Ser Thr Tyr Tyr Ala Ser Trp Ala Lys Gly
                    50                  55                  60

Arg Phe Thr Ile Ser Lys Thr Ser Thr Thr Val Asp Leu Lys Met Thr
```

```
                65                  70                  75                  80
        Ser Leu Thr Thr Glu Asp Thr Ala Thr Tyr Phe Cys Ala Arg Ile Asp
                        85                  90                  95
        Ile Gly Val Gly Asp Tyr Gly Trp Ala Tyr Asp Arg Leu Asp Leu Trp
                        100                 105                 110
        Gly Gln Gly Thr Leu Val Thr Val Ser Ser Ala Ser Thr Lys Gly Pro
                        115                 120                 125
        Ser Val Phe Pro Leu Ala Pro Ser Ser Lys Ser Thr Ser Gly Gly Thr
                130                 135                 140
        Ala Ala Leu Gly Cys Leu Val Lys Asp Tyr Phe Pro Glu Pro Val Thr
        145                 150                 155                 160
        Val Ser Trp Asn Ser Gly Ala Leu Thr Ser Gly Val His Thr Phe Pro
                        165                 170                 175
        Ala Val Leu Gln Ser Ser Gly Leu Tyr Ser Leu Ser Ser Val Val Thr
                        180                 185                 190
        Val Pro Ser Ser Ser Leu Gly Thr Gln Thr Tyr Ile Cys Asn Val Asn
                        195                 200                 205
        His Lys Pro Ser Asn Thr Lys Val Asp Lys Lys Val Glu Pro Lys Ser
                210                 215                 220
        Cys Asp Lys Thr His Thr Cys Pro Pro Cys Pro Ala Pro Glu Leu Leu
        225                 230                 235                 240
        Gly Gly Pro Ser Val Phe Leu Phe Pro Pro Lys Pro Lys Asp Thr Leu
                        245                 250                 255
        Met Ile Ser Arg Thr Pro Glu Val Thr Cys Val Val Val Asp Val Ser
                        260                 265                 270
        His Glu Asp Pro Glu Val Lys Phe Asn Trp Tyr Val Asp Gly Val Glu
                        275                 280                 285
        Val His Asn Ala Lys Thr Lys Pro Arg Glu Glu Gln Tyr Asn Ser Thr
                290                 295                 300
        Tyr Arg Val Val Ser Val Leu Thr Val Leu His Gln Asp Trp Leu Asn
        305                 310                 315                 320
        Gly Lys Glu Tyr Lys Cys Lys Val Ser Asn Lys Ala Leu Pro Ala Pro
                        325                 330                 335
        Ile Glu Lys Thr Ile Ser Lys Ala Lys Gly Gln Pro Arg Glu Pro Gln
                        340                 345                 350
        Val Tyr Thr Leu Pro Pro Ser Arg Glu Glu Met Thr Lys Asn Gln Val
                        355                 360                 365
        Ser Leu Thr Cys Leu Val Lys Gly Phe Tyr Pro Ser Asp Ile Ala Val
                370                 375                 380
        Glu Trp Glu Ser Asn Gly Gln Pro Glu Asn Asn Tyr Lys Thr Thr Pro
        385                 390                 395                 400
        Pro Val Leu Asp Ser Asp Gly Ser Phe Phe Leu Tyr Ser Lys Leu Thr
                        405                 410                 415
        Val Asp Lys Ser Arg Trp Gln Gln Gly Asn Val Phe Ser Cys Ser Val
                        420                 425                 430
        Met His Glu Ala Leu His Asn His Tyr Thr Gln Lys Ser Leu Ser Leu
                        435                 440                 445
        Ser Pro Gly Lys
                450

<210> SEQ ID NO 186
<211> LENGTH: 451
<212> TYPE: PRT
<213> ORGANISM: Artificial Sequence
```

<220> FEATURE:
<223> OTHER INFORMATION: P2-A01HC

<400> SEQUENCE: 186

```
Gln Glu Gln Leu Val Glu Ser Gly Gly Arg Leu Val Thr Pro Gly Thr
1               5                   10                  15

Pro Leu Thr Leu Ser Cys Thr Ala Ser Gly Phe Phe Leu Ser Gly Tyr
            20                  25                  30

Tyr Met Ser Trp Val Arg Gln Ala Pro Gly Lys Gly Leu Glu Trp Ile
        35                  40                  45

Gly Ile Ile Tyr Pro Ser Gly Ser Thr Asp Tyr Ala Ser Trp Ala Lys
    50                  55                  60

Gly Arg Phe Thr Ile Ser Lys Thr Ser Thr Thr Val Asp Leu Lys Ile
65                  70                  75                  80

Thr Thr Pro Thr Thr Glu Asp Thr Ala Thr Tyr Phe Cys Ala Arg Val
                85                  90                  95

Ala Gly Tyr Val Gly Tyr Gly Tyr Glu Thr Phe Phe Asp Ile Trp Gly
            100                 105                 110

Pro Gly Thr Leu Val Thr Val Ser Leu Ala Ser Thr Lys Gly Pro Ser
        115                 120                 125

Val Phe Pro Leu Ala Pro Ser Ser Lys Ser Thr Ser Gly Gly Thr Ala
    130                 135                 140

Ala Leu Gly Cys Leu Val Lys Asp Tyr Phe Pro Glu Pro Val Thr Val
145                 150                 155                 160

Ser Trp Asn Ser Gly Ala Leu Thr Ser Gly Val His Thr Phe Pro Ala
                165                 170                 175

Val Leu Gln Ser Ser Gly Leu Tyr Ser Leu Ser Ser Val Val Thr Val
            180                 185                 190

Pro Ser Ser Ser Leu Gly Thr Gln Thr Tyr Ile Cys Asn Val Asn His
        195                 200                 205

Lys Pro Ser Asn Thr Lys Val Asp Lys Lys Val Glu Pro Lys Ser Cys
    210                 215                 220

Asp Lys Thr His Thr Cys Pro Pro Cys Pro Ala Pro Glu Leu Leu Gly
225                 230                 235                 240

Gly Pro Ser Val Phe Leu Phe Pro Pro Lys Pro Lys Asp Thr Leu Met
                245                 250                 255

Ile Ser Arg Thr Pro Glu Val Thr Cys Val Val Val Asp Val Ser His
            260                 265                 270

Glu Asp Pro Glu Val Lys Phe Asn Trp Tyr Val Asp Gly Val Glu Val
        275                 280                 285

His Asn Ala Lys Thr Lys Pro Arg Glu Glu Gln Tyr Asn Ser Thr Tyr
    290                 295                 300

Arg Val Val Ser Val Leu Thr Val Leu His Gln Asp Trp Leu Asn Gly
305                 310                 315                 320

Lys Glu Tyr Lys Cys Lys Val Ser Asn Lys Ala Leu Pro Ala Pro Ile
                325                 330                 335

Glu Lys Thr Ile Ser Lys Ala Lys Gly Gln Pro Arg Glu Pro Gln Val
            340                 345                 350

Tyr Thr Leu Pro Pro Ser Arg Glu Glu Met Thr Lys Asn Gln Val Ser
        355                 360                 365

Leu Thr Cys Leu Val Lys Gly Phe Tyr Pro Ser Asp Ile Ala Val Glu
    370                 375                 380

Trp Glu Ser Asn Gly Gln Pro Glu Asn Asn Tyr Lys Thr Thr Pro Pro
385                 390                 395                 400
```

-continued

```
Val Leu Asp Ser Asp Gly Ser Phe Phe Leu Tyr Ser Lys Leu Thr Val
                405                 410                 415

Asp Lys Ser Arg Trp Gln Gln Gly Asn Val Phe Ser Cys Ser Val Met
            420                 425                 430

His Glu Ala Leu His Asn His Tyr Thr Gln Lys Ser Leu Ser Leu Ser
        435                 440                 445

Pro Gly Lys
    450

<210> SEQ ID NO 187
<211> LENGTH: 446
<212> TYPE: PRT
<213> ORGANISM: Artificial Sequence
<220> FEATURE:
<223> OTHER INFORMATION: P2-A03HC

<400> SEQUENCE: 187

Gln Ser Val Glu Glu Ser Gly Gly Arg Leu Val Thr Pro Gly Thr Pro
1               5                   10                  15

Leu Thr Leu Thr Cys Thr Val Ser Gly Phe Ser Leu Asn Asn Tyr Asp
            20                  25                  30

Met Ser Trp Val Arg Gln Ala Pro Gly Lys Gly Leu Glu Tyr Ile Gly
        35                  40                  45

Phe Met Asp Thr Asp Gly Ser Ala Tyr Tyr Ala Thr Trp Ala Lys Gly
    50                  55                  60

Arg Phe Thr Ile Ser Arg Thr Ser Thr Val Asp Leu Lys Met Thr
65                  70                  75                  80

Ser Pro Thr Thr Glu Asp Thr Ala Thr Tyr Phe Cys Ala Arg Arg Gly
                85                  90                  95

Ser Ser Tyr Tyr Gly Gly Ile Asp Ile Trp Gly Pro Gly Thr Pro Val
            100                 105                 110

Thr Val Ser Leu Ala Ser Thr Lys Gly Pro Ser Val Phe Pro Leu Ala
        115                 120                 125

Pro Ser Ser Lys Ser Thr Ser Gly Gly Thr Ala Ala Leu Gly Cys Leu
    130                 135                 140

Val Lys Asp Tyr Phe Pro Glu Pro Val Thr Val Ser Trp Asn Ser Gly
145                 150                 155                 160

Ala Leu Thr Ser Gly Val His Thr Phe Pro Ala Val Leu Gln Ser Ser
                165                 170                 175

Gly Leu Tyr Ser Leu Ser Ser Val Val Thr Val Pro Ser Ser Ser Leu
            180                 185                 190

Gly Thr Gln Thr Tyr Ile Cys Asn Val Asn His Lys Pro Ser Asn Thr
        195                 200                 205

Lys Val Asp Lys Lys Val Glu Pro Lys Ser Cys Asp Lys Thr His Thr
    210                 215                 220

Cys Pro Pro Cys Pro Ala Pro Glu Leu Leu Gly Gly Pro Ser Val Phe
225                 230                 235                 240

Leu Phe Pro Pro Lys Pro Lys Asp Thr Leu Met Ile Ser Arg Thr Pro
                245                 250                 255

Glu Val Thr Cys Val Val Val Asp Val Ser His Glu Asp Pro Glu Val
            260                 265                 270

Lys Phe Asn Trp Tyr Val Asp Gly Val Glu Val His Asn Ala Lys Thr
        275                 280                 285

Lys Pro Arg Glu Glu Gln Tyr Asn Ser Thr Tyr Arg Val Val Ser Val
    290                 295                 300
```

-continued

```
Leu Thr Val Leu His Gln Asp Trp Leu Asn Gly Lys Glu Tyr Lys Cys
305                 310                 315                 320

Lys Val Ser Asn Lys Ala Leu Pro Ala Pro Ile Glu Lys Thr Ile Ser
                325                 330                 335

Lys Ala Lys Gly Gln Pro Arg Glu Pro Gln Val Tyr Thr Leu Pro Pro
            340                 345                 350

Ser Arg Glu Glu Met Thr Lys Asn Gln Val Ser Leu Thr Cys Leu Val
        355                 360                 365

Lys Gly Phe Tyr Pro Ser Asp Ile Ala Val Glu Trp Glu Ser Asn Gly
    370                 375                 380

Gln Pro Glu Asn Asn Tyr Lys Thr Thr Pro Pro Val Leu Asp Ser Asp
385                 390                 395                 400

Gly Ser Phe Phe Leu Tyr Ser Lys Leu Thr Val Asp Lys Ser Arg Trp
                405                 410                 415

Gln Gln Gly Asn Val Phe Ser Cys Ser Val Met His Glu Ala Leu His
            420                 425                 430

Asn His Tyr Thr Gln Lys Ser Leu Ser Leu Ser Pro Gly Lys
        435                 440                 445

<210> SEQ ID NO 188
<211> LENGTH: 443
<212> TYPE: PRT
<213> ORGANISM: Artificial Sequence
<220> FEATURE:
<223> OTHER INFORMATION: P2-F07HC

<400> SEQUENCE: 188

Gln Ser Leu Glu Glu Ser Gly Gly Arg Leu Val Thr Pro Gly Thr Pro
1               5                   10                  15

Leu Thr Leu Thr Cys Thr Ala Ser Gly Phe Ser Leu Ser Ser Tyr Tyr
                20                  25                  30

Met Asn Trp Val Arg Gln Ala Pro Gly Lys Gly Leu Glu Trp Ile Gly
            35                  40                  45

Ile Ile Tyr Pro Ser Gly Thr Thr Tyr Tyr Ala Gly Trp Ala Lys Gly
        50                  55                  60

Arg Phe Thr Ile Ser Lys Thr Ser Thr Thr Val Asp Leu Lys Ile Thr
65                  70                  75                  80

Ser Pro Thr Ser Glu Asp Thr Ala Thr Tyr Phe Cys Ala Arg Thr Val
                85                  90                  95

Ser Gly Tyr Phe Asp Ile Trp Gly Pro Gly Thr Leu Val Thr Val Ser
                100                 105                 110

Leu Ala Ser Thr Lys Gly Pro Ser Val Phe Pro Leu Ala Pro Ser Ser
            115                 120                 125

Lys Ser Thr Ser Gly Gly Thr Ala Ala Leu Gly Cys Leu Val Lys Asp
        130                 135                 140

Tyr Phe Pro Glu Pro Val Thr Val Ser Trp Asn Ser Gly Ala Leu Thr
145                 150                 155                 160

Ser Gly Val His Thr Phe Pro Ala Val Leu Gln Ser Ser Gly Leu Tyr
                165                 170                 175

Ser Leu Ser Ser Val Val Thr Val Pro Ser Ser Ser Leu Gly Thr Gln
            180                 185                 190

Thr Tyr Ile Cys Asn Val Asn His Lys Pro Ser Asn Thr Lys Val Asp
        195                 200                 205

Lys Lys Val Glu Pro Lys Ser Cys Asp Lys Thr His Thr Cys Pro Pro
    210                 215                 220
```

```
Cys Pro Ala Pro Glu Leu Leu Gly Gly Pro Ser Val Phe Leu Phe Pro
225                 230                 235                 240

Pro Lys Pro Lys Asp Thr Leu Met Ile Ser Arg Thr Pro Glu Val Thr
                245                 250                 255

Cys Val Val Val Asp Val Ser His Glu Asp Pro Glu Val Lys Phe Asn
                260                 265                 270

Trp Tyr Val Asp Gly Val Glu Val His Asn Ala Lys Thr Lys Pro Arg
            275                 280                 285

Glu Glu Gln Tyr Asn Ser Thr Tyr Arg Val Val Ser Val Leu Thr Val
        290                 295                 300

Leu His Gln Asp Trp Leu Asn Gly Lys Glu Tyr Lys Cys Lys Val Ser
305                 310                 315                 320

Asn Lys Ala Leu Pro Ala Pro Ile Glu Lys Thr Ile Ser Lys Ala Lys
                325                 330                 335

Gly Gln Pro Arg Glu Pro Gln Val Tyr Thr Leu Pro Pro Ser Arg Glu
                340                 345                 350

Glu Met Thr Lys Asn Gln Val Ser Leu Thr Cys Leu Val Lys Gly Phe
            355                 360                 365

Tyr Pro Ser Asp Ile Ala Val Glu Trp Glu Ser Asn Gly Gln Pro Glu
        370                 375                 380

Asn Asn Tyr Lys Thr Thr Pro Pro Val Leu Asp Ser Asp Gly Ser Phe
385                 390                 395                 400

Phe Leu Tyr Ser Lys Leu Thr Val Asp Lys Ser Arg Trp Gln Gln Gly
                405                 410                 415

Asn Val Phe Ser Cys Ser Val Met His Glu Ala Leu His Asn His Tyr
                420                 425                 430

Thr Gln Lys Ser Leu Ser Leu Ser Pro Gly Lys
                435                 440

<210> SEQ ID NO 189
<211> LENGTH: 444
<212> TYPE: PRT
<213> ORGANISM: Artificial Sequence
<220> FEATURE:
<223> OTHER INFORMATION: P2-F11HC

<400> SEQUENCE: 189

Gln Glu Gln Leu Val Glu Ser Gly Gly Arg Leu Val Thr Pro Gly Thr
1               5                   10                  15

Thr Leu Thr Leu Thr Cys Thr Val Ser Gly Phe Ser Leu Ser Ser Tyr
                20                  25                  30

Gly Val Ser Trp Val Arg Gln Ala Pro Gly Lys Gly Leu Glu Trp Ile
            35                  40                  45

Gly Tyr Ile Ala Asn Asn Tyr Asn Pro His Tyr Ala Ser Trp Ala Lys
        50                  55                  60

Gly Arg Phe Thr Ile Ser Lys Thr Ser Thr Thr Val Asp Leu Lys
65                  70                  75                  80

Met Thr Ser Leu Thr Thr Glu Asp Thr Ala Thr Tyr Phe Cys Ala Arg
                85                  90                  95

Asp Asn Tyr Gly Met Asp Pro Trp Gly Pro Gly Thr Leu Val Thr Val
                100                 105                 110

Ser Ser Ala Ser Thr Lys Gly Pro Ser Val Phe Pro Leu Ala Pro Ser
            115                 120                 125

Ser Lys Ser Thr Ser Gly Gly Thr Ala Ala Leu Gly Cys Leu Val Lys
        130                 135                 140
```

Asp Tyr Phe Pro Glu Pro Val Thr Val Ser Trp Asn Ser Gly Ala Leu
145                 150                 155                 160

Thr Ser Gly Val His Thr Phe Pro Ala Val Leu Gln Ser Ser Gly Leu
                165                 170                 175

Tyr Ser Leu Ser Ser Val Val Thr Val Pro Ser Ser Ser Leu Gly Thr
            180                 185                 190

Gln Thr Tyr Ile Cys Asn Val Asn His Lys Pro Ser Asn Thr Lys Val
        195                 200                 205

Asp Lys Lys Val Glu Pro Lys Ser Cys Asp Lys Thr His Thr Cys Pro
210                 215                 220

Pro Cys Pro Ala Pro Glu Leu Leu Gly Gly Pro Ser Val Phe Leu Phe
225                 230                 235                 240

Pro Pro Lys Pro Lys Asp Thr Leu Met Ile Ser Arg Thr Pro Glu Val
                245                 250                 255

Thr Cys Val Val Val Asp Val Ser His Glu Asp Pro Glu Val Lys Phe
            260                 265                 270

Asn Trp Tyr Val Asp Gly Val Glu Val His Asn Ala Lys Thr Lys Pro
        275                 280                 285

Arg Glu Glu Gln Tyr Asn Ser Thr Tyr Arg Val Val Ser Val Leu Thr
290                 295                 300

Val Leu His Gln Asp Trp Leu Asn Gly Lys Glu Tyr Lys Cys Lys Val
305                 310                 315                 320

Ser Asn Lys Ala Leu Pro Ala Pro Ile Glu Lys Thr Ile Ser Lys Ala
                325                 330                 335

Lys Gly Gln Pro Arg Glu Pro Gln Val Tyr Thr Leu Pro Pro Ser Arg
            340                 345                 350

Glu Glu Met Thr Lys Asn Gln Val Ser Leu Thr Cys Leu Val Lys Gly
        355                 360                 365

Phe Tyr Pro Ser Asp Ile Ala Val Glu Trp Glu Ser Asn Gly Gln Pro
370                 375                 380

Glu Asn Asn Tyr Lys Thr Thr Pro Pro Val Leu Asp Ser Asp Gly Ser
385                 390                 395                 400

Phe Phe Leu Tyr Ser Lys Leu Thr Val Asp Lys Ser Arg Trp Gln Gln
                405                 410                 415

Gly Asn Val Phe Ser Cys Ser Val Met His Glu Ala Leu His Asn His
            420                 425                 430

Tyr Thr Gln Lys Ser Leu Ser Leu Ser Pro Gly Lys
        435                 440

<210> SEQ ID NO 190
<211> LENGTH: 217
<212> TYPE: PRT
<213> ORGANISM: Artificial Sequence
<220> FEATURE:
<223> OTHER INFORMATION: P2-C12LC

<400> SEQUENCE: 190

Glu Leu Asp Met Thr Gln Thr Pro Ser Ser Val Ser Ala Ala Val Gly
1               5                   10                  15

Gly Thr Val Thr Ile Lys Cys Gln Ala Ser Gln Ser Ile Ser Ser Tyr
            20                  25                  30

Leu Ser Trp Tyr Gln Gln Lys Pro Gly Gln Pro Pro Lys Leu Leu Ile
        35                  40                  45

Tyr Glu Ala Ser Lys Leu Ala Ser Gly Val Pro Ser Arg Phe Ser Gly
    50                  55                  60

```
Ser Gly Tyr Gly Thr Glu Phe Thr Leu Thr Ile Ser Asp Leu Glu Cys
 65                  70                  75                  80

Ala Asp Ala Ala Thr Tyr Tyr Cys Gln Gln Gly Tyr Ser Ser Thr Asn
                 85                  90                  95

Val Trp Asn Ala Phe Gly Gly Thr Asn Val Glu Ile Lys Arg Ser
            100                 105                 110

Val Ala Ala Pro Ser Val Phe Ile Phe Pro Pro Ser Asp Glu Gln Leu
            115                 120                 125

Lys Ser Gly Thr Ala Ser Val Val Cys Leu Leu Asn Asn Phe Tyr Pro
            130                 135                 140

Arg Glu Ala Lys Val Gln Trp Lys Val Asp Asn Ala Leu Gln Ser Gly
145                 150                 155                 160

Asn Ser Gln Glu Ser Val Thr Glu Gln Asp Ser Lys Asp Ser Thr Tyr
                165                 170                 175

Ser Leu Ser Ser Thr Leu Thr Leu Ser Lys Ala Asp Tyr Glu Lys His
            180                 185                 190

Lys Val Tyr Ala Cys Glu Val Thr His Gln Gly Leu Ser Ser Pro Val
            195                 200                 205

Thr Lys Ser Phe Asn Arg Gly Glu Cys
            210                 215

<210> SEQ ID NO 191
<211> LENGTH: 213
<212> TYPE: PRT
<213> ORGANISM: Artificial Sequence
<220> FEATURE:
<223> OTHER INFORMATION: 13B4LC

<400> SEQUENCE: 191

Ser Tyr Glu Leu Thr Gln Pro Leu Ser Val Ser Val Ser Pro Gly Gln
  1               5                  10                  15

Thr Ala Ser Ile Thr Cys Ser Gly Asp Lys Leu Gly Asn Val Tyr Ala
             20                  25                  30

Ser Trp Tyr Gln Gln Lys Pro Gly Gln Ser Pro Thr Leu Val Ile Tyr
         35                  40                  45

Gln Asp Asn Lys Arg Pro Ser Gly Ile Pro Glu Arg Phe Ser Gly Ser
 50                  55                  60

Asn Ser Gly Lys Thr Ala Thr Leu Thr Ile Ser Gly Thr Gln Ala Leu
 65                  70                  75                  80

Asp Glu Ala Asp Tyr Tyr Cys Gln Ala Trp Asp Ser Ser Thr Ala Val
                 85                  90                  95

Phe Gly Gly Gly Thr Lys Leu Thr Val Leu Arg Ser Val Ala Ala Pro
            100                 105                 110

Ser Val Phe Ile Phe Pro Pro Ser Asp Glu Gln Leu Lys Ser Gly Thr
            115                 120                 125

Ala Ser Val Val Cys Leu Leu Asn Asn Phe Tyr Pro Arg Glu Ala Lys
            130                 135                 140

Val Gln Trp Lys Val Asp Asn Ala Leu Gln Ser Gly Asn Ser Gln Glu
145                 150                 155                 160

Ser Val Thr Glu Gln Asp Ser Lys Asp Ser Thr Tyr Ser Leu Ser Ser
                165                 170                 175

Thr Leu Thr Leu Ser Lys Ala Asp Tyr Glu Lys His Lys Val Tyr Ala
            180                 185                 190

Cys Glu Val Thr His Gln Gly Leu Ser Ser Pro Val Thr Lys Ser Phe
            195                 200                 205
```

Asn Arg Gly Glu Cys
    210

<210> SEQ ID NO 192
<211> LENGTH: 219
<212> TYPE: PRT
<213> ORGANISM: Artificial Sequence
<220> FEATURE:
<223> OTHER INFORMATION: 13F7LC

<400> SEQUENCE: 192

Asp Ile Val Met Thr Gln Thr Pro Leu Ser Leu Pro Val Ala Pro Gly
1               5                   10                  15

Glu Pro Ala Ser Ile Ser Cys Arg Ser Gln Ser Leu Leu His Ser
            20                  25                  30

Asn Gly Tyr Asn Tyr Leu Asp Trp Tyr Val Gln Lys Pro Gly Gln Pro
        35                  40                  45

Pro Gln Leu Leu Ile Tyr Leu Gly Ser Asn Arg Ala Ser Gly Val Pro
    50                  55                  60

Asp Arg Phe Ser Gly Ser Gly Ser Gly Thr Asp Phe Thr Leu Lys Ile
65                  70                  75                  80

Ser Arg Val Glu Ala Glu Asp Val Gly Val Tyr Tyr Cys Met Gln Ala
                85                  90                  95

Arg Gln Thr Pro Leu Thr Phe Gly Gly Gly Thr Lys Val Glu Ile Lys
            100                 105                 110

Arg Ser Val Ala Ala Pro Ser Val Phe Ile Phe Pro Pro Ser Asp Glu
        115                 120                 125

Gln Leu Lys Ser Gly Thr Ala Ser Val Val Cys Leu Leu Asn Asn Phe
    130                 135                 140

Tyr Pro Arg Glu Ala Lys Val Gln Trp Lys Val Asp Asn Ala Leu Gln
145                 150                 155                 160

Ser Gly Asn Ser Gln Glu Ser Val Thr Glu Gln Asp Ser Lys Asp Ser
                165                 170                 175

Thr Tyr Ser Leu Ser Ser Thr Leu Thr Leu Ser Lys Ala Asp Tyr Glu
            180                 185                 190

Lys His Lys Val Tyr Ala Cys Glu Val Thr His Gln Gly Leu Ser Ser
        195                 200                 205

Pro Val Thr Lys Ser Phe Asn Arg Gly Glu Cys
    210                 215

<210> SEQ ID NO 193
<211> LENGTH: 214
<212> TYPE: PRT
<213> ORGANISM: Artificial Sequence
<220> FEATURE:
<223> OTHER INFORMATION: 15A9LC

<400> SEQUENCE: 193

Asp Ile Gln Met Thr Gln Ser Pro Ser Ser Leu Ser Ala Ser Val Gly
1               5                   10                  15

Asp Arg Ile Thr Ile Ser Cys Arg Ala Ser Gln Ser Ile Ser Thr Ser
            20                  25                  30

Leu Asn Trp Tyr Gln Gln Thr Pro Gly Lys Ala Pro Arg Leu Leu Ile
        35                  40                  45

Tyr Gly Ala Ser Thr Leu Gln Ser Gly Val Pro Ser Arg Phe Ser Gly
    50                  55                  60

Gly Gly Ser Gly Thr Asp Phe Ser Leu Thr Ile Thr Ser Leu Gln Pro

```
                65                  70                  75                  80
Glu Asp Phe Ala Thr Tyr Tyr Cys Gln Glu Ser Ala Ser Ile Pro Arg
                    85                  90                  95

Thr Phe Gly Gln Gly Thr Lys Leu Asp Ile Lys Arg Ser Val Ala Ala
            100                 105                 110

Pro Ser Val Phe Ile Phe Pro Ser Asp Glu Gln Leu Lys Ser Gly
            115                 120                 125

Thr Ala Ser Val Val Cys Leu Leu Asn Asn Phe Tyr Pro Arg Glu Ala
            130                 135                 140

Lys Val Gln Trp Lys Val Asp Asn Ala Leu Gln Ser Gly Asn Ser Gln
145                 150                 155                 160

Glu Ser Val Thr Glu Gln Asp Ser Lys Asp Ser Thr Tyr Ser Leu Ser
                165                 170                 175

Ser Thr Leu Thr Leu Ser Lys Ala Asp Tyr Glu Lys His Lys Val Tyr
            180                 185                 190

Ala Cys Glu Val Thr His Gln Gly Leu Ser Ser Pro Val Thr Lys Ser
            195                 200                 205

Phe Asn Arg Gly Glu Cys
            210

<210> SEQ ID NO 194
<211> LENGTH: 217
<212> TYPE: PRT
<213> ORGANISM: Artificial Sequence
<220> FEATURE:
<223> OTHER INFORMATION: P1-A03LC

<400> SEQUENCE: 194

Glu Leu Val Met Thr Gln Thr Pro Pro Ser Leu Ser Ala Ser Val Gly
1               5                   10                  15

Glu Thr Val Arg Ile Arg Cys Leu Ala Ser Glu Asp Ile Tyr Ser Gly
                20                  25                  30

Ile Ser Trp Tyr Gln Gln Lys Pro Glu Lys Pro Pro Thr Leu Leu Ile
            35                  40                  45

Ser Gly Ala Ser Asn Leu Glu Ser Gly Val Pro Pro Arg Phe Ser Gly
50                  55                  60

Ser Gly Ser Gly Thr Asp Tyr Thr Leu Thr Ile Gly Gly Val Gln Ala
65                  70                  75                  80

Glu Asp Ala Ala Thr Tyr Tyr Cys Leu Gly Gly Tyr Ser Tyr Ser Ser
                85                  90                  95

Thr Gly Leu Thr Phe Gly Ala Gly Thr Asn Val Glu Ile Lys Arg Ser
            100                 105                 110

Val Ala Ala Pro Ser Val Phe Ile Phe Pro Pro Ser Asp Glu Gln Leu
            115                 120                 125

Lys Ser Gly Thr Ala Ser Val Val Cys Leu Leu Asn Asn Phe Tyr Pro
            130                 135                 140

Arg Glu Ala Lys Val Gln Trp Lys Val Asp Asn Ala Leu Gln Ser Gly
145                 150                 155                 160

Asn Ser Gln Glu Ser Val Thr Glu Gln Asp Ser Lys Asp Ser Thr Tyr
                165                 170                 175

Ser Leu Ser Ser Thr Leu Thr Leu Ser Lys Ala Asp Tyr Glu Lys His
            180                 185                 190

Lys Val Tyr Ala Cys Glu Val Thr His Gln Gly Leu Ser Ser Pro Val
            195                 200                 205

Thr Lys Ser Phe Asn Arg Gly Glu Cys
```

<210> SEQ ID NO 195
<211> LENGTH: 217
<212> TYPE: PRT
<213> ORGANISM: Artificial Sequence
<220> FEATURE:
<223> OTHER INFORMATION: P1-A08LC

<400> SEQUENCE: 195

```
Glu Leu Val Leu Thr Gln Ser Pro Ser Val Gln Val Asn Leu Gly Gln
1               5                   10                  15

Thr Val Ser Leu Thr Cys Thr Ala Asp Thr Leu Ser Arg Ser Tyr Ala
            20                  25                  30

Ser Trp Tyr Gln Gln Lys Pro Gly Gln Ala Pro Val Leu Leu Ile Tyr
        35                  40                  45

Arg Asp Thr Ser Arg Pro Ser Gly Val Pro Asp Arg Phe Ser Gly Ser
    50                  55                  60

Ser Ser Gly Asn Thr Ala Thr Leu Thr Ile Ser Gly Ala Gln Ala Gly
65                  70                  75                  80

Asp Glu Ala Asp Tyr Tyr Cys Ala Thr Ser Asp Gly Ser Gly Ser Asn
                85                  90                  95

Tyr Gln Tyr Val Phe Gly Gly Gly Thr Gln Leu Thr Val Thr Arg Ser
            100                 105                 110

Val Ala Ala Pro Ser Val Phe Ile Phe Pro Pro Ser Asp Glu Gln Leu
        115                 120                 125

Lys Ser Gly Thr Ala Ser Val Val Cys Leu Leu Asn Asn Phe Tyr Pro
    130                 135                 140

Arg Glu Ala Lys Val Gln Trp Lys Val Asp Asn Ala Leu Gln Ser Gly
145                 150                 155                 160

Asn Ser Gln Glu Ser Val Thr Glu Gln Asp Ser Lys Asp Ser Thr Tyr
                165                 170                 175

Ser Leu Ser Ser Thr Leu Thr Leu Ser Lys Ala Asp Tyr Glu Lys His
            180                 185                 190

Lys Val Tyr Ala Cys Glu Val Thr His Gln Gly Leu Ser Ser Pro Val
        195                 200                 205

Thr Lys Ser Phe Asn Arg Gly Glu Cys
    210                 215
```

<210> SEQ ID NO 196
<211> LENGTH: 215
<212> TYPE: PRT
<213> ORGANISM: Artificial Sequence
<220> FEATURE:
<223> OTHER INFORMATION: P1-F02LC

<400> SEQUENCE: 196

```
Glu Leu Asp Met Thr Gln Thr Pro Ser Leu Ser Ala Ser Val Gly
1               5                   10                  15

Glu Thr Val Arg Ile Arg Cys Leu Ala Ser Glu Asp Ile Tyr Ser Gly
            20                  25                  30

Ile Ser Trp Tyr Gln Gln Lys Pro Gly Lys Pro Pro Thr Leu Leu Ile
        35                  40                  45

Tyr Gly Ala Ser Asn Leu Glu Ser Gly Val Pro Pro Arg Phe Ser Gly
    50                  55                  60

Ser Gly Ser Gly Thr Asp Tyr Thr Leu Thr Ile Gly Gly Val Gln Ala
65                  70                  75                  80
```

Glu Asp Ala Ala Thr Tyr Tyr Cys Leu Gly Gly Tyr Ser Tyr Ser Ser
            85                  90                  95

Ile Thr Phe Gly Ala Gly Thr Asn Val Glu Ile Lys Arg Ser Val Ala
        100                 105                 110

Ala Pro Ser Val Phe Ile Phe Pro Ser Asp Glu Gln Leu Lys Ser
    115                 120                 125

Gly Thr Ala Ser Val Val Cys Leu Leu Asn Asn Phe Tyr Pro Arg Glu
130                 135                 140

Ala Lys Val Gln Trp Lys Val Asp Asn Ala Leu Gln Ser Gly Asn Ser
145                 150                 155                 160

Gln Glu Ser Val Thr Glu Gln Asp Ser Lys Asp Ser Thr Tyr Ser Leu
                165                 170                 175

Ser Ser Thr Leu Thr Leu Ser Lys Ala Asp Tyr Glu Lys His Lys Val
            180                 185                 190

Tyr Ala Cys Glu Val Thr His Gln Gly Leu Ser Ser Pro Val Thr Lys
        195                 200                 205

Ser Phe Asn Arg Gly Glu Cys
    210                 215

<210> SEQ ID NO 197
<211> LENGTH: 219
<212> TYPE: PRT
<213> ORGANISM: Artificial Sequence
<220> FEATURE:
<223> OTHER INFORMATION: P2-A01LC

<400> SEQUENCE: 197

Glu Leu Val Met Thr Gln Thr Pro Pro Ser Leu Ser Ala Ser Val Gly
1               5                   10                  15

Glu Thr Val Arg Ile Arg Cys Leu Ala Ser Glu Asp Ile Tyr Ser Gly
            20                  25                  30

Ile Ser Trp Tyr Gln Gln Lys Pro Gly Lys Pro Pro Thr Leu Leu Ile
        35                  40                  45

Tyr Gly Ala Ser Asn Leu Glu Ser Gly Val Pro Pro Arg Phe Ser Gly
    50                  55                  60

Ser Gly Ser Gly Ser Asp Tyr Thr Leu Thr Ile Gly Gly Val Gln Ala
65                  70                  75                  80

Glu Asp Ala Ala Thr Tyr Tyr Cys Leu Gly Gly Val Thr Tyr Ser Ser
            85                  90                  95

Thr Gly Thr His Leu Thr Phe Gly Ala Gly Thr Asn Val Glu Ile Lys
        100                 105                 110

Arg Ser Val Ala Ala Pro Ser Val Phe Ile Phe Pro Pro Ser Asp Glu
    115                 120                 125

Gln Leu Lys Ser Gly Thr Ala Ser Val Val Cys Leu Leu Asn Asn Phe
130                 135                 140

Tyr Pro Arg Glu Ala Lys Val Gln Trp Lys Val Asp Asn Ala Leu Gln
145                 150                 155                 160

Ser Gly Asn Ser Gln Glu Ser Val Thr Glu Gln Asp Ser Lys Asp Ser
                165                 170                 175

Thr Tyr Ser Leu Ser Ser Thr Leu Thr Leu Ser Lys Ala Asp Tyr Glu
            180                 185                 190

Lys His Lys Val Tyr Ala Cys Glu Val Thr His Gln Gly Leu Ser Ser
        195                 200                 205

Pro Val Thr Lys Ser Phe Asn Arg Gly Glu Cys
    210                 215

<210> SEQ ID NO 198
<211> LENGTH: 219
<212> TYPE: PRT
<213> ORGANISM: Artificial Sequence
<220> FEATURE:
<223> OTHER INFORMATION: P2-A03LC

<400> SEQUENCE: 198

```
Glu Leu Asp Leu Thr Gln Thr Pro Ala Ser Val Ser Glu Pro Val Gly
1               5                   10                  15

Gly Thr Val Thr Ile Lys Cys Gln Ala Ser Gln Ser Ile Gly Gly Asn
            20                  25                  30

Leu Ala Trp Tyr Gln Gln Lys Pro Gly Gln Pro Pro Lys Leu Leu Ile
        35                  40                  45

Tyr Arg Ala Ser Thr Leu Ala Ser Gly Val Pro Ser Arg Phe Lys Gly
50                  55                  60

Ser Gly Ser Gly Thr Asp Phe Thr Leu Thr Ile Ser Asp Leu Glu Cys
65                  70                  75                  80

Ala Asp Ala Ala Thr Tyr Tyr Cys Gln Ser Pro Ala Tyr Asp Pro Ala
                85                  90                  95

Ala Tyr Val Gly Asn Ala Phe Gly Gly Gly Thr Glu Leu Glu Ile Leu
            100                 105                 110

Arg Ser Val Ala Ala Pro Ser Val Phe Ile Phe Pro Pro Ser Asp Glu
        115                 120                 125

Gln Leu Lys Ser Gly Thr Ala Ser Val Val Cys Leu Leu Asn Asn Phe
    130                 135                 140

Tyr Pro Arg Glu Ala Lys Val Gln Trp Lys Val Asp Asn Ala Leu Gln
145                 150                 155                 160

Ser Gly Asn Ser Gln Glu Ser Val Thr Glu Gln Asp Ser Lys Asp Ser
                165                 170                 175

Thr Tyr Ser Leu Ser Ser Thr Leu Thr Leu Ser Lys Ala Asp Tyr Glu
            180                 185                 190

Lys His Lys Val Tyr Ala Cys Glu Val Thr His Gln Gly Leu Ser Ser
        195                 200                 205

Pro Val Thr Lys Ser Phe Asn Arg Gly Glu Cys
    210                 215
```

<210> SEQ ID NO 199
<211> LENGTH: 214
<212> TYPE: PRT
<213> ORGANISM: Artificial Sequence
<220> FEATURE:
<223> OTHER INFORMATION: P2-F07LC

<400> SEQUENCE: 199

```
Glu Leu Asp Leu Thr Gln Thr Pro Pro Ser Leu Ser Ala Ser Val Gly
1               5                   10                  15

Gly Thr Val Thr Ile Asn Cys Leu Ala Ser Glu Asp Ile Tyr Ser Ala
            20                  25                  30

Leu Ala Trp Tyr Gln Gln Lys Pro Gly Lys Pro Pro Thr Leu Leu Ile
        35                  40                  45

Ser Gly Thr Ser Asn Leu Glu Ser Gly Val Pro Pro Arg Phe Ser Gly
    50                  55                  60

Ser Gly Ser Gly Thr Asp Tyr Thr Leu Thr Ile Gly Gly Val Gln Ala
65                  70                  75                  80

Glu Asp Ala Ala Thr Tyr Phe Cys Gln Gly Tyr Ser Ser Tyr Pro Leu
                85                  90                  95
```

```
Thr Phe Gly Ala Gly Thr Asn Val Glu Ile Lys Arg Ser Val Ala Ala
                100                 105                 110

Pro Ser Val Phe Ile Phe Pro Pro Ser Asp Glu Gln Leu Lys Ser Gly
            115                 120                 125

Thr Ala Ser Val Val Cys Leu Leu Asn Asn Phe Tyr Pro Arg Glu Ala
        130                 135                 140

Lys Val Gln Trp Lys Val Asp Asn Ala Leu Gln Ser Gly Asn Ser Gln
145                 150                 155                 160

Glu Ser Val Thr Glu Gln Asp Ser Lys Asp Ser Thr Tyr Ser Leu Ser
                165                 170                 175

Ser Thr Leu Thr Leu Ser Lys Ala Asp Tyr Glu Lys His Lys Val Tyr
            180                 185                 190

Ala Cys Glu Val Thr His Gln Gly Leu Ser Ser Pro Val Thr Lys Ser
        195                 200                 205

Phe Asn Arg Gly Glu Cys
    210
```

<210> SEQ ID NO 200
<211> LENGTH: 220
<212> TYPE: PRT
<213> ORGANISM: Artificial Sequence
<220> FEATURE:
<223> OTHER INFORMATION: P2-F11LC

<400> SEQUENCE: 200

```
Glu Leu Asp Leu Thr Gln Thr Pro Ser Val Ser Ala Ala Val Gly
1               5                   10                  15

Gly Thr Val Thr Ile Asn Cys Gln Ala Ser Gln Ser Val Tyr Asn Asn
                20                  25                  30

Lys Asn Leu Ala Trp Tyr Gln Gln Lys Pro Gly Gln Pro Pro Lys Leu
            35                  40                  45

Leu Ile Tyr Ala Ala Ser Thr Leu Ala Ser Gly Val Ser Ser Arg Phe
        50                  55                  60

Lys Gly Ser Gly Ser Gly Thr Gln Phe Thr Leu Thr Ile Ser Asp Val
65                  70                  75                  80

Gln Cys Asp Asp Ala Ala Thr Tyr Tyr Cys Gln Gly Glu Phe Ser Cys
                85                  90                  95

Ser Ser Ala Asp Cys Asn Ala Phe Gly Gly Gly Thr Glu Leu Glu Ile
            100                 105                 110

Leu Arg Ser Val Ala Ala Pro Ser Val Phe Ile Phe Pro Pro Ser Asp
        115                 120                 125

Glu Gln Leu Lys Ser Gly Thr Ala Ser Val Val Cys Leu Leu Asn Asn
130                 135                 140

Phe Tyr Pro Arg Glu Ala Lys Val Gln Trp Lys Val Asp Asn Ala Leu
145                 150                 155                 160

Gln Ser Gly Asn Ser Gln Glu Ser Val Thr Glu Gln Asp Ser Lys Asp
                165                 170                 175

Ser Thr Tyr Ser Leu Ser Ser Thr Leu Thr Leu Ser Lys Ala Asp Tyr
            180                 185                 190

Glu Lys His Lys Val Tyr Ala Cys Glu Val Thr His Gln Gly Leu Ser
        195                 200                 205

Ser Pro Val Thr Lys Ser Phe Asn Arg Gly Glu Cys
        210                 215                 220
```

<210> SEQ ID NO 201

<211> LENGTH: 251
<212> TYPE: PRT
<213> ORGANISM: Artificial Sequence
<220> FEATURE:
<223> OTHER INFORMATION: 3-2 scFv

<400> SEQUENCE: 201

```
Ala Leu Thr Gln Pro Ser Ser Val Ser Ala Asn Pro Gly Glu Thr Val
1               5                   10                  15
Lys Ile Thr Cys Ser Gly Gly Gly Ser Tyr Ala Gly Ser Tyr Tyr Tyr
            20                  25                  30
Gly Trp Tyr Gln Gln Lys Ala Pro Gly Ser Ala Pro Val Thr Leu Ile
        35                  40                  45
Tyr Glu Ser Asn Lys Arg Pro Ser Asp Ile Pro Ser Arg Phe Ser Gly
    50                  55                  60
Ser Thr Ser Gly Ser Thr Ala Thr Leu Thr Ile Thr Gly Val Gln Ala
65                  70                  75                  80
Asp Asp Glu Ala Ile Tyr Tyr Cys Gly Ser Trp Asp Ser Ser Asn Gly
                85                  90                  95
Gly Ile Phe Gly Ala Gly Thr Thr Leu Thr Val Leu Ser Gly Gly Gly
            100                 105                 110
Gly Ser Ser Gly Gly Gly Gly Ser Ala Val Thr Leu Asp Glu Ser Gly
        115                 120                 125
Gly Gly Leu Gln Thr Pro Gly Gly Ala Leu Ser Leu Val Cys Lys Ala
    130                 135                 140
Ser Gly Phe Thr Phe Ser Ser Phe Asn Met Phe Trp Val Arg Gln Ala
145                 150                 155                 160
Pro Gly Lys Gly Leu Glu Tyr Val Ala Gln Ile Ser Ser Ser Gly Ser
                165                 170                 175
Ser Thr Asn Tyr Ala Pro Ala Val Arg Gly Arg Ala Thr Ile Ser Arg
            180                 185                 190
Asp Asn Gly Gln Ser Thr Val Arg Leu Gln Leu Asn Asn Pro Gly Ala
        195                 200                 205
Glu Asp Thr Gly Thr Tyr Tyr Cys Ala Lys Ser Ser Tyr Asp Cys Pro
    210                 215                 220
Tyr Gly His Cys Ser Ser Gly Val Asp Ser Ala Gly Glu Ile Asp Ala
225                 230                 235                 240
Trp Gly His Gly Thr Glu Val Ile Val Ser Ser
                245                 250
```

<210> SEQ ID NO 202
<211> LENGTH: 244
<212> TYPE: PRT
<213> ORGANISM: Artificial Sequence
<220> FEATURE:
<223> OTHER INFORMATION: 1-65 scFv

<400> SEQUENCE: 202

```
Ala Leu Thr Gln Pro Ser Ser Val Ser Ala Asn Pro Gly Glu Thr Val
1               5                   10                  15
Lys Ile Thr Cys Ser Gly Gly Gly Ser Ser Gly Tyr Gly Tyr Gly Trp
            20                  25                  30
Tyr Gln Gln Lys Ser Pro Ser Ser Ala Pro Leu Thr Val Ile Tyr Trp
        35                  40                  45
Asn Asp Lys Arg Pro Ser Asp Ile Pro Ser Arg Phe Ser Gly Ser Lys
    50                  55                  60
Ser Gly Ser Thr His Thr Leu Thr Ile Thr Gly Val Gln Ala Glu Asp
```

```
                65                  70                  75                  80
Glu Ala Val Tyr Phe Cys Gly Asn Asp Asp Tyr Ser Ser Asp Ser Gly
                    85                  90                  95

Tyr Val Gly Val Phe Gly Ala Gly Thr Thr Leu Thr Val Leu Ser Gly
                100                 105                 110

Gly Gly Gly Ser Ser Gly Gly Gly Ser Ala Val Thr Leu Asp Glu
                115                 120                 125

Ser Gly Gly Gly Leu Gln Thr Pro Gly Gly Ala Leu Ser Leu Val Cys
                130                 135                 140

Lys Ala Ser Gly Phe Thr Phe Ser Ser Tyr Gln Met Gly Trp Val Arg
145                 150                 155                 160

Gln Ala Pro Gly Lys Gly Leu Glu Trp Val Gly Val Ile Asn Lys Ser
                165                 170                 175

Gly Ser Asp Thr Ser Tyr Gly Ser Ala Val Lys Gly Arg Ala Thr Ile
                180                 185                 190

Ser Arg Asp Asn Gly Gln Ser Thr Val Arg Leu Gln Leu Asn Asn Leu
                195                 200                 205

Arg Ala Glu Asp Thr Gly Thr Tyr Phe Cys Ala Lys Gly Ser Ala Ser
                210                 215                 220

Tyr Ile Thr Ala Ala Thr Ile Asp Ala Trp Gly His Gly Thr Glu Val
225                 230                 235                 240

Ile Val Ser Ser

<210> SEQ ID NO 203
<211> LENGTH: 245
<212> TYPE: PRT
<213> ORGANISM: Artificial Sequence
<220> FEATURE:
<223> OTHER INFORMATION: 2-13 scFv

<400> SEQUENCE: 203

Ala Leu Thr Gln Pro Ser Ser Val Ser Ala Asn Pro Gly Glu Thr Val
1               5                   10                  15

Lys Ile Thr Cys Ser Gly Gly Ser Tyr Ser Tyr Gly Trp Phe Gln Gln
                20                  25                  30

Lys Ser Pro Gly Ser Ala Leu Val Thr Val Ile Tyr Trp Asp Asp Glu
                35                  40                  45

Arg Pro Ser Asp Ile Pro Ser Arg Phe Ser Gly Ala Leu Ser Gly Ser
                50                  55                  60

Thr Asn Thr Leu Thr Ile Thr Gly Val Gln Ala Asp Asp Glu Ala Val
65                  70                  75                  80

Tyr Phe Cys Gly Thr Glu Asp Ile Ser Gly Thr Ala Gly Val Phe Gly
                85                  90                  95

Ala Gly Thr Thr Leu Thr Val Leu Ser Gly Gly Gly Ser Ser Gly
                100                 105                 110

Gly Gly Gly Ser Ala Val Thr Leu Asp Glu Ser Gly Gly Gly Leu Gln
                115                 120                 125

Thr Pro Gly Gly Ala Leu Ser Leu Val Cys Lys Ala Ser Gly Phe Thr
                130                 135                 140

Phe Ser Ser His Gly Met Phe Trp Val Arg Gln Thr Pro Gly Lys Gly
145                 150                 155                 160

Leu Glu Tyr Val Ala Glu Ile Thr Asn Asp Gly Ser Gly Thr Asn Tyr
                165                 170                 175

Gly Ser Ala Val Lys Gly Arg Ala Thr Ile Ser Arg Asp Asn Gly Gln
                180                 185                 190
```

Ser Thr Val Arg Leu Gln Leu Asn Asn Leu Arg Ala Glu Asp Thr Gly
        195                 200                 205

Thr Tyr Phe Cys Ala Arg Ser Thr Tyr Glu Cys Pro Gly Gly Phe Ser
        210                 215                 220

Cys Trp Gly Asp Thr Gly Gln Ile Asp Ala Trp Gly His Gly Thr Glu
225                 230                 235                 240

Val Ile Val Ser Ser
                245

<210> SEQ ID NO 204
<211> LENGTH: 753
<212> TYPE: DNA
<213> ORGANISM: Artificial Sequence
<220> FEATURE:
<223> OTHER INFORMATION: 3-2 scFv

<400> SEQUENCE: 204

| | | | | | | |
|---|---|---|---|---|---|---|
| gcattgactc | agccctcttc | cgtgagtgct | aatccaggtg | aaacagtaaa | ataacttgc | 60 |
| agtgggggag | ggtcttacgc | aggatcttat | tattatggat | ggtaccagca | aaaagcccct | 120 |
| gggtctgcac | cagtcactct | gatatacgag | agcaataaac | gcccttccga | catccccagc | 180 |
| cgcttttctg | gttctaccct | tggcagtact | gctaccttga | ctattaccgg | ggtccaggct | 240 |
| gacgacgaag | ccatttatta | ttgtggaagt | tgggattcaa | gcaacggggg | tatattcggc | 300 |
| gctggtacta | cccttaccgt | gctgtccggt | ggggtggga | gcagtggagg | tggaggaagt | 360 |
| gctgtaactc | ttgatgaaag | cggggagggg | ctgcaaaccc | ctggcggggc | cttgtccttg | 420 |
| gtttgtaagg | cttccggatt | tactttctca | agttttaata | tgttttgggt | gcgacaggcc | 480 |
| ccagggaaag | ggttggaata | tgttgcacag | atctccagct | caggttcatc | accaattat | 540 |
| gcacctgccg | tccgagggag | ggctacaatt | tctagggaca | cgggcagtc | aactgtacgg | 600 |
| ttgcagctta | caatcccgg | agcagaagat | acaggtacct | attactgtgc | taagagttca | 660 |
| tacgactgtc | cctatggtca | ctgttcctca | ggtgttgact | ccgcagggga | gatagatgct | 720 |
| tgggggcatg | ggaccgaagt | gattgtgtca | tct | | | 753 |

<210> SEQ ID NO 205
<211> LENGTH: 732
<212> TYPE: DNA
<213> ORGANISM: Artificial Sequence
<220> FEATURE:
<223> OTHER INFORMATION: 1-65 scFv

<400> SEQUENCE: 205

| | | | | | | |
|---|---|---|---|---|---|---|
| gccttgacac | aaccctcatc | agtatctgct | aaccccggcg | aaacagttaa | aataacatgc | 60 |
| tcaggaggtg | gttcatctgg | ctatggatat | gggtggtatc | aacagaaatc | accaagttcc | 120 |
| gcccccttga | ccgtgattta | ttggaatgat | aagcgcccct | cagacattcc | cagtcgcttc | 180 |
| tcaggcagta | atcaggctc | aacccatact | cttactatca | ccgtgtccca | agcagaagat | 240 |
| gaagccgtgt | attttttgtgg | aatgatgac | tattccagcg | attctggcta | tgtaggagtg | 300 |
| ttcggtgccg | gtactaccct | cacagtattg | agtggtggtg | gcggaagttc | aggtggtggt | 360 |
| ggaagcgctg | tcactttgga | tgaatcaggt | ggaggcctcc | aaaccccagg | tggcgcactc | 420 |
| agtctcgtat | gtaaagcctc | tggtttcact | ttcagctcat | atcaaatggg | atgggtgcgg | 480 |
| caggctcccg | gcaaggggtt | ggagtgggtc | ggtgttatca | acaagagcgg | ctctgatact | 540 |
| agctatggaa | gcgcagtcaa | ggggagagct | actataagca | gggataatgg | caaagtacc | 600 |

```
gtcaggcttc aattgaacaa tctcagggct gaggatacag gaacctactt ctgcgccaaa    660
gggtcagcat cttatatcac agcagctacc attgacgcat ggggacatgg cacagaggtc    720
attgtttcca gt                                                        732
```

```
<210> SEQ ID NO 206
<211> LENGTH: 735
<212> TYPE: DNA
<213> ORGANISM: Artificial Sequence
<220> FEATURE:
<223> OTHER INFORMATION: 2-13 scFv

<400> SEQUENCE: 206
gctctgacac aaccaagctc tgtcagtgca aatccaggag agaccgttaa aatcacttgc     60
agcggaggct cttattccta cggatggttc cagcaaaaaa gtcctggttc agccctcgtt    120
actgtcatct actgggacga cgagcgccct agcgatattc ctagtagatt ctcaggggct    180
cttagcggct ccactaatac tttgaccatt actggagtac aggctgatga cgaagcagtt    240
tacttctgtg gcaccgaaga tataagcgga actgcagggg tatttggggc tggtacaaca    300
ctcacagtgc tctccggggg gggcgggagc tcaggaggcg gcggatcagc tgtaaccctg    360
gacgaatctg gtgggggggct tcaaacaccc ggaggagccc tctccctcgt atgcaaagct    420
tcaggattca ccttctcttc acatggaatg ttctgggtaa ggcagacacc tggcaaaggg    480
cttgaatatg tagctgagat cactaatgac ggtagcggta caaactatgg gtctgctgtg    540
aaaggccggg ctacaataag tcgagacaat ggacaaagta ccgttagact ccagctcaac    600
aacctgcgag ctgaggacac aggcacttac ttttgtgcac gcagtactta cgagtgtcca    660
ggtggatttt catgttgggg agataccgga cagatcgacg cttgggggca cggcaccgag    720
gtcattgtaa gtagc                                                    735
```

```
<210> SEQ ID NO 207
<211> LENGTH: 12
<212> TYPE: PRT
<213> ORGANISM: Artificial Sequence
<220> FEATURE:
<223> OTHER INFORMATION: Linker

<400> SEQUENCE: 207

Ser Gly Gly Gly Gly Ser Ser Gly Gly Gly Gly Ser
1               5                   10
```

```
<210> SEQ ID NO 208
<211> LENGTH: 10
<212> TYPE: PRT
<213> ORGANISM: Artificial sequence
<220> FEATURE:
<223> OTHER INFORMATION: SS01-13-s5 Ab VH-CDR2

<400> SEQUENCE: 208

Ala Ile Asn Lys Ser Gly Ser Asp Thr Ser
1               5                   10
```

```
<210> SEQ ID NO 209
<211> LENGTH: 10
<212> TYPE: PRT
<213> ORGANISM: Artificial sequence
<220> FEATURE:
<223> OTHER INFORMATION: S5-2.GKNG Ab VH-CDR2

<400> SEQUENCE: 209

Ala Ile Asn Lys Gly Gly Ser Asp Thr Ser
```

```
<210> SEQ ID NO 210
<211> LENGTH: 10
<212> TYPE: PRT
<213> ORGANISM: Artificial sequence
<220> FEATURE:
<223> OTHER INFORMATION: 1-7A-IT Ab VH-CDR1

<400> SEQUENCE: 210

Gly Phe Thr Phe Ser Ser Phe Asn Met Phe
1               5                   10

<210> SEQ ID NO 211
<211> LENGTH: 17
<212> TYPE: PRT
<213> ORGANISM: Artificial sequence
<220> FEATURE:
<223> OTHER INFORMATION: 1-7A-IT Ab VH-CDR2

<400> SEQUENCE: 211

Gln Ile Ser Ser Ser Gly Ser Ser Thr Asn Tyr Ala Pro Ala Val Lys
1               5                   10                  15

Gly

<210> SEQ ID NO 212
<211> LENGTH: 10
<212> TYPE: PRT
<213> ORGANISM: Artificial sequence
<220> FEATURE:
<223> OTHER INFORMATION: Low-PI; 1-30; 1-17; 1-32; 4-11; 6-10 Abs
      VH-CDR1

<400> SEQUENCE: 212

Gly Phe Asp Phe Glu Ser Phe Asn Met Phe
1               5                   10

<210> SEQ ID NO 213
<211> LENGTH: 17
<212> TYPE: PRT
<213> ORGANISM: Artificial sequence
<220> FEATURE:
<223> OTHER INFORMATION: Low-PI; 1-30; 1-17; 1-32; 4-11; 6-10 Abs
      VH-CDR2

<400> SEQUENCE: 213

Gln Ile Ser Ser Ser Glu Glu Asp Glu Asn Tyr Ala Pro Ala Val Lys
1               5                   10                  15

Gly

<210> SEQ ID NO 214
<211> LENGTH: 10
<212> TYPE: PRT
<213> ORGANISM: Artificial sequence
<220> FEATURE:
<223> OTHER INFORMATION: 2-13D Ab VH-CDR1

<400> SEQUENCE: 214

Gly Phe Thr Phe Ser Ser His Gly Met Phe
1               5                   10

<210> SEQ ID NO 215
<211> LENGTH: 10
<212> TYPE: PRT
<213> ORGANISM: Artificial sequence
<220> FEATURE:
```

```
<223> OTHER INFORMATION: 2-13D-37; 2-13D-37-1.5W-41; 2-13D-37-3W-16
      VH-CDR1

<400> SEQUENCE: 215

Gly Phe Asp Phe Ser Ser His Gly Met Phe
1               5                   10

<210> SEQ ID NO 216
<211> LENGTH: 20
<212> TYPE: PRT
<213> ORGANISM: Artificial sequence
<220> FEATURE:
<223> OTHER INFORMATION: 2-13D-37-1.5W-41 VH-CDR3

<400> SEQUENCE: 216

Ser Ser Tyr Val Cys Pro Gly Gly Phe Ser Cys Trp Gly Asp Thr Gly
1               5                   10                  15

Gln Ile Asp Ala
            20

<210> SEQ ID NO 217
<211> LENGTH: 20
<212> TYPE: PRT
<213> ORGANISM: Artificial sequence
<220> FEATURE:
<223> OTHER INFORMATION: 2-13D-37-3W-16 VH-CDR3

<400> SEQUENCE: 217

Ser Asn Tyr Ala Cys Pro Gly Gly Phe Ser Cys Trp Gly Asp Thr Gly
1               5                   10                  15

Gln Ile Asp Ala
            20

<210> SEQ ID NO 218
<211> LENGTH: 11
<212> TYPE: PRT
<213> ORGANISM: Artificial sequence
<220> FEATURE:
<223> OTHER INFORMATION: ss01-13; SS01-13-S5; S5-2.GKNG Abs VL-CDR1

<400> SEQUENCE: 218

Ser Gly Gly Ala Ser Ser Gly Tyr Gly Tyr Gly
1               5                   10

<210> SEQ ID NO 219
<211> LENGTH: 7
<212> TYPE: PRT
<213> ORGANISM: Artificial sequence
<220> FEATURE:
<223> OTHER INFORMATION: ss01-13 Ab VL-CDR2

<400> SEQUENCE: 219

Lys Asp Asp Glu Arg Pro Ser
1               5

<210> SEQ ID NO 220
<211> LENGTH: 7
<212> TYPE: PRT
<213> ORGANISM: Artificial sequence
<220> FEATURE:
<223> OTHER INFORMATION: ss01-13-S5; S5-2.GKNG Ab VL-CDR2

<400> SEQUENCE: 220

Lys Asp Ser Glu Arg Pro Ser
1               5
```

<210> SEQ ID NO 221
<211> LENGTH: 7
<212> TYPE: PRT
<213> ORGANISM: Artificial sequence
<220> FEATURE:
<223> OTHER INFORMATION: 1-7A-IT Ab VL-CDR2

<400> SEQUENCE: 221

Glu Asn Asn Lys Arg Pro Ser
1               5

<210> SEQ ID NO 222
<211> LENGTH: 13
<212> TYPE: PRT
<213> ORGANISM: Artificial sequence
<220> FEATURE:
<223> OTHER INFORMATION: Low-PI; 1-30 Abs VL-CDR1

<400> SEQUENCE: 222

Ser Gly Gly Gly Ser Glu Glu Glu Gln Tyr Tyr Tyr Gly
1               5                   10

<210> SEQ ID NO 223
<211> LENGTH: 7
<212> TYPE: PRT
<213> ORGANISM: Artificial sequence
<220> FEATURE:
<223> OTHER INFORMATION: Low-PI VL-CDR2

<400> SEQUENCE: 223

Glu Asp Glu Glu Arg Pro Ser
1               5

<210> SEQ ID NO 224
<211> LENGTH: 10
<212> TYPE: PRT
<213> ORGANISM: Artificial sequence
<220> FEATURE:
<223> OTHER INFORMATION: Low-PI; 1-30; 1-17; 1-32 Abs VL-CDR3

<400> SEQUENCE: 224

Gly Ser Trp Asp Ser Glu Asp Glu Asp His
1               5                   10

<210> SEQ ID NO 225
<211> LENGTH: 7
<212> TYPE: PRT
<213> ORGANISM: Artificial sequence
<220> FEATURE:
<223> OTHER INFORMATION: 1-30; 1-32 Abs VL-CDR2

<400> SEQUENCE: 225

Gln Asp Glu Glu Arg Pro Ser
1               5

<210> SEQ ID NO 226
<211> LENGTH: 7
<212> TYPE: PRT
<213> ORGANISM: Artificial sequence
<220> FEATURE:
<223> OTHER INFORMATION: 1-17 Ab VL-CDR2

<400> SEQUENCE: 226

Glu Asp Glu Gln Arg Pro Ser
1               5

```
<210> SEQ ID NO 227
<211> LENGTH: 7
<212> TYPE: PRT
<213> ORGANISM: Artificial sequence
<220> FEATURE:
<223> OTHER INFORMATION: 4-11 Ab VL-CDR2

<400> SEQUENCE: 227

Glu Asp His Glu Arg Pro Ser
1               5

<210> SEQ ID NO 228
<211> LENGTH: 10
<212> TYPE: PRT
<213> ORGANISM: Artificial sequence
<220> FEATURE:
<223> OTHER INFORMATION: 4-11 Ab VL-CDR3

<400> SEQUENCE: 228

Gly Ser Trp Asp Ser Ser Asp Glu Asp His
1               5                   10

<210> SEQ ID NO 229
<211> LENGTH: 7
<212> TYPE: PRT
<213> ORGANISM: Artificial sequence
<220> FEATURE:
<223> OTHER INFORMATION: 6-10 Ab VL-CDR2

<400> SEQUENCE: 229

Gln Asp Leu Leu Arg Pro Ser
1               5

<210> SEQ ID NO 230
<211> LENGTH: 10
<212> TYPE: PRT
<213> ORGANISM: Artificial sequence
<220> FEATURE:
<223> OTHER INFORMATION: 6-10 Ab VL-CDR3

<400> SEQUENCE: 230

Gly Ser Trp Asp Ser Leu Ser Ser Ser His
1               5                   10

<210> SEQ ID NO 231
<211> LENGTH: 8
<212> TYPE: PRT
<213> ORGANISM: Artificial sequence
<220> FEATURE:
<223> OTHER INFORMATION: 2-13D; 2-13D-37; 2-13D-37-1.5W-41; 2-13D-37-3W-
      16 Abs VL-CDR1

<400> SEQUENCE: 231

Ser Gly Gly Val Tyr Ser Tyr Gly
1               5

<210> SEQ ID NO 232
<211> LENGTH: 122
<212> TYPE: PRT
<213> ORGANISM: Artificial sequence
<220> FEATURE:
<223> OTHER INFORMATION: SS01-13 Ab VH

<400> SEQUENCE: 232

Ala Val Thr Leu Asp Glu Ser Gly Gly Gly Leu Gln Thr Pro Gly Gly
1               5                   10                  15

Ala Leu Ser Leu Ser Cys Lys Ala Ser Gly Phe Thr Phe Ser Ser Tyr
```

```
                    20                  25                  30

Gln Met Gly Trp Val Arg Gln Ala Pro Gly Lys Gly Leu Glu Trp Val
            35                  40                  45

Gly Val Ile Asn Lys Ser Gly Ser Asp Thr Ser Tyr Gly Ser Ala Val
    50                  55                  60

Lys Gly Arg Ala Thr Ile Ser Arg Asp Asn Gly Gln Ser Thr Leu Tyr
65                  70                  75                  80

Leu Gln Met Asn Asn Leu Arg Ala Glu Asp Thr Ala Val Tyr Phe Cys
                85                  90                  95

Ala Lys Gly Ser Ala Ser Tyr Ile Thr Ala Ala Thr Ile Asp Ala Trp
            100                 105                 110

Gly His Gly Thr Glu Val Ile Val Ser Ser
        115                 120

<210> SEQ ID NO 233
<211> LENGTH: 122
<212> TYPE: PRT
<213> ORGANISM: Artificial sequence
<220> FEATURE:
<223> OTHER INFORMATION: SS01-13-s5 Ab VH

<400> SEQUENCE: 233

Ala Val Thr Leu Asp Glu Ser Gly Gly Gly Leu Gln Thr Pro Gly Gly
1               5                   10                  15

Ala Leu Arg Leu Ser Cys Lys Ala Ser Gly Phe Thr Phe Ser Ser Tyr
            20                  25                  30

Gln Met Gly Trp Val Arg Gln Ala Pro Gly Lys Gly Leu Glu Trp Val
        35                  40                  45

Ser Ala Ile Asn Lys Ser Gly Ser Asp Thr Ser Tyr Gly Ser Ala Val
    50                  55                  60

Lys Gly Arg Ala Thr Ile Ser Arg Asp Asn Gly Gln Ser Thr Leu Tyr
65                  70                  75                  80

Leu Gln Met Asn Ser Leu Arg Ala Glu Asp Thr Ala Val Tyr Phe Cys
                85                  90                  95

Ala Lys Gly Ser Ala Ser Tyr Ile Thr Ala Ala Thr Ile Asp Ala Trp
            100                 105                 110

Gly His Gly Thr Glu Val Ile Val Ser Ser
        115                 120

<210> SEQ ID NO 234
<211> LENGTH: 122
<212> TYPE: PRT
<213> ORGANISM: Artificial sequence
<220> FEATURE:
<223> OTHER INFORMATION: S5-2.GKNG Ab VH

<400> SEQUENCE: 234

Ala Val Thr Leu Asp Glu Ser Gly Gly Gly Leu Gln Thr Pro Gly Gly
1               5                   10                  15

Ala Leu Arg Leu Ser Cys Lys Ala Ser Gly Phe Thr Phe Ser Ser Tyr
            20                  25                  30

Gln Met Gly Trp Val Arg Gln Ala Pro Gly Lys Gly Leu Glu Trp Val
        35                  40                  45

Ser Ala Ile Asn Lys Gly Gly Ser Asp Thr Ser Tyr Gly Ser Ala Val
    50                  55                  60

Lys Gly Arg Ala Thr Ile Ser Arg Asp Asn Gly Gln Ser Thr Leu Tyr
65                  70                  75                  80
```

```
Leu Gln Met Asn Ser Leu Arg Ala Glu Asp Thr Ala Val Tyr Phe Cys
                85                  90                  95

Ala Lys Gly Ser Ala Ser Tyr Ile Thr Ala Ala Thr Ile Asp Ala Trp
            100                 105                 110

Gly His Gly Thr Glu Val Ile Val Ser Ser
        115                 120

<210> SEQ ID NO 235
<211> LENGTH: 131
<212> TYPE: PRT
<213> ORGANISM: Artificial sequence
<220> FEATURE:
<223> OTHER INFORMATION: 1-7A-IT Ab VH

<400> SEQUENCE: 235

Ala Val Thr Leu Asp Glu Ser Gly Gly Gly Leu Gln Thr Pro Gly Gly
1               5                   10                  15

Ala Leu Arg Leu Ser Cys Lys Ala Ser Gly Phe Thr Phe Ser Ser Phe
            20                  25                  30

Asn Met Phe Trp Val Arg Gln Ala Pro Gly Lys Gly Leu Glu Tyr Val
            35                  40                  45

Ser Gln Ile Ser Ser Ser Gly Ser Ser Thr Asn Tyr Ala Pro Ala Val
        50                  55                  60

Lys Gly Arg Ala Thr Ile Ser Arg Asp Asn Gly Gln Ser Thr Leu Tyr
65                  70                  75                  80

Leu Gln Met Asn Ser Leu Arg Ala Glu Asp Thr Gly Thr Tyr Tyr Cys
                85                  90                  95

Ala Lys Ser Ser Tyr Asp Cys Pro Tyr Gly His Cys Ser Ser Gly Val
            100                 105                 110

Asp Ser Ala Gly Glu Ile Asp Ala Trp Gly His Gly Thr Glu Val Ile
            115                 120                 125

Val Ser Ser
    130

<210> SEQ ID NO 236
<211> LENGTH: 131
<212> TYPE: PRT
<213> ORGANISM: Artificial sequence
<220> FEATURE:
<223> OTHER INFORMATION: Low-PI; 1-30; 1-17; 1-31; 4-11; 6-10 Abs VH

<400> SEQUENCE: 236

Ala Val Thr Leu Asp Glu Ser Gly Gly Gly Leu Gln Thr Pro Gly Gly
1               5                   10                  15

Ala Leu Arg Leu Ser Cys Lys Ala Ser Gly Phe Asp Phe Glu Ser Phe
            20                  25                  30

Asn Met Phe Trp Val Arg Gln Ala Pro Gly Lys Gly Leu Glu Tyr Val
            35                  40                  45

Ser Gln Ile Ser Ser Ser Glu Glu Asp Glu Asn Tyr Ala Pro Ala Val
        50                  55                  60

Lys Gly Arg Ala Thr Ile Ser Arg Asp Asn Gly Gln Ser Thr Leu Tyr
65                  70                  75                  80

Leu Gln Met Asn Ser Leu Arg Ala Glu Asp Thr Gly Tyr Tyr Tyr Cys
                85                  90                  95

Ala Lys Ser Ser Tyr Asp Cys Pro Tyr Gly His Cys Ser Ser Gly Val
            100                 105                 110

Asp Ser Ala Gly Glu Ile Asp Ala Trp Gly His Gly Thr Glu Val Ile
            115                 120                 125
```

Val Ser Ser
    130

<210> SEQ ID NO 237
<211> LENGTH: 129
<212> TYPE: PRT
<213> ORGANISM: Artificial sequence
<220> FEATURE:
<223> OTHER INFORMATION: 2-13D VH

<400> SEQUENCE: 237

Ala Val Thr Leu Asp Glu Ser Gly Gly Leu Gln Thr Pro Gly Gly
1               5                   10                  15

Ala Leu Arg Leu Ser Cys Ser Ala Ser Gly Phe Thr Phe Ser Ser His
            20                  25                  30

Gly Met Phe Trp Val Arg Gln Ala Pro Gly Lys Gly Leu Glu Tyr Val
        35                  40                  45

Ser Glu Ile Thr Asn Asp Gly Ser Gly Thr Asn Tyr Gly Ser Ala Val
    50                  55                  60

Lys Gly Arg Ala Thr Ile Ser Arg Asp Asn Gly Gln Ser Thr Leu Tyr
65                  70                  75                  80

Leu Gln Met Asn Ser Leu Arg Ala Glu Asp Thr Gly Thr Tyr Phe Cys
                85                  90                  95

Ala Arg Ser Thr Tyr Glu Cys Pro Gly Gly Phe Ser Cys Trp Gly Asp
            100                 105                 110

Thr Gly Gln Ile Asp Ala Trp Gly His Gly Thr Glu Val Ile Val Ser
        115                 120                 125

Ser

<210> SEQ ID NO 238
<211> LENGTH: 129
<212> TYPE: PRT
<213> ORGANISM: Artificial sequence
<220> FEATURE:
<223> OTHER INFORMATION: 2-13D-37 VH

<400> SEQUENCE: 238

Ala Val Thr Leu Asp Glu Ser Gly Gly Leu Gln Thr Pro Gly Gly
1               5                   10                  15

Ala Leu Arg Leu Ser Cys Ser Ala Ser Gly Phe Asp Phe Ser Ser His
            20                  25                  30

Gly Met Phe Trp Val Arg Gln Ala Pro Gly Lys Gly Leu Glu Tyr Val
        35                  40                  45

Ser Glu Ile Thr Asn Asp Gly Ser Gly Thr Asn Tyr Gly Ser Ala Val
    50                  55                  60

Lys Gly Arg Ala Thr Ile Ser Arg Asp Asn Gly Gln Ser Thr Leu Tyr
65                  70                  75                  80

Leu Gln Met Asn Ser Leu Arg Ala Glu Asp Thr Gly Thr Tyr Phe Cys
                85                  90                  95

Ala Arg Ser Thr Tyr Glu Cys Pro Gly Gly Phe Ser Cys Trp Gly Asp
            100                 105                 110

Thr Gly Gln Ile Asp Ala Trp Gly His Gly Thr Glu Val Ile Val Ser
        115                 120                 125

Ser

<210> SEQ ID NO 239
<211> LENGTH: 129

<212> TYPE: PRT
<213> ORGANISM: Artificial sequence
<220> FEATURE:
<223> OTHER INFORMATION: 2-13D-37-1.5W-41 VH

<400> SEQUENCE: 239

Ala Val Thr Leu Asp Glu Ser Gly Gly Gly Leu Gln Thr Pro Gly Gly
1               5                   10                  15

Ala Leu Arg Leu Ser Cys Ser Ala Ser Gly Phe Asp Phe Ser Ser His
            20                  25                  30

Gly Met Phe Trp Val Arg Gln Ala Pro Gly Lys Gly Leu Glu Tyr Val
        35                  40                  45

Ser Glu Ile Thr Asn Asp Gly Ser Gly Thr Asn Tyr Gly Ser Ala Val
    50                  55                  60

Lys Gly Arg Ala Thr Ile Ser Arg Asp Asn Gly Gln Ser Thr Leu Tyr
65                  70                  75                  80

Leu Gln Met Asn Ser Leu Arg Ala Glu Asp Thr Gly Thr Tyr Phe Cys
                85                  90                  95

Ala Arg Ser Ser Tyr Val Cys Pro Gly Gly Phe Ser Cys Trp Gly Asp
            100                 105                 110

Thr Gly Gln Ile Asp Ala Trp Gly His Gly Thr Glu Val Ile Val Ser
        115                 120                 125

Ser

<210> SEQ ID NO 240
<211> LENGTH: 129
<212> TYPE: PRT
<213> ORGANISM: Artificial sequence
<220> FEATURE:
<223> OTHER INFORMATION: 2-13D-37-3W-16 VH

<400> SEQUENCE: 240

Ala Val Thr Leu Asp Glu Ser Gly Gly Gly Leu Gln Thr Pro Gly Gly
1               5                   10                  15

Ala Leu Arg Leu Ser Cys Ser Ala Ser Gly Phe Asp Phe Ser Ser His
            20                  25                  30

Gly Met Phe Trp Val Arg Gln Ala Pro Gly Lys Gly Leu Glu Tyr Val
        35                  40                  45

Ser Glu Ile Thr Asn Asp Gly Ser Gly Thr Asn Tyr Gly Ser Ala Val
    50                  55                  60

Lys Gly Arg Ala Thr Ile Ser Arg Asp Asn Gly Gln Ser Thr Leu Tyr
65                  70                  75                  80

Leu Gln Met Asn Ser Leu Arg Ala Glu Asp Thr Gly Thr Tyr Phe Cys
                85                  90                  95

Ala Arg Ser Asn Tyr Ala Cys Pro Gly Gly Phe Ser Cys Trp Gly Asp
            100                 105                 110

Thr Gly Gln Ile Asp Ala Trp Gly His Gly Thr Glu Val Ile Val Ser
        115                 120                 125

Ser

<210> SEQ ID NO 241
<211> LENGTH: 109
<212> TYPE: PRT
<213> ORGANISM: Artificial sequence
<220> FEATURE:
<223> OTHER INFORMATION: SS01-13 VL

<400> SEQUENCE: 241

Ala Leu Thr Gln Pro Ser Ser Val Ser Ala Asn Pro Gly Glu Thr Val
1               5                   10                  15

Arg Ile Thr Cys Ser Gly Gly Ala Ser Ser Gly Tyr Gly Tyr Gly Trp
            20                  25                  30

Tyr Gln Gln Lys Pro Ser Ser Ala Pro Leu Thr Val Ile Tyr Lys Asp
        35                  40                  45

Asp Glu Arg Pro Ser Asp Ile Pro Ser Arg Phe Ser Gly Ser Ser Ser
    50                  55                  60

Gly Ser Thr His Thr Leu Thr Ile Thr Gly Val Gln Ala Glu Asp Glu
65                  70                  75                  80

Ala Val Tyr Phe Cys Gly Asn Asp Asp Tyr Ser Ser Asp Ser Gly Tyr
                85                  90                  95

Val Gly Val Phe Gly Ala Gly Thr Thr Leu Thr Val Leu
            100                 105

<210> SEQ ID NO 242
<211> LENGTH: 109
<212> TYPE: PRT
<213> ORGANISM: Artificial sequence
<220> FEATURE:
<223> OTHER INFORMATION: SS01-13-s5; S5-2.GKNG VL

<400> SEQUENCE: 242

Ala Leu Thr Gln Pro Ser Ser Val Ser Ala Asn Pro Gly Glu Thr Ala
1               5                   10                  15

Arg Ile Thr Cys Ser Gly Gly Ala Ser Ser Gly Tyr Gly Tyr Gly Trp
            20                  25                  30

Tyr Gln Gln Lys Pro Ser Ser Ala Pro Leu Thr Val Ile Tyr Lys Asp
        35                  40                  45

Ser Glu Arg Pro Ser Asp Ile Pro Ser Arg Phe Ser Gly Ser Ser Ser
    50                  55                  60

Gly Ser Thr His Thr Leu Thr Ile Ser Gly Val Gln Ala Glu Asp Glu
65                  70                  75                  80

Ala Val Tyr Phe Cys Gly Asn Asp Asp Tyr Ser Ser Asp Ser Gly Tyr
                85                  90                  95

Val Gly Val Phe Gly Ala Gly Thr Thr Leu Thr Val Leu
            100                 105

<210> SEQ ID NO 243
<211> LENGTH: 107
<212> TYPE: PRT
<213> ORGANISM: Artificial sequence
<220> FEATURE:
<223> OTHER INFORMATION: 1-7A-IT VL

<400> SEQUENCE: 243

Ala Leu Thr Gln Pro Ser Ser Val Ser Ala Asn Pro Gly Glu Thr Val
1               5                   10                  15

Lys Ile Thr Cys Ser Gly Gly Gly Ser Tyr Ala Gly Ser Tyr Tyr Tyr
            20                  25                  30

Gly Trp Tyr Gln Gln Lys Pro Gly Ser Ala Pro Val Thr Leu Ile Tyr
        35                  40                  45

Glu Asn Asn Lys Arg Pro Ser Asp Ile Pro Ser Arg Phe Ser Gly Ser
    50                  55                  60

Thr Ser Gly Ser Thr Ala Thr Leu Thr Ile Thr Gly Val Gln Ala Gly
65                  70                  75                  80

Asp Glu Ala Asp Tyr Tyr Cys Gly Ser Trp Asp Ser Ser Asn Gly Gly
                85                  90                  95

```
Ile Phe Gly Ala Gly Thr Thr Leu Thr Val Leu
            100                 105
```

<210> SEQ ID NO 244
<211> LENGTH: 107
<212> TYPE: PRT
<213> ORGANISM: Artificial sequence
<220> FEATURE:
<223> OTHER INFORMATION: Low-PI VL

<400> SEQUENCE: 244

```
Ala Leu Thr Gln Pro Ser Ser Val Ser Ala Asn Pro Gly Glu Thr Val
1               5                   10                  15

Lys Ile Thr Cys Ser Gly Gly Ser Glu Glu Glu Gln Tyr Tyr Tyr
            20                  25                  30

Gly Trp Tyr Gln Gln Lys Pro Gly Ser Ala Pro Val Thr Leu Ile Tyr
        35                  40                  45

Glu Asp Glu Glu Arg Pro Ser Asp Ile Pro Ser Arg Phe Ser Gly Ser
    50                  55                  60

Thr Ser Gly Ser Thr Ala Thr Leu Thr Ile Thr Gly Val Gln Ala Gly
65                  70                  75                  80

Asp Glu Ala Asp Tyr Tyr Cys Gly Ser Trp Asp Ser Glu Asp Glu Asp
                85                  90                  95

His Phe Gly Ala Gly Thr Thr Leu Thr Val Leu
            100                 105
```

<210> SEQ ID NO 245
<211> LENGTH: 107
<212> TYPE: PRT
<213> ORGANISM: Artificial sequence
<220> FEATURE:
<223> OTHER INFORMATION: 1-30 VL

<400> SEQUENCE: 245

```
Ala Leu Thr Gln Pro Ser Ser Val Ser Ala Asn Pro Gly Glu Thr Val
1               5                   10                  15

Lys Ile Thr Cys Ser Gly Gly Ser Glu Glu Glu Gln Tyr Tyr Tyr
            20                  25                  30

Gly Trp Tyr Gln Gln Lys Pro Gly Ser Ala Pro Val Thr Leu Ile Tyr
        35                  40                  45

Gln Asp Glu Glu Arg Pro Ser Asp Ile Pro Ser Arg Phe Ser Gly Ser
    50                  55                  60

Thr Ser Gly Ser Thr Ala Thr Leu Thr Ile Thr Gly Val Gln Ala Gly
65                  70                  75                  80

Asp Glu Ala Asp Tyr Tyr Cys Gly Ser Trp Asp Ser Glu Asp Glu Asp
                85                  90                  95

His Phe Gly Ala Gly Thr Thr Leu Thr Val Leu
            100                 105
```

<210> SEQ ID NO 246
<211> LENGTH: 107
<212> TYPE: PRT
<213> ORGANISM: Artificial sequence
<220> FEATURE:
<223> OTHER INFORMATION: 1-17 VL

<400> SEQUENCE: 246

```
Ala Leu Thr Gln Pro Ser Ser Val Ser Ala Asn Pro Gly Glu Thr Val
1               5                   10                  15
```

Lys Ile Thr Cys Ser Gly Gly Gly Ser Tyr Ala Gly Ser Tyr Tyr Tyr
                20                  25                  30

Gly Trp Tyr Gln Gln Lys Pro Gly Ser Ala Pro Val Thr Leu Ile Tyr
            35                  40                  45

Glu Asp Glu Gln Arg Pro Ser Asp Ile Pro Ser Arg Phe Ser Gly Ser
 50                  55                  60

Thr Ser Gly Ser Thr Ala Thr Leu Thr Ile Thr Gly Val Gln Ala Gly
 65                  70                  75                  80

Asp Glu Ala Asp Tyr Tyr Cys Gly Ser Trp Asp Ser Glu Asp Glu Asp
                85                  90                  95

His Phe Gly Ala Gly Thr Thr Leu Thr Val Leu
                100                 105

<210> SEQ ID NO 247
<211> LENGTH: 107
<212> TYPE: PRT
<213> ORGANISM: Artificial sequence
<220> FEATURE:
<223> OTHER INFORMATION: 1-32 VL

<400> SEQUENCE: 247

Ala Leu Thr Gln Pro Ser Ser Val Ser Ala Asn Pro Gly Glu Thr Val
 1               5                  10                  15

Lys Ile Thr Cys Ser Gly Gly Gly Ser Tyr Ala Gly Ser Tyr Tyr Tyr
                20                  25                  30

Gly Trp Tyr Gln Gln Lys Pro Gly Ser Ala Pro Val Thr Leu Ile Tyr
            35                  40                  45

Gln Asp Glu Glu Arg Pro Ser Asp Ile Pro Ser Arg Phe Ser Gly Ser
 50                  55                  60

Thr Ser Gly Ser Thr Ala Thr Leu Thr Ile Thr Gly Val Gln Ala Gly
 65                  70                  75                  80

Asp Glu Ala Asp Tyr Tyr Cys Gly Ser Trp Asp Ser Glu Asp Glu Asp
                85                  90                  95

His Phe Gly Ala Gly Thr Thr Leu Thr Val Leu
                100                 105

<210> SEQ ID NO 248
<211> LENGTH: 107
<212> TYPE: PRT
<213> ORGANISM: Artificial sequence
<220> FEATURE:
<223> OTHER INFORMATION: 4-11 VL

<400> SEQUENCE: 248

Ala Leu Thr Gln Pro Ser Ser Val Ser Ala Asn Pro Gly Glu Thr Val
 1               5                  10                  15

Lys Ile Thr Cys Ser Gly Gly Gly Ser Tyr Ala Gly Ser Tyr Tyr Tyr
                20                  25                  30

Gly Trp Tyr Gln Gln Lys Pro Gly Ser Ala Pro Val Thr Leu Ile Tyr
            35                  40                  45

Glu Asp His Glu Arg Pro Ser Asp Ile Pro Ser Arg Phe Ser Gly Ser
 50                  55                  60

Thr Ser Gly Ser Thr Ala Thr Leu Thr Ile Thr Gly Val Gln Ala Gly
 65                  70                  75                  80

Asp Glu Ala Asp Tyr Tyr Cys Gly Ser Trp Asp Ser Ser Asp Glu Asp
                85                  90                  95

His Phe Gly Ala Gly Thr Thr Leu Thr Val Leu
                100                 105

<210> SEQ ID NO 249
<211> LENGTH: 107
<212> TYPE: PRT
<213> ORGANISM: Artificial sequence
<220> FEATURE:
<223> OTHER INFORMATION: 6-10 VL

<400> SEQUENCE: 249

Ala Leu Thr Gln Pro Ser Ser Val Ser Ala Asn Pro Gly Glu Thr Val
1               5                   10                  15

Lys Ile Thr Cys Ser Gly Gly Gly Ser Tyr Ala Gly Ser Tyr Tyr Tyr
                20                  25                  30

Gly Trp Tyr Gln Gln Lys Pro Gly Ser Ala Pro Val Thr Leu Ile Tyr
            35                  40                  45

Gln Asp Leu Leu Arg Pro Ser Asp Ile Pro Ser Arg Phe Ser Gly Ser
        50                  55                  60

Thr Ser Gly Ser Thr Ala Thr Leu Thr Ile Thr Gly Val Gln Ala Gly
65                  70                  75                  80

Asp Glu Ala Asp Tyr Tyr Cys Gly Ser Trp Asp Ser Leu Ser Ser Ser
                85                  90                  95

His Phe Gly Ala Gly Thr Thr Leu Thr Val Leu
            100                 105

<210> SEQ ID NO 250
<211> LENGTH: 103
<212> TYPE: PRT
<213> ORGANISM: Artificial sequence
<220> FEATURE:
<223> OTHER INFORMATION: 2-13D; 2-13D-37; 2-13D-37-1.5W-41; 2-13D-37-3W-
      16 VL

<400> SEQUENCE: 250

Ala Leu Thr Gln Pro Ser Ser Val Ser Ala Asn Pro Gly Glu Thr Ala
1               5                   10                  15

Lys Ile Thr Cys Ser Gly Gly Val Tyr Ser Tyr Gly Trp Phe Gln Gln
                20                  25                  30

Lys Pro Gly Ser Ala Leu Val Thr Val Ile Tyr Trp Asp Asp Glu Arg
            35                  40                  45

Pro Ser Asp Ile Pro Ser Arg Phe Ser Gly Ala Leu Ser Gly Ser Thr
        50                  55                  60

Asn Thr Leu Thr Ile Thr Gly Val Gln Ala Glu Asp Glu Ala Asp Tyr
65                  70                  75                  80

Tyr Cys Gly Thr Glu Asp Ile Ser Gly Thr Ala Gly Val Phe Gly Ala
                85                  90                  95

Gly Thr Leu Thr Val Leu
            100

<210> SEQ ID NO 251
<211> LENGTH: 249
<212> TYPE: PRT
<213> ORGANISM: Artificial sequence
<220> FEATURE:
<223> OTHER INFORMATION: SS01-13 scFv

<400> SEQUENCE: 251

Ala Leu Thr Gln Pro Ser Ser Val Ser Ala Asn Pro Gly Glu Thr Val
1               5                   10                  15

Arg Ile Thr Cys Ser Gly Gly Ala Ser Ser Gly Tyr Gly Tyr Gly Trp
                20                  25                  30

```
Tyr Gln Gln Lys Pro Ser Ser Ala Pro Leu Thr Val Ile Tyr Lys Asp
            35                  40                  45

Asp Glu Arg Pro Ser Asp Ile Pro Ser Arg Phe Ser Gly Ser Ser Ser
 50                  55                  60

Gly Ser Thr His Thr Leu Thr Ile Thr Gly Val Gln Ala Glu Asp Glu
 65                  70                  75                  80

Ala Val Tyr Phe Cys Gly Asn Asp Asp Tyr Ser Ser Asp Ser Gly Tyr
                85                  90                  95

Val Gly Val Phe Gly Ala Gly Thr Thr Leu Thr Val Leu Gly Gln Ser
            100                 105                 110

Ser Arg Ser Ser Gly Gly Gly Ser Gly Gly Gly Ser Ala
            115                 120                 125

Val Thr Leu Asp Glu Ser Gly Gly Leu Gln Thr Pro Gly Gly Ala
            130                 135                 140

Leu Ser Leu Ser Cys Lys Ala Ser Gly Phe Thr Phe Ser Ser Tyr Gln
145                 150                 155                 160

Met Gly Trp Val Arg Gln Ala Pro Gly Lys Gly Leu Glu Trp Val Gly
                165                 170                 175

Val Ile Asn Lys Ser Gly Ser Asp Thr Ser Tyr Gly Ser Ala Val Lys
                180                 185                 190

Gly Arg Ala Thr Ile Ser Arg Asp Asn Gly Gln Ser Thr Leu Tyr Leu
                195                 200                 205

Gln Met Asn Asn Leu Arg Ala Glu Asp Thr Ala Val Tyr Phe Cys Ala
            210                 215                 220

Lys Gly Ser Ala Ser Tyr Ile Thr Ala Ala Thr Ile Asp Ala Trp Gly
225                 230                 235                 240

His Gly Thr Glu Val Ile Val Ser Ser
                245

<210> SEQ ID NO 252
<211> LENGTH: 249
<212> TYPE: PRT
<213> ORGANISM: Artificial sequence
<220> FEATURE:
<223> OTHER INFORMATION: SS01-13-s5 scFv

<400> SEQUENCE: 252

Ala Leu Thr Gln Pro Ser Ser Val Ser Ala Asn Pro Gly Glu Thr Ala
 1               5                  10                  15

Arg Ile Thr Cys Ser Gly Gly Ala Ser Ser Gly Tyr Gly Tyr Gly Trp
                 20                  25                  30

Tyr Gln Gln Lys Pro Ser Ser Ala Pro Leu Thr Val Ile Tyr Lys Asp
            35                  40                  45

Ser Glu Arg Pro Ser Asp Ile Pro Ser Arg Phe Ser Gly Ser Ser Ser
 50                  55                  60

Gly Ser Thr His Thr Leu Thr Ile Ser Gly Val Gln Ala Glu Asp Glu
 65                  70                  75                  80

Ala Val Tyr Phe Cys Gly Asn Asp Asp Tyr Ser Ser Asp Ser Gly Tyr
                85                  90                  95

Val Gly Val Phe Gly Ala Gly Thr Thr Leu Thr Val Leu Gly Gln Ser
            100                 105                 110

Ser Arg Ser Ser Gly Gly Gly Ser Gly Gly Gly Ser Ala
            115                 120                 125

Val Thr Leu Asp Glu Ser Gly Gly Leu Gln Thr Pro Gly Gly Ala
            130                 135                 140
```

```
Leu Arg Leu Ser Cys Lys Ala Ser Gly Phe Thr Phe Ser Ser Tyr Gln
145                 150                 155                 160

Met Gly Trp Val Arg Gln Ala Pro Gly Lys Gly Leu Glu Trp Val Ser
                165                 170                 175

Ala Ile Asn Lys Ser Gly Ser Asp Thr Ser Tyr Gly Ser Ala Val Lys
            180                 185                 190

Gly Arg Ala Thr Ile Ser Arg Asp Asn Gly Gln Ser Thr Leu Tyr Leu
            195                 200                 205

Gln Met Asn Ser Leu Arg Ala Glu Asp Thr Ala Val Tyr Phe Cys Ala
        210                 215                 220

Lys Gly Ser Ala Ser Tyr Ile Thr Ala Ala Thr Ile Asp Ala Trp Gly
225                 230                 235                 240

His Gly Thr Glu Val Ile Val Ser Ser
                245
```

<210> SEQ ID NO 253
<211> LENGTH: 249
<212> TYPE: PRT
<213> ORGANISM: Artificial sequence
<220> FEATURE:
<223> OTHER INFORMATION: S5-2.GKNG scFv

<400> SEQUENCE: 253

```
Ala Leu Thr Gln Pro Ser Ser Val Ser Ala Asn Pro Gly Glu Thr Ala
1               5                   10                  15

Arg Ile Thr Cys Ser Gly Gly Ala Ser Ser Gly Tyr Gly Tyr Gly Trp
                20                  25                  30

Tyr Gln Gln Lys Pro Ser Ser Ala Pro Leu Thr Val Ile Tyr Lys Asp
                35                  40                  45

Ser Glu Arg Pro Ser Asp Ile Pro Ser Arg Phe Ser Gly Ser Ser Ser
        50                  55                  60

Gly Ser Thr His Thr Leu Thr Ile Ser Gly Val Gln Ala Glu Asp Glu
65                  70                  75                  80

Ala Val Tyr Phe Cys Gly Asn Asp Asp Tyr Ser Ser Asp Ser Gly Tyr
                85                  90                  95

Val Gly Val Phe Gly Ala Gly Thr Thr Leu Thr Val Leu Gly Gln Ser
                100                 105                 110

Ser Arg Ser Ser Gly Gly Gly Ser Gly Gly Gly Gly Ser Ala
            115                 120                 125

Val Thr Leu Asp Glu Ser Gly Gly Gly Leu Gln Thr Pro Gly Gly Ala
            130                 135                 140

Leu Arg Leu Ser Cys Lys Ala Ser Gly Phe Thr Phe Ser Ser Tyr Gln
145                 150                 155                 160

Met Gly Trp Val Arg Gln Ala Pro Gly Lys Gly Leu Glu Trp Val Ser
                165                 170                 175

Ala Ile Asn Lys Gly Gly Ser Asp Thr Ser Tyr Gly Ser Ala Val Lys
            180                 185                 190

Gly Arg Ala Thr Ile Ser Arg Asp Asn Gly Gln Ser Thr Leu Tyr Leu
            195                 200                 205

Gln Met Asn Ser Leu Arg Ala Glu Asp Thr Ala Val Tyr Phe Cys Ala
        210                 215                 220

Lys Gly Ser Ala Ser Tyr Ile Thr Ala Ala Thr Ile Asp Ala Trp Gly
225                 230                 235                 240

His Gly Thr Glu Val Ile Val Ser Ser
                245
```

<210> SEQ ID NO 254
<211> LENGTH: 256
<212> TYPE: PRT
<213> ORGANISM: Artificial sequence
<220> FEATURE:
<223> OTHER INFORMATION: 1-7A-IT scFv

<400> SEQUENCE: 254

Ala Leu Thr Gln Pro Ser Ser Val Ser Ala Asn Pro Gly Glu Thr Val
1               5                   10                  15

Lys Ile Thr Cys Ser Gly Gly Ser Tyr Ala Gly Ser Tyr Tyr Tyr
            20                  25                  30

Gly Trp Tyr Gln Gln Lys Pro Gly Ser Ala Pro Val Thr Leu Ile Tyr
        35                  40                  45

Glu Asn Asn Lys Arg Pro Ser Asp Ile Pro Ser Arg Phe Ser Gly Ser
    50                  55                  60

Thr Ser Gly Ser Thr Ala Thr Leu Thr Ile Thr Gly Val Gln Ala Gly
65                  70                  75                  80

Asp Glu Ala Asp Tyr Tyr Cys Gly Ser Trp Asp Ser Ser Asn Gly Gly
                85                  90                  95

Ile Phe Gly Ala Gly Thr Thr Leu Thr Val Leu Gly Gln Ser Ser Arg
            100                 105                 110

Ser Ser Gly Gly Gly Gly Ser Gly Gly Gly Ser Ala Val Thr
            115                 120                 125

Leu Asp Glu Ser Gly Gly Gly Leu Gln Thr Pro Gly Gly Ala Leu Arg
130                 135                 140

Leu Ser Cys Lys Ala Ser Gly Phe Thr Phe Ser Ser Phe Asn Met Phe
145                 150                 155                 160

Trp Val Arg Gln Ala Pro Gly Lys Gly Leu Glu Tyr Val Ser Gln Ile
                165                 170                 175

Ser Ser Ser Gly Ser Ser Thr Asn Tyr Ala Pro Ala Val Lys Gly Arg
            180                 185                 190

Ala Thr Ile Ser Arg Asp Asn Gly Gln Ser Thr Leu Tyr Leu Gln Met
            195                 200                 205

Asn Ser Leu Arg Ala Glu Asp Thr Gly Thr Tyr Tyr Cys Ala Lys Ser
    210                 215                 220

Ser Tyr Asp Cys Pro Tyr Gly His Cys Ser Ser Gly Val Asp Ser Ala
225                 230                 235                 240

Gly Glu Ile Asp Ala Trp Gly His Gly Thr Glu Val Ile Val Ser Ser
                245                 250                 255

<210> SEQ ID NO 255
<211> LENGTH: 256
<212> TYPE: PRT
<213> ORGANISM: Artificial sequence
<220> FEATURE:
<223> OTHER INFORMATION: Low-PI scFv

<400> SEQUENCE: 255

Ala Leu Thr Gln Pro Ser Ser Val Ser Ala Asn Pro Gly Glu Thr Val
1               5                   10                  15

Lys Ile Thr Cys Ser Gly Gly Ser Glu Glu Glu Gln Tyr Tyr Tyr
            20                  25                  30

Gly Trp Tyr Gln Gln Lys Pro Gly Ser Ala Pro Val Thr Leu Ile Tyr
        35                  40                  45

Glu Asp Glu Glu Arg Pro Ser Asp Ile Pro Ser Arg Phe Ser Gly Ser

```
            50                  55                  60
Thr Ser Gly Ser Thr Ala Thr Leu Thr Ile Thr Gly Val Gln Ala Gly
 65                  70                  75                  80

Asp Glu Ala Asp Tyr Tyr Cys Gly Ser Trp Asp Ser Glu Asp Glu Asp
                 85                  90                  95

His Phe Gly Ala Gly Thr Thr Leu Thr Val Leu Gly Gln Ser Ser Arg
            100                 105                 110

Ser Ser Gly Gly Gly Gly Ser Ser Gly Gly Gly Ser Ala Val Thr
            115                 120                 125

Leu Asp Glu Ser Gly Gly Gly Leu Gln Thr Pro Gly Gly Ala Leu Arg
        130                 135                 140

Leu Ser Cys Lys Ala Ser Gly Phe Asp Phe Glu Ser Phe Asn Met Phe
145                 150                 155                 160

Trp Val Arg Gln Ala Pro Gly Lys Gly Leu Glu Tyr Val Ser Gln Ile
                165                 170                 175

Ser Ser Ser Glu Glu Asp Glu Asn Tyr Ala Pro Ala Val Lys Gly Arg
            180                 185                 190

Ala Thr Ile Ser Arg Asp Asn Gly Gln Ser Thr Leu Tyr Leu Gln Met
        195                 200                 205

Asn Ser Leu Arg Ala Glu Asp Thr Gly Thr Tyr Tyr Cys Ala Lys Ser
210                 215                 220

Ser Tyr Asp Cys Pro Tyr Gly His Cys Ser Ser Gly Val Asp Ser Ala
225                 230                 235                 240

Gly Glu Ile Asp Ala Trp Gly His Gly Thr Glu Val Ile Val Ser Ser
                245                 250                 255

<210> SEQ ID NO 256
<211> LENGTH: 256
<212> TYPE: PRT
<213> ORGANISM: Artificial sequence
<220> FEATURE:
<223> OTHER INFORMATION: 1-30 scFv

<400> SEQUENCE: 256

Ala Leu Thr Gln Pro Ser Ser Val Ser Ala Asn Pro Gly Glu Thr Val
 1               5                  10                  15

Lys Ile Thr Cys Ser Gly Gly Gly Ser Glu Glu Glu Gln Tyr Tyr Tyr
                20                  25                  30

Gly Trp Tyr Gln Gln Lys Pro Gly Ser Ala Pro Val Thr Leu Ile Tyr
            35                  40                  45

Gln Asp Glu Glu Arg Pro Ser Asp Ile Pro Ser Arg Phe Ser Gly Ser
         50                  55                  60

Thr Ser Gly Ser Thr Ala Thr Leu Thr Ile Thr Gly Val Gln Ala Gly
 65                  70                  75                  80

Asp Glu Ala Asp Tyr Tyr Cys Gly Ser Trp Asp Ser Glu Asp Glu Asp
                 85                  90                  95

His Phe Gly Ala Gly Thr Thr Leu Thr Val Leu Gly Gln Ser Ser Arg
            100                 105                 110

Ser Ser Gly Gly Gly Gly Ser Ser Gly Gly Gly Ser Ala Val Thr
            115                 120                 125

Leu Asp Glu Ser Gly Gly Gly Leu Gln Thr Pro Gly Gly Ala Leu Arg
        130                 135                 140

Leu Ser Cys Lys Ala Ser Gly Phe Asp Phe Glu Ser Phe Asn Met Phe
145                 150                 155                 160

Trp Val Arg Gln Ala Pro Gly Lys Gly Leu Glu Tyr Val Ser Gln Ile
```

```
                165                 170                 175
Ser Ser Ser Glu Glu Asp Glu Asn Tyr Ala Pro Ala Val Lys Gly Arg
            180                 185                 190

Ala Thr Ile Ser Arg Asp Asn Gly Gln Ser Thr Leu Tyr Leu Gln Met
            195                 200                 205

Asn Ser Leu Arg Ala Glu Asp Thr Gly Thr Tyr Tyr Cys Ala Lys Ser
        210                 215                 220

Ser Tyr Asp Cys Pro Tyr Gly His Cys Ser Ser Gly Val Asp Ser Ala
225                 230                 235                 240

Gly Glu Ile Asp Ala Trp Gly His Gly Thr Glu Val Ile Val Ser Ser
                245                 250                 255

<210> SEQ ID NO 257
<211> LENGTH: 256
<212> TYPE: PRT
<213> ORGANISM: Artificial sequence
<220> FEATURE:
<223> OTHER INFORMATION: 1-17 scFv

<400> SEQUENCE: 257

Ala Leu Thr Gln Pro Ser Ser Val Ser Ala Asn Pro Gly Glu Thr Val
1               5                   10                  15

Lys Ile Thr Cys Ser Gly Gly Ser Tyr Ala Gly Ser Tyr Tyr Tyr
            20                  25                  30

Gly Trp Tyr Gln Gln Lys Pro Gly Ser Ala Pro Val Thr Leu Ile Tyr
                35                  40                  45

Glu Asp Glu Gln Arg Pro Ser Asp Ile Pro Ser Arg Phe Ser Gly Ser
50                  55                  60

Thr Ser Gly Ser Thr Ala Thr Leu Thr Ile Thr Gly Val Gln Ala Gly
65                  70                  75                  80

Asp Glu Ala Asp Tyr Tyr Cys Gly Ser Trp Asp Ser Glu Asp Glu Asp
                85                  90                  95

His Phe Gly Ala Gly Thr Thr Leu Thr Val Leu Gly Gln Ser Ser Arg
            100                 105                 110

Ser Ser Gly Gly Gly Gly Ser Ser Gly Gly Gly Ser Ala Val Thr
        115                 120                 125

Leu Asp Glu Ser Gly Gly Leu Gln Thr Pro Gly Gly Ala Leu Arg
130                 135                 140

Leu Ser Cys Lys Ala Ser Gly Phe Asp Phe Glu Ser Phe Asn Met Phe
145                 150                 155                 160

Trp Val Arg Gln Ala Pro Gly Lys Gly Leu Glu Tyr Val Ser Gln Ile
                165                 170                 175

Ser Ser Ser Glu Glu Asp Glu Asn Tyr Ala Pro Ala Val Lys Gly Arg
            180                 185                 190

Ala Thr Ile Ser Arg Asp Asn Gly Gln Ser Thr Leu Tyr Leu Gln Met
            195                 200                 205

Asn Ser Leu Arg Ala Glu Asp Thr Gly Thr Tyr Tyr Cys Ala Lys Ser
        210                 215                 220

Ser Tyr Asp Cys Pro Tyr Gly His Cys Ser Ser Gly Val Asp Ser Ala
225                 230                 235                 240

Gly Glu Ile Asp Ala Trp Gly His Gly Thr Glu Val Ile Val Ser Ser
                245                 250                 255

<210> SEQ ID NO 258
<211> LENGTH: 256
<212> TYPE: PRT
```

```
<213> ORGANISM: Artificial sequence
<220> FEATURE:
<223> OTHER INFORMATION: 1-32 scFv

<400> SEQUENCE: 258

Ala Leu Thr Gln Pro Ser Ser Val Ser Ala Asn Pro Gly Glu Thr Val
1               5                   10                  15

Lys Ile Thr Cys Ser Gly Gly Ser Tyr Ala Gly Ser Tyr Tyr Tyr
            20                  25                  30

Gly Trp Tyr Gln Gln Lys Pro Gly Ser Ala Pro Val Thr Leu Ile Tyr
                35                  40                  45

Gln Asp Glu Glu Arg Pro Ser Asp Ile Pro Ser Arg Phe Ser Gly Ser
        50                  55                  60

Thr Ser Gly Ser Thr Ala Thr Leu Thr Ile Thr Gly Val Gln Ala Gly
65                  70                  75                  80

Asp Glu Ala Asp Tyr Tyr Cys Gly Ser Trp Asp Ser Glu Asp Glu Asp
                85                  90                  95

His Phe Gly Ala Gly Thr Thr Leu Thr Val Leu Gly Gln Ser Ser Arg
            100                 105                 110

Ser Ser Gly Gly Gly Gly Ser Gly Gly Gly Ser Ala Val Thr
            115                 120                 125

Leu Asp Glu Ser Gly Gly Leu Gln Thr Pro Gly Gly Ala Leu Arg
130                 135                 140

Leu Ser Cys Lys Ala Ser Gly Phe Asp Phe Glu Ser Phe Asn Met Phe
145                 150                 155                 160

Trp Val Arg Gln Ala Pro Gly Lys Gly Leu Glu Tyr Val Ser Gln Ile
                165                 170                 175

Ser Ser Ser Glu Glu Asp Glu Asn Tyr Ala Pro Ala Val Lys Gly Arg
            180                 185                 190

Ala Thr Ile Ser Arg Asp Asn Gly Gln Ser Thr Leu Tyr Leu Gln Met
        195                 200                 205

Asn Ser Leu Arg Ala Glu Asp Thr Gly Thr Tyr Tyr Cys Ala Lys Ser
    210                 215                 220

Ser Tyr Asp Cys Pro Tyr Gly His Cys Ser Ser Gly Val Asp Ser Ala
225                 230                 235                 240

Gly Glu Ile Asp Ala Trp Gly His Gly Thr Glu Val Ile Val Ser Ser
                245                 250                 255

<210> SEQ ID NO 259
<211> LENGTH: 256
<212> TYPE: PRT
<213> ORGANISM: Artificial sequence
<220> FEATURE:
<223> OTHER INFORMATION: 4-11 scFv

<400> SEQUENCE: 259

Ala Leu Thr Gln Pro Ser Ser Val Ser Ala Asn Pro Gly Glu Thr Val
1               5                   10                  15

Lys Ile Thr Cys Ser Gly Gly Ser Tyr Ala Gly Ser Tyr Tyr Tyr
            20                  25                  30

Gly Trp Tyr Gln Gln Lys Pro Gly Ser Ala Pro Val Thr Leu Ile Tyr
                35                  40                  45

Glu Asp His Glu Arg Pro Ser Asp Ile Pro Ser Arg Phe Ser Gly Ser
        50                  55                  60

Thr Ser Gly Ser Thr Ala Thr Leu Thr Ile Thr Gly Val Gln Ala Gly
65                  70                  75                  80
```

Asp Glu Ala Asp Tyr Tyr Cys Gly Ser Trp Asp Ser Ser Asp Glu Asp
                85                  90                  95

His Phe Gly Ala Gly Thr Thr Leu Thr Val Leu Gly Gln Ser Ser Arg
            100                 105                 110

Ser Ser Gly Gly Gly Gly Ser Ser Gly Gly Gly Ser Ala Val Thr
        115                 120                 125

Leu Asp Glu Ser Gly Gly Gly Leu Gln Thr Pro Gly Gly Ala Leu Arg
130                 135                 140

Leu Ser Cys Lys Ala Ser Gly Phe Asp Phe Glu Ser Phe Asn Met Phe
145                 150                 155                 160

Trp Val Arg Gln Ala Pro Gly Lys Gly Leu Glu Tyr Val Ser Gln Ile
                165                 170                 175

Ser Ser Ser Glu Glu Asp Glu Asn Tyr Ala Pro Ala Val Lys Gly Arg
            180                 185                 190

Ala Thr Ile Ser Arg Asp Asn Gly Gln Ser Thr Leu Tyr Leu Gln Met
        195                 200                 205

Asn Ser Leu Arg Ala Glu Asp Thr Gly Thr Tyr Tyr Cys Ala Lys Ser
210                 215                 220

Ser Tyr Asp Cys Pro Tyr Gly His Cys Ser Ser Gly Val Asp Ser Ala
225                 230                 235                 240

Gly Glu Ile Asp Ala Trp Gly His Gly Thr Glu Val Ile Val Ser Ser
                245                 250                 255

<210> SEQ ID NO 260
<211> LENGTH: 256
<212> TYPE: PRT
<213> ORGANISM: Artificial sequence
<220> FEATURE:
<223> OTHER INFORMATION: 6-10 scFv

<400> SEQUENCE: 260

Ala Leu Thr Gln Pro Ser Ser Val Ser Ala Asn Pro Gly Glu Thr Val
1               5                   10                  15

Lys Ile Thr Cys Ser Gly Gly Ser Tyr Ala Gly Ser Tyr Tyr Tyr
            20                  25                  30

Gly Trp Tyr Gln Gln Lys Pro Gly Ser Ala Pro Val Thr Leu Ile Tyr
        35                  40                  45

Gln Asp Leu Leu Arg Pro Ser Asp Ile Pro Ser Arg Phe Ser Gly Ser
    50                  55                  60

Thr Ser Gly Ser Thr Ala Thr Leu Thr Ile Thr Gly Val Gln Ala Gly
65                  70                  75                  80

Asp Glu Ala Asp Tyr Tyr Cys Gly Ser Trp Asp Ser Leu Ser Ser Ser
                85                  90                  95

His Phe Gly Ala Gly Thr Thr Leu Thr Val Leu Gly Gln Ser Ser Arg
            100                 105                 110

Ser Ser Gly Gly Gly Gly Ser Ser Gly Gly Gly Ser Ala Val Thr
        115                 120                 125

Leu Asp Glu Ser Gly Gly Gly Leu Gln Thr Pro Gly Gly Ala Leu Arg
130                 135                 140

Leu Ser Cys Lys Ala Ser Gly Phe Asp Phe Glu Ser Phe Asn Met Phe
145                 150                 155                 160

Trp Val Arg Gln Ala Pro Gly Lys Gly Leu Glu Tyr Val Ser Gln Ile
                165                 170                 175

Ser Ser Ser Glu Glu Asp Glu Asn Tyr Ala Pro Ala Val Lys Gly Arg
            180                 185                 190

```
Ala Thr Ile Ser Arg Asp Asn Gly Gln Ser Thr Leu Tyr Leu Gln Met
            195                 200                 205

Asn Ser Leu Arg Ala Glu Asp Thr Gly Thr Tyr Tyr Cys Ala Lys Ser
    210                 215                 220

Ser Tyr Asp Cys Pro Tyr Gly His Cys Ser Ser Gly Val Asp Ser Ala
225                 230                 235                 240

Gly Glu Ile Asp Ala Trp Gly His Gly Thr Glu Val Ile Val Ser Ser
                245                 250                 255

<210> SEQ ID NO 261
<211> LENGTH: 250
<212> TYPE: PRT
<213> ORGANISM: Artificial sequence
<220> FEATURE:
<223> OTHER INFORMATION: 2-13D scFv

<400> SEQUENCE: 261

Ala Leu Thr Gln Pro Ser Ser Val Ser Ala Asn Pro Gly Glu Thr Ala
1               5                   10                  15

Lys Ile Thr Cys Ser Gly Gly Val Tyr Ser Tyr Gly Trp Phe Gln Gln
            20                  25                  30

Lys Pro Gly Ser Ala Leu Val Thr Val Ile Tyr Trp Asp Asp Glu Arg
        35                  40                  45

Pro Ser Asp Ile Pro Ser Arg Phe Ser Gly Ala Leu Ser Gly Ser Thr
50                  55                  60

Asn Thr Leu Thr Ile Thr Gly Val Gln Ala Glu Asp Glu Ala Asp Tyr
65                  70                  75                  80

Tyr Cys Gly Thr Glu Asp Ile Ser Gly Thr Ala Gly Val Phe Gly Ala
                85                  90                  95

Gly Thr Thr Leu Thr Val Leu Gly Gln Ser Ser Arg Ser Ser Gly Gly
            100                 105                 110

Gly Gly Ser Ser Gly Gly Gly Ser Ala Val Thr Leu Asp Glu Ser
        115                 120                 125

Gly Gly Gly Leu Gln Thr Pro Gly Gly Ala Leu Arg Leu Ser Cys Ser
130                 135                 140

Ala Ser Gly Phe Thr Phe Ser Ser His Gly Met Phe Trp Val Arg Gln
145                 150                 155                 160

Ala Pro Gly Lys Gly Leu Glu Tyr Val Ser Glu Ile Thr Asn Asp Gly
                165                 170                 175

Ser Gly Thr Asn Tyr Gly Ser Ala Val Lys Gly Arg Ala Thr Ile Ser
            180                 185                 190

Arg Asp Asn Gly Gln Ser Thr Leu Tyr Leu Gln Met Asn Ser Leu Arg
        195                 200                 205

Ala Glu Asp Thr Gly Thr Tyr Phe Cys Ala Arg Ser Thr Tyr Glu Cys
210                 215                 220

Pro Gly Gly Phe Ser Cys Trp Gly Asp Thr Gly Gln Ile Asp Ala Trp
225                 230                 235                 240

Gly His Gly Thr Glu Val Ile Val Ser Ser
                245                 250

<210> SEQ ID NO 262
<211> LENGTH: 250
<212> TYPE: PRT
<213> ORGANISM: Artificial sequence
<220> FEATURE:
<223> OTHER INFORMATION: 2-13D-37 scFv

<400> SEQUENCE: 262
```

```
Ala Leu Thr Gln Pro Ser Ser Val Ser Ala Asn Pro Gly Glu Thr Ala
1               5                   10                  15

Lys Ile Thr Cys Ser Gly Gly Val Tyr Ser Tyr Gly Trp Phe Gln Gln
                20                  25                  30

Lys Pro Gly Ser Ala Leu Val Thr Val Ile Tyr Trp Asp Asp Glu Arg
            35                  40                  45

Pro Ser Asp Ile Pro Ser Arg Phe Ser Gly Ala Leu Ser Gly Ser Thr
        50                  55                  60

Asn Thr Leu Thr Ile Thr Gly Val Gln Ala Glu Asp Glu Ala Asp Tyr
65                  70                  75                  80

Tyr Cys Gly Thr Glu Asp Ile Ser Gly Thr Ala Gly Val Phe Gly Ala
                85                  90                  95

Gly Thr Thr Leu Thr Val Leu Gly Gln Ser Ser Arg Ser Ser Gly Gly
                100                 105                 110

Gly Gly Ser Ser Gly Gly Gly Ser Ala Val Thr Leu Asp Glu Ser
            115                 120                 125

Gly Gly Gly Leu Gln Thr Pro Gly Gly Ala Leu Arg Leu Ser Cys Ser
        130                 135                 140

Ala Ser Gly Phe Asp Phe Ser Ser His Gly Met Phe Trp Val Arg Gln
145                 150                 155                 160

Ala Pro Gly Lys Gly Leu Glu Tyr Val Ser Glu Ile Thr Asn Asp Gly
                165                 170                 175

Ser Gly Thr Asn Tyr Gly Ser Ala Val Lys Gly Arg Ala Thr Ile Ser
                180                 185                 190

Arg Asp Asn Gly Gln Ser Thr Leu Tyr Leu Gln Met Asn Ser Leu Arg
            195                 200                 205

Ala Glu Asp Thr Gly Thr Tyr Phe Cys Ala Arg Ser Thr Tyr Glu Cys
        210                 215                 220

Pro Gly Gly Phe Ser Cys Trp Gly Asp Thr Gly Gln Ile Asp Ala Trp
225                 230                 235                 240

Gly His Gly Thr Glu Val Ile Val Ser Ser
                245                 250

<210> SEQ ID NO 263
<211> LENGTH: 250
<212> TYPE: PRT
<213> ORGANISM: Artificial sequence
<220> FEATURE:
<223> OTHER INFORMATION: 2-13D-37-1.5W-41 scFv

<400> SEQUENCE: 263

Ala Leu Thr Gln Pro Ser Ser Val Ser Ala Asn Pro Gly Glu Thr Ala
1               5                   10                  15

Lys Ile Thr Cys Ser Gly Gly Val Tyr Ser Tyr Gly Trp Phe Gln Gln
                20                  25                  30

Lys Pro Gly Ser Ala Leu Val Thr Val Ile Tyr Trp Asp Asp Glu Arg
            35                  40                  45

Pro Ser Asp Ile Pro Ser Arg Phe Ser Gly Ala Leu Ser Gly Ser Thr
        50                  55                  60

Asn Thr Leu Thr Ile Thr Gly Val Gln Ala Glu Asp Glu Ala Asp Tyr
65                  70                  75                  80

Tyr Cys Gly Thr Glu Asp Ile Ser Gly Thr Ala Gly Val Phe Gly Ala
                85                  90                  95

Gly Thr Thr Leu Thr Val Leu Gly Gln Ser Ser Arg Ser Ser Gly Gly
                100                 105                 110
```

```
Gly Gly Ser Ser Gly Gly Gly Ser Ala Val Thr Leu Asp Glu Ser
            115                 120                 125

Gly Gly Gly Leu Gln Thr Pro Gly Gly Ala Leu Arg Leu Ser Cys Ser
            130                 135                 140

Ala Ser Gly Phe Asp Phe Ser Ser His Gly Met Phe Trp Val Arg Gln
145                 150                 155                 160

Ala Pro Gly Lys Gly Leu Glu Tyr Val Ser Glu Ile Thr Asn Asp Gly
                165                 170                 175

Ser Gly Thr Asn Tyr Gly Ser Ala Val Lys Gly Arg Ala Thr Ile Ser
            180                 185                 190

Arg Asp Asn Gly Gln Ser Thr Leu Tyr Leu Gln Met Asn Ser Leu Arg
            195                 200                 205

Ala Glu Asp Thr Gly Thr Tyr Phe Cys Ala Arg Ser Ser Tyr Val Cys
        210                 215                 220

Pro Gly Phe Ser Cys Trp Gly Asp Thr Gly Gln Ile Asp Ala Trp
225                 230                 235                 240

Gly His Gly Thr Glu Val Ile Val Ser Ser
            245                 250

<210> SEQ ID NO 264
<211> LENGTH: 250
<212> TYPE: PRT
<213> ORGANISM: Artificial sequence
<220> FEATURE:
<223> OTHER INFORMATION: 2-13D-37-3W-16 scFv

<400> SEQUENCE: 264

Ala Leu Thr Gln Pro Ser Ser Val Ser Ala Asn Pro Gly Glu Thr Ala
1               5                   10                  15

Lys Ile Thr Cys Ser Gly Gly Val Tyr Ser Tyr Gly Trp Phe Gln Gln
            20                  25                  30

Lys Pro Gly Ser Ala Leu Val Thr Val Ile Tyr Trp Asp Asp Glu Arg
        35                  40                  45

Pro Ser Asp Ile Pro Ser Arg Phe Ser Gly Ala Leu Ser Gly Ser Thr
    50                  55                  60

Asn Thr Leu Thr Ile Thr Gly Val Gln Ala Glu Asp Glu Ala Asp Tyr
65                  70                  75                  80

Tyr Cys Gly Thr Glu Asp Ile Ser Gly Thr Ala Gly Val Phe Gly Ala
                85                  90                  95

Gly Thr Thr Leu Thr Val Leu Gly Gln Ser Ser Arg Ser Ser Gly Gly
            100                 105                 110

Gly Gly Ser Ser Gly Gly Gly Ser Ala Val Thr Leu Asp Glu Ser
            115                 120                 125

Gly Gly Gly Leu Gln Thr Pro Gly Gly Ala Leu Arg Leu Ser Cys Ser
            130                 135                 140

Ala Ser Gly Phe Asp Phe Ser Ser His Gly Met Phe Trp Val Arg Gln
145                 150                 155                 160

Ala Pro Gly Lys Gly Leu Glu Tyr Val Ser Glu Ile Thr Asn Asp Gly
                165                 170                 175

Ser Gly Thr Asn Tyr Gly Ser Ala Val Lys Gly Arg Ala Thr Ile Ser
            180                 185                 190

Arg Asp Asn Gly Gln Ser Thr Leu Tyr Leu Gln Met Asn Ser Leu Arg
            195                 200                 205

Ala Glu Asp Thr Gly Thr Tyr Phe Cys Ala Arg Ser Asn Tyr Ala Cys
        210                 215                 220
```

```
Pro Gly Gly Phe Ser Cys Trp Gly Asp Thr Gly Gln Ile Asp Ala Trp
225                 230                 235                 240

Gly His Gly Thr Glu Val Ile Val Ser Ser
                245                 250
```

<210> SEQ ID NO 265
<211> LENGTH: 366
<212> TYPE: DNA
<213> ORGANISM: Artificial sequence
<220> FEATURE:
<223> OTHER INFORMATION: SS01-13 VH

<400> SEQUENCE: 265

| | | | | | |
|---|---|---|---|---|---|
| gccgtgacgt | tggacgagtc | cggggggcggc | ctccagacgc | ccggaggagc | gctctctctc | 60 |
| tcttgcaaag | cctccgggtt | caccttcagc | agctatcaga | tgggctgggt | gcgacaggcg | 120 |
| cccggcaagg | ggctggaatg | ggtcggtgtt | attaacaagt | ctggtagtga | cacatcatac | 180 |
| gggtcggcgg | tgaagggccg | tgccaccatc | tcgaggaca | acgggcagag | cacactgtac | 240 |
| ctgcagatga | acaacctcag | ggctgaggac | accgctgttt | acttctgcgc | caaaggttct | 300 |
| gctagttaca | taactgctgc | taccatcgac | gcatggggcc | acgggaccga | agtcatcgtc | 360 |
| tcctcc | | | | | | 366 |

<210> SEQ ID NO 266
<211> LENGTH: 366
<212> TYPE: DNA
<213> ORGANISM: Artificial sequence
<220> FEATURE:
<223> OTHER INFORMATION: SS01-13-S5 VH

<400> SEQUENCE: 266

| | | | | | |
|---|---|---|---|---|---|
| gccgtgacgt | tggacgagtc | cggggggcggc | ctccagacgc | ccggaggagc | gctccgcctc | 60 |
| tcttgcaagg | cctccgggtt | caccttcagc | agctatcaga | tgggctgggt | gcgacaggcg | 120 |
| cccggcaagg | ggctggaatg | ggtcagcgcg | attaataaga | gcggtagtga | cacatcatac | 180 |
| gggtcggcgg | tgaagggccg | tgccaccatc | tcgaggaca | acgggcagag | cacactgtac | 240 |
| ctgcagatga | acagcctcag | ggctgaggac | accgctgttt | acttctgcgc | caaaggttct | 300 |
| gctagttaca | taactgctgc | taccatcgac | gcatggggcc | acgggaccga | agtcatcgtc | 360 |
| tcctcc | | | | | | 366 |

<210> SEQ ID NO 267
<211> LENGTH: 366
<212> TYPE: DNA
<213> ORGANISM: Artificial sequence
<220> FEATURE:
<223> OTHER INFORMATION: S5-2.GKNG VH

<400> SEQUENCE: 267

| | | | | | |
|---|---|---|---|---|---|
| gccgtgacgt | tggacgagtc | cggggggcggc | ctccagacgc | ccggaggagc | gctccgcctc | 60 |
| tcttgcaagg | cctccgggtt | caccttcagc | agctatcaga | tgggctgggt | gcgacaggcg | 120 |
| cccggcaagg | ggctggaatg | ggtcagcgcg | attaataagg | gcggtagtga | cacatcatac | 180 |
| gggtcggcgg | tgaagggccg | tgccaccatc | tcgaggaca | acgggcagag | cacactgtac | 240 |
| ctgcagatga | acagcctcag | ggctgaggac | accgctgttt | acttctgcgc | caaaggttct | 300 |
| gctagttaca | taactgctgc | taccatcgac | gcatggggcc | acgggaccga | agtcatcgtc | 360 |
| tcctcc | | | | | | 366 |

<210> SEQ ID NO 268
<211> LENGTH: 393
<212> TYPE: DNA
<213> ORGANISM: Artificial sequence
<220> FEATURE:
<223> OTHER INFORMATION: 1-7A-IT VH

<400> SEQUENCE: 268

```
gccgtgacgt tggatgaatc cgggggcggc ctccagacgc ccggaggagc gctccgcctc    60
agctgcaagg cctctgggtt caccttcagc agcttcaaca tgttctgggt gcgacaggcg   120
cccggcaagg ggctggaata cgtctcgcag attagcagca gtggtagtag cacaaactac   180
gcacccgcgg tgaaaggccg tgccaccatc tcgagggaca cgggcagag cacactgtat    240
ctgcagatga acagcctgcg cgctgaagac accggcacct actactgcgc caaaagtagt   300
tatgactgtc cttacggtca ttgtagtagt ggtgttgata gtgctggtga gatcgacgca   360
tggggccacg ggaccgaagt catcgtctcc tcc                                 393
```

<210> SEQ ID NO 269
<211> LENGTH: 393
<212> TYPE: DNA
<213> ORGANISM: Artificial sequence
<220> FEATURE:
<223> OTHER INFORMATION: Low-PI VH

<400> SEQUENCE: 269

```
gccgtgacgt tggatgaatc cgggggcggc ctccagacgc ccggaggagc gctccgcctc    60
agctgcaagg cctctgggtt caccttcagc agcttcaaca tgttctgggt gcgacaggcg   120
cccggcaagg ggctggaata cgtctcgcag attagcagca gtggtagtag cacaaactac   180
gcacccgcgg tgaaaggccg tgccaccatc tcgagggaca cgggcagag cacactgtat    240
ctgcagatga acagcctgcg cgctgaagac accggcacct actactgcgc caaaagtagt   300
tatgactgtc cttacggtca ttgtagtagt ggtgttgata gtgctggtga gatcgacgca   360
tggggccacg ggaccgaagt catcgtctcc tcc                                 393
```

<210> SEQ ID NO 270
<211> LENGTH: 393
<212> TYPE: DNA
<213> ORGANISM: Artificial sequence
<220> FEATURE:
<223> OTHER INFORMATION: 1-30 VH

<400> SEQUENCE: 270

```
gccgtgacgt tggatgaatc cgggggcggc ctccagacgc ccggaggagc gctccgcctc    60
agctgcaagg cctctggctt tgattttgaa agcttcaaca tgttctgggt gcgacaggcg   120
cccggcaagg ggctggaata cgtctcgcag attagcagca gtgaagaaga tgaaaactac   180
gcacccgcgg tgaaaggccg tgccaccatc tcgagggaca cgggcagag cacactgtat    240
ctgcagatga acagcctgcg cgctgaagac accggcacct actactgcgc caaaagtagt   300
tatgactgtc cttacggtca ttgtagtagt ggtgttgata gtgctggtga gatcgacgca   360
tggggccacg ggaccgaagt catcgtctcc tcc                                 393
```

<210> SEQ ID NO 271
<211> LENGTH: 393
<212> TYPE: DNA
<213> ORGANISM: Artificial sequence
<220> FEATURE:
<223> OTHER INFORMATION: 1-17 VH

<400> SEQUENCE: 271

| gccgtgacgt tggatgaatc cggggcggc ctccagacgc ccggaggagc gctccgcctc | 60 |
|---|---|
| agctgcaagg cctctggctt tgattttgaa agcttcaaca tgttctgggt gcgacaggcg | 120 |
| cccggcaagg ggctggaata cgtctcgcag attagcagca gtgaagaaga tgaaaactac | 180 |
| gcacccgcgg tgaaaggccg tgccaccatc tcgagggaca cgggcagag cacactgtat | 240 |
| ctgcagatga acagcctgcg cgctgaagac accggcacct actactgcgc caaaagtagt | 300 |
| tatgactgtc cttacggtca ttgtagtagt ggtgttgata gtgctggtga gatcgacgca | 360 |
| tggggccacg ggaccgaagt catcgtctcc tcc | 393 |

<210> SEQ ID NO 272
<211> LENGTH: 393
<212> TYPE: DNA
<213> ORGANISM: Artificial sequence
<220> FEATURE:
<223> OTHER INFORMATION: 1-32 VH

<400> SEQUENCE: 272

| gccgtgacgt tggatgaatc cggggcggc ctccagacgc ccggaggagc gctccgcctc | 60 |
|---|---|
| agctgcaagg cctctggctt tgattttgaa agcttcaaca tgttctgggt gcgacaggcg | 120 |
| cccggcaagg ggctggaata cgtctcgcag attagcagca gtgaagaaga tgaaaactac | 180 |
| gcacccgcgg tgaaaggccg tgccaccatc tcgagggaca cgggcagag cacactgtat | 240 |
| ctgcagatga acagcctgcg cgctgaagac accggcacct actactgcgc caaaagtagt | 300 |
| tatgactgtc cttacggtca ttgtagtagt ggtgttgata gtgctggtga gatcgacgca | 360 |
| tggggccacg ggaccgaagt catcgtctcc tcc | 393 |

<210> SEQ ID NO 273
<211> LENGTH: 393
<212> TYPE: DNA
<213> ORGANISM: Artificial sequence
<220> FEATURE:
<223> OTHER INFORMATION: 4-11 VH

<400> SEQUENCE: 273

| gccgtgacgt tggatgaatc cggggcggc ctccagacgc ccggaggagc gctccgcctc | 60 |
|---|---|
| agctgcaagg cctctggctt tgattttgaa agcttcaaca tgttctgggt gcgacaggcg | 120 |
| cccggcaagg ggctggaata cgtctcgcag attagcagca gtgaagaaga tgaaaactac | 180 |
| gcacccgcgg tgaaaggccg tgccaccatc tcgagggaca cgggcagag cacactgtat | 240 |
| ctgcagatga acagcctgcg cgctgaagac accggcacct actactgcgc caaaagtagt | 300 |
| tatgactgtc cttacggtca ttgtagtagt ggtgttgata gtgctggtga gatcgacgca | 360 |
| tggggccacg ggaccgaagt catcgtctcc tcc | 393 |

<210> SEQ ID NO 274
<211> LENGTH: 393
<212> TYPE: DNA
<213> ORGANISM: Artificial sequence
<220> FEATURE:
<223> OTHER INFORMATION: 6-10 VH

<400> SEQUENCE: 274

| gccgtgacgt tggatgaatc cggggcggc ctccagacgc ccggaggagc gctccgcctc | 60 |
|---|---|
| agctgcaagg cctctggctt tgattttgaa agcttcaaca tgttctgggt gcgacaggcg | 120 |

```
cccggcaagg ggctggaata cgtctcgcag attagcagca gtgaagaaga tgaaaactac    180
gcacccgcgg tgaaaggccg tgccaccatc tcgaggaca acgggcagag cacactgtat     240
ctgcagatga acagcctgcg cgctgaagac accggcacct actactgcgc caaaagtagt   300
tatgactgtc cttacggtca ttgtagtagt ggtgttgata tgctggtga atcgacgca     360 tggggccacg ggaccgaagt catcgtctcc tcc                                 393

<210> SEQ ID NO 275
<211> LENGTH: 387
<212> TYPE: DNA
<213> ORGANISM: Artificial sequence
<220> FEATURE:
<223> OTHER INFORMATION: 2-13D VH

<400> SEQUENCE: 275
gccgtgacgt tggacgagtc cgggggcggc ctccagacgc ccggaggagc gctccgcctt    60
agctgcagcg cctccgggtt caccttcagc agccatggca tgttctgggt gcgacaggcg   120
cccggcaagg ggttggaata tgtctcggag attaccaatg atggtagtgg cacaaactac   180
gggtcggcgg tgaagggccg tgccaccatc tcgaggaca acgggcagag cacactgtat    240
ctgcagatga acagcctcag ggctgaggac accggcacct acttctgcgc cagatctact   300
tatgaatgtc ctggtggttt tagttgttgg ggtgatactg gtcaaataga cgcatggggc   360
cacgggaccg aagtcatcgt ctcctcc                                        387

<210> SEQ ID NO 276
<211> LENGTH: 387
<212> TYPE: DNA
<213> ORGANISM: Artificial sequence
<220> FEATURE:
<223> OTHER INFORMATION: 2-13D-37 VH

<400> SEQUENCE: 276
gccgtgacgt tggacgagtc cgggggcggc ctccagacgc ccggaggagc gctccgcctt    60
agctgcagcg cctccgggtt cgatttcagc agccatggca tgttctgggt gcgacaggcg   120
cccggcaagg ggttggaata tgtctcggag attaccaatg atggtagtgg cacaaactac   180
gggtcggcgg tgaagggccg tgccaccatc tcgaggaca acgggcagag cacactgtat    240
ctgcagatga acagcctcag ggctgaggac accggcacct acttctgcgc cagatctact   300
tatgaatgtc ctggtggttt tagttgttgg ggtgatactg gtcaaataga cgcatggggc   360
cacgggaccg aagtcatcgt ctcctcc                                        387

<210> SEQ ID NO 277
<211> LENGTH: 387
<212> TYPE: DNA
<213> ORGANISM: Artificial sequence
<220> FEATURE:
<223> OTHER INFORMATION: 2-13D-37-1.5W-41 VH

<400> SEQUENCE: 277
gccgtgacgt tggacgagtc cgggggcggc ctccagacgc ccggaggagc gctccgcctt    60
agctgcagcg cctccgggtt cgatttcagc agccatggca tgttctgggt gcgacaggcg   120
cccggcaagg ggttggaata tgtctcggag attaccaatg atggtagtgg cacaaactac   180
gggtcggcgg tgaagggccg tgccaccatc tcgaggaca acgggcagag cacactgtat    240
ctgcagatga acagcctcag ggctgaggac accggcacct acttctgcgc cagatcttct   300
tatgtttgtc ctggtggttt tagttgttgg ggtgatactg gtcaaataga cgcatggggc   360
```

```
cacgggaccg aagtcatcgt ctcctcc                                     387
```

<210> SEQ ID NO 278
<211> LENGTH: 387
<212> TYPE: DNA
<213> ORGANISM: Artificial sequence
<220> FEATURE:
<223> OTHER INFORMATION: 2-13D-37-3W-16 VH

<400> SEQUENCE: 278

```
gccgtgacgt tggacgagtc cgggggcggc tccagacgc ccggaggagc gctccgcctt    60
agctgcagcg cctccgggtt cgatttcagc agccatggca tgttctgggt gcgacaggcg   120
cccggcaagg ggttggaata tgtctcggag attaccaatg atggtagtgg cacaaactac   180
gggtcggcgg tgaagggccg tgccaccatc tcgaggaca acgggcagag cacactgtat    240
ctgcagatga acagcctcag ggctgaggac accggcacct acttctgcgc cagatctaat   300
tatgcttgtc ctggtggttt tagttgttgg ggtgatactg gtcaaataga cgcatggggc   360
cacgggaccg aagtcatcgt ctcctcc                                      387
```

<210> SEQ ID NO 279
<211> LENGTH: 327
<212> TYPE: DNA
<213> ORGANISM: Artificial sequence
<220> FEATURE:
<223> OTHER INFORMATION: SS01-13 VL

<400> SEQUENCE: 279

```
gccctgactc agccgtcctc ggtgtcagca accctgggg aaactgttcg tatcacctgc    60
tccgggggtg ctagcagtgg ctatggttat ggctggtatc agcagaagcc tagcagtgcc   120
cctctcactg tgatctacaa agacgacgaa agaccctcgg acatcccttc acgattctcc   180
ggttcctctt ccggctccac acacacatta accatcactg ggtccaagc cgaggacgag    240
gctgtatatt tctgtgggaa tgatgactac agcagtgata gtggatatgt cggtgtattt   300
ggggccggga caaccctgac cgtccta                                      327
```

<210> SEQ ID NO 280
<211> LENGTH: 327
<212> TYPE: DNA
<213> ORGANISM: Artificial sequence
<220> FEATURE:
<223> OTHER INFORMATION: SS01-13-S5 VL

<400> SEQUENCE: 280

```
gccctgactc agccgtcctc ggtgtcagca accctgggg aaactgcgcg tatcacctgc    60
tccggtggtg ctagcagtgg ctatggttat ggctggtatc agcagaagcc tagcagtgcc   120
cctctcactg tgatctacaa agactctgaa agaccctcgg acatcccttc acgattctcc   180
ggttcctctt ccggctccac acacacatta accatcagcg ggtccaagc cgaggacgag    240
gctgtatatt tctgtgggaa tgatgactac agcagtgata gtggatatgt cggtgtattt   300
ggggccggga caaccctgac cgtccta                                      327
```

<210> SEQ ID NO 281
<211> LENGTH: 327
<212> TYPE: DNA
<213> ORGANISM: Artificial sequence
<220> FEATURE:
<223> OTHER INFORMATION: S5-2.GKNG VL

```
<400> SEQUENCE: 281
gccctgactc agccgtcctc ggtgtcagca aaccctgggg aaactgcgcg tatcacctgc    60
tccggtggtg ctagcagtgg ctatggttat ggctggtatc agcagaagcc tagcagtgcc   120
cctctcactg tgatctacaa agactctgaa agacccgcgg acatcccttc acgattctcc   180
ggttcctctt ccggctccac acacacatta accatcagcg gggtccaagc cgaggacgag   240
gctgtatatt tctgtgggaa tgatgactac agcagtgata gtggatatgt cggtgtattt   300
ggggccggga caaccctgac cgtccta                                       327

<210> SEQ ID NO 282
<211> LENGTH: 321
<212> TYPE: DNA
<213> ORGANISM: Artificial sequence
<220> FEATURE:
<223> OTHER INFORMATION: 1-7A-IT VL

<400> SEQUENCE: 282
gccctgactc agccgtcctc ggtgtcagca aacccaggag aaaccgtcaa gatcacctgc    60 tccggggggtg gcagctatgc tggaagttac tattatggct ggtatcagca gaagcctggc   120
agtgcccctg tcactctgat ctatgaaaac aacaagagac cctcggacat cccttcacga   180
ttctccggtt ccacatctgg ctccacagcc acactaacca tcactggggt ccaagccggc   240
gacgaggctg attattactg tgggagctgg gacagtagca atggtggtat atttggggcc   300
gggacaaccc tgaccgtcct a                                             321

<210> SEQ ID NO 283
<211> LENGTH: 321
<212> TYPE: DNA
<213> ORGANISM: Artificial sequence
<220> FEATURE:
<223> OTHER INFORMATION: Low-PI VL

<400> SEQUENCE: 283
gccctgactc agccgtcctc ggtgtcagca aacccaggag aaaccgtcaa gatcacctgc    60 tccggggggtg gcagctatgc tggaagttac tattatggct ggtatcagca gaagcctggc   120
agtgcccctg tcactctgat ctatgaaaac aacaagagac cctcggacat cccttcacga   180
ttctccggtt ccacatctgg ctccacagcc acactaacca tcactggggt ccaagccggc   240
gacgaggctg attattactg tgggagctgg gacagtagca atggtggtat atttggggcc   300
gggacaaccc tgaccgtcct a                                             321

<210> SEQ ID NO 284
<211> LENGTH: 321
<212> TYPE: DNA
<213> ORGANISM: Artificial sequence
<220> FEATURE:
<223> OTHER INFORMATION: 1-30 VL

<400> SEQUENCE: 284
gccctgactc agccgtcctc ggtgtcagca aacccaggag aaaccgtcaa gatcacctgc    60 tccggggggtg gcagcgaaga agaacagtac tattatggct ggtatcagca gaagcctggc   120
agtgcccctg tcactctgat ctatcaggat gaagaaagac cctcggacat cccttcacga   180
ttctccggtt ccacatctgg ctccacagcc acactaacca tcactggggt ccaagccggc   240
gacgaggctg attattactg tgggagctgg gacagtgaag atgaagatca ttttggggcc   300
gggacaaccc tgaccgtcct a                                             321
```

<210> SEQ ID NO 285
<211> LENGTH: 321
<212> TYPE: DNA
<213> ORGANISM: Artificial sequence
<220> FEATURE:
<223> OTHER INFORMATION: 1-17 VL

<400> SEQUENCE: 285

```
gccctgactc agccgtcctc ggtgtcagca aacccaggag aaaccgtcaa gatcacctgc    60
tccgggggtg gcagctatgc tggaagttac tattatggct ggtatcagca gaagcctggc   120
agtgcccctg tcactctgat ctatgaagat gaacagagac cctcggacat cccttcacga   180
ttctccggtt ccacatctgg ctccacagcc acactaacca tcactggggt ccaagccggc   240
gacgaggctg attattactg tgggagctgg gacagtgaag atgaagatca ttttggggcc   300
gggacaaccc tgaccgtcct a                                             321
```

<210> SEQ ID NO 286
<211> LENGTH: 321
<212> TYPE: DNA
<213> ORGANISM: Artificial sequence
<220> FEATURE:
<223> OTHER INFORMATION: 1-32 VL

<400> SEQUENCE: 286

```
gccctgactc agccgtcctc ggtgtcagca aacccaggag aaaccgtcaa gatcacctgc    60
tccgggggtg gcagctatgc tggaagttac tattatggct ggtatcagca gaagcctggc   120
agtgcccctg tcactctgat ctatcaggat gaagaaagac cctcggacat cccttcacga   180
ttctccggtt ccacatctgg ctccacagcc acactaacca tcactggggt ccaagccggc   240
gacgaggctg attattactg tgggagctgg gacagtgaag atgaagatca ttttggggcc   300
gggacaaccc tgaccgtcct a                                             321
```

<210> SEQ ID NO 287
<211> LENGTH: 321
<212> TYPE: DNA
<213> ORGANISM: Artificial sequence
<220> FEATURE:
<223> OTHER INFORMATION: 4-11 VL

<400> SEQUENCE: 287

```
gccctgactc agccgtcctc ggtgtcagca aacccaggag aaaccgtcaa gatcacctgc    60
tccgggggtg gcagctatgc tggaagttac tattatggct ggtatcagca gaagcctggc   120
agtgcccctg tcactctgat ctatgaagac cacgagagac cctcggacat cccttcacga   180
ttctccggtt ccacatctgg ctccacagcc acactaacca tcactggggt ccaagccggc   240
gacgaggctg attattactg tgggagctgg gacagtagcg atgaagatca ttttggggcc   300
gggacaaccc tgaccgtcct a                                             321
```

<210> SEQ ID NO 288
<211> LENGTH: 321
<212> TYPE: DNA
<213> ORGANISM: Artificial sequence
<220> FEATURE:
<223> OTHER INFORMATION: 6-10 VL

<400> SEQUENCE: 288

```
gccctgactc agccgtcctc ggtgtcagca aacccaggag aaaccgtcaa gatcacctgc    60
```

```
tccgggggtg gcagctatgc tggaagttac tattatggct ggtatcagca gaagcctggc    120 agtgccctg tcactctgat ctatcaggat ctgctgagac cctcggacat cccttcacga    180
ttctccggtt ccacatctgg ctccacagcc acactaacca tcactggggt ccaagccggc   240
gacgaggctg attattactg tgggagctgg gacagtctga gcagcagcca ttttggggcc   300
gggacaaccc tgaccgtcct a                                             321
```

<210> SEQ ID NO 289
<211> LENGTH: 309
<212> TYPE: DNA
<213> ORGANISM: Artificial sequence
<220> FEATURE:
<223> OTHER INFORMATION: 2-13D VL

<400> SEQUENCE: 289

```
gccctgactc agccgtcctc ggtgtcagca aacccaggag aaaccgcgaa gataacctgc    60
tccgggggtg tgtatagcta tggctggttc cagcagaagc ctggcagtgc ccttgtcact   120
gtgatctact gggatgatga gagaccctcg gacatccctt cacgattctc cggtgcccta   180
tccggctcca caaacacatt aaccatcact ggggtccaag ccgaagacga ggctgattat   240
tattgtggga ctgaagacat cagcggcact gctggtgtat ttggggccgg gacaaccctg   300
accgtcctg                                                          309
```

<210> SEQ ID NO 290
<211> LENGTH: 309
<212> TYPE: DNA
<213> ORGANISM: Artificial sequence
<220> FEATURE:
<223> OTHER INFORMATION: 2-13D-37 VL

<400> SEQUENCE: 290

```
gccctgactc agccgtcctc ggtgtcagca aacccaggag aaaccgcgaa gataacctgc    60
tccgggggtg tgtatagcta tggctggttc cagcagaagc ctggcagtgc ccttgtcact   120
gtgatctact gggatgatga gagaccctcg gacatccctt cacgattctc cggtgcccta   180
tccggctcca caaacacatt aaccatcact ggggtccaag ccgaagacga ggctgattat   240
tattgtggga ctgaagacat cagcggcact gctggtgtat ttggggccgg gacaaccctg   300
accgtcctg                                                          309
```

<210> SEQ ID NO 291
<211> LENGTH: 309
<212> TYPE: DNA
<213> ORGANISM: Artificial sequence
<220> FEATURE:
<223> OTHER INFORMATION: 2-13D-37-1.5W-41 VL

<400> SEQUENCE: 291

```
gccctgactc agccgtcctc ggtgtcagca aacccaggag aaaccgcgaa gataacctgc    60
tccgggggtg tgtatagcta tggctggttc cagcagaagc ctggcagtgc ccttgtcact   120
gtgatctact gggatgatga gagaccctcg gacatccctt cacgattctc cggtgcccta   180
tccggctcca caaacacatt aaccatcact ggggtccaag ccgaagacga ggctgattat   240
tattgtggga ctgaagacat cagcggcact gctggtgtat ttggggccgg gacaaccctg   300
accgtcctg                                                          309
```

<210> SEQ ID NO 292
<211> LENGTH: 309

```
<212> TYPE: DNA
<213> ORGANISM: Artificial sequence
<220> FEATURE:
<223> OTHER INFORMATION: 2-13D-37-3W-16 VL

<400> SEQUENCE: 292
gccctgactc agccgtcctc ggtgtcagca acccaggag  aaaccgcgaa gataacctgc    60
tccgggggtg tgtatagcta tggctggttc cagcagaagc ctggcagtgc ccttgtcact   120
gtgatctact gggatgatga gagaccctcg gacatcccctt cacgattctc cggtgcccta   180
tccggctcca caaacacatt aaccatcact ggggtccaag ccgaagacga ggctgattat   240
tattgtggga ctgaagacat cagcggcact gctggtgtat ttggggccgg acaaccctg    300 accgtcctg                                                           309

<210> SEQ ID NO 293
<211> LENGTH: 747
<212> TYPE: DNA
<213> ORGANISM: Artificial sequence
<220> FEATURE:
<223> OTHER INFORMATION: SS01-13 scFv

<400> SEQUENCE: 293
gccctgactc agccgtcctc ggtgtcagca accctgggg  aaactgttcg tatcacctgc    60
tccgggggtg ctagcagtgg ctatggttat ggctggtatc agcagaagcc tagcagtgcc   120
cctctcactg tgatctacaa agacgacgaa agaccctcgg acatcccttc acgattctcc   180
ggttcctctt ccggctccac acacacatta accatcactg gggtccaagc cgaggacgag   240
gctgtatatt tctgtgggaa tgatgactac agcagtgata gtggatatgt cggtgtattt   300
ggggccggga caaccctgac cgtcctaggt cagtcctcta gatcttccgg cggtggtggc   360
agctccggtg gtggcggttc cgccgtgacg ttggacgagt ccggggggcgg cctccagacg   420 cccggaggag cgctctctct ctcttgcaaa gcctccgggt tcaccttcag cagctatcag   480
atgggctggg tgcgacaggc gcccggcaag gggctggaat gggtcggtgt tattaacaag   540
tctggtagtg acacatcata cggggtcggcg gtgaagggcc gtgccaccat ctcgagggac   600
aacgggcaga gcacactgta cctgcagatg aacaacctca gggctgagga caccgctgtt   660
tacttctgcg ccaaaggttc tgctagttac ataactgctg ctaccatcga cgcatggggc   720
cacgggaccg aagtcatcgt ctcctcc                                       747

<210> SEQ ID NO 294
<211> LENGTH: 747
<212> TYPE: DNA
<213> ORGANISM: Artificial sequence
<220> FEATURE:
<223> OTHER INFORMATION: SS01-13-s5 scFv

<400> SEQUENCE: 294
gccctgactc agccgtcctc ggtgtcagca accctgggg  aaactgcgcg tatcacctgc    60
tccggtggtg ctagcagtgg ctatggttat ggctggtatc agcagaagcc tagcagtgcc   120
cctctcactg tgatctacaa agactctgaa agaccctcgg acatcccttc acgattctcc   180
ggttcctctt ccggctccac acacacatta accatcagcg gggtccaagc cgaggacgag   240
gctgtatatt tctgtgggaa tgatgactac agcagtgata gtggatatgt cggtgtattt   300
ggggccggga caaccctgac cgtcctaggt cagtcctcta gatcttccgg cggtggtgga   360
tcctctggtg gtggtggttc cgccgtgacg ttggacgagt ccggggggcgg cctccagacg   420
```

```
cccggaggag cgctccgcct ctcttgcaag gcctccgggt tcaccttcag cagctatcag    480
atgggctggg tgcgacaggc gcccggcaag gggctggaat gggtcagcgc gattaataag    540
agcggtagtg acacatcata cgggtcggcg gtgaagggcc gtgccaccat ctcgagggac    600
aacgggcaga gcacactgta cctgcagatg aacagcctca gggctgagga caccgctgtt    660
tacttctgcg ccaaaggttc tgctagttac ataactgctg ctaccatcga cgcatggggc    720
cacgggaccg aagtcatcgt ctcctcc                                        747
```

<210> SEQ ID NO 295
<211> LENGTH: 747
<212> TYPE: DNA
<213> ORGANISM: Artificial sequence
<220> FEATURE:
<223> OTHER INFORMATION: S5-2.GKNG scFv

<400> SEQUENCE: 295

```
gccctgactc agccgtcctc ggtgtcagca aaccctgggg aaactgcgcg tatcacctgc     60
tccggtggtg ctagcagtgg ctatggttat ggctggtatc agcagaagcc tagcagtgcc    120
cctctcactg tgatctacaa agactctgaa agaccctcgg acatcccttc acgattctcc    180
ggttcctctt ccggctccac acacacatta accatcagcg gggtccaagc cgaggacgag    240
gctgtatatt tctgtgggaa tgatgactac agcagtgata gtggatatgt cggtgtattt    300
ggggccggga caaccctgac cgtcctaggt cagtcctcta gatcttccgg cggtggtgga    360
tcctctggtg gtggtggttc cgccgtgacg ttggacgagt ccggggcgg cctccagacg    420 cccggaggag cgctccgcct ctcttgcaag gcctccgggt tcaccttcag cagctatcag    480
atgggctggg tgcgacaggc gcccggcaag gggctggaat gggtcagcgc gattaataag    540
ggcggtagtg acacatcata cgggtcggcg gtgaagggcc gtgccaccat ctcgagggac    600
aacgggcaga gcacactgta cctgcagatg aacagcctca gggctgagga caccgctgtt    660
tacttctgcg ccaaaggttc tgctagttac ataactgctg ctaccatcga cgcatggggc    720
cacgggaccg aagtcatcgt ctcctcc                                        747
```

<210> SEQ ID NO 296
<211> LENGTH: 747
<212> TYPE: DNA
<213> ORGANISM: Artificial sequence
<220> FEATURE:
<223> OTHER INFORMATION: 2-13D scFv

<400> SEQUENCE: 296

```
ctgactcagc cgtcctcggt gtcagcaaac ccaggagaaa ccgcgaagat aacctgctcc     60
gggggtgtgt atagctatgg ctggttccag cagaagcctg gcagtgccct tgtcactgtg    120
atctactggg atgatgagag accctcggac atcccttcac gattctccgg tgccctatcc    180
ggctccacaa acacattaac catcactggg gtccaagccg aagacgaggc tgattattat    240
tgtgggactg aagacatcag cggcactgct ggtgtatttg gggccgggac aaccctgacc    300
gtcctgggtc agtcctctag atcttccggc ggtggtggat cctctggtgg tggtggttcc    360
gccgtgacgt tggacgagtc cggggcgg ctccagacgc ccggaggagc gctccgcctt    420
agctgcagcg cctccgggtt caccttcagc agccatggca tgttctgggt gcgacaggcg    480
cccggcaagg ggttggaata tgtctcggag attaccaatg atggtagtgg cacaaactac    540
gggtcggcgt gaagggccg tgccaccatc tcgagggaca acgggcagag cactgtat    600 ctgcagatga acagcctcag ggctgaggac accggcacct acttctgcgc cagatctact    660
```

```
tatgaatgtc ctggtggttt tagttgttgg ggtgatactg gtcaaataga cgcatggggc    720
cacgggaccg aagtcatcgt ctcctcc                                        747

<210> SEQ ID NO 297
<211> LENGTH: 747
<212> TYPE: DNA
<213> ORGANISM: Artificial sequence
<220> FEATURE:
<223> OTHER INFORMATION: 2-13D-37 scFv

<400> SEQUENCE: 297
ctgactcagc cgtcctcggt gtcagcaaac ccaggagaaa ccgcgaagat aacctgctcc     60
gggggtgtgt atagctatgg ctggttccag cagaagcctg gcagtgccct tgtcactgtg    120
atctactggg atgatgagag accctcggac atcccttcac gattctccgg tgccctatcc    180
ggctccacaa acacattaac catcactggg gtccaagccg aagacgaggc tgattattat    240
tgtgggactg aagacatcag cggcactgct ggtgtatttg gggccgggac aaccctgacc    300
gtcctgggtc agtcctctag atcttccggc ggtggtggat cctctggtgg tggtggttcc    360
gccgtgacgt tggacgagtc cggggggcggc ctccagacgc ccgaggagc gctccgcctt    420 agctgcagcg cctccgggtt cgatttcagc agccatggca tgttctgggt gcgacaggcg    480
cccggcaagg ggttggaata tgtctcggag attaccaatg atggtagtgg cacaaactac    540
gggtcggcgg tgaagggccg tgccaccatc tcgagggaca cgggcagag cacactgtat    600 ctgcagatga acagcctcag gctgaggac accggcacct acttctgcgc cagatctact    660
tatgaatgtc ctggtggttt tagttgttgg ggtgatactg gtcaaataga cgcatggggc    720
cacgggaccg aagtcatcgt ctcctcc                                        747

<210> SEQ ID NO 298
<211> LENGTH: 750
<212> TYPE: DNA
<213> ORGANISM: Artificial sequence
<220> FEATURE:
<223> OTHER INFORMATION: 2-13D-37-1.5W-41 scFv

<400> SEQUENCE: 298
gccctgactc agccgtcctc ggtgtcagca aacccaggag aaaccgcgaa gataacctgc     60 tccggggggtg tgtatagcta tggctggttc cagcagaagc tggcagtgc ccttgtcact    120 gtgatctact gggatgatga gagaccctcg gacatccctt cacgattctc cggtgcccta    180
tccggctcca caaacacatt aaccatcact ggggtccaag ccgaagacga ggctgattat    240
tattgtggga ctgaagacat cagcggcact gctggtgtat ttggggccgg gacaaccctg    300
accgtcctgg gtcagtcctc tagatcttcc ggcggtggtg gatcctctgg tggtggtggt    360
tccgccgtga cgttggacga gtccgggggc ggcctccaga cgcccggagg agcgctccgc    420
cttagctgca gcgcctccgg gttcgatttc agcagccatg gcatgttctg ggtgcgacag    480
gcgcccggca agggggttgga atatgtctcg gagattacca atgatggtag tggcacaaac    540
tacgggtcgg cggtgaaggg ccgtgccacc atctcgaggg acaacgggca gagcacactg    600
tatctgcaga tgaacagcct cagggctgag gacaccggca cctacttctg cgccagatct    660
tcttatgttt gtcctggtgg ttttagttgt tggggtgata ctggtcaaat agacgcatgg    720
ggccacggga ccgaagtcat cgtctcctcc                                     750

<210> SEQ ID NO 299
```

<211> LENGTH: 750
<212> TYPE: DNA
<213> ORGANISM: Artificial sequence
<220> FEATURE:
<223> OTHER INFORMATION: 2-13D-37-3W-16 scFv

<400> SEQUENCE: 299

| | | | | | |
|---|---|---|---|---|---|
| gccctgactc | agccgtcctc | ggtgtcagca | aacccaggag | aaaccgcgaa | gataacctgc | 60 |
| tccgggggtg | tgtatagcta | tggctggttc | cagcagaagc | ctggcagtgc | ccttgtcact | 120 |
| gtgatctact | gggatgatga | gagaccctcg | gacatccctt | cacgattctc | cggtgcccta | 180 |
| tccggctcca | caaacacatt | aaccatcact | ggggtccaag | ccgaagacga | ggctgattat | 240 |
| tattgtggga | ctgaagacat | cagcggcact | gctggtgtat | ttggggccgg | gacaaccctg | 300 |
| accgtcctgg | gtcagtcctc | tagatcttcc | ggcggtggtg | gatcctctgg | tggtggtggt | 360 |
| tccgccgtga | cgttggacga | gtccgggggc | ggcctccaga | cgcccggagg | agcgctccgc | 420 |
| cttagctgca | gcgcctccgg | gttcgatttc | agcagccatg | gcatgttctg | ggtgcgacag | 480 |
| gcgcccggca | aggggttgga | atatgtctcg | gagattacca | atgatggtag | tggcacaaac | 540 |
| tacgggtcgg | cggtgaaggg | ccgtgccacc | atctcgaggg | acaacgggca | gagcacactg | 600 |
| tatctgcaga | tgaacagcct | cagggctgag | gacaccggca | cctacttctg | cgccagatct | 660 |
| aattatgctt | gtcctggtgg | ttttagttgt | tggggtgata | ctggtcaaat | agacgcatgg | 720 |
| ggccacggga | ccgaagtcat | cgtctcctcc | | | | 750 |

<210> SEQ ID NO 300
<211> LENGTH: 18
<212> TYPE: PRT
<213> ORGANISM: Artificial sequence
<220> FEATURE:
<223> OTHER INFORMATION: Linker

<400> SEQUENCE: 300

Gly Gln Ser Ser Arg Ser Ser Gly Gly Gly Gly Ser Ser Gly Gly Gly
1               5                   10                  15

Gly Ser

<210> SEQ ID NO 301
<211> LENGTH: 768
<212> TYPE: DNA
<213> ORGANISM: Artificial Sequence
<220> FEATURE:
<223> OTHER INFORMATION: 1-30 scFv

<400> SEQUENCE: 301

| | | | | | |
|---|---|---|---|---|---|
| gctctcacac | aaccttcctc | tgtctctgct | aatcctggcg | agactgttaa | aatcacctgc | 60 |
| tccgggggg | gtagtgagga | agaacagtat | tactatggat | ggtaccaaca | aaagcctggg | 120 |
| tctgcacccg | taacccttat | ataccaagat | gaggagcgcc | catccgatat | accctcacgc | 180 |
| ttctcaggca | gtacatctgg | gtcaactgca | accctcacca | ttacaggagt | gcaagcaggt | 240 |
| gatgaggcag | attattattg | tgggtcatgg | gactccgagg | acgaggatca | ttttggagct | 300 |
| ggcactacat | tgacagtact | gggccagtca | tcaagaagtt | caggtggcgg | cggaagctcc | 360 |
| gggggcggtg | gatcagcagt | aactctcgac | gaatctggag | gcgtcttca | aacccctggg | 420 |
| ggggctctga | gactctcatg | taaagccagc | ggattcgatt | tcgagtcatt | taacatgttt | 480 |
| tgggtccgcc | aggcccccgg | taaaggcctg | gagtatgtgt | cccaaatatc | aagttcagag | 540 |
| gaggacgaga | actatgcccc | agccgtgaaa | ggtcgagcta | caatttcccg | agacaacggc | 600 |

-continued

```
cagtcaacac tctacttgca gatgaacagc ctgagagccg aagacactgg tacatactat    660
tgtgctaaat ccagctacga ctgtccatac ggccattgtt catcaggagt agactccgca    720
ggtgagatag acgcatgggg tcatggcact gaggtcattg tgtcctct                 768
```

USE OF ANTI-FAM19A5 ANTIBODIES

CROSS-REFERENCE TO RELATED APPLICATIONS

This PCT application claims the priority benefit of U.S. Provisional Application No. 62/746,194, filed Oct. 16, 2018, which is incorporated herein by reference in its entirety.

REFERENCE TO SEQUENCE LISTING SUBMITTED ELECTRONICALLY

The content of the electronically submitted sequence listing in ASCII text file (Name: 3763.012PC01_SeqListing_ST25.txt; Size: 261,609 bytes; and Date of Creation: Oct. 13, 2019) filed with the application is incorporated herein by reference in its entirety.

FIELD OF THE DISCLOSURE

The present disclosure provides methods for the treatment of retinopathies (e.g., diabetic retinopathy) and/or macular degeneration (e.g., age-related macular degeneration) in a subject (e.g., a human) using antagonist against family with sequence similarity 19, member A5 (FAM19A5) (e.g., anti-FAM19A5 antibody) or a composition comprising such antagonists.

BACKGROUND OF THE DISCLOSURE

Retinopathies, such as diabetic retinopathy (DR) (also known as diabetic eye disease), result from damage to the small blood vessels and neurons of the retina. DR is the most common cause of vision loss in the working-age population (e.g., aged 20 to 74) around the world. Lee R., et al., *Eye Vis (Lond)*: 2:17 (2015). With increasing life expectancy of diabetics, the incidence of DR has dramatically increased over the years. Roughly, about 50 percent of diabetic patients develop DR after 10 years, 70 percent after 20 years and 90 percent after 30 years of onset of the diabetes. It is estimated that by 2030, the number of diabetic patients in the age-group 20-79 years will nearly double worldwide, suggesting an even further increase in the number of individuals diagnosed with DR. Nentwich M. M. and Ulbig M. W., *World J Diabetes* 6(3):489-499 (2015).

While some treatment options are available and can help manage the symptoms associated with DR, they do not cure the disease and can also have undesirable side effects. For example, laser therapy can cause significant discomfort during treatment, permanent retinal scarring, and decreased peripheral, color, and night vision. See worldwideweb.aao.org/munnerlyn-laser-surgery-center/laser-treatment-of-proliferative-nonproliferative-. Accordingly, there is a current need for alternative treatment options for diabetic retinopathy.

Age-related macular degeneration (AMD) is another retinopathy that affects the eye, and more specifically, the central part (i.e., macula) of the eye. AMD is thought to be caused by hardening of the arteries that nourish the retina, which deprives the retinal tissue of oxygen and thus, leading to central vision deterioration. Gheorghe A., et al., *Rom J Ophthalmol* 59(2):74-77 (2015). AMD is the most common type of macular degeneration with approximately 11 million individuals being affected in the United States alone, and with a global prevalence of 170 million. AMD is the leading cause of visual disability in the industrialized world and the third leading cause globally. Pennington K. L. and DeAngelis M. M., *Eye Vis (Lond)* 3:34 (2016). Aging is the greatest risk factor; therefore, the prevalence of AMD in the U.S. is anticipated to increase to 22 million by the year 2050, while the global prevalence is expected to increase to 288 million by the year 2040. Wong W. L., et al., *Lancet Glob Health* 2:e106-e116 (2014).

If diagnosed early, AMD can be managed through various treatment options that include vitamin supplements (e.g., antioxidants), dietary changes (e.g., low fat diets), anti-angiogenic drugs (e.g., anti-VEGF antibody), laser therapy, surgery (e.g., submacular surgery), and retinal translocation. Holz F. G., et al., *J Clin Invest* 124(4):1430-1438 (2014). However, there is no known cure for AMD and many of the treatment options may not be viable for all AMD patients. For instance, many patients who develop choroidal neovascularization (CNV) (i.e., wet AMD) are not good candidates for laser therapy because the CNV is too large for laser treatment, or the location cannot be determined accurately. Moreover, even with treatment, many AMD patients experience progressive loss of central vision. Virgili G. and Bini A., *Cochrane Database Syst Rev* 3:CD004763 (2007). Accordingly, there is a current need for more effective and comprehensive treatment options for AMD.

BRIEF SUMMARY OF THE DISCLOSURE

Provided herein is a method of improving a retinal potential in a retina of a subject in need thereof comprising administering the subject an antagonist against a family with sequence similarity 19, member A5 ("FAM19A5") protein ("FAM19A5 antagonist") compared to a reference (e.g., corresponding value in the subject prior to FAM19A5 antagonist administration or in the subject without the FAM19A5 antagonist administration). In some aspects, the improvement in retinal potential comprises an increase in A-wave, B-wave, oscillatory potential, or any combination thereof.

In some aspects, the subject has a disease or condition associated with a decreased retinal potential in the retina. In certain aspects, the disease or condition is a diabetic retinopathy. In other aspects, the disease or condition is an age-related macular degeneration in the retina.

Also provided herein is a method for treating a retinopathy and/or maculopathy in a subject in need thereof comprising administering to the subject a FAM19A5 antagonist. In some aspects, the retinopathy is a diabetic retinopathy. In some aspects, the diabetic retinopathy is a nonproliferative diabetic retinopathy (NPDR). In other aspects, the diabetic retinopathy is a proliferative diabetic retinopathy. In certain aspects, the diabetic retinopathy is associated with a decreased retinal potential, loss of pericytes, acellular capillary formation, vascular congestion, or any combination thereof within the retina of the subject.

In some aspects, the maculopathy is a diabetic macular edema. In certain aspects, the diabetic macular edema is associated with a decreased retinal potential, loss of pericytes, acellular capillary formation, vascular congestion, or any combination thereof within the retina of the subject.

In some aspects, the FAM19A5 antagonist improves a retinal potential of the subject compared to a reference (e.g., corresponding value in the subject prior to FAM19A5 antagonist administration or in the subject without the FAM19A5 antagonist administration). In certain aspects, the improvement in retinal potential comprises an increase in A-wave, B-wave, oscillatory potential, or any combination thereof. In some aspects, the FAM19A5 antagonist reduces the loss of pericytes within the retina of the subject. In some aspects, the FAM19A5 antagonist reduces and/or inhibits acellular capillary formation within the retina of the subject. In other aspects, the FAM19A5 antagonist reduces and/or inhibits vascular congestion within a nerve fiber layer of the retina of the subject.

The present disclosure also provide a method for treating a macular degeneration in a subject in need thereof comprising administering to the subject an antagonist against a FAM19A5 protein.

In some aspects, the macular degeneration is an age-related macular degeneration.

In certain aspects, the age-related macular degeneration is dry (atrophic) macular degeneration. In other aspects, the age-related macular degeneration is wet (neovascular or exudative) macular degeneration. In certain aspects, the age-related macular degeneration is (i) early AMD, (ii) intermediate AMD, or (iii) late or advanced AMD (geographic atrophy). In further aspects, the age-related macular degeneration is associated with accumulation or aggregation of drusen, neovascularization, decreased retinal potential, astrocyte formation, or any combination thereof within the retina of the subject.

In some aspects, the FAM19A5 antagonist reduces and/or inhibits neovascularization within the retina of the subject, as evidenced by decreased CD31 and/or VEGF expression. In certain aspects, the FAM19A5 antagonist is capable of reducing and/or inhibiting neovascularization within the retina of a mouse having laser induced choroidal neovascularization, as evidenced by decreased CD31 and/or VEGF expression. In further aspects, wherein the FAM19A5 antagonist reduces expression of platelet-derived growth factor (PDGF) within a nerve fiber layer and a ganglion cell layer of the retina of the subject compared to a reference (e.g., corresponding value in the subject prior to FAM19A5 antagonist administration or in the subject without the FAM19A5 antagonist administration). In other aspects, the FAM19A5 antagonist improve the retinal potential of the subject compared to a reference (e.g., corresponding value in the subject prior to FAM19A5 antagonist administration or in the subject without the FAM19A5 antagonist administration). In some aspects, the improvement in retinal potential comprises an increase in B-wave. In certain aspects, the FAM19A5 antagonist is capable of reducing and/or inhibiting the accumulation or aggregation of drusen within the retina of the subject.

In some aspects, the FAM19A5 antagonist is an antisense oligonucleotide, siRNA, shRNA, miRNA, dsRNA targeting FAM19A5, aptamer, PNA, or a vector including the same.

In some aspects, the FAM19A5 antagonist is an antibody, or an antigen-binding portion thereof, that specifically binds to the FAM19A5 protein ("anti-FAM19A5 antibody"). In certain aspects, wherein the anti-FAM19A5 antibody exhibits a property selected from: (a) binds to soluble human FAM19A5 with a $K_D$ of 10 nM or less as measured by enzyme-linked immunosorbent assay (ELISA); (b) binds to membrane bound human FAM19A5 with a $K_D$ of 10 nM or less as measured by ELISA; and (c) both (a) and (b).

In some aspects, the anti-FAM19A5 antibody cross-competes for binding to a human FAM19A5 epitope with a reference antibody, wherein the reference antibody is selected from the group consisting of the antibodies in TABLES 2-5. In certain aspects, the reference antibody comprises heavy chain CDR1, CDR2, and CDR3 and light chain CDR1, CDR2, and CDR3, (i) wherein the heavy chain CDR1 comprises the amino acid sequence set forth as SEQ ID NO: 14, the heavy chain CDR2 comprises the amino acid sequence set forth as SEQ ID NO: 15, the heavy chain CDR3 comprises the amino acid sequence set forth as SEQ ID NO: 16, the light chain CDR1 comprises the amino acid sequence set forth as SEQ ID NO: 26, the light chain CDR2 comprises the amino acid sequence set forth as SEQ ID NO: 27, and the light chain CDR3 comprises the amino acid sequence set forth as SEQ ID NO: 28; or (ii) wherein the heavy chain CDR1 comprises the amino acid sequence set forth as SEQ ID NO: 17, the heavy chain CDR2 comprises the amino acid sequence set forth as SEQ ID NO: 18, the heavy chain CDR3 comprises the amino acid sequence set forth as SEQ ID NO: 19, the light chain CDR1 comprises the amino acid sequence set forth as SEQ ID NO: 29, the light chain CDR2 comprises the amino acid sequence set forth as SEQ ID NO: 30, and the light chain CDR3 comprises the amino acid sequence set forth as SEQ ID NO: 31.

In some aspects, the anti-FAM19A5 antibody specifically binds to the same FAM19A5 epitope as a reference antibody, wherein the reference antibody is selected from the group consisting of TABLES 2-5. In certain aspects, the reference antibody comprises heavy chain CDR1, CDR2, and CDR3 and light chain CDR1, CDR2, and CDR3, (i) wherein the heavy chain CDR1 comprises the amino acid sequence set forth as SEQ ID NO: 14, the heavy chain CDR2 comprises the amino acid sequence set forth as SEQ ID NO: 15, the heavy chain CDR3 comprises the amino acid sequence set forth as SEQ ID NO: 16, the light chain CDR1 comprises the amino acid sequence set forth as SEQ ID NO: 26, the light chain CDR2 comprises the amino acid sequence set forth as SEQ ID NO: 27, and the light chain CDR3 comprises the amino acid sequence set forth as SEQ ID NO: 28; or (ii) wherein the heavy chain CDR1 comprises the amino acid sequence set forth as SEQ ID NO: 17, the heavy chain CDR2 comprises the amino acid sequence set forth as SEQ ID NO: 18, the heavy chain CDR3 comprises the amino acid sequence set forth as SEQ ID NO: 19, the light chain CDR1 comprises the amino acid sequence set forth as SEQ ID NO: 29, the light chain CDR2 comprises the amino acid sequence set forth as SEQ ID NO: 30, and the light chain CDR3 comprises the amino acid sequence set forth as SEQ ID NO: 31.

In some aspects, the anti-FAM19A5 antibody specifically binds to at least one FAM19A5 epitope, which is SEQ ID NO: 6 or SEQ ID NO: 9.

In some aspects, the anti-FAM19A5 antibody comprises a heavy chain CDR1, CDR2, and CDR3, and a light chain CDR1, CDR2, and CDR3, (i) wherein the heavy chain CDR1 comprises a CDR1 selected from the group consisting of CDR1s in TABLE 2; (ii) wherein the heavy chain CDR2 comprises a CDR2 selected from the group consisting of CDR2s in TABLE 2; (iii) wherein the heavy chain CDR3 comprises a CDR3 selected from the group consisting of CDR3s in TABLE 2; (iv) wherein the light chain CDR1 comprises a CDR1 selected from the group consisting of CDR1s in TABLE 3; (v) wherein the light chain CDR2 comprises a CDR2 selected from the group consisting of CDR2s in TABLE 3; and/or (vi) wherein the light chain CDR3 comprises a CDR3 selected from the group consisting of CDR3s in TABLE 3.

In some aspects, the anti-FAM19A5 antibody comprises a heavy chain CDR1, CDR2, and CDR3, and a light chain CDR1, CDR2, and CDR3, (i) wherein the heavy chain CDR1 comprises the amino acid sequence set forth as SEQ ID NO: 14 or SEQ ID NO: 17; (ii) wherein the heavy chain CDR2 comprises the amino acid sequence set forth as SEQ ID NO: 15 or SEQ ID NO: 18; (iii) wherein the heavy chain CDR3 comprises the amino acid sequence set forth as SEQ ID NO: 16 or SEQ ID NO: 19; (iv) wherein the light chain CDR1 comprises the amino acid sequence set forth as SEQ ID NO: 26 or SEQ ID NO: 29; (v) wherein the light chain CDR2 comprises the amino acid sequence set forth as SEQ ID NO: 27 or SEQ ID NO: 30; and/or (vi) wherein the light chain CDR3 comprises the amino acid sequence set forth as SEQ ID NO: 28 or SEQ ID NO: 31.

In some aspects, the anti-FAM19A5 antibody comprises a heavy chain CDR1, CDR2, and CDR3, and a light chain CDR1, CDR2, and CDR3, wherein the heavy chain CDR1, CDR2, and CDR3 comprises the amino acid sequence set forth as SEQ ID NOs: 14, 15, and 16, respectively, and the light chain CDR1, CDR2, and CDR3 comprises the amino acid sequence set forth as SEQ ID NOs: 26, 27, and 28, respectively. In other aspects, the anti-FAM19A5 antibody comprises a heavy chain CDR1, CDR2, and CDR3, and a light chain CDR1, CDR2, and CDR3, wherein the heavy chain CDR1, CDR2, and CDR3 comprises the amino acid sequence set forth as SEQ ID NOs: 17, 18, and 19, respectively, and the light chain CDR1, CDR2, and CDR3 comprises the amino acid sequence set forth as SEQ ID NOs: 29, 30, and 31, respectively.

In some aspects, the anti-FAM19A5 antibody comprises a heavy chain variable region (VH) and a light chain variable region (VL), (i) wherein the VH comprises the amino acid sequence set forth as SEQ ID NO: 36 or SEQ ID NO: 37; or (ii) wherein the VL comprises the amino acid sequence set forth as SEQ ID NO: 40 or SEQ ID NO: 41. In certain aspects, the VH comprises the amino acid sequence of SEQ ID NO: 36 and the VL comprises the amino acid sequence set forth as SEQ ID NO: 40. In other aspects, the VH comprises the amino acid sequence of SEQ ID NO: 37 and the VL comprises the amino acid sequence set forth as SEQ ID NO: 41.

In some aspects, the anti-FAM19A5 antibody comprises a heavy chain variable region (VH) and a light chain variable region (VL), wherein the VH comprises an amino acid sequence which is at least about 80%, at least about 85%, at least about 90%, at least about 95%, at least about 96%, at least about 97%, at least about 98%, at least about 99%, or about 100% identical to the amino acid sequence set forth as SEQ ID NO: 36 or SEQ ID NO: 37. In some aspects, the anti-FAM19A5 antibody comprises a heavy chain variable region (VH) and a light chain variable region (VL), wherein the VL comprises an amino acid sequence which is at least about 80%, at least about 85%, at least about 90%, at least about 95%, at least about 96%, at least about 97%, at least about 98%, at least about 99%, or about 100% identical to the amino acid sequence set forth as SEQ ID NO: 40 or SEQ ID NO: 41.

In some aspects, the anti-FAM19A5 antibody comprises a heavy chain variable region (VH) and a light chain variable region (VL), (i) wherein the VH comprises an amino acid sequence which is at least about 80%, at least about 85%, at least about 90%, at least about 95%, at least about 96%, at least about 97%, at least about 98%, at least about 99%, or about 100% identical to the amino acid sequence set forth as SEQ ID NO: 36 or SEQ ID NO: 37; and (ii) wherein the VL comprises an amino acid sequence which is at least about 80%, at least about 85%, at least about 90%, at least about 95%, at least about 96%, at least about 97%, at least about 98%, at least about 99%, or about 100% identical to the amino acid sequence set forth as SEQ ID NO: 40 or SEQ ID NO: 41.

In some aspects, the anti-FAM19A5 antibody comprises a Fab, a Fab', a F(ab')2, a Fv, or a single chain Fv (scFv). In certain aspects, the anti-FAM19A5 antibody is selected from the group consisting of an IgG1, an IgG2, an IgG3, an IgG4, and a variant thereof. In some aspects, the anti-FAM19A5 antibody is an IgG2, an IgG4, or a combination thereof. In further aspects, the anti-FAM19A5 antibody comprises an IgG2/IgG4 isotype antibody. In some aspects, the anti-FAM19A5 antibody comprises a constant region without the Fc function. In some aspects, the anti-FAM19A5 antibody is a chimeric antibody, a human antibody, or a humanized antibody.

In some aspects, the FAM19A5 antagonist is linked to a molecule having a second binding moiety, thereby forming a bispecific molecule. In some aspects, the FAM19A5 antagonist is linked to an agent, thereby forming an immunoconjugate.

In some aspects, the FAM19A5 antagonist disclosed herein is formulated with a pharmaceutically acceptable carrier. In some aspects, the FAM19A5 antagonist is administered via an intraocular administration. In certain aspects, the intraocular administration comprises intravitreal administration. In some aspects, the FAM19A5 antagonist is administered via intravenous administration.

In some aspects, methods disclosed herein further comprise administering a therapeutic agent. In some aspects, the subject being treated with the present disclosure is a human.

The present disclosure also provides a pharmaceutical composition for preventing or treating retinopathy and/or maculopathy comprising a pharmaceutically effective amount of an antagonist against a FAM19A5 protein.

BRIEF DESCRIPTION OF THE DRAWINGS

FIG. 2A shows a microscopic image (100× magnification) after periodic acid-Schiff (PAS) staining of a representative retinal region from a mouse in each of the different treatment groups: (i) normal (i.e., non-diabetic) (upper left panel), (ii) human IgG control (upper right panel), and (iii) anti-FAM19A5 antibody (clone 1-65, bottom left panel; clone 3-2, bottom right panel). The black arrows indicate endothelial cells, the white arrows indicate pericytes, and the gray arrows indicate acellular capillary. FIG. 2B shows a comparison of the ratio of endothelial cells to pericytes ("E/P ratio") observed within the entire analyzed retinal area of mice from the different treatment groups. To determine the E/P ratio, the number of endothelial cells and pericytes were counted in each photographed image. Data are shown as mean±S.D. "***" above the bars indicates a statistically significant difference (p<0.001) compared to IgG-treated group.

FIG. 7A shows representative retinal image showing the four wet AMD-like lesions (indicated by arrows in the left column images) in mice treated with human IgG antibody (top row) or anti-FAM19A5 (clone 3-2) (bottom row) both on the day of CNV induction ("Day 0") and on day 13 post-CNV induction. FIG. 7B provides a comparison the corrected total fluorescence (CTF) value for CNV-induced mice treated with either human IgG antibody ("IgG") or anti-FAM19A5 antibody (clone "3-2") at day 13 post CNV induction. Data are shown both as mean and individually. "*" indicates a statistically significant difference (p<0.05) compared to the IgG-treated group.

FIG. 8A provides representative retinal image showing the four wet AMD-like lesions (numbered as 1, 2, 3, and 4) in mice treated with human IgG antibody (top row) or anti-FAM19A5 (clone 3-2) (bottom row) at day 13 post CNV induction. The columns labeled as 1, 2, 3, and 4 provide the OCT image for the corresponding lesion shown in the image to the far left. FIG. 8B shows the scale bar used to quantitate the size of the lesions. FIG. 8C provides a comparison of the size of the CNV lesions observed at day 13 post CNV induction in mice treated with human IgG control antibody or with anti-FAM19A5 antibody (clone 3-2). Data are shown as both mean and individually. "***" indicates a statistically significant difference (p<0.001) compared to the IgG-treated group.

FIG. 10A identifies the different retinal layers using H&E analysis (left image) or OCT analysis (right image). The layers shown include: (i) retinal nerve fiber layer/ganglion cell layer (RNFL/GCL); (ii) inner plexiform layer; (iii) inner nuclear layer; (iv) outer plexiform layers; (v) outer nuclear layer, (vi) photoreceptor inner segment/outer segment (IS/OS), and (vii) retinal pigment epithelium (RPE). FIG. 10B shows representative H&E images of the relevant cell layers of the retina in mice from the different groups: (i) normal healthy animals, (ii) CNV-induced mice treated with human IgG antibody, and (iii) CNV-induced mice treated with anti-FAM19A5 antibody. Arrowheads indicate areas of choroidal neovascularization.

FIG. 13A provides a microscopic image (100× magnification) after periodic acid-Schiff (PAS) staining of a representative retinal region from a mouse in each of the different treatment groups. The black arrows indicate endothelial cells, the white arrows indicate pericytes, and the black arrowheads indicate acellular capillary. FIG. 13B provides a comparison of the number of acellular capillary observed within the entire analyzed retinal area of mice from the different treatment groups. FIG. 13C provides a comparison of the ratio of endothelial cells to pericytes ("E/P ratio") observed within the entire analyzed retinal area of mice from the different treatment groups. To determine the E/P ratio, the number of endothelial cells and pericytes were counted in each photographed image. In FIGS. 13B and 13C, the data are shown as mean±S.D. "*" and "***" above the bars indicates a statistically significant difference (p<0.05 and p<0.001, respectively) compared with the native mice. "##" and "###" above the bars indicates a statistically significant difference (p<0.01 and p<0.001, respectively) compared to the human IgG antibody treated group. "†††" above the bars indicates a statistically significant difference (p<0.001) compared with aflibercept treated group. "§" above the bars indicates a statistically significant difference (p<0.05) compared with the IVT group.

DETAILED DESCRIPTION OF THE DISCLOSURE

Figure 1A:
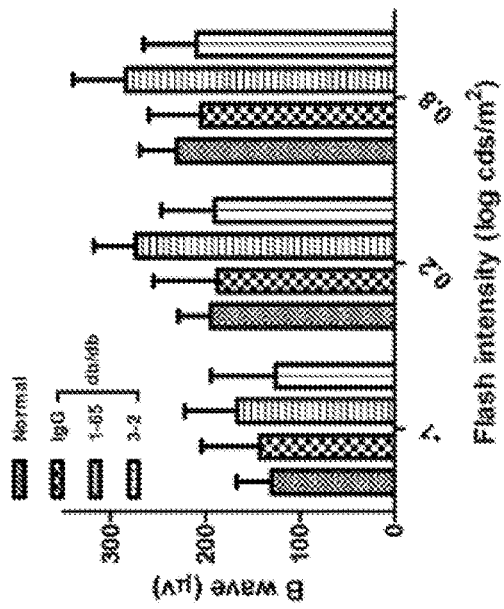
FIGS. 1A, 1B, and 1C show the effect of anti-FAM19A5 antibody on recovery of retinal potential in 25-week old db/db mice. The mice were treated with either human IgG control antibody ("IgG") or anti-FAM19A5 antibody (clones "1-65" or "3-2"). Normal (i.e., non-diabetic) mice were used as controls. The mice from each of the groups were exposed to white light at three different flash intensities (−1, 0.2, and 0.8 log cds/m$^2$) and then, the A-wave (µV) (FIG. 1A), B-wave (µV) (FIG. 1B), and oscillatory potential (µV) (FIG. 1C) were measured. Data are shown as mean±S.D.

To facilitate an understanding of the disclosure disclosed herein, a number of terms and phrases are defined. Additional definitions are set forth throughout the detailed description.

I. Definitions

Throughout this disclosure, the term "a" or "an" entity refers to one or more of that entity; for example, "an antibody," is understood to represent one or more antibodies. As such, the terms "a" (or "an"), "one or more," and "at least one" can be used interchangeably herein.

Furthermore, "and/or" where used herein is to be taken as specific disclosure of each of the two specified features or components with or without the other. Thus, the term "and/or" as used in a phrase such as "A and/or B" herein is intended to include "A and B," "A or B," "A" (alone), and "B" (alone). Likewise, the term "and/or" as used in a phrase such as "A, B, and/or C" is intended to encompass each of the following aspects: A, B, and C; A, B, or C; A or C; A or B; B or C; A and C; A and B; B and C; A (alone); B (alone); and C (alone).

It is understood that wherever aspects are described herein with the language "comprising," otherwise analogous aspects described in terms of "consisting of" and/or "consisting essentially of" are also provided.

Unless defined otherwise, all technical and scientific terms used herein have the same meaning as commonly understood by one of ordinary skill in the art to which this disclosure is related. For example, the Concise Dictionary of Biomedicine and Molecular Biology, Juo, Pei-Show, 2nd ed., 2002, CRC Press; The Dictionary of Cell and Molecular Biology, 3rd ed., 1999, Academic Press; and the Oxford Dictionary Of Biochemistry And Molecular Biology, Revised, 2000, Oxford University Press, provide one of skill with a general dictionary of many of the terms used in this disclosure.

Units, prefixes, and symbols are denoted in their Système International de Unites (SI) accepted form. Numeric ranges are inclusive of the numbers defining the range. Unless otherwise indicated, amino acid sequences are written left to right in amino to carboxy orientation. The headings provided herein are not limitations of the various aspects of the disclosure, which can be had by reference to the specification as a whole. Accordingly, the terms defined immediately below are more fully defined by reference to the specification in its entirety.

The term "about" is used herein to mean approximately, roughly, around, or in the regions of. When the term "about" is used in conjunction with a numerical range, it modifies that range by extending the boundaries above and below the numerical values set forth. In general, the term "about" can modify a numerical value above and below the stated value by a variance of, e.g., 10 percent, up or down (higher or lower).

As used herein, the term "retinopathy" refers to a disease, inflammation, or damage to the retina (i.e., tissue lining the inner surface of the back of the eye that captures images that pass through the cornea and lens.).

As used herein, the term "diabetic retinopathy" (DR) refers to retinopathy caused by complications associated with diabetes. Depending on the severity of the disease, DR can be asymptomatic, cause mild vision problems, or result in blindness. DR is the result of microvascular retinal changes. Hyperglycemia-induced intramural pericyte death and thickening of the basement membrane can lead to incompetence of the vascular walls. These damages can change the formation of the blood-retinal barrier and also make the retinal blood vessels become more permeable. The pericyte death can be caused when "hyperglycemia persistently activates protein kinase C-δ (PKC-δ, encoded by Prkcd) and p38 mitogen-activated protein kinase (MAPK) to increase the expression of a previously unknown target of PKC-δ signaling, Src homology-2 domain-containing phosphatase-1 (SHP-1), a protein tyrosine phosphatase. This signaling cascade can lead to PDGF receptor-dephosphorylation and a reduction in downstream signaling from this receptor, resulting in pericyte apoptosis. Small blood vessels, such as those in the eye, can be especially vulnerable to poor control over blood sugar. An overaccumulation of glucose and/or fructose can damage the tiny blood vessels in the retina.

DR can be categorized into two separate stages. Wu L., et al., *World J Diabetes* 4(6):290-294 (2013). The first stage, called non-proliferative diabetic retinopathy (NPDR), is associated with early diabetic retinopathy. NPDR generally has no apparent symptoms or is associated with minor vision distortion, resulting from blood vessels leaking fluid into the surrounding tissues. The only way to detect NPDR is by fundus photography, in which microaneurysms (microscopic blood-filled bulges in the artery walls) can be seen. If left untreated, DR patients can progress into the second and more advanced stage, called proliferative diabetic retinopathy (PDR). PDR is characterized by abnormal new blood vessel formation (i.e., neovascularization), which can burst and bleed, causing blurred vision. Other symptoms of PDR include, but are not limited to, spots or dark string floating in one's vision ("floaters"), fluctuating vision, impaired color vision, dark or empty areas in one's vision, pain, patchy vision, and complete vision loss.

The term "diabetic retinopathy" comprises all types of diabetic retinopathy including, but not limited to, non-proliferative diabetic retinopathy (NPDR), proliferative diabetic retinopathy (PDR), diabetic maculopathy, and diabetic macular edema.

In some aspects, PDR occurs after the onset of NPRD (e.g., subject first diagnosed with NPRD and the disease progresses to PDR). In other aspects, PDR occurs independent of NPRD. As used herein, the term "diabetic retinopathy" also comprises all types of diabetic retinopathy regardless of the cause and any and all symptoms of diabetic retinopathy. Non-limiting examples of risk factors for diabetic retinopathy include: duration of diabetes, genetics, excessive alcohol consumption, tobacco use, hypertension, obesity, dyslipidemia, high cholesterol, renal diseases, pregnancy, and kidney impairment.

As used herein, the term "maculopathy" refers to any pathological condition of the macula, an area at the center of the retina that is associated with highly sensitive, accurate vision. In some aspects, the term "maculopathy" and "retinopathy" can be used interchangeably (i.e., where only the macula is affected). In some aspects, the maculopathy is a diabetic maculopathy.

"Diabetic maculopathy" occurs when the macula becomes affected by the retinal changes caused by diabetes. The term refers to two distinct eye diseases: diabetic macular edema and diabetic ischemic maculopathy. The two types of maculopathy are often comorbid, that is; an individual with macular edema also often has ischemic maculopathy. Ischemic maculopathy occurs in conjunction with macular edema and can occur even when macular edema is mild. In some aspects, the retinal changes associated with diabetic maculopathy comprises decreased retinal potential, loss of pericytes, acellular capillary formation, vascular congestion, impaired vascular function, vascular leakage, vascular occlusion, tissue swelling (edema), tissue ischemia, or any combination thereof within the retina of the subject.

As used herein, the term "acellular capillary" refers to capillary-sized vessel tubes having no nuclei anywhere along their length.

As used herein, the term "vascular congestion" refers to a type of vascular injury and is an important factor in the pathogenesis of the various ocular conditions disclosed herein (e.g., diabetic macular edema). Vascular congestion is associated with a buildup of fluid within the vascular tissue (e.g., blood within the blood vessels). In some aspects, vascular congestion can be caused by hyperglycemia (i.e., high blood sugar).

As used herein, the term "macular degeneration" refers to any number of disorders and conditions in which the macula degenerates or loses functional activity. The degeneration or loss of functional activity can arise as a result of, for example, cell death, decreased cell proliferation, loss of normal biological function, or a combination of the foregoing. Macular degeneration can lead to and/or manifest as alterations in the structural integrity of the cells and/or extracellular matrix of the macula, alteration in normal cellular and/or extracellular matrix architecture, and/or the loss of function of macular cells. The cells can be any cell type normally present in or near the macula including RPE cells, photoreceptors, and/or capillary endothelial cells. Age-related macular degeneration is the most common of the macular degeneration, but the term "macular degeneration" does not necessarily exclude macular degeneration in patients who are not the elderly. Non-limiting examples of macular degenerations include: age-related macular degeneration (wet or dry); Best macular dystrophy, Sorsby fundus dystrophy, Mallatia Leventinese, Doyne honeycomb retinal dystrophy, Stargardt disease (also called Stargardt macular dystrophy, juvenile macular degeneration, or fundus flavimaculatus), and pigment epithelial detachment associated macular degeneration.

As used herein, the term "age-related macular degeneration" (AMD) refers to a retinopathy which usually affects older individuals and is associated with a loss of central vision, resulting from damage to the central part (i.e., macula) of the retina. AMD is generally characterized by a progressive accumulation or aggregation of yellowish insoluble extracellular deposits, called drusen (buildup of extracellular proteins, such as amyloid beta, and lipids), in the macula (primarily between the retinal pigment epithelium (RPE) and the underlying choroid). The accumulation or aggregation of these deposits within the macula can cause gradual deterioration of the macula, resulting in central vision impairment. As used herein, the term "macula," refers to the central part of the retina that is responsible for central, high-resolution, color vision.

The pathogenesis of age-related macular degeneration is not well known, although some theories have been put forward, including oxidative stress, mitochondrial dysfunction, and inflammatory processes. The imbalance between the production of damaged cellular components and degradation leads to the accumulation of harmful products, for example, intracellular lipofuscin and extracellular drusen. Incipient atrophy is demarcated by areas of retinal pigment epithelium (RPE) thinning or depigmentation that precede geographic atrophy in the early stages of AMD. In advanced stages of AMD, atrophy of the RPE (geographic atrophy) and/or development of new blood vessels (neovascularization) result in the death of photoreceptors and central vision loss. In the dry (nonexudative) AMD, cellular debris called drusen accumulates between the retina and the choroid, causing atrophy and scarring to the retina. In the wet (exudative) AMD, which is more severe, blood vessels grow up from the choroid (neovascularization) behind the retina which can leak exudate and fluid and also cause hemorrhaging.

Depending on the extent of the drusen present, AMD can be categorized into three primary stages: (i) early, (ii) intermediate, and (iii) advanced or late. The early stage AMD is characterized by the presence of either several small (e.g., less than about 63 microns in diameter) drusen or a few medium-sized (e.g., between about 63 to 124 microns in diameter) drusen. During the early stage, patients have no apparent symptoms with no vision loss. The intermediate stage is characterized by the presence of many medium-sized drusen or one or more large (e.g., more than about 125 microns in diameter) drusen. During this stage, some patients may begin to experience blurred spots in the center of their vision. The advanced or late stage AMD is characterized by large areas of damage to the retinal tissue, causing central blind spots and the eventual loss of central vision. Based on the type of damage (e.g., presence or absence of neovascularization), advanced or late stage AMD can be further divided into two subtypes: (i) geographic atrophy (also called atrophic AMD) and (ii) wet AMD (also called neovascular or exudative AMD).

There are two primary forms of AMD: (i) dry AMD and (ii) wet AMD. Unless specified otherwise, the term "age-related macular degeneration" comprises both dry AMD and wet AMD. As used herein, the term "age-related macular degeneration" also comprises all types of age-related macular degeneration regardless of the cause and any and all symptoms of age-related macular degeneration. Non-limiting examples of symptoms associated with macular degeneration (e.g., age-related macular degeneration) include: loss of central vision, distortion, decreased contrast sensitivity, blurred vision, difficulty adapting to low light level, sudden onset and rapid worsening of symptoms, and decreased color vision. In some aspects, macular degeneration (e.g., age-related macular degeneration) can cause macular edema (i.e., swelling of the macula resulting from collection of fluid and protein deposits on or under the macula).

As used herein, the term "dry AMD" (also referred to as atrophic age-related macular degeneration or non-exudative AMD) refers to all forms of AMD that are not wet (neovascular) AMD. This includes early and intermediate forms of AMD, as well as the advanced form of dry AMD known as geographic atrophy. Dry AMD patients tend to have minimal symptoms in the earlier stages; visual function loss occurs more often if the condition advances to geographic atrophy.

As used herein, the term "wet AMD" (also referred to as neovascular age-related macular degeneration or exudative AMD) refers to retinal condition characterized by the presence of retinal neovascularization and is the most advanced form of AMD. In wet AMD, blood vessels grow from the choriocapillaris through defects in Bruch's membrane, and in some cases the underlying retinal pigment epithelium (choroidal neovascularization or angiogenesis). Organization of serous or hemorrhagic exudates escaping from these vessels can result in fibrovascular scarring of the macular region with attendant degeneration of the neuroretina, detachment and tears of the retinal pigment epithelium, vitreous hemorrhage, and permanent loss of central vision.

The term "neovascularization," as used herein, refers to the growth of new, abnormal blood vessels in different parts of the eyes that can result in bleeding and cause loss of vision. As used herein, the term "choroidal neovascularization" refers to the abnormal growth of new blood vessels in the choroid (i.e., vascular layer of the eye, containing connective tissues, and lying between the retina and the sclera). In wet AMD, the new blood vessels can grow through the retinal pigment epithelium (RPE) and choroid, and into the retina, and can cause damage to visual function due to blood and lipid leakage. As used herein, the term "retinal neovascularization" refers to the abnormal development, proliferation, and/or growth of blood vessels on or in the retina, e.g., on the retinal surface. Retinal neovascularization can develop in numerous retinopathies, such as those associated with retinal ischemia and/or inflammatory diseases (e.g., diabetic retinopathy, sickle cell retinopathy, Eales disease, ocular ischemic syndrome, carotid cavernous fistula, familial exudative vitreoretinopathy, hyperviscosity syndrome, idiopathic occlusive arteriolitis, radiation retinopathy, retinal vein occlusion, retinal artery occlusion, retinal embolism, birdshot retinochoroidopathy, retinal vasculitis, sarcoidosis, toxoplasmosis, and uveitis, choroidal melanoma, chronic retinal detachment, anterior ischemic optic neuropathy (AION), non-arteritic anterior ischemic optic neuropathy (NAION), and incontinentia pigmenti). Methods of detecting neovascularization are known in the art and include, but are not limited to, measuring the expression of CD31 (also known as platelet endothelial cell adhesion molecule, PECAM-1) and vascular endothelial growth factor (VEGF) in a tissue. See, e.g., Schluter A., et al., *BMC Cancer* 18(1):272 (2018).

The "retinal pigment epithelium" (RPE) is single monolayer of epithelial cells, located in the back of the vertebrate eye, between the choroidal blood supply (choriocapillaris) and the neuroretina. The RPE acts as one of the components of the blood-retinal barrier, and RPE cells play vital roles in maintaining the visual cycle, in photoreceptor outer segment phagocytosis, and in transport of nutrients, metabolic waste products, ions, and fluid between the distal retina and the choriocapillaris.

The term "intraocular" refers to within or under an ocular tissue. As used herein, the term "intraocular administration" refers to any administration that can deliver a composition (e.g., anti-FAM19A5 antibodies disclosed herein) to a sub-Tenon, subconjunctival, suprachoroidal, intravitreal and like locations of the eye. In some aspects, intraocular administration comprises intravitreal administration.

The term "ocular condition" refers to a disease, aliment, or condition that affects or involves the eye or a part or region of the eye, such as a retinal disease. In some aspects, ocular conditions that can be treated with the present disclosure include diabetic retinopathy and age-related macular degeneration. Other ocular conditions that can treated with compositions and methods disclosed herein comprises diabetic macular edema, anterior ischemic optic neuropathy (AION), non-arteritic anterior ischemic optic neuropathy (NAION), retinal vein occlusion, retinal artery occlusion, or combinations thereof.

The term "eye," as used herein, includes the eyeball and the tissues and fluids which constitute the eyeball (e.g., sclera, cornea, anterior and posterior chambers, iris/pupil, lens, vitreous humor, retina, fovea, macula, and choroid), the periocular muscles (such as the oblique and rectus muscles), and the portion of the optic nerve which is within or adjacent to the eyeball.

The term "optic nerve damage" refers to an alteration of the normal structure or function of the optic nerve. The alteration of the normal structure or function of the optic nerve can be the result of any disease, disorder, or injury, including glaucoma. An alteration of the normal function of the optic nerve includes any alteration of the ability of the optic nerve to function appropriately, such as transmit visual information from the retina to the brain. An alteration in function can manifest itself, for example, as loss of visual field, impaired central visual acuity, abnormal color vision, and so forth. Examples of alteration of structure include nerve fiber loss in the retina, abnormal cupping of the optic nerve, and/or loss of cells from the retinal ganglion cell layer of the retina. "Optic nerve damage" as used herein can include optic nerve damage to one or both optic nerves of a subject.

The terms "treat," "treating," and "treatment," as used herein, refer to any type of intervention or process performed on, or administering an active agent to, the subject with the objective of reversing, alleviating, ameliorating, inhibiting, or slowing down or preventing the progression, development, severity or recurrence of a symptom, complication, condition or biochemical indicia associated with a disease. Treatment can be of a subject having a disease or a subject who does not have a disease (e.g., for prophylaxis).

As used herein, "administering" refers to the physical introduction of a therapeutic agent or a composition comprising a therapeutic agent to a subject, using any of the various methods and delivery systems known to those skilled in the art. The different routes of administration for antibodies described herein include intravenous, intraperitoneal, intramuscular, subcutaneous, spinal or other parenteral routes of administration, for example by injection or infusion. The phrase "parenteral administration" as used herein means modes of administration other than enteral and topical administration, usually by injection, and includes, without limitation, intravitreal, intravenous, intraperitoneal, intramuscular, intraarterial, intrathecal, intralymphatic, intralesional, intracapsular, intraorbital, intracardiac, intradermal, transtracheal, pulmonary, subcutaneous, subcuticular, intraarticular, subcapsular, subarachnoid, intraventricle, intravitreal, epidural, and intrasternal injection and infusion, as well as in vivo electroporation. Alternatively, an antibody described herein can be administered via a non-parenteral route, such as a topical, epidermal or mucosal route of administration, for example, intranasally, orally, vaginally, rectally, sublingually or topically. Administering can also be performed, for example, once, a plurality of times, and/or over one or more extended periods.

The term "therapeutically effective amount" as used herein refers to an amount of a drug, alone or in combination with another therapeutic agent, effective to "treat" a disease or disorder in a subject or reduce the risk, potential, possibility or occurrence of a disease or disorder (e.g., a glaucoma). A "therapeutically effective amount" includes an amount of a drug or a therapeutic agent that provides some improvement or benefit to a subject having or at risk of having a disease or disorder (e.g., a glaucoma disclosed herein). Thus, a "therapeutically effective" amount is an amount that reduces the risk, potential, possibility or occurrence of a disease or provides disorder or some alleviation, mitigation, and/or reduces at least one indicator (e.g., increased inflammation), and/or decrease in at least one clinical symptom of a disease or disorder.

As used herein, the term "subject" includes any human or non-human animal. The term "non-human animal" includes all vertebrates, e.g., mammals and non-mammals, such as non-human primates, sheep, dog, cow, chickens, amphibians, reptiles, etc.

The term "family with sequence similarity 19, member A5" or "FAM19A5" refers to a protein that belongs to the TAFA family (also known as FAM19 family) of five highly homologous proteins. Tang T. Y. et al., *Genomics* 83(4):727-34 (2004). These proteins contain conserved cysteine residues at fixed positions, and are distantly related to macrophage inflammatory protein 1-alpha (MIP-1-alpha), a member of the CC-chemokine family. The TAFA proteins are expressed in specific regions of the brain and the spinal cord. These proteins are believed to be generated and secreted by adult neural stem cells in neurogenesis processes. FAM19A5 is also known as TAFA5 or Chemokine-like protein TAFA-5.

FAM19A5 is believed to be important for the development, differentiation, formation of a complete central nervous system. FAM19A5 also plays a significant role in the pathogenesis of many central nervous system damage and/or degenerative brain diseases (e.g., Huntington's disease, Parkinson's disease, Alzheimer's disease, cerebrospinal damage, strokes, and brain tumors). Upon damage to the central nervous system, neural stem cells produce FAM19A5, which induces the differentiation of normal astrocytes into reactive astrocytes. These reactive astrocytes (along with microglia) can express a wide array of ECMs (e.g., proteoglycans) and induce the formation of glial scars, which can surround the damaged region of the central nervous system like a net and prevent the regeneration of the neurons. Antagonists against FAM19A5 (e.g., anti-FAM19A5 antibody) can be used in the prevention and/or treatment of central nervous system injuries and/or diseases. See U.S. Pat. No. 9,579,398.

However, for certain diseases, particularly those associated with blood vessel abnormalities, a recent study has suggested that FAM19A5 antagonists may not be a viable treatment option. Wang et al., *Circulation* 138(1):48-63 (2018). Wang et al. showed that the adipose tissues of normal, healthy individuals produce FAM19A5, which signals through sphingosine-1-phosphate receptor 2 (S1PR2) to suppress the proliferation and migration of vascular smooth muscle cells (VSMCs) and to attenuate postinjury neointima formation. However, in obese individuals, there is a significant decrease in FAM19A5 expression (both mRNA and protein) in the adipose tissues. Wang et al. concludes that this decrease in FAM19A5 activity is responsible for the accelerated development of cardiovascular diseases observed in many obese individuals.

In humans, the gene encoding FAM19A5 is located on chromosome 22. There are three human FAM19A5 (UniProt: Q7Z5A7) isoforms, which are believed to be produced by alternative splicing: isoform 1 (UniProt: Q7Z5A7-1), which consists of 132 amino acids; isoform 2 (UniProt: Q7Z5A7-2), which consists of 125 amino acids; and isoform 3 (UniProt: Q7Z5A7-3), which consists of 53 amino acids. Human FAM19A5 protein is believed to exist as both membrane bound and soluble (secreted) forms. Isoform 1 is believed to be a membrane protein with one transmembrane region. Isoform 2, which was reported in Tang T. Y. et al., *Genomics* 83(4):727-34 (2004) as a secreted protein (soluble), contains a signal peptide at amino acid positions 1-25. Isoform 3 is predicted based on EST data. Below are the amino acid sequences of the three known human FAM19A5 isoforms.

(I) Isoform 1 (UniProt: Q7Z5A7-1, transmembrane protein): this isoform has been chosen as the canonical sequence.

```
                                           (SEQ ID NO: 1)
MAPSPRTGSR QDATALPSMS STFWAFMILA SLLIAYCSQL

AAGTCEIVTL DRDSSQPRRT IARQTARCAC RKGQIAGTTR

ARPACVDARI IKTKQWCDML PCLEGEGCDL LINRSGWTCT

QPGGRIKTTT VS
```

(II) Isoform 2 (UniProt: Q7Z5A7-2, soluble protein):

```
                                           (SEQ ID NO: 2)
MQLLKALWAL AGAALCCFLV LVIHAQFLKE GQLAAGTCEI

VTLDRDSSQP RRTIARQTAR CACRKGQIAG TTRARPACVD

ARIIKTKQWC DMLPCLEGEG CDLLINRSGW TCTQPGGRIK

TTTVS
```

(III) Isoform 3 (UniProt: Q7Z5A7-3):

(SEQ ID NO: 3)
MYHHREWPAR IIKTKQWCDM LPCLEGEGCD LLINRSGWTC
TQPGGRIKTT TVS

The term "FAM19A5" includes any variants or isoforms of FAM19A5 which are naturally expressed by cells. Accordingly, antibodies described herein can cross-react with different isoforms in the same species (e.g., different isoforms of human FAM19A5), or cross-react with FAM19A5 from species other than human (e.g., mouse FAM19A5). Alternatively, the antibodies can be specific for human FAM19A5 and cannot exhibit any cross-reactivity with other species. FAM19A5, or any variants and isoforms thereof, can either be isolated from cells or tissues which naturally express them or be recombinantly produced. The polynucleotide encoding human FAM19A5 has the GenBank Accession No. BC039396 and the following sequence:

TABLE 1A

Polynucleotide sequence of human FAM19A5

Polynucleotide sequence (SEQ ID NO: 4)

| | |
|---|---|
| FAM19A5 (GenBank Accession No. BC039396) | ggcggcggag gggcgcgggca gccgcggctt gaccgccctg ccagcctgct attgtgacct gcagaccgcc gagcccggcc tgtgacatgc ccggtcaggc cggtctcctg ctccctggag tcaccgttc gacggcctca aggaggccgg atacgcagtc gttggccctg ccacagaagg ggactgtcag ttgcttttat aatctatctg ttgtgcgggc ggagcggaga cacaccctcg cgggaggcag attcctctgt taaccagtta atccagtatc cgatacccca ttgaaagaga a | gatggcgcgc gggccggctg caatggcgcc cccagcatgt catcgcctac tggaccggga cgctgtgcgt cgcctgtgtg ttccgtgtct tggacgtgca acaaacacag agcccacgtc tctgccgccc ggccttggca actcagacac tgtgggagcc ctgtcctcag ctgcagccca gcacagaagc tttcttatac aacctggacg gggagggcaa gggcggccgt gaggacgggc cgacggcccc acttagatca aacatgcctc tgccaaagag tttagctcca tcattaaatg | gcggggcccg ctgagacgcg atcgcccagg cctcaacttt tgcagtcagc cagcagccag gtagaaaggg gacgcaagaa cgcagcccgg ggcccccagg tcagccacag tcctgagctt ataggcgggg cggccgcgcc aggaggagga gccgcctcc ggcctcctcc tttcagtata caccctcact tggtggcaga ggtggaggcc ttcggctgcg cacgcagacg acttgaccgt ttctacagct atgtgggtc tattttgcaa | cacgtggagg ctgctgcccc accggcagcc ctgggcgttc tggccgccgg cctcggagga gcagatcgcc tcatcaagac ggctgcgact cgggaggata ggccccggga ttctccactc cggtctgtcc gcggcacct cagccccgc ggaggaggca gacacgacgc cgtgcccag atccatagac gtcagggtcc gacatgctgg tccaccccag cggaggccgt ccgggaacgc actaaaatcc ccatttttga tcccgtgact agcccaaaaa | ccggcgcggg ccgcgcgggc ggcaagatgc atgatcctgg cacctgtgag cgatcgcccg ggcaccacga caagcagtgg tgttaatcaa aagaccacca gtggccttgg gcctcggact agccgacccg ggcatcagca cgaccgtggc gctccggcag ctgccccagg actgtccgaa caaagagcaa ctgggggtcgc tggccccggc gagcaccccg ggcacacctg aggccgcttt ctttctgttt tagttggata gctgcctcat taacacttgt aaaaaaaaa |

The term "antagonist against a FAM19A5 protein" refers to all antagonists that suppress and/or neutralize the expression and/or activity of the FAM19A5 protein. Such antagonist can be a peptide, nucleic acid, or a compound. More specifically, the antagonist can be an antisense-oligonucleotide, siRNA, shRNA, miRNA, dsRNA, aptamer, PNA (peptide nucleic acid) targeting FAM19A5, or a vector including the same. In some aspects, the antagonist can be an antibody, or an antigen-binding portion thereof, that specifically binds to the FAM19A5 protein.

The terms "antibody" and "antibodies" are terms of art and can be used interchangeably herein and refer to a molecule with an antigen binding site that specifically binds an antigen. The terms as used herein include whole antibodies and any antigen binding fragments (i.e., "antigen-binding portions") or single chains thereof. An "antibody" refers, in one aspect, to a glycoprotein comprising at least two heavy (H) chains and two light (L) chains inter-connected by disulfide bonds, or an antigen-binding portion thereof. In another aspect, an "antibody" refers to a single chain antibody comprising a single variable domain, e.g., VHH domain. Each heavy chain is comprised of a heavy chain variable region (abbreviated herein as VH) and a heavy chain constant region. In certain naturally-occurring antibodies, the heavy chain constant region is comprised of three domains, CH1, CH2 and CH3. In certain naturally-occurring antibodies, each light chain is comprised of a light chain variable region (abbreviated herein as VL) and a light chain constant region. The light chain constant region is comprised of one domain, CL.

The VH and VL regions can be further subdivided into regions of hypervariability, termed complementarity determining regions (CDR), interspersed with regions that are more conserved, termed framework regions (FR). Each VH and VL is composed of three CDRs and four FRs, arranged from amino-terminus to carboxy-terminus in the following order: FR1, CDR1, FR2, CDR2, FR3, CDR3, and FR4. The variable regions of the heavy and light chains contain a binding domain that interacts with an antigen. The constant regions of the antibodies can mediate the binding of the immunoglobulin to host tissues or factors, including various cells of the immune system (e.g., effector cells) and the first component (C1q) of the classical complement system.

The term "Kabat numbering" and like terms are recognized in the art and refer to a system of numbering amino acid residues in the heavy and light chain variable regions of an antibody, or an antigen-binding portion thereof. In certain aspects, the CDRs of an antibody can be determined according to the Kabat numbering system (see, e.g., Kabat E A &

Wu T T (1971) *Ann NY Acad Sci* 190: 382-391 and Kabat E A et al., (1991) Sequences of Proteins of Immunological Interest, Fifth Edition, U.S. Department of Health and Human Services, NIH Publication No. 91-3242). Using the Kabat numbering system, CDRs within an antibody heavy chain molecule are typically present at amino acid positions 31 to 35, which optionally can include one or two additional amino acids, following 35 (referred to in the Kabat numbering scheme as 35A and 35B) (CDR1), amino acid positions 50 to 65 (CDR2), and amino acid positions 95 to 102 (CDR3). Using the Kabat numbering system, CDRs within an antibody light chain molecule are typically present at amino acid positions 24 to 34 (CDR1), amino acid positions 50 to 56 (CDR2), and amino acid positions 89 to 97 (CDR3). In a specific aspect, the CDRs of the antibodies described herein have been determined according to the Kabat numbering scheme.

The phrases "amino acid position numbering as in Kabat," "Kabat position," and grammatical variants thereof refer to the numbering system used for heavy chain variable domains or light chain variable domains of the compilation of antibodies in Kabat et al., Sequences of Proteins of Immunological Interest, 5th Ed. Public Health Service, National Institutes of Health, Bethesda, Md. (1991). Using this numbering system, the actual linear amino acid sequence can contain fewer or additional amino acids corresponding to a shortening of, or insertion into, a FW or CDR of the variable domain. For example, a heavy chain variable domain can include a single amino acid insert (residue 52a according to Kabat) after residue 52 of H2 and inserted residues (e.g., residues 82a, 82b, and 82c, etc. according to Kabat) after heavy chain FW residue 82. See TABLE 1B.

TABLE 1B

| Loop | Kabat | AbM | Chothia |
|---|---|---|---|
| L1 | L24-L34 | L24-L34 | L24-L34 |
| L2 | L50-L56 | L50-L56 | L50-L56 |
| L3 | L89-L97 | L89-L97 | L89-L97 |
| H1 | H31-H35B | H26-H35B | H26-H32 ... 34 |
| | (Kabat Numbering) | | |
| H1 | H31-H35 | H26-H35 | H26-H32 |
| | (Chothia Numbering) | | |
| H2 | H50-H65 | H50-H58 | H52-H56 |
| H3 | H95-H102 | H95-H102 | H95-H102 |

The Kabat numbering of residues can be determined for a given antibody by alignment at regions of homology of the sequence of the antibody with a "standard" Kabat numbered sequence. Chothia refers instead to the location of the structural loops (Chothia and Lesk, *J. Mol. Biol.* 196:901-917 (1987)). The end of the Chothia CDR-H1 loop when numbered using the Kabat numbering convention varies between H32 and H34 depending on the length of the loop (this is because the Kabat numbering scheme places the insertions at H35A and H35B; if neither 35A nor 35B is present, the loop ends at 32; if only 35A is present, the loop ends at 33; if both 35A and 35B are present, the loop ends at 34). The AbM hypervariable regions represent a compromise between the Kabat CDRs and Chothia structural loops, and are used by Oxford Molecular's AbM antibody modeling software.

IMGT (ImMunoGeneTics) also provides a numbering system for the immunoglobulin variable regions, including the CDRs. See, e.g., Lefranc, M. P. et al., *Dev. Comp. Immunol.* 27: 55-77(2003), which is herein incorporated by reference. The IMGT numbering system was based on an alignment of more than 5,000 sequences, structural data, and characterization of hypervariable loops and allows for easy comparison of the variable and CDR regions for all species. According to the IMGT numbering schema VH-CDR1 is at positions 26 to 35, VH-CDR2 is at positions 51 to 57, VH-CDR3 is at positions 93 to 102, VL-CDR1 is at positions 27 to 32, VL-CDR2 is at positions 50 to 52, and VL-CDR3 is at positions 89 to 97.

For all heavy chain constant region amino acid positions discussed in the present disclosure, numbering is according to the EU index first described in Edelman et al., 1969, *Proc. Natl. Acad. Sci. USA* 63(1):78-85, describing the amino acid sequence of myeloma protein EU, which is the first human IgG1 sequenced. The EU index of Edelman et al. is also set forth in Kabat et al., 1991, Sequences of Proteins of Immunological Interest, 5th Ed., United States Public Health Service, National Institutes of Health, Bethesda. Thus, the phrases "EU index as set forth in Kabat" or "EU index of Kabat" and "position . . . according to the EU index as set forth in Kabat," and grammatical variants thereof refer to the residue numbering system based on the human IgG1 EU antibody of Edelman et al. as set forth in Kabat 1991.

The numbering system used for the variable domains (both heavy chain and light chain) and light chain constant region amino acid sequence is that set forth in Kabat 1991.

Antibodies can be of any type (e.g., IgG, IgE, IgM, IgD, IgA, or IgY), any class (e.g., IgD, IgG2, IgG3, IgG4, IgA1, or IgA2), or any subclass (e.g., IgG1, IgG2, IgG3, and IgG4 in humans; and IgG1, IgG2a, IgG2b, and IgG3 in mice) of immunoglobulin molecule. Immunoglobulins, e.g., IgG1, exist in several allotypes, which differ from each other in at most a few amino acids. An antibody disclosed herein can be from any of the commonly known isotypes, classes, subclasses, or allotypes. In certain aspects, the antibodies described herein are of the IgG1, IgG2, IgG3, or IgG4 subclass or any hybrid thereof. In certain aspects, the antibodies are of the human IgG1 subclass or the human IgG2 or human IgG4 subclass.

"Antibody" includes, by way of example, both naturally-occurring and non-naturally-occurring antibodies; monoclonal and polyclonal antibodies; chimeric and humanized antibodies; human and non-human antibodies; wholly synthetic antibodies; single chain antibodies; monospecific antibodies; multispecific antibodies (including bispecific antibodies); tetrameric antibodies comprising two heavy chain and two light chain molecules; an antibody light chain monomer; an antibody heavy chain monomer; an antibody light chain dimer, an antibody heavy chain dimer; an antibody light chain-antibody heavy chain pair; intrabodies; heteroconjugate antibodies; monovalent antibodies; camelized antibodies; affybodies; anti-idiotypic (anti-Id) antibodies (including, e.g., anti-anti-Id antibodies), and single-domain antibodies (sdAbs), which include binding molecules consisting of a single monomeric variable antibody domain that are fully capable of antigen binding (e.g., a VH domain or a VL domain). Harmen M. M. and Haard H. *J. Appl Microbiol Biotechnol.* 77(1): 13-22 (2007)).

The term "antigen-binding portion" of an antibody, as used herein, refers to one or more fragments of an antibody that retain the ability to specifically bind to an antigen (e.g., human FAM19A5). Such "fragments" are, for example between about 8 and about 1500 amino acids in length, suitably between about 8 and about 745 amino acids in length, suitably about 8 to about 300, for example about 8 to about 200 amino acids, or about 10 to about 50 or 100 amino acids in length. It has been shown that the antigen-binding function of an antibody can be performed by fragments of a full-length antibody. Examples of binding fragments encompassed within the term "antigen-binding portion" of an antibody, e.g., an anti-FAM19A5 antibody described herein, include (i) a Fab fragment, a monovalent fragment consisting of the VL, VH, CL, and CH1 domains; (ii) a F(ab')2 fragment, a bivalent fragment comprising two Fab fragments linked by a disulfide bridge at the hinge region; (iii) a Fd fragment consisting of the VH and CH1 domains; (iv) a Fv fragment consisting of the VL and VH domains of a single arm of an antibody, and disulfide-linked Fvs (sdFv); (v) a dAb fragment (Ward et al., (1989) *Nature* 341:544-546), which consists of a VH domain; and (vi) an isolated complementarity determining region (CDR) or (vii) a combination of two or more isolated CDRs which can optionally be joined by a synthetic linker. Furthermore, although the two domains of the Fv fragment, VL and VH, are coded for by separate genes, they can be joined, using recombinant methods, by a synthetic linker that enables them to be made as a single protein chain in which the VL and VH regions pair to form monovalent molecules (known as single chain Fv (scFv)); see, e.g., Bird et al. (1988) *Science* 242:423-426; and Huston et al. (1988) *Proc. Natl. Acad. Sci. USA* 85:5879-5883). Such single chain antibodies are also intended to be encompassed within the term "antigen-binding portion" of an antibody. These antibody fragments are obtained using conventional techniques known to those with skill in the art, and the fragments are screened for utility in the same manner as are intact antibodies. Antigen-binding portions can be produced by recombinant DNA techniques, or by enzymatic or chemical cleavage of intact immunoglobulins.

As used herein, the terms "variable region" and "variable domain" are used interchangeably and are common in the art. The variable region typically refers to a portion of an antibody, generally, a portion of a light or heavy chain, typically about the amino-terminal 110 to 120 amino acids in the mature heavy chain and about 90 to 115 amino acids in the mature light chain, which differ extensively in sequence among antibodies and are used in the binding and specificity of a particular antibody for its particular antigen. The variability in sequence is concentrated in those regions called complementarity determining regions (CDRs) while the more highly conserved regions in the variable domain are called framework regions (FR).

Without wishing to be bound by any particular mechanism or theory, it is believed that the CDRs of the light and heavy chains are primarily responsible for the interaction and specificity of the antibody with antigen. In certain aspects, the variable region is a human variable region. In certain aspects, the variable region comprises rodent or murine CDRs and human framework regions (FRs). In particular aspects, the variable region is a primate (e.g., non-human primate) variable region. In certain aspects, the variable region comprises rodent or murine CDRs and primate (e.g., non-human primate) framework regions (FRs).

As used herein, the term "heavy chain" (HC) when used in reference to an antibody can refer to any distinct type, e.g., alpha ($\alpha$), delta ($\delta$), epsilon ($\epsilon$), gamma ($\gamma$) and mu ($\mu$), based on the amino acid sequence of the constant domain, which give rise to IgA, IgD, IgE, IgG and IgM classes of antibodies, respectively, including subclasses of IgG, e.g., IgG1, IgG2, IgG3 and IgG4.

As used herein, the term "light chain" (LC) when used in reference to an antibody can refer to any distinct type, e.g., kappa ($\kappa$) or lambda ($\lambda$) based on the amino acid sequence of the constant domains. Light chain amino acid sequences are well known in the art. In specific aspects, the light chain is a human light chain.

The terms "VL" and "VL domain" are used interchangeably to refer to the light chain variable region of an antibody.

The terms "VH" and "VH domain" are used interchangeably to refer to the heavy chain variable region of an antibody.

As used herein, the terms "constant region" and "constant domain" are interchangeable and have its meaning common in the art. The constant region is an antibody portion, e.g., a carboxyl terminal portion of a light and/or heavy chain which is not directly involved in binding of an antibody to antigen but which can exhibit various effector functions, such as interaction with the Fc receptor. The constant region of an immunoglobulin molecule generally has a more conserved amino acid sequence relative to an immunoglobulin variable domain.

An "Fc region" (fragment crystallizable region) or "Fc domain" or "Fc" refers to the C-terminal region of the heavy chain of an antibody that mediates the binding of the immunoglobulin to host tissues or factors, including binding to Fc receptors located on various cells of the immune system (e.g., effector cells) or to the first component (C1q) of the classical complement system. Thus, a Fc region comprises the constant region of an antibody excluding the first constant region immunoglobulin domain (e.g., CH1 or CL). In IgG, IgA and IgD antibody isotypes, the Fc region comprises two identical protein fragments, derived from the second (CH2) and third (CH3) constant domains of the antibody's two heavy chains; IgM and IgE Fc regions comprise three heavy chain constant domains (CH domains 2-4) in each polypeptide chain. For IgG, the Fc region comprises immunoglobulin domains C$\gamma$2 and C$\gamma$3 and the hinge between C$\gamma$1 and C$\gamma$2. Although the boundaries of the Fc region of an immunoglobulin heavy chain might vary, the human IgG heavy chain Fc region is usually defined to stretch from an amino acid residue at position C226 or P230 (or amino acid between these two amino acids) to the carboxy-terminus of the heavy chain, wherein the numbering is according to the EU index as in Kabat. The CH2 domain of a human IgG Fc region extends from about amino acid 231 to about amino acid 340, whereas the CH3 domain is positioned on C-terminal side of a Cm domain in a Fc region, i.e., it extends from about amino acid 341 to about amino acid 447 of an IgG. As used herein, the Fc region can be a native sequence Fc, including any allotypic variant, or a variant Fc (e.g., a non-naturally-occurring Fc). Fc can also refer to this region in isolation or in the context of a Fc-comprising protein polypeptide such as a "binding protein comprising a Fc region," also referred to as an "Fc fusion protein" (e.g., an antibody or immunoadhesion).

A "native sequence Fc region" or "native sequence Fc" comprises an amino acid sequence that is identical to the amino acid sequence of a Fc region found in nature. Native sequence human Fc regions include a native sequence human IgG1 Fc region; native sequence human IgG2 Fc region; native sequence human IgG3 Fc region; and native sequence human IgG4 Fc region as well as naturally-occurring variants thereof. Native sequence Fc includes the various allotypes of Fcs (see, e.g., Jefferis et al. (2009) *mAbs* 1:1; Vidarsson G. et al. *Front Immunol.* 5:520 (published online Oct. 20, 2014)).

An "Fc receptor" or "FcR" is a receptor that binds to the Fc region of an immunoglobulin. FcRs that bind to an IgG antibody comprise receptors of the Fc$\gamma$R family, including allelic variants and alternatively spliced forms of these receptors. The FcγR family consists of three activating (FcγRI, FcγRIII, and FcγRIV in mice; FcγRIA, FcγRIIA, and FcγRIIIA in humans) and one inhibitory (FcγRIIB) receptor. Human IgG1 binds to most human Fc receptors and elicits the strongest Fc effector functions. It is considered equivalent to murine IgG2a with respect to the types of activating Fc receptors that it binds to. Conversely, human IgG4 elicits the least Fc effector functions. Vidarsson G. et al. *Front Immunol.* 5:520 (published online Oct. 20, 2014).

The constant region can be manipulated, e.g., by recombinant technology, to eliminate one or more effector functions. An "effector function" refers to the interaction of an antibody Fc region with a Fc receptor or ligand, or a biochemical event that results therefrom. Exemplary "effector functions" include C1q binding, complement dependent cytotoxicity (CDC), Fc receptor binding, FcγR-mediated effector functions such as ADCC and antibody dependent cell-mediated phagocytosis (ADCP), and down regulation of a cell surface receptor (e.g., the B cell receptor; BCR). Such effector functions generally require the Fc region to be combined with a binding domain (e.g., an antibody variable domain). Accordingly, the term "a constant region without the Fc function" include constant regions with reduced or without one or more effector functions mediated by Fc region.

Effector functions of an antibody can be reduced or avoided by different approaches. Effector functions of an antibody can be reduced or avoided by using antibody fragments lacking the Fc region (e.g., such as a Fab, F(ab')$_2$, single chain Fv (scFv), or a sdAb consisting of a monomeric VH or VL domain). Alternatively, the so-called aglycosylated antibodies can be generated by removing sugars that are linked to particular residues in the Fc region to reduce the effector functions of an antibody while retaining other valuable attributes of the Fc region (e.g., prolonged half-life and heterodimerization). Aglycosylated antibodies can be generated by, for example, deleting or altering the residue the sugar is attached to, removing the sugars enzymatically, producing the antibody in cells cultured in the presence of a glycosylation inhibitor, or by expressing the antibody in cells unable to glycosylate proteins (e.g., bacterial host cells). See, e.g., U.S. Pub. No. 20120100140. Another approach is to employ Fc regions from an IgG subclass that have reduced effector function, for example, IgG2 and IgG4 antibodies are characterized by having lower levels of Fc effector functions than IgG1 and IgG3. The residues most proximal to the hinge region in the CH2 domain of the Fc part are responsible for effector functions of antibodies as it contains a largely overlapping binding site for C1q (complement) and IgG-Fc receptors (FcγR) on effector cells of the innate immune system. Vidarsson G. et al. *Front Immunol.* 5:520 (published online Oct. 20, 2014). Accordingly, antibodies with reduced or without Fc effector functions can be prepared by generating, e.g., a chimeric Fc region which comprises a CH2 domain from an IgG antibody of the IgG4 isotype and a CH3 domain from an IgG antibody of the IgG1 isotype, or a chimeric Fc region which comprises hinge region from IgG2 and CH2 region from IgG4 (see, e.g., Lau C. et al. *J. Immunol.* 191:4769-4777 (2013)), or a Fc region with mutations that result in altered Fc effector functions, e.g., reduced or no Fc functions. Such Fc regions with mutations are known in the art. See, e.g., U.S. Pub. No. 20120100140 and U.S. and PCT applications cited therein and An et al. *mAbs* 1:6, 572-579 (2009); the disclosure of which are incorporated by reference to their entirety.

A "hinge", "hinge domain" or "hinge region" or "antibody hinge region" refers to the domain of a heavy chain constant region that joins the CH1 domain to the CH2 domain and includes the upper, middle, and lower portions of the hinge (Roux et al. *J. Immunol.* 1998 161:4083). The hinge provides varying levels of flexibility between the binding and effector regions of an antibody and also provides sites for intermolecular disulfide bonding between the two heavy chain constant regions. As used herein, a hinge starts at Glu216 and ends at Gly237 for all IgG isotypes (Roux et al., 1998 *J Immunol* 161:4083). The sequences of wild-type IgG1, IgG2, IgG3 and IgG4 hinges are known in the art. See, e.g., Kabat E A et al., (1991) Sequences of Proteins of Immunological Interest, Fifth Edition, U.S. Department of Health and Human Services, NIH Publication No. 91-3242; Vidarsson G. et al. *Front Immunol.* 5:520 (published online Oct. 20, 2014).

The term "CH1 domain" refers to the heavy chain constant region linking the variable domain to the hinge in a heavy chain constant domain. As used herein, a CH1 domain starts at A118 and ends at V215. The term "CH1 domain" includes wildtype CH1 domains, as well as naturally existing variants thereof (e.g., allotypes). CH1 domain sequences of IgG1, IgG2, IgG3, and IgG4 (including wildtype and allotypes) are known in the art. See, e.g., Kabat E A et al, (1991) supra and Vidarsson G. et al. *Front Immunol.* 5:520 (published online Oct. 20, 2014). Exemplary CH1 domains include CH1 domains with mutations that modify a biological activity of an antibody, e.g., half-life, e.g., described in U.S. Pub. No. 20120100140 and U.S. patents and publications and PCT publications cited therein.

The term "CH2 domain" refers to the heavy chain constant region linking the hinge to the CH3 domain in a heavy chain constant domain. As used herein, a CH2 domain starts at P238 and ends at K340. The term "CH2 domain" includes wildtype CH2 domains, as well as naturally existing variants thereof (e.g., allotypes). CH2 domain sequences of IgG1, IgG2, IgG3, and IgG4 (including wildtype and allotypes) are known in the art. See, e.g., Kabat E A et al., (1991) supra and Vidarsson G. et al. *Front Immunol.* 5:520 (published online Oct. 20, 2014). Exemplary CH2 domains include CH2 domains with mutations that modify a biological activity of an antibody, e.g., half-life and/or reduced Fc effector function, e.g., described in U.S. Pub. No. 20120100140 and U.S. patents and publications and PCT publications cited therein.

The term "CH3 domain" refers to the heavy chain constant region that is C-terminal to the CH2 domain in a heavy chain constant domain. As used herein, a CH3 domain starts at G341 and ends at K447. The term "CH3 domain" includes wildtype CH3 domains, as well as naturally existing variants thereof (e.g., allotypes). CH3 domain sequences of IgG1, IgG2, IgG3, and IgG4 (including wildtype and allotypes) are known in the art. See, e.g., Kabat E A et al., (1991) supra and Vidarsson G. et al. *Front Immunol.* 5:520 (published online Oct. 20, 2014). Exemplary CH3 domains include CH3 domains with mutations that modify a biological activity of an antibody, e.g., half-life, e.g., described in U.S. Pub. No. 20120100140 and U.S. patents and publications and PCT publications cited therein.

As used herein, "isotype" refers to the antibody class (e.g., IgG1, IgG2, IgG3, IgG4, IgM, IgA1, IgA2, IgD, and IgE antibody) that is encoded by the heavy chain constant region genes.

"Allotype" refers to naturally-occurring variants within a specific isotype group, which variants differ in a few amino acids (see, e.g., Jefferis et al. (2009) *mAbs* 1:1). Antibodies described herein can be of any allotype. Allotypes of IgG1, IgG2, IgG3, and IgG4 are known in the art. See, e.g., Kabat E A et al., (1991) supra; Vidarsson G. et al. *Front Immunol.* 5:520 (published online Oct. 20, 2014); and Lefranc M P, *mAbs* 1:4, 1-7(2009).

The phrases "an antibody recognizing an antigen" and "an antibody specific for an antigen" are used interchangeably herein with the term "an antibody which binds specifically to an antigen."

An "isolated antibody," as used herein, is intended to refer to an antibody which is substantially free of other antibodies having different antigenic specificities (e.g., an isolated antibody that specifically binds to FAM19A5 is substantially free of antibodies that specifically bind antigens other than FAM19A5). An isolated antibody that specifically binds to an epitope of FAM19A5 can, however, have cross-reactivity to other FAM19A5 proteins from different species.

"Binding affinity" generally refers to the strength of the sum total of non-covalent interactions between a single binding site of a molecule (e.g., an antibody) and its binding partner (e.g., an antigen). Unless indicated otherwise, as used herein, "binding affinity" refers to intrinsic binding affinity which reflects a 1:1 interaction between members of a binding pair (e.g., antibody and antigen). The affinity of a molecule X for its partner Y can generally be represented by the dissociation constant ($K_D$). Affinity can be measured and/or expressed in a number of ways known in the art, including, but not limited to, equilibrium dissociation constant ($K_D$), and equilibrium association constant ($K_A$). The $K_D$ is calculated from the quotient of $k_{off}/k_{on}$ and is expressed as a molar concentration (M), whereas $K_A$ is calculated from the quotient of $k_{on}/k_{off}$. $k_{on}$ refers to the association rate constant of, e.g., an antibody to an antigen, and $k_{off}$ refers to the dissociation of, e.g., an antibody to an antigen. The $k_{on}$ and $k_{off}$ can be determined by techniques known to one of ordinary skill in the art, such as immunoassays (e.g., enzyme-linked immunosorbent assay (ELISA)), BIACORE™ or kinetic exclusion assay (KINEXA®).

As used herein, the terms "specifically binds," "specifically recognizes," "specific binding," "selective binding," and "selectively binds," are analogous terms in the context of antibodies and refer to molecules (e.g., antibodies) that bind to an antigen (e.g., epitope or immune complex) as such binding is understood by one skilled in the art. For example, a molecule that specifically binds to an antigen can bind to other peptides or polypeptides, generally with lower affinity as determined by, e.g., immunoassays, BIACORE™, KINEXA® 3000 instrument (Sapidyne Instruments, Boise, Id.), or other assays known in the art. In a specific aspect, molecules that specifically bind to an antigen bind to the antigen with a $K_A$ that is at least 2 logs, 2.5 logs, 3 logs, 4 logs or greater than the $K_A$ when the molecules bind to another antigen.

Antibodies typically bind specifically to their cognate antigen with high affinity, reflected by a dissociation constant ($K_D$) of $10^{-5}$ to $10^{-11}$ M or less. Any $K_D$ greater than about $10^{-4}$ M is generally considered to indicate nonspecific binding. As used herein, an antibody that "binds specifically" to an antigen refers to an antibody that binds to the antigen and substantially identical antigens with high affinity, which means having a $K_D$ of $10^{-7}$ M or less, preferably $10^{-8}$ M or less, even more preferably $10^{-9}$ M or less, and most preferably between $10^{-8}$ M and $10^{-10}$ M or less, when determined by, e.g., immunoassays (e.g., ELISA) or surface plasmon resonance (SPR) technology in a BIACORE™ 2000 instrument using the predetermined antigen, but does not bind with high affinity to unrelated antigens.

As used herein, the term "antigen" refers to any natural or synthetic immunogenic substance, such as a protein, peptide, or hapten. An antigen can be FAM19A5 or a fragment thereof.

As used herein, an "epitope" is a term in the art and refers to a localized region of an antigen to which an antibody can specifically bind. An epitope can be, for example, contiguous amino acids of a polypeptide (linear or contiguous epitope) or an epitope can, for example, come together from two or more non-contiguous regions of a polypeptide or polypeptides (conformational, non-linear, discontinuous, or non-contiguous epitope). Epitopes formed from contiguous amino acids are typically, but not always, retained on exposure to denaturing solvents, whereas epitopes formed by tertiary folding are typically lost on treatment with denaturing solvents. An epitope typically includes at least 1, 2, 3, 4, 5, 6, 7, 8, 9, 10, 11, 12, 13, 14, 15, or 20 amino acids in a unique spatial conformation. Methods for determining what epitopes are bound by a given antibody (i.e., epitope mapping) are well known in the art and include, for example, immunoblotting and immunoprecipitation assays, wherein overlapping or contiguous peptides from (e.g., from FAM19A5) are tested for reactivity with a given antibody (e.g., anti-FAM19A5 antibody). Methods of determining spatial conformation of epitopes include techniques in the art and those described herein, for example, x-ray crystallography, 2-dimensional nuclear magnetic resonance and HDX-MS (see, e.g., Epitope Mapping Protocols in Methods in Molecular Biology, Vol. 66, G. E. Morris, Ed. (1996)).

In certain aspects, the epitope to which an antibody binds can be determined by, e.g., NMR spectroscopy, X-ray diffraction crystallography studies, ELISA assays, hydrogen/deuterium exchange coupled with mass spectrometry (e.g., liquid chromatography electrospray mass spectrometry), array-based oligo-peptide scanning assays, and/or mutagenesis mapping (e.g., site-directed mutagenesis mapping). For X-ray crystallography, crystallization can be accomplished using any of the known methods in the art (e.g., Giege R et al., (1994) *Acta Crystallogr D Biol Crystallogr* 50(Pt 4): 339-350; McPherson A (1990) *Eur J Biochem* 189: 1-23; Chayen N E (1997) *Structure* 5: 1269-1274; McPherson A (1976) *J Biol Chem* 251: 6300-6303). Antibody:antigen crystals can be studied using well known X-ray diffraction techniques and can be refined using computer software such as X-PLOR (Yale University, 1992, distributed by Molecular Simulations, Inc.; see, e.g., Meth Enzymol (1985) volumes 114 & 115, eds Wyckoff H W et al., U.S. 2004/0014194), and BUSTER (Bricogne G (1993) *Acta Crystallogr D Biol Crystallogr* 49(Pt 1): 37-60; Bricogne G (1997) *Meth Enzymol* 276A: 361-423, ed Carter C W; Roversi P et al., (2000) *Acta Crystallogr D Biol Crystallogr* 56(Pt 10): 1316-1323). Mutagenesis mapping studies can be accomplished using any method known to one of skill in the art. See, e.g., Champe M et al., (1995) *J Biol Chem* 270: 1388-1394 and Cunningham B C & Wells J A (1989) *Science* 244: 1081-1085 for a description of mutagenesis techniques, including alanine scanning mutagenesis techniques.

The term "epitope mapping" refers to the process of identification of the molecular determinants for antibody-antigen recognition.

The term "binds to the same epitope" with reference to two or more antibodies means that the antibodies bind to the same segment of amino acid residues, as determined by a given method. Techniques for determining whether antibodies bind to the "same epitope on FAM19A5" with the antibodies described herein include, for example, epitope mapping methods, such as, x-ray analyses of crystals of antigen:antibody complexes which provides atomic resolution of the epitope and hydrogen/deuterium exchange mass spectrometry (HDX-MS). Other methods monitor the binding of the antibody to antigen fragments or mutated variations of the antigen where loss of binding due to a modification of an amino acid residue within the antigen sequence is often considered an indication of an epitope component. In addition, computational combinatorial methods for epitope mapping can also be used. These methods rely on the ability of the antibody of interest to affinity isolate specific short peptides from combinatorial phage display peptide libraries. Antibodies having the same VH and VL or the same CDR1, 2 and 3 sequences are expected to bind to the same epitope.

Antibodies that "compete with another antibody for binding to a target" refer to antibodies that inhibit (partially or completely) the binding of the other antibody to the target. Whether two antibodies compete with each other for binding to a target, i.e., whether and to what extent one antibody inhibits the binding of the other antibody to a target, can be determined using known competition experiments. In certain aspects, an antibody competes with, and inhibits binding of another antibody to a target by at least 10%, 20%, 30%, 40%, 50%, 60%, 70%, 80%, 90% or 100%. The level of inhibition or competition can be different depending on which antibody is the "blocking antibody" (i.e., the cold antibody that is incubated first with the target). Competition assays can be conducted as described, for example, in Ed Harlow and David Lane, Cold Spring Harb Protoc; 2006; doi: 10.1101/pdb.prot4277 or in Chapter 11 of "Using Antibodies" by Ed Harlow and David Lane, Cold Spring Harbor Laboratory Press, Cold Spring Harbor, N.Y., USA 1999. Competing antibodies bind to the same epitope, an overlapping epitope or to adjacent epitopes (e.g., as evidenced by steric hindrance).

Other competitive binding assays include: solid phase direct or indirect radioimmunoassay (RIA), solid phase direct or indirect enzyme immunoassay (EIA), sandwich competition assay (see Stahli et al., *Methods in Enzymology* 9:242 (1983)); solid phase direct biotin-avidin EIA (see Kirkland et al., *J. Immunol.* 137:3614 (1986)); solid phase direct labeled assay, solid phase direct labeled sandwich assay (see Harlow and Lane, Antibodies: A Laboratory Manual, Cold Spring Harbor Press (1988)); solid phase direct label RIA using 1-125 label (see Morel et al., *Mol. Immunol.* 25(1):7 (1988)); solid phase direct biotin-avidin EIA (Cheung et al., *Virology* 176:546 (1990)); and direct labeled RIA. (Moldenhauer et al., *Scand. J. Immunol.* 32:77 (1990)).

A "bispecific" or "bifunctional antibody" is an artificial hybrid antibody having two different heavy/light chain pairs and two different binding sites. Bispecific antibodies can be produced by a variety of methods including fusion of hybridomas or linking of Fab' fragments. See, e.g., Songsivilai & Lachmann, *Clin. Exp. Immunol.* 79:315-321 (1990); Kostelny et al., *J. Immunol.* 148, 1547-1553 (1992).

The term "monoclonal antibody," as used herein, refers to an antibody that displays a single binding specificity and affinity for a particular epitope or a composition of antibodies in which all antibodies display a single binding specificity and affinity for a particular epitope. Accordingly, the term "human monoclonal antibody" refers to an antibody or antibody composition that display(s) a single binding specificity and which has variable and optional constant regions derived from human germline immunoglobulin sequences. In some aspects, human monoclonal antibodies are produced by a hybridoma which includes a B cell obtained from a transgenic non-human animal, e.g., a transgenic mouse, having a genome comprising a human heavy chain transgene and a light chain transgene fused to an immortalized cell.

The term "recombinant human antibody," as used herein, includes all human antibodies that are prepared, expressed, created or isolated by recombinant means, such as (a) antibodies isolated from an animal (e.g., a mouse) that is transgenic or transchromosomal for human immunoglobulin genes or a hybridoma prepared therefrom, (b) antibodies isolated from a host cell transformed to express the antibody, e.g., from a transfectoma, (c) antibodies isolated from a recombinant, combinatorial human antibody library, and (d) antibodies prepared, expressed, created or isolated by any other means that involve splicing of human immunoglobulin gene sequences to other DNA sequences. Such recombinant human antibodies comprise variable and constant regions that utilize particular human germline immunoglobulin sequences are encoded by the germline genes, but include subsequent rearrangements and mutations which occur, for example, during antibody maturation. As known in the art (see, e.g., Lonberg (2005) *Nature Biotech.* 23(9): 1117-1125), the variable region contains the antigen binding domain, which is encoded by various genes that rearrange to form an antibody specific for a foreign antigen. In addition to rearrangement, the variable region can be further modified by multiple single amino acid changes (referred to as somatic mutation or hypermutation) to increase the affinity of the antibody to the foreign antigen. The constant region will change in further response to an antigen (i.e., isotype switch). Therefore, the rearranged and somatically mutated nucleic acid molecules that encode the light chain and heavy chain immunoglobulin polypeptides in response to an antigen cannot have sequence identity with the original nucleic acid molecules, but instead will be substantially identical or similar (i.e., have at least 80% identity).

A "human" antibody (HuMAb) refers to an antibody having variable regions in which both the framework and CDR regions are derived from human germline immunoglobulin sequences. Furthermore, if the antibody contains a constant region, the constant region also is derived from human germline immunoglobulin sequences. The antibodies described herein can include amino acid residues not encoded by human germline immunoglobulin sequences (e.g., mutations introduced by random or site-specific mutagenesis in vitro or by somatic mutation in vivo). However, the term "human antibody", as used herein, is not intended to include antibodies in which CDR sequences derived from the germline of another mammalian species, such as a mouse, have been grafted onto human framework sequences. The terms "human" antibodies and "fully human" antibodies are used synonymously.

A "humanized" antibody refers to an antibody in which some, most or all of the amino acids outside the CDR domains of a non-human antibody are replaced with corresponding amino acids derived from human immunoglobulins. In some aspects of a humanized form of an antibody, some, most or all of the amino acids outside the CDR domains have been replaced with amino acids from human immunoglobulins, whereas some, most or all amino acids within one or more CDR regions are unchanged. Small additions, deletions, insertions, substitutions or modifications of amino acids are permissible as long as they do not abrogate the ability of the antibody to bind to a particular antigen. A "humanized" antibody retains an antigenic specificity similar to that of the original antibody.

A "chimeric antibody" refers to an antibody in which the variable regions are derived from one species and the constant regions are derived from another species, such as an antibody in which the variable regions are derived from a mouse antibody and the constant regions are derived from a human antibody.

The term "cross-reacts," as used herein, refers to the ability of an antibody described herein to bind to FAM19A5 from a different species. For example, an antibody described herein that binds human FAM19A5 can also bind another species of FAM19A5 (e.g., mouse FAM19A5). As used herein, cross-reactivity can be measured by detecting a specific reactivity with purified antigen in binding assays (e.g., SPR, ELISA) or binding to, or otherwise functionally interacting with, cells physiologically expressing FAM19A5. Methods for determining cross-reactivity include standard binding assays as described herein, for example, by BIACORE™ surface plasmon resonance (SPR) analysis using a BIACORE™ 2000 SPR instrument (Biacore AB, Uppsala, Sweden), or flow cytometric techniques.

The term "naturally-occurring" as applied to an object herein refers to the fact that an object can be found in nature. For example, a polypeptide or polynucleotide sequence that is present in an organism (including viruses) that can be isolated from a source in nature and which has not been intentionally modified by man in the laboratory is naturally-occurring.

A "polypeptide" refers to a chain comprising at least two consecutively linked amino acid residues, with no upper limit on the length of the chain. One or more amino acid residues in the protein can contain a modification such as, but not limited to, glycosylation, phosphorylation or disulfide bond formation. A "protein" can comprise one or more polypeptides.

The term "nucleic acid molecule," as used herein, is intended to include DNA molecules and RNA molecules. A nucleic acid molecule can be single-stranded or double-stranded, and can be cDNA.

The term "vector," as used herein, is intended to refer to a nucleic acid molecule capable of transporting another nucleic acid to which it has been linked. One type of vector is a "plasmid," which refers to a circular double stranded DNA loop into which additional DNA segments can be ligated. Another type of vector is a viral vector, wherein additional DNA segments can be ligated into the viral genome. Certain vectors are capable of autonomous replication in a host cell into which they are introduced (e.g., bacterial vectors having a bacterial origin of replication and episomal mammalian vectors). Other vectors (e.g., non-episomal mammalian vectors) can be integrated into the genome of a host cell upon introduction into the host cell, and thereby are replicated along with the host genome. Moreover, certain vectors are capable of directing the expression of genes to which they are operatively linked. Such vectors are referred to herein as "recombinant expression vectors" (or simply, "expression vectors"). In general, expression vectors of utility in recombinant DNA techniques are often in the form of plasmids. In the present specification, "plasmid" and "vector" can be used interchangeably as the plasmid is the most commonly used form of vector. However, also included are other forms of expression vectors, such as viral vectors (e.g., replication defective retroviruses, adenoviruses and adeno-associated viruses), which serve equivalent functions.

The term "recombinant host cell" (or simply "host cell"), as used herein, is intended to refer to a cell that comprises a nucleic acid that is not naturally present in the cell, and can be a cell into which a recombinant expression vector has been introduced. It should be understood that such terms are intended to refer not only to the particular subject cell but to the progeny of such a cell. Because certain modifications can occur in succeeding generations due to either mutation or environmental influences, such progeny cannot, in fact, be identical to the parent cell, but are still included within the scope of the term "host cell" as used herein.

As used herein, the term "linked" refers to the association of two or more molecules. The linkage can be covalent or non-covalent. The linkage also can be genetic (i.e., recombinantly fused). Such linkages can be achieved using a wide variety of art recognized techniques, such as chemical conjugation and recombinant protein production.

The term "therapeutically effective amount" as used herein refers to an amount of a drug, alone or in combination with another therapeutic agent, effective to "treat" a disease or disorder in a subject or reduce the risk, potential, possibility or occurrence of a disease or disorder (e.g., diabetic retinopathy or age-related macular degeneration). A "therapeutically effective amount" includes an amount of a drug or a therapeutic agent (e.g., anti-FAM19A5 antibodies disclosed herein) that provides some improvement or benefit to a subject having or at risk of having a disease or disorder (e.g., diabetic retinopathy or age-related macular degeneration). Thus, a "therapeutically effective" amount is an amount that reduces the risk, potential, possibility, or occurrence of a disease or disorder or provides some alleviation, mitigation, and/or reduces at least one indicator, and/or decrease in at least one clinical symptom of a disease or disorder (e.g., diabetic retinopathy or age-related macular degeneration).

II. Methods of Treating Retinopathy and/or Macular Degeneration

Disclosed herein are methods of treating an ocular condition in a subject in need thereof. More specifically, the methods disclosed herein can be used to treat a retinopathy, particularly a diabetic retinopathy. The methods disclosed herein can also be used to treat a macular degeneration, particularly an age-related macular degeneration. As described infra, eye disorders, such as diabetic retinopathy and age-related macular degeneration, is associated with decreased retinal potential. Accordingly, also provided herein are methods of improving a retinal potential in a subject in need thereof (e.g., having a diabetic retinopathy or age-related macular degeneration).

In some aspects, methods disclosed herein comprise administering to the subject an antagonist against FAM19A5 protein ("FAM19A5 antagonist"). In some aspects, the FAM19A5 antagonist is an antisense oligonucleotide, siRNA, shRNA, miRNA, dsRNA targeting FAM19A5, aptamer, PNA, or a vector including the same. In other aspects, the FAM19A5 antagonist is an antibody, or an antigen-binding portion thereof, that specifically binds to the FAM19A5 protein ("an anti-FAM19A5 antibody"), a polynucleotide encoding the anti-FAM19A5 antibody, or a vector comprising the polynucleotide thereof. In some aspects, the anti-FAM19A5 antibody binds to FAM19A5 protein and reduces FAM19A5 activity.

Subjects with retinopathy (e.g., diabetic retinopathy) and/or macular degeneration (e.g., age-related macular degeneration) can exhibit one or more of the following properties within the retina: (i) decreased retinal potential, (ii) pericyte loss, (iii) increased acellular capillary formation, (iv) increased vascular congestion (e.g., within the nerve fiber layer of the retina), (v) increased apoptotic cells (e.g., within the nerve fiber layer and/or the inner nuclear layer of the retina), (vi) increased retinal and/or choroidal neovascularization, and (vii) increased astrocyte formation (e.g., as evidenced by increased PDGF staining within the nerve fiber layer and/or the ganglion cell layer of the retina). See Examples 6-10.

Accordingly, not being bound by any single theory, a FAM19A5 antagonist disclosed herein (e.g., anti-FAM19A5 antibody) can treat a retinopathy and/or macular degeneration by reducing, alleviating, and/or reversing one or more of the properties described above. In some aspect, a FAM19A5 antagonist is capable of neutralizing a FAM19A5 protein, e.g., a FAM19A5 neutralizing agent. In other aspect, a FAM19A5 antagonist is an anti-FAM19A5 antibody. In some aspects, the anti-FAM19A5 antibody is a neutralizing antibody.

In some aspects, a FAM19A5 antagonist can improve a retinal potential in a subject (e.g., having diabetic retinopathy or age-related macular degeneration). In certain aspects, an improved retinal potential comprises an increase in the values for A-wave, B-wave, and/or oscillatory potential, compared to a reference (e.g., corresponding value in a DR or AMD subject not treated with a FAM19A5 antagonist disclosed herein). In some aspects, the values for A-wave, B-wave, and/or oscillatory potential is increased by at least about 5%, 10%, 20%, 30%, 40%, 50%, 60%, 70%, 80%, 90%, or 100% or more, compared to a reference.

In some aspects, a FAM19A5 antagonist disclosed herein (e.g., anti-FAM19A5 antibody) can reduce or prevent the loss of pericytes within the retina of a subject (e.g., having diabetic retinopathy or age-related macular degeneration). In certain aspects, the loss of pericytes within the retina is reduced by at least about 5%, 10%, 20%, 30%, 40%, 50%, 60%, 70%, 80%, 90%, or 100%, compared to a reference (e.g., corresponding value in a DR or AMD subject not treated with a FAM19A5 antagonist disclosed herein).

In some aspects, a FAM19A5 antagonist of the present disclosure can reduce and/or inhibit acellular capillary formation within the retina of a subject (e.g., having diabetic retinopathy or age-related macular degeneration). In certain aspects, the formation of acellular capillaries is reduced and/or inhibited by at least about 5%, 10%, 20%, 30%, 40%, 50%, 60%, 70%, 80%, 90%, or 100%, compared to a reference (e.g., corresponding value in a DR or AMD subject not treated with a FAM19A5 antagonist disclosed herein).

In some aspects, a FAM19A5 antagonist (e.g., anti-FAM19A5 antibody) can reduce and/or inhibit vascular congestion within the retina of a subject (e.g., having diabetic retinopathy or age-related macular degeneration). In certain aspects, vascular congestion within the retina is reduced and/or inhibited by at least about 5%, 10%, 20%, 30%, 40%, 50%, 60%, 70%, 80%, 90%, or 100%, compared to a reference (e.g., corresponding value in a DR or AMD subject not treated with a FAM19A5 antagonist disclosed herein).

In some aspects, a FAM19A5 antagonist disclosed herein can reduce and/or inhibit apoptosis of retinal cells within a subject (e.g., having diabetic retinopathy or age-related macular degeneration). In certain aspects, the frequency of retinal cells undergoing apoptosis is decreased by at least about 5%, 10%, 20%, 30%, 40%, 50%, 60%, 70%, 80%, 90%, or 100%, compared to a reference (e.g., corresponding value in a DR or AMD subject not treated with a FAM19A5 antagonist disclosed herein).

In some aspects, a FAM19A5 antagonist can reduce and/or inhibit neovascularization (e.g., retinal and/or choroidal) within the retina of a subject (e.g., having diabetic retinopathy or age-related macular degeneration). In certain aspects, neovascularization (e.g., retinal and/or choroidal) within the retina is reduced and/or inhibited by at least about 5%, 10%, 20%, 30%, 40%, 50%, 60%, 70%, 80%, 90%, or 100%, compared to a reference (e.g., corresponding value in a DR or AMD subject not treated with a FAM19A5 antagonist disclosed herein).

In some aspects, a FAM19A5 antagonist reduces and/or inhibits the expression of PDGF within the retina of a subject (e.g., having diabetic retinopathy or age-related macular degeneration). In certain aspects, the expression of PDGF within the retina is reduced and/or inhibited by at least about 5%, 10%, 20%, 30%, 40%, 50%, 60%, 70%, 80%, 90%, or 100%, compared to a reference (e.g., corresponding value in a DR or AMD subject not treated with a FAM19A5 antagonist disclosed herein). In some aspects, the reduced and/or inhibited expression of PDGF is associated with decreased astrocyte formation within the retina of the subject.

In some aspects, the term "reference," as used herein, refers to a corresponding subject (e.g., having diabetic retinopathy or age-related macular degeneration) who did not receive a composition disclosed herein (e.g., FAM19A5 antagonist, e.g., anti-FAM19A5 antibody). The term "reference" can also refer to a same subject (e.g., having diabetic retinopathy or age-related macular degeneration) but prior to the administration of a composition disclosed herein. In certain aspects, the term "reference" refers to an average of a population of subjects (e.g., having diabetic retinopathy or age-related macular degeneration).

In some aspects, retinopathy that can be treated with the current disclosure comprises diabetic retinopathy. In certain aspects, diabetic retinopathy is non-proliferative diabetic retinopathy (NPDR). In other aspects, diabetic retinopathy is proliferative diabetic retinopathy (PDR). In some aspects, diabetic retinopathy is diabetic maculopathy. In further aspects, diabetic retinopathy is diabetic macular edema. In some aspects, diabetic retinopathy is any retinopathy associated with an ischemic damage within the retina.

In some aspects, macular degeneration that can be treated with the present disclosure comprises age-related macular degeneration (AMD). In some aspects, age-related macular degeneration is early AMD. In other aspects, age-related macular degeneration is intermediate AMD. In further aspects, age-related macular degeneration is late or advanced AMD (i.e., geographic atrophy). In some aspects, age-related macular degeneration is dry (non-exudative) AMD. In other aspects, age-related macular degeneration is wet (neovascular or exudative) AMD.

In some aspects, subject that can be treated with the present methods is a nonhuman animal, such as a rat or a mouse. In other aspects, subject that can be treated with the methods disclosed herein is a human.

In some aspects, a FAM19A5 antagonist (e.g., anti-FAM19A5 antibody), a bispecific molecule, or an immunoconjugate, or a composition thereof disclosed herein, is delivered to a subject via intraocular administration, or any other administration that can deliver the composition disclosed herein (e.g., FAM19A5 antagonist) to a sub-Tenon, subconjunctival, suprachoroidal, intravitreal, and like locations within the eye. In some aspects, intraocular administration comprises intravitreal administration.

For administration of a FAM19A5 antagonist, or a composition thereof, disclosed herein (e.g., anti-FAM19A5 antibody), dosage ranges from about 0.0001 to 100 mg/kg.

In some aspects, FAM19A5 antagonist, or a composition thereof, can be administered in combination with one or more additional agent (e.g., therapeutic agent) for treating a retinopathy (e.g., diabetic retinopathy) and/or macular degeneration (e.g., age-related macular degeneration), e.g., standard therapy, e.g., (i) corticosteroids, (ii) anti-angiogenic inhibitors (e.g., anti-VEGF inhibitors), (iii) laser treatment (e.g., laser photocoagulation), (iv) antioxidants. Other currently available treatment options that can be used in combination with FAM19A5 antagonist, or a composition thereof, include, but are not limited to, surgery (e.g., vitrectomy) and controlling modifiable risk factors (e.g., lowering glucose and cholesterol levels, stopping tobacco use).

III. FAM19A5 Antagonists

In some aspects, a FAM19A5 antagonist useful for the present disclosure is an antisense oligonucleotide, siRNA, shRNA, miRNA, dsRNA, aptamer, PNA (peptide nucleic acid) that specifically targets FAM19A5, or a vector including the same. In other aspects, a FAM19A5 antagonist is an antibody, or an antigen-binding portion thereof, that specifically binds to the FAM19A5 protein ("anti-FAM19A5 antibody"), a polynucleotide encoding the anti-FAM19A5 antibody, or a vector comprising the polynucleotide thereof.

Antibodies that are useful in the methods disclosed herein include monoclonal antibodies, which are characterized by particular functional features or properties. For example, the antibodies specifically bind human FAM19A5, including soluble FAM19A5 and membrane bound FAM19A5. In addition to binding specifically to soluble and/or membrane bound human FAM19A5, the antibodies described herein also (a) binds to soluble human FAM19A5 with a $K_D$ of 10 nM or less; (b) binds to membrane bound human FAM19A5 with a $K_D$ of 10 nM or less; or both (a) and (b).

In some aspects, the anti-FAM19A5 antibody or antigen binding portion thereof specifically binds to soluble human FAM19A5 or membrane-bound human with high affinity, for example, with a $K_D$ of $10^{-7}$ M or less, $10^{-8}$ M (10 nM) or less, $10^{-9}$ M (1 nM) or less, $10^{-10}$ M (0.1 nM) or less, $10^{-11}$ M or less, or $10^{-12}$ M or less, e.g., $10^{-12}$ M to $10^{-7}$ M, $10^{-11}$ M to $10^{-7}$ M, $10^{-10}$ M to $10^{-7}$ M, or $10^{-9}$ M to $10^{-7}$ M, e.g., $10^{-12}$ M, $5 \times 10^{-12}$ M, $10^{-11}$ M, $5 \times 10^{-11}$ M, $10^{-10}$ M, $5 \times 10^{-10}$ M, $10^{-9}$ M, $5 \times 10^{-9}$ M, $10^{-8}$ M, $5 \times 10^{-8}$ M, $10^{-7}$ M, or $5 \times 10^{-7}$ M. Standard assays to evaluate the binding ability of the antibody toward human FAM19A5 of various species are known in the art, including for example, ELISAs, Western blots, and RIAs. Suitable assays are described in detail in the Examples. The binding kinetics (e.g., binding affinity) of the antibodies also can be assessed by standard assays known in the art, such as by ELISA, BIACORE™ analysis, or KINEXA®.

In some aspects, the anti-FAM19A5 antibody or antigen binding portion thereof binds to soluble human FAM19A5 with a $K_D$, e.g., as determined by ELISA, of $10^{-7}$ M or less, $10^{-8}$ M (10 nM) or less, $10^{-9}$ M (1 nM) or less, $10^{-10}$ M or less, $10^{-12}$ M to $10^{-7}$ M, $10^{-11}$ M to $10^{-7}$ M, $10^{-10}$ M to $10^{-7}$ M, $10^{-9}$ M to $10^{-7}$ M, or $10^{-8}$ M to $10^{-7}$ M. In some aspects, the anti-FAM19A5 antibody or antigen binding portion thereof binds to soluble FAM19A5 with a $K_D$ of 10 nM or less, e.g., between 0.1 and 10 nM, between 0.1 and 5 nM, between 0.1 and 1 nM, between 0.5 and 10 nM, between 0.5 and 5 nM, between 0.5 and 1 nM, between 1 and 10 nM, between 1 and 5 nM, or between 5 and 10 nM. In some aspects, the anti-FAM19A5 antibody or antigen binding portion thereof specifically binds to soluble human FAM19A5 with a $K_D$ of about 1 pM, 2 pM, 3 pM, 4 pM, 5 pM, 6 pM, 7 pM, 8 pM, 9 pM, 10 pM, 20 pM, 30 pM, 40 pM, 50 pM, 60 pM, 70 pM, 80 pM, 90 pM, 100 pM, 200 pM, 300 pM, 400 pM, 500 pM, 600 pM, 700 pM, 800 pM, or 900 pM, or about 1 nM, 2 nM, 3 nM, 4 nM, 5 nM, 6 nM, 7 nM, 8 nM, or 9 nM, or about 10 nM, 20 nM, 30 nM, 40 nM, 50 nM, 60 nM, 70 nM, 80 nM, or 90 nM, as determined by as determined by ELISA.

In some aspects, the anti-FAM19A5 antibody or antigen binding portion thereof binds to membrane-bound human with a $K_D$, e.g., as determined by ELISA, of $10^{-7}$ M or less, $10^{-8}$ M (10 nM) or less, $10^{-9}$ M (1 nM) or less, $10^{-10}$ M or less, $10^{-12}$ M to $10^{-7}$ M, $10^{-11}$ M to $10^{-7}$ M, $10^{-10}$ M to $10^{-7}$ M, $10^{-9}$ M to $10^{-7}$ M, or $10^{-8}$ M to $10^{-7}$ M. In certain aspects, the anti-FAM19A5 antibody or antigen binding portion thereof specifically binds to membrane-bound human FAM19A5 with a $K_D$ of 10 nM or less as determined by ELISA, e.g., between 0.1 and 10 nM, between 0.1 and 5 nM, between 0.1 and 1 nM, between 0.5 and 10 nM, between 0.5 and 5 nM, between 0.5 and 1 nM, between 1 and 10 nM, between 1 and 5 nM, or between 5 and 10 nM. In some aspects, the anti-FAM19A5 antibody or antigen binding portion thereof binds to membrane-bound human FAM19A5 with a $K_D$ of about 1 pM, 2 pM, 3 pM, 4 pM, 5 pM, 6 pM, 7 pM, 8 pM, 9 pM, 10 pM, 20 pM, 30 pM, 40 pM, 50 pM, 60 pM, 70 pM, 80 pM, 90 pM, 100 pM, 200 pM, 300 pM, 400 pM, 500 pM, 600 pM, 700 pM, 800 pM, or 900 pM, or about 1 nM, 2 nM, 3 nM, 4 nM, 5 nM, 6 nM, 7 nM, 8 nM, or 9 nM, or about 10 nM, 20 nM, 30 nM, 40 nM, 50 nM, 60 nM, 70 nM, 80 nM, or 90 nM, as determined by as determined by ELISA.

In certain aspects, the anti-FAM19A5 antibody or antigen binding portion thereof of useful in the methods disclosed herewith thereof cross-competes for binding to (or inhibits binding of) a human FAM19A5 epitope with an anti-FAM19A5 antibody comprising CDRs or variable regions disclosed herein.

In certain aspects, anti-FAM19A5 antibodies or antigen binding portions thereof inhibit binding of a reference antibody comprising heavy chain CDR1, CDR2, and CDR3, and light chain CDR1, CDR2, and CDR3, (i) wherein the heavy chain CDR1, CDR2, and CDR3 of the reference antibody comprise the amino acid sequence of SEQ ID NO: 11, SEQ ID NO: 12, and SEQ ID NO: 13, respectively, and light chain CDR1, CDR2, and CDR3 of the reference antibody comprise the amino acid sequence of SEQ ID NO: 23, SEQ ID NO: 24, and SEQ ID NO: 25; (ii) wherein the heavy chain CDR1 comprises the amino acid sequence of SEQ ID NO: 14, the heavy chain CDR2 comprises the amino acid sequence of SEQ ID NO: 15, and the heavy chain CDR3 comprises the amino acid sequence of SEQ ID NO: 16, the light chain CDR1 comprises the amino acid sequence of SEQ ID NO: 26, the light chain CDR2 comprises the amino acid sequence of SEQ ID NO: 27, and the light chain CDR3 comprises the amino acid sequence of SEQ ID NO: 28; (iii) wherein the heavy chain CDR1 comprises the amino acid sequence of SEQ ID NO: 17, the heavy chain CDR2 comprises the amino acid sequence of SEQ ID NO: 18, and the heavy chain CDR3 comprises the amino acid sequence of SEQ ID NO: 19, the light chain CDR1 comprises the amino acid sequence of SEQ ID NO: 29, the light chain CDR2 comprises the amino acid sequence of SEQ ID NO: 30, and the light chain CDR3 comprises the amino acid sequence of SEQ ID NO: 31; (iv) wherein the heavy chain CDR1 comprises the amino acid sequence of SEQ ID NO: 20, the heavy chain CDR2 comprises the amino acid sequence of SEQ ID NO: 21, the heavy chain CDR3 comprises the amino acid sequence of SEQ ID NO: 22, the light chain CDR1 comprises the amino acid sequence of SEQ ID NO: 32, the light chain CDR2 comprises the amino acid sequence of SEQ ID NO: 33, and the light chain CDR3 comprises the amino acid sequence of SEQ ID NO: 34; (v) wherein the heavy chain CDR1 comprises the amino acid sequence of SEQ ID NO: 89, the heavy chain CDR2 comprises the amino acid sequence of SEQ ID NO: 90, the heavy chain CDR3 comprises the amino acid sequence of SEQ ID NO: 91, the light chain CDR1 comprises the amino acid sequence of SEQ ID NO: 92, the light chain CDR2 comprises the amino acid sequence of SEQ ID NO: 93, and the light chain CDR3 comprises the amino acid sequence of SEQ ID NO: 94; (vi) wherein the heavy chain CDR1 comprises the amino acid sequence of SEQ ID NO: 95, the heavy chain CDR2 comprises the amino acid sequence of SEQ ID NO: 96, the heavy chain CDR3 comprises the amino acid sequence of SEQ ID NO: 97, the light chain CDR1 comprises the amino acid sequence of SEQ ID NO: 98, the light chain CDR2 comprises the amino acid sequence of SEQ ID NO: 99, and the light chain CDR3 comprises the amino acid sequence of SEQ ID NO: 100; (vii) wherein the heavy chain CDR1 comprises the amino acid sequence of SEQ ID NO: 101, the heavy chain CDR2 comprises the amino acid sequence of SEQ ID NO: 102, the heavy chain CDR3 comprises the amino acid sequence of SEQ ID NO: 103, the light chain CDR1 comprises the amino acid sequence of SEQ ID NO: 104, the light chain CDR2 comprises the amino acid sequence of SEQ ID NO: 105, and the light chain CDR3 comprises the amino acid sequence of SEQ ID NO: 106; (viii) wherein the heavy chain CDR1 comprises the amino acid sequence of SEQ ID NO: 107, the heavy chain CDR2 comprises the amino acid sequence of SEQ ID NO: 108, the heavy chain CDR3 comprises the amino acid sequence of SEQ ID NO: 109, the light chain CDR1 comprises the amino acid sequence of SEQ ID NO: 110, the light chain CDR2 comprises the amino acid sequence of SEQ ID NO: 111, and the light chain CDR3 comprises the amino acid sequence of SEQ ID NO: 112; (ix) wherein the heavy chain CDR1 comprises the amino acid sequence of SEQ ID NO: 113, the heavy chain CDR2 comprises the amino acid sequence of SEQ ID NO: 114, the heavy chain CDR3 comprises the amino acid sequence of SEQ ID NO: 115, the light chain CDR1 comprises the amino acid sequence of SEQ ID NO: 116, the light chain CDR2 comprises the amino acid sequence of SEQ ID NO: 117, and the light chain CDR3 comprises the amino acid sequence of SEQ ID NO: 118; (x) wherein the heavy chain CDR1 comprises the amino acid sequence of SEQ ID NO: 119, the heavy chain CDR2 comprises the amino acid sequence of SEQ ID NO: 120, the heavy chain CDR3 comprises the amino acid sequence of SEQ ID NO: 121, the light chain CDR1 comprises the amino acid sequence of SEQ ID NO: 122, the light chain CDR2 comprises the amino acid sequence of SEQ ID NO: 123, and the light chain CDR3 comprises the amino acid sequence of SEQ ID NO: 124; (xi) wherein the heavy chain CDR1 comprises the amino acid sequence of SEQ ID NO: 125, the heavy chain CDR2 comprises the amino acid sequence of SEQ ID NO: 126, the heavy chain CDR3 comprises the amino acid sequence of SEQ ID NO: 127, the light chain CDR1 comprises the amino acid sequence of SEQ ID NO: 128, the light chain CDR2 comprises the amino acid sequence of SEQ ID NO: 129, and the light chain CDR3 comprises the amino acid sequence of SEQ ID NO: 130; (xii) wherein the heavy chain CDR1 comprises the amino acid sequence of SEQ ID NO: 131, the heavy chain CDR2 comprises the amino acid sequence of SEQ ID NO: 132, the heavy chain CDR3 comprises the amino acid sequence of SEQ ID NO: 133, the light chain CDR1 comprises the amino acid sequence of SEQ ID NO: 134, the light chain CDR2 comprises the amino acid sequence of SEQ ID NO: 135, and the light chain CDR3 comprises the amino acid sequence of SEQ ID NO: 136; (xiii) wherein the heavy chain CDR1 comprises the amino acid sequence of SEQ ID NO: 137, the heavy chain CDR2 comprises the amino acid sequence of SEQ ID NO: 138, the heavy chain CDR3 comprises the amino acid sequence of SEQ ID NO: 139, the light chain CDR1 comprises the amino acid sequence of SEQ ID NO: 140, the light chain CDR2 comprises the amino acid sequence of SEQ ID NO: 141, and the light chain CDR3 comprises the amino acid sequence of SEQ ID NO: 142; (xiv) wherein the heavy chain CDR1 comprises the amino acid sequence of SEQ ID NO: 143, the heavy chain CDR2 comprises the amino acid sequence of SEQ ID NO: 144, the heavy chain CDR3 comprises the amino acid sequence of SEQ ID NO: 145, the light chain CDR1 comprises the amino acid sequence of SEQ ID NO: 146, the light chain CDR2 comprises the amino acid sequence of SEQ ID NO: 147, and the light chain CDR3 comprises the amino acid sequence of SEQ ID NO: 148; or (xv) wherein the heavy chain CDR1 comprises the amino acid sequence of SEQ ID NO: 149, the heavy chain CDR2 comprises the amino acid sequence of SEQ ID NO: 150, the heavy chain CDR3 comprises the amino acid sequence of SEQ ID NO: 151, the light chain CDR1 comprises the amino acid sequence of SEQ ID NO: 152, the light chain CDR2 comprises the amino acid sequence of SEQ ID NO: 153, and the light chain CDR3 comprises the amino acid sequence of SEQ ID NO: 154.

In some aspects, the reference antibody comprises (a) heavy and light chain variable region sequences comprising SEQ ID NOs: 35 and 39, respectively; (b) heavy and light chain variable region sequences comprising SEQ ID NOs: 36 and 40, respectively; (c) heavy and light chain variable region sequences comprising SEQ ID NOs: 37 and 41, respectively; (d) heavy and light chain variable region sequences comprising SEQ ID NOs: 38 and 42, respectively; (e) heavy and light chain variable region sequences comprising SEQ ID NOs: 155 and 166, respectively; (f) heavy and light chain variable region sequences comprising SEQ ID NOs: 156 and 167, respectively; (g) heavy and light chain variable region sequences comprising SEQ ID NOs: 157 and 168, respectively; (h) heavy and light chain variable region sequences comprising SEQ ID NOs: 158 and 169, respectively; (i) heavy and light chain variable region sequences comprising SEQ ID NOs: 159 and 170, respectively; (j) heavy and light chain variable region sequences comprising SEQ ID NOs: 160 and 171, respectively; (k) heavy and light chain variable region sequences comprising SEQ ID NOs: 161 and 172, respectively; (l) heavy and light chain variable region sequences comprising SEQ ID NOs: 162 and 173, respectively; (m) heavy and light chain variable region sequences comprising SEQ ID NOs: 163 and 174, respectively; (n) heavy and light chain variable region sequences comprising SEQ ID NOs: 164 and 175, respectively; or (o) heavy and light chain variable region sequences comprising SEQ ID NOs: 165 and 176, respectively.

In certain aspects, the anti-FAM19A5 antibody or antigen binding portion thereof inhibits binding of such a reference antibody to human FAM19A5 by at least 10%, 20%, 30%, 40%, 50%, 60%, 70%, 80%, or 90% or by 100%. Competing antibodies bind to the same epitope, an overlapping epitope or to adjacent epitopes (e.g., as evidenced by steric hindrance). Whether two antibodies compete with each other for binding to a target can be determined using competition experiments known in the art such as RIA and EIA.

In certain aspects, the anti-FAM19A5 antibody or antigen binding portions thereof bind to the same FAM19A5 epitope as a reference antibody disclosed herein comprising heavy chain CDR1, CDR2, and CDR3 and light chain CDR1, CDR2, and CDR3, (i) wherein the heavy chain CDR1 comprises the amino acid sequence of SEQ ID NO: 11, the heavy chain CDR2 comprises the amino acid sequence of SEQ ID NO: 12, the heavy chain CDR3 comprises the amino acid sequence of SEQ ID NO: 13, the light chain CDR1 comprises the amino acid sequence of SEQ ID NO: 23, the light chain CDR2 comprises the amino acid sequence of SEQ ID NO: 24, and the light chain CDR3 comprises the amino acid sequence of SEQ ID NO: 25; (ii) wherein the heavy chain CDR1 comprises the amino acid sequence of SEQ ID NO: 14, the heavy chain CDR2 comprises the amino acid sequence of SEQ ID NO: 15, the heavy chain CDR3 comprises the amino acid sequence of SEQ ID NO: 16, the light chain CDR1 comprises the amino acid sequence of SEQ ID NO: 26, the light chain CDR2 comprises the amino acid sequence of SEQ ID NO: 27, and the light chain CDR3 comprises the amino acid sequence of SEQ ID NO: 28; (iii) wherein the heavy chain CDR1 comprises the amino acid sequence of SEQ ID NO: 17, the heavy chain CDR2 comprises the amino acid sequence of SEQ ID NO: 18, the heavy chain CDR3 comprises the amino acid sequence of SEQ ID NO: 19, the light chain CDR1 comprises the amino acid sequence of SEQ ID NO: 29, the light chain CDR2 comprises the amino acid sequence of SEQ ID NO: 30, and the light chain CDR3 comprises the amino acid sequence of SEQ ID NO: 31; (iv) wherein the heavy chain CDR1 comprises the amino acid sequence of SEQ ID NO: 20, the heavy chain CDR2 comprises the amino acid sequence of SEQ ID NO: 21, the heavy chain CDR3 comprises the amino acid sequence of SEQ ID NO: 22, the light chain CDR1 comprises the amino acid sequence of SEQ ID NO: 32, the light chain CDR2 comprises the amino acid sequence of SEQ ID NO: 33, and the light chain CDR3 comprises the amino acid sequence of SEQ ID NO: 34; (v) wherein the heavy chain CDR1 comprises the amino acid sequence of SEQ ID NO: 89, the heavy chain CDR2 comprises the amino acid sequence of SEQ ID NO: 90, the heavy chain CDR3 comprises the amino acid sequence of SEQ ID NO: 91, the light chain CDR1 comprises the amino acid sequence of SEQ ID NO: 92, the light chain CDR2 comprises the amino acid sequence of SEQ ID NO: 93, and the light chain CDR3 comprises the amino acid sequence of SEQ ID NO: 94; (vi) wherein the heavy chain CDR1 comprises the amino acid sequence of SEQ ID NO: 95, the heavy chain CDR2 comprises the amino acid sequence of SEQ ID NO: 96, the heavy chain CDR3 comprises the amino acid sequence of SEQ ID NO: 97, the light chain CDR1 comprises the amino acid sequence of SEQ ID NO: 98, the light chain CDR2 comprises the amino acid sequence of SEQ ID NO: 99, and the light chain CDR3 comprises the amino acid sequence of SEQ ID NO: 100; (vii) wherein the heavy chain CDR1 comprises the amino acid sequence of SEQ ID NO: 101, the heavy chain CDR2 comprises the amino acid sequence of SEQ ID NO: 102, the heavy chain CDR3 comprises the amino acid sequence of SEQ ID NO: 103, the light chain CDR1 comprises the amino acid sequence of SEQ ID NO: 104, the light chain CDR2 comprises the amino acid sequence of SEQ ID NO: 105, and the light chain CDR3 comprises the amino acid sequence of SEQ ID NO: 106; (viii) wherein the heavy chain CDR1 comprises the amino acid sequence of SEQ ID NO: 107, the heavy chain CDR2 comprises the amino acid sequence of SEQ ID NO: 108, the heavy chain CDR3 comprises the amino acid sequence of SEQ ID NO: 109, the light chain CDR1 comprises the amino acid sequence of SEQ ID NO: 110, the light chain CDR2 comprises the amino acid sequence of SEQ ID NO: 111, and the light chain CDR3 comprises the amino acid sequence of SEQ ID NO: 112; (ix) wherein the heavy chain CDR1 comprises the amino acid sequence of SEQ ID NO: 113, the heavy chain CDR2 comprises the amino acid sequence of SEQ ID NO: 114, the heavy chain CDR3 comprises the amino acid sequence of SEQ ID NO: 115, the light chain CDR1 comprises the amino acid sequence of SEQ ID NO: 116, the light chain CDR2 comprises the amino acid sequence of SEQ ID NO: 117, and the light chain CDR3 comprises the amino acid sequence of SEQ ID NO: 118; (x) wherein the heavy chain CDR1 comprises the amino acid sequence of SEQ ID NO: 119, the heavy chain CDR2 comprises the amino acid sequence of SEQ ID NO: 120, the heavy chain CDR3 comprises the amino acid sequence of SEQ ID NO: 121, the light chain CDR1 comprises the amino acid sequence of SEQ ID NO: 122, the light chain CDR2 comprises the amino acid sequence of SEQ ID NO: 123, and the light chain CDR3 comprises the amino acid sequence of SEQ ID NO: 124; (xi) wherein the heavy chain CDR1 comprises the amino acid sequence of SEQ ID NO: 125, the heavy chain CDR2 comprises the amino acid sequence of SEQ ID NO: 126, the heavy chain CDR3 comprises the amino acid sequence of SEQ ID NO: 127, the light chain CDR1 comprises the amino acid sequence of SEQ ID NO: 128, the light chain CDR2 comprises the amino acid sequence of SEQ ID NO: 129, and the light chain CDR3 comprises the amino acid sequence of SEQ ID NO: 130; (xii) wherein the heavy chain CDR1 comprises the amino acid sequence of SEQ ID NO: 131, the heavy chain CDR2 comprises the amino acid sequence of SEQ ID NO: 132, the heavy chain CDR3 comprises the amino acid sequence of SEQ ID NO: 133, the light chain CDR1 comprises the amino acid sequence of SEQ ID NO: 134, the light chain CDR2 comprises the amino acid sequence of SEQ ID NO: 135, and the light chain CDR3 comprises the amino acid sequence of SEQ ID NO: 136; (xiii) wherein the heavy chain CDR1 comprises the amino acid sequence of SEQ ID NO: 137, the heavy chain CDR2 comprises the amino acid sequence of SEQ ID NO: 138, the heavy chain CDR3 comprises the amino acid sequence of SEQ ID NO: 139, the light chain CDR1 comprises the amino acid sequence of SEQ ID NO: 140, the light chain CDR2 comprises the amino acid sequence of SEQ ID NO: 141, and the light chain CDR3 comprises the amino acid sequence of SEQ ID NO: 142; (xiv) wherein the heavy chain CDR1 comprises the amino acid sequence of SEQ ID NO: 143, the heavy chain CDR2 comprises the amino acid sequence of SEQ ID NO: 144, the heavy chain CDR3 comprises the amino acid sequence of SEQ ID NO: 145, the light chain CDR1 comprises the amino acid sequence of SEQ ID NO: 146, the light chain CDR2 comprises the amino acid sequence of SEQ ID NO: 147, and the light chain CDR3 comprises the amino acid sequence of SEQ ID NO: 148; or (xv) wherein the heavy chain CDR1 comprises the amino acid sequence of SEQ ID NO: 149, the heavy chain CDR2 comprises the amino acid sequence of SEQ ID NO: 150, the heavy chain CDR3 comprises the amino acid sequence of SEQ ID NO: 151, the light chain CDR1 comprises the amino acid sequence of SEQ ID NO: 152, the light chain CDR2 comprises the amino acid sequence of SEQ ID NO: 153, and the light chain CDR3 comprises the amino acid sequence of SEQ ID NO: 154.

In some aspects, the reference antibody comprises (a) heavy and light chain variable region sequences comprising SEQ ID NOs: 35 and 39, respectively; (b) heavy and light chain variable region sequences comprising SEQ ID NOs: 36 and 40, respectively; (c) heavy and light chain variable region sequences comprising SEQ ID NOs: 37 and 41, respectively; (d) heavy and light chain variable region sequences comprising SEQ ID NOs: 38 and 42, respectively; (e) heavy and light chain variable region sequences comprising SEQ ID NOs: 155 and 166, respectively; (f) heavy and light chain variable region sequences comprising SEQ ID NOs: 156 and 167, respectively; (g) heavy and light chain variable region sequences comprising SEQ ID NOs: 157 and 168, respectively; (h) heavy and light chain variable region sequences comprising SEQ ID NOs: 158 and 169, respectively; (i) heavy and light chain variable region sequences comprising SEQ ID NOs: 159 and 170, respectively; (j) heavy and light chain variable region sequences comprising SEQ ID NOs: 160 and 171, respectively; (k) heavy and light chain variable region sequences comprising SEQ ID NOs: 161 and 172, respectively; (l) heavy and light chain variable region sequences comprising SEQ ID NOs: 162 and 173, respectively; (m) heavy and light chain variable region sequences comprising SEQ ID NOs: 163 and 174, respectively; (n) heavy and light chain variable region sequences comprising SEQ ID NOs: 164 and 175, respectively; or (o) heavy and light chain variable region sequences comprising SEQ ID NOs: 165 and 176, respectively.

Techniques for determining whether two antibodies bind to the same epitope include, e.g., epitope mapping methods, such as, x-ray analyses of crystals of antigen:antibody complexes which provides atomic resolution of the epitope and hydrogen/deuterium exchange mass spectrometry (HDX-MS), methods monitoring the binding of the antibody to antigen fragments or mutated variations of the antigen, where loss of binding due to a modification of an amino acid residue within the antigen sequence is often considered an indication of an epitope component, computational combinatorial methods for epitope mapping.

An anti-FAM19A5 antibody or antigen binding portion thereof that would be useful in the methods disclosed herewith can bind to at least one epitope of mature human FAM19A5, as determined, e.g., by binding of the antibodies to fragments of human FAM19A5. In some aspects, anti-FAM19A5 antibodies or antigen binding portions thereof bind to a fragment located within the amino acid sequence of TLDRDSSQPRRTIARQTARC (SEQ ID NO: 6 or amino acid residues 42 to 61 of SEQ ID NO: 2), e.g., an epitope having at least 3, 4, 5, 6, 7, 8, 9, 10, 11, 12, 13, 14, 15, 16, 17, 18, 19, or 20 amino acids of SEQ ID NO: 6. In some aspects, anti-FAM19A5 antibodies or antigen binding portion thereof bind to SEQ ID NO: 6 at one or more amino acids corresponding to amino acid residues 46 to 51 (i.e., DSSQPR), e.g., amino acid residues 46, 50, and 52 (i.e., D - - - P-R), e.g., amino acid residues 46, 47, 48, and 50 (i.e., DSS-P) of SEQ ID NO: 2. In some aspects, anti-FAM19A5 antibodies or antigen binding portions thereof bind to a fragment located within the amino acid sequence of CDMLPCLEGEGCDLLINRSG (SEQ ID NO: 9 or amino acids 90 to 109 of SEQ ID NO: 2), e.g., an epitope having at least 3, 4, 5, 6, 7, 8, 9, 10, 11, 12, 13, 14, 15, 16, 17, 18, 19, or 20 amino acids of SEQ ID NO: 9. In certain aspects, anti-FAM19A5 antibodies or antigen binding portion thereof bind to SEQ ID NO: 9 at one or more amino acids residues 99 to 107 (i.e., EGCDLLINR), e.g., amino acid residues 102, 103, 105, and 107 (i.e., DL-I-R), e.g., amino acid residues 99, 100, 102, 103, 105, and 107 (i.e., EG-DL-I-R), e.g., amino acid residues 99, 100, and 107 (i.e., EG - - - R) of SEQ ID NO: 4.

In some aspects, the at least one epitope has the amino acid sequence that is at least 90%, at least about 95%, at least about 96%, at least about 97%, at least about 98%, at least about 99%, or about 100% identical to SEQ ID NO: 6. In some aspects, the at least one epitope has the amino acid sequence that is at least 90%, at least about 95%, at least about 96%, at least about 97%, at least about 98%, at least about 99%, or about 100% identical to SEQ ID NO: 9.

In some aspects, the anti-FAM19A5 antibody or antigen binding portion thereof binds to a human FAM19A5 epitope only, which is SEQ ID NO: 5, 6, 7, 8, 9, or 10, or a fragment located within the amino acid sequence of SEQ ID NO: 5, 6, 7, 8, 9, or 10, e.g., an epitope having 1, 2, 3, 4, 5, 6, 7, 8, 9, 10, 11, 12, 13, 14, 15, 16, 17, 18, 19, or 20 amino acids of SEQ ID NO: 5, 6, 7, 8, 9, or 10.

In some aspects, the anti-FAM19A5 antibody or antigen binding portion thereof of the present disclosure binds to SEQ ID NO: 6 or a fragment thereof in its native conformation (i.e., un-denatured). In some aspects, the anti-FAM19A5 antibody or antigen binding portion thereof of the present disclosure binds to SEQ ID NO: 9 or a fragment thereof in its native conformation (i.e., un-denatured). In other aspects, the at least one epitope has the amino acid sequence that is at least 90%, at least about 95%, at least about 96%, at least about 97%, at least about 98%, at least about 99%, or about 100% identical to SEQ ID NO: 5. epitope has the amino acid sequence that is at least 90%, at least about 95%, at least about 96%, at least about 97%, at least about 98%, at least about 99%, or about 100% identical to SEQ ID NO: 10. In some aspects, the anti-FAM19A5 antibody or antigen binding portion thereof binds to both glycosylated and unglycosylated human FAM19A5.

In some aspects, the anti-FAM19A5 antibody or antigen binding portion thereof further binds to one or more additional FAM19A5 epitopes. Therefore, certain anti-FAM19A5 antibodies or antigen binding portions thereof bind to an epitope of SEQ ID NO: 6 and an additional epitope or an epitope of SEQ ID NO: 9 and an additional epitope. Other anti-FAM19A5 antibodies or antigen binding portions thereof can bind to an epitope of SEQ ID NO: 5, SEQ ID NO: 9, and an additional epitope. In some aspects, anti-FAM19A5 antibodies or antigen binding portions thereof bind to an epitope of SEQ ID NO: 6, an epitope of SEQ ID NO: 10, and an additional epitope. In some aspects, the one or more additional FAM19A5 epitopes are selected from $_o$LAAGTCE IVTLDR (SEQ ID NO: 5, epitope F1), TLDRDSSQPRRTIARQTARC (SEQ ID NO: 6, epitope F2), TARCACRKGQIAGTTRARPA (SEQ ID NO: 7, epitope F3), ARPACVDARI I KTKQWCDML (SEQ ID NO: 8, epitope F4), CDMLPCLEGEGCDLLINRSG (SEQ ID NO: 9, epitope F5), or NRSGWTCTQPGGRIKTTTVS (SEQ ID NO: 10, epitope F6), or a fragment located within the amino acid sequence of SEQ ID NO: 5, SEQ ID NO: 6, SEQ ID NO: 7, SEQ ID NO: 8, SEQ ID NO: 9, or SEQ ID NO: 10, or any combination thereof. A fragment located within the amino acid sequence of SEQ ID NO: 5, SEQ ID NO: 6, SEQ ID NO: 7, SEQ ID NO: 8, SEQ ID NO: 9, or SEQ ID NO: 10, includes a fragment having 1, 2, 3, 4, 5, 6, 7, 8, 9, 10, 11, 12, 13, 14, 15, 16, 17, 18, 19, or 20 amino acids of any of SEQ ID NO: 5, SEQ ID NO: 6, SEQ ID NO: 7, SEQ ID NO: 8, SEQ ID NO: 9, or SEQ ID NO: 10. In some aspects, the one or more additional FAM19A5 epitopes are selected from SEQ ID NO: 5, 6, 7, 8, 9, or 10, a fragment located within the amino acid sequence of SEQ ID NO: 5, 6, 7, 8, 9, or 10, e.g., a fragment having 1, 2, 3, 4, 5, 6, 7, 8, 9, 10, 11, 12, 13, 14, 15, 16, 17, 18, 19, or 20 amino acids of SEQ ID NO: 5, 6, 7, 8, 9, or 10, or any combination thereof. In some aspects, the anti-FAM19A5 antibody or antigen binding portion thereof of the disclosure binds to any of the one or more additional epitopes in their native conformation (i.e., un-denatured). In some aspects, the anti-FAM19A5 antibody or antigen binding portion thereof binds to both glycosylated and unglycosylated of the one or more additional FAM19A5 epitopes.

In some aspects, anti-FAM19A5 antibodies or antigen binding portions thereof bind to at least one FAM19A5 epitope identified as EP2, EP4, and/or EP8, wherein EP2 comprises, consists essentially of, or consists of the amino acids DSSQP (SEQ ID NO: 66), wherein EP4 comprises, consists essentially of, or consists of the amino acids ARCACRK (SEQ ID NO: 68), and wherein EP8 comprises, consists essentially of, or consists of the amino acids TCTQPGGR (SEQ ID NO: 72). In some aspects, the at least one epitope has the amino acid sequence that is at least 90%, at least about 95%, at least about 96%, at least about 97%, at least about 98%, at least about 99%, or about 100% identical to EP2, EP4, or EP8. In some aspects, anti-FAM19A5 antibodies or antigen binding portion thereof only bind to EP2 In some aspects, anti-FAM19A5 antibodies or antigen binding portion thereof bind to EP4 and EP8.

In some aspects, the anti-FAM19A5 antibody, or antigen binding portion thereof, binds to at least one FAM19A5 epitope identified as EP6, EP7, or EP8, wherein EP6 comprises the amino acids KTKQWCDML (SEQ ID NO: 70), wherein EP7 comprises the amino acids GCDLLINR (SEQ ID NO: 71), and wherein EP8 comprises the amino acids TCTQPGGR (SEQ ID NO: 72). In some aspects, the at least one epitope has the amino acid sequence that is at least 90%, at least about 95%, at least about 96%, at least about 97%, at least about 98%, at least about 99%, or about 100% identical to EP6, EP7, or EP8. In some aspects, the anti-FAM19A5 antibody, or antigen binding portion thereof, only binds to EP6, EP7, or EP8. In some aspects, the anti-FAM19A5 antibody, or antigen binding portion thereof, binds to EP6, EP7, and EP8. In some aspects, the anti-FAM19A5 antibody, or antigen binding portion thereof, binds to EP7 and EP8. In some aspects, the anti-FAM19A5 antibody, or antigen binding portion thereof, binds to EP7.

In some aspects, anti-FAM19A5 antibodies or antigen binding portion thereof bind to one or more FAM19A5 epitopes selected from the group consisting of SEQ ID NO: 65, SEQ ID NO: 66, SEQ ID NO: 67, SEQ ID NO: 68, SEQ ID NO: 69, SEQ ID NO: 70, SEQ ID NO: 71, SEQ ID NO: 72, and any combinations thereof.

In certain aspects, provided herein is an antibody or antigen binding portion thereof that binds to FAM19A5 (e.g., human FAM19A5) with a 20%, 25%, 30%, 35%, 40%, 45%, 50%, 55%, 60%, 65%, 70%, 75%, 80%, 85%, 90%, 95% or higher affinity than to another protein in the FAM19A family as measured by, e.g., a immunoassay (e.g., ELISA), surface plasmon resonance, or kinetic exclusion assay. In a specific aspect, provided herein is an antibody or antigen binding portion thereof that binds to FAM19A5 (e.g., human FAM19A5) with no cross reactivity with another protein in the FAM19A family as measured by, e.g., an immunoassay.

In certain aspects, the anti-FAM19A5 antibodies are not native antibodies or are not naturally-occurring antibodies. For example, the anti-FAM19A5 antibodies have post-translational modifications that are different from those of antibodies that are naturally-occurring, such as by having more, less or a different type of post-translational modification.

IV. Exemplary Anti-FAM19A5 Antibodies

Particular antibodies that can be used in the methods disclosed herein are antibodies, e.g., monoclonal antibodies, having the CDR and/or variable region sequences disclosed herein, as well as antibodies having at least 80% identity (e.g., at least 85%, at least 90%, at least 95%, or at least 99% identity) to their variable region or CDR sequences. The amino acid sequences for the VH and VL CDRs for the different anti-FAM19A5 antibodies are provided in Tables 2 and 3, respectively. The CDRs for the following antibodies were identified using the Kabat numbering scheme (see supra): 1-65, 3-2, 2-13, 1-28, P2-C12, 13B4, 13F7, 15A9, P1-A03, P1-A08, P1-F02, P2-A01, P2-A03, P2-F07, P2-F11, SS01-13, SS01-13-s5, and S5-2.GKNG. The CDRs for the following antibodies were identified using the IMGT numbering system (see supra): 1-7A-IT, Low-PI, 1-30, 1-17, 1-32, 4-11, 6-10, 2-13D, 2-13D-37, 2-13D-37-1.5W-41, and 2-13D-37-3W-16. The VH and VL amino acid sequences of different anti-FAM19A5 antibodies of the present disclosure are provided in Tables 4 and 5, respectively.

TABLE 2

Variable heavy chain CDR amino acid sequences (according to Kabat system)

| Antibody | VH-CDR1 | VH-CDR2 | VH-CDR3 |
|---|---|---|---|
| Anti-FAM19A5 ("2-13") | SHGMF (SEQ ID NO: 11) | EITNDGSGTNYGSAVKG (SEQ ID NO: 12) | STYECPGGFSCWGDTGQIDA (SEQ ID NO: 13) |
| Anti-FAM19A5 ("3-2") | SFNMF (SEQ ID NO: 14) | QISSSGSSTNYAPAVRG (SEQ ID NO: 15) | SSYDCPYGHCSSGVDSAGEIDA (SEQ ID NO: 16) |
| Anti-FAM19A5 ("1-65") | SYQMG (SEQ ID NO: 17) | VINKSGSDTS (SEQ ID NO: 18) | GSASYITAATIDA (SEQ ID NO: 19) |
| Anti-FAM19A5 ("1-28") | GFDFSDYG (SEQ ID NO: 20) | IRSDGSNP (SEQ ID NO: 21) | AKDGNGYCALDAYRSGGYSCGVY PGSIDA (SEQ ID NO: 22) |
| Anti-FAM19A5 ("P2-C12") | TYAVT (SEQ ID NO: 89) | YINWRGGTSYANWAKG (SEQ ID NO: 90) | DASSGAAFGSYGMDP (SEQ ID NO: 91) |
| Anti-FAM19A5 ("13B4") | SsNWWS (SEQ ID NO: 95) | EIYHGGTTNYNPSLKG (SEQ ID NO: 96) | WQLVGGLDV (SEQ ID NO: 97) |

TABLE 2-continued

Variable heavy chain CDR amino acid sequences (according to Kabat system)

| Antibody | VH-CDR1 | VH-CDR2 | VH-CDR3 |
|---|---|---|---|
| Anti-FAM19A5 ("13F7") | GYSWT (SEQ ID NO: 101) | EISHFGSANYNPSLKS (SEQ ID NO: 102) | ALRGTYSRFYYGMDV (SEQ ID NO: 103) |
| Anti-FAM19A5 ("15A9") | SYYWS (SEQ ID NO: 107) | YIYPSGSTNYNPSLKS (SEQ ID NO: 108) | VNPFGYYYAMDV (SEQ ID NO: 109) |
| Anti-FAM19A5 ("P1-A03") | SDYMS (SEQ ID NO: 113) | IIYPSTTTYYASWAKG (SEQ ID NO: 114) | GSNWSSGMNL (SEQ ID NO: 115) |
| Anti-FAM19A5 ("P1-A08") | TYYMS (SEQ ID NO: 119) | IVYPSGTTYYANWAKG (SEQ ID NO: 120) | GDSFGYGL (SEQ ID NO: 121) |
| Anti-FAM19A5 ("P1-F02") | NYYMG (SEQ ID NO: 125) | IIYASGSTYYASWAKG (SEQ ID NO: 126) | IDIGVGDYGWAYDRLDL (SEQ ID NO: 127) |
| Anti-FAM19A5 ("P2-A01") | GYYMS (SEQ ID NO: 131) | IIYPSGSTDYASWAKG (SEQ ID NO: 132) | VAGYVGYGYETFFDI (SEQ ID NO: 133) |
| Anti-FAM19A5 ("P2-A03") | NYDMS (SEQ ID NO: 137) | FMDTDGSAYYATWAKG (SEQ ID NO: 138) | RGSSYYGGIDI (SEQ ID NO: 139) |
| Anti-FAM19A5 ("P2-F07") | SYYMN (SEQ ID NO: 143) | IIYPSGTTYYAGWAKG (SEQ ID NO: 144) | TVSGYFDI (SEQ ID NO: 145) |
| Anti-FAM19A5 ("P2-F11") | SYGVS (SEQ ID NO: 149) | YIANNYNPHYASWAKG (SEQ ID NO: 150) | DNYGMDP (SEQ ID NO: 151) |
| Anti-FAM19A5 ("SS01-13") | SYQMG (SEQ ID NO: 17) | VINKSGSDTS (SEQ ID NO: 18) | GSASYITAATIDA (SEQ ID NO: 19) |
| Anti-FAM19A5 ("SS01-13-S5") | SYQMG (SEQ ID NO: 17) | AINKSGSDTS (SEQ ID NO: 208) | GSASYITAATIDA (SEQ ID NO: 19) |
| Anti-FAM19A5 ("S5-2.GKNG") | SYQMG (SEQ ID NO: 17) | AINKGGSDTS (SEQ ID NO: 209) | GSASYITAATIDA (SEQ ID NO: 19) |
| Anti-FAM19A5 ("1-7A-IT") | GFTFSSFNMF (SEQ ID NO: 210) | QISSSGSSTNYAPAVKG (SEQ ID NO: 211) | SSYDCPYGHCSSGVDSAGEIDA (SEQ ID NO: 16) |
| Anti-FAM19A5 ("Low-PI") | GFDFESFNMF (SEQ ID NO: 212) | QISSSEEDENYAPAVKG (SEQ ID NO: 213) | SSYDCPYGHCSSGVDSAGEIDA (SEQ ID NO: 16) |
| Anti-FAM19A5 ("1-30") | GFDFESFNMF (SEQ ID NO: 212) | QISSSEEDENYAPAVKG (SEQ ID NO: 213) | SSYDCPYGHCSSGVDSAGEIDA (SEQ ID NO: 16) |
| Anti-FAM19A5 ("1-17") | GFDFESFNMF (SEQ ID NO: 212) | QISSSEEDENYAPAVKG (SEQ ID NO: 213) | SSYDCPYGHCSSGVDSAGEIDA (SEQ ID NO: 16) |
| Anti-FAM19A5 ("1-32") | GFDFESFNMF (SEQ ID NO: 212) | QISSSEEDENYAPAVKG (SEQ ID NO: 213) | SSYDCPYGHCSSGVDSAGEIDA (SEQ ID NO: 16) |
| Anti-FAM19A5 ("4-11") | GFDFESFNMF (SEQ ID NO: 212) | QISSSEEDENYAPAVKG (SEQ ID NO: 213) | SSYDCPYGHCSSGVDSAGEIDA (SEQ ID NO: 16) |
| Anti-FAM19A5 ("6-10") | GFDFESFNMF (SEQ ID NO: 212) | QISSSEEDENYAPAVKG (SEQ ID NO: 213) | SSYDCPYGHCSSGVDSAGEIDA (SEQ ID NO: 16) |
| Anti-FAM19A5 ("2-13D") | GFTESSHGMF (SEQ ID NO: 214) | EITNDGSGTNYGSAVKG (SEQ ID NO: 12) | STYECPGGFSCWGDTGQIDA (SEQ ID NO: 13) |
| Anti-FAM19A5 ("2-13D-37") | GEDFSSHGMF (SEQ ID NO: 215) | EITNDGSGTNYGSAVKG (SEQ ID NO: 12) | STYECPGGFSCWGDTGQIDA (SEQ ID NO: 13) |

TABLE 2-continued

Variable heavy chain CDR amino acid sequences (according to Kabat system)

| Antibody | VH-CDR1 | VH-CDR2 | VH-CDR3 |
|---|---|---|---|
| Anti-FAM19A5 ("2-13D-37-1.5W-41") | GEDFSSHGMF (SEQ ID NO: 215) | EITNDGSGTNYGSAVKG (SEQ ID NO: 12) | SSYVCPGGFSCWGDTGQIDA (SEQ ID NO: 216) |
| Anti-FAM19A5 ("2-13D-37-3W-16") | GEDFSSHGMF (SEQ ID NO: 215) | EITNDGSGTNYGSAVKG (SEQ ID NO: 12) | SNYACPGGFSCWGDTGQIDA (SEQ ID NO: 217) |

TABLE 3

Variable light chain CDR amino acid sequences (according to Kabat system)

| Antibody | VL-CDR1 | VL-CDR2 | VL-CDR3 |
|---|---|---|---|
| Anti-FAM19A5 ("2-13") | SGGSYSYG (SEQ ID NO: 23) | WDDERPS (SEQ ID NO: 24) | GTEDISGTAGV (SEQ ID NO: 25) |
| Anti-FAM19A5 ("3-2") | SGGGSYAGSYYYG (SEQ ID NO: 26) | ESNKRPS (SEQ ID NO: 27) | GSWDSSNGGI (SEQ ID NO: 28) |
| Anti-FAM19A5 ("1-65") | SGGGSSGYGYG (SEQ ID NO: 29) | WNDKRPS (SEQ ID NO: 30) | GNDDYSSDSGYVGV (SEQ ID NO: 31) |
| Anti-FAM19A5 ("1-28") | GYGYG (SEQ ID NO: 32) | QND (SEQ ID NO: 33) | GSEDSSTLAGI (SEQ ID NO: 34) |
| Anti-FAM19A5 ("P2-C12") | QASQSISSYLS (SEQ ID NO: 92) | EASKLAS (SEQ ID NO: 93) | QQGYSSTNVWNA (SEQ ID NO: 94) |
| Anti-FAM19A5 ("13B4") | SGDKLGNVYAS (SEQ ID NO: 98) | QDNKRPS (SEQ ID NO: 99) | QAWDSSTAV (SEQ ID NO: 100) |
| Anti-FAM19A5 ("13F7") | RSSQSLLHSNGYNYLD (SEQ ID NO: 104) | LGSNRAS (SEQ ID NO: 105) | MQARQTPLT (SEQ ID NO: 106) |
| Anti-FAM19A5 ("15A9") | RASQSISTSLN (SEQ ID NO: 110) | GASTLQS (SEQ ID NO: 111) | QESASIPRT (SEQ ID NO: 112) |
| Anti-FAM19A5 ("P1-A03") | LASEDIYSGIS (SEQ ID NO: 116) | GASNLES (SEQ ID NO: 117) | LGGYSYSSTGLT (SEQ ID NO: 118) |
| Anti-FAM19A5 ("P1-A08") | TADTLSRSYAS (SEQ ID NO: 122) | RDTSRPS (SEQ ID NO: 123) | ATSDGSGSNYQYV (SEQ ID NO: 124) |
| Anti-FAM19A5 ("P1-F02") | LASEDIYSGIS (SEQ ID NO: 128) | GASNLES (SEQ ID NO: 129) | LGGYSYSSIT (SEQ ID NO: 130) |
| Anti-FAM19A5 ("P2-A01") | LASEDIYSGIS (SEQ ID NO: 134) | GASNLES (SEQ ID NO: 135) | LGGVTYSSTGTHLT (SEQ ID NO: 136) |
| Anti-FAM19A5 ("P2-A03") | QASQSIGGNLA (SEQ ID NO: 140) | RASTLAS (SEQ ID NO: 141) | QSPAYDPAAYVGNA (SEQ ID NO: 142) |
| Anti-FAM19A5 ("P2-F07") | LASEDIYSALA (SEQ ID NO: 146) | GTSNLES (SEQ ID NO: 147) | QGYSSYPLT (SEQ ID NO: 148) |
| Anti-FAM19A5 ("P2-F11") | QASQSVYNNKNLA (SEQ ID NO: 152) | AASTLAS (SEQ ID NO: 153) | QGEFSCSSADCNA (SEQ ID NO: 154) |
| Anti-FAM19A5 ("SS01-13") | SGGASSGYGYG (SEQ ID NO: 218) | KDDERPS (SEQ ID NO: 219) | GNDDYSSDSGYVGV (SEQ ID NO: 31) |
| Anti-FAM19A5 ("SS01-13-S5") | SGGASSGYGYG (SEQ ID NO: 218) | KDSERPS (SEQ ID NO: 220) | GNDDYSSDSGYVGV (SEQ ID NO: 31) |
| Anti-FAM19A5 ("S5-2.GKNG") | SGGASSGYGYG (SEQ ID NO: 218) | KDSERPS (SEQ ID NO: 220) | GNDDYSSDSGYVGV (SEQ ID NO: 31) |
| Anti-FAM19A5 ("1-7A-IT") | SGGGSYAGSYYYG (SEQ ID NO: 26) | ENNKRPS (SEQ ID NO: 221) | GSWDSSNGGI (SEQ ID NO: 28) |

TABLE 3-continued

Variable light chain CDR amino acid sequences (according to Kabat system)

| Antibody | VL-CDR1 | VL-CDR2 | VL-CDR3 |
|---|---|---|---|
| Anti-FAM19A5 ("Low-PI") | SGGGSEEEQYYYG (SEQ ID NO: 222) | EDEERPS (SEQ ID NO: 223) | GSWDSEDEDH (SEQ ID NO: 223) |
| Anti-FAM19A5 ("1-30") | SGGGSEEEQYYYG (SEQ ID NO: 222) | QDEERPS (SEQ ID NO: 225) | GSWDSEDEDH (SEQ ID NO: 224) |
| Anti-FAM19A5 ("1-17") | SGGGSYAGSYYYG (SEQ ID NO: 26) | EDEQRPS (SEQ ID NO: 226) | GSWDSEDEDH (SEQ ID NO: 224) |
| Anti-FAM19A5 ("1-32") | SGGGSYAGSYYYG (SEQ ID NO: 26) | QDEERPS (SEQ ID NO: 225) | GSWDSEDEDH (SEQ ID NO: 224) |
| Anti-FAM19A5 ("4-11") | SGGGSYAGSYYYG (SEQ ID NO: 26) | EDHERPS (SEQ ID NO: 227) | GSWDSSDEDH (SEQ ID NO: 228) |
| Anti-FAM19A5 ("6-10") | SGGGSYAGSYYYG (SEQ ID NO: 26) | QDLLRPS (SEQ ID NO: 229) | GSWDSLSSSH (SEQ ID NO: 230) |
| Anti-FAM19A5 ("2-13D") | SGGVYSYG (SEQ ID NO: 231) | WDDERPS (SEQ ID NO: 24) | GTEDISGTAGV (SEQ ID NO: 25) |
| Anti-FAM19A5 ("2-13D-37") | SGGVYSYG (SEQ ID NO: 231) | WDDERPS (SEQ ID NO: 24) | GTEDISGTAGV (SEQ ID NO: 25) |
| Anti-FAM19A5 ("2-13D-37-1.5W-41) | SGGVYSYG (SEQ ID NO: 231) | WDDERPS (SEQ ID NO: 24) | GTEDISGTAGV (SEQ ID NO: 25) |
| Anti-FAM19A5 ("2-13D-37-3W-16") | SGGVYSYG (SEQ ID NO: 231) | WDDERPS (SEQ ID NO: 24) | GTEDISGTAGV (SEQ ID NO: 25) |

TABLE 4

Variable heavy chain amino acid sequence

| Antibody | VH Amino Acid Sequence (SEQ ID NO) |
|---|---|
| Anti-FAM19A5 ("2-13") | AVTLDESGGGLQTPGGALSLVCKASGFTFSSHGMFWVRQTPGKGLEYVAEITNDGSGTNY GSAVKGRATISRDNGQSTVRLQLNNLRAEDTGTYFCARSTYECPGGFSCWGDTGQIDAWG HGTEVIVSS (SEQ ID NO: 35) |
| Anti-FAM19A5 ("3-2") | AVTLDESGGGLQTPGGALSLVCKASGFTFSSFNMFWVRQAPGKGLEYVAQISSSGSSTNY APAVRGRATISRDNGQSTVRLQLNNPGAEDTGTYYCAKSSYDCPYGHCSSGVDSAGEIDA WGHGTEVIVSS (SEQ ID NO: 36) |
| Anti-FAM19A5 ("1-65") | AVTLDESGGGLQTPGGALSLVCKASGFTFSSYQMGWVRQAPGKGLEWVGVINKSGSDTSY GSAVKGRATISRDNGQSTVRLQLNNLRAEDTGTYFCAKGSASYITAATIDAWGHGTEVIV SS (SEQ ID NO: 37) |
| Anti-FAM19A5 ("1-28") | AVTLDESGGGLQTPGGALSLVCKASGFDFSDYGMGWVRQAPGKGLEWVAAIRSDGSNPSYGSAV KGRATISKDNGRSTVRLQLNNLRAEDTATYYCAKDGNGYCALDAYRSGGYSCGVYPGSIDAWGHG TEVIVSS (SEQ ID NO: 38) |
| Anti-FAM19A5 ("P2-C12") | QSLEESGGRLVTPGTPLTLTCTVSGFSLSTYAVTWVRQAPGKGLEWIGYINWRGGTSYAN WAKGRFTISKTSSTTVDLKMTSPTTEDTATYFCARDASSGAAFGSYGMDPWGPGTLVTVS S (SEQ ID NO: 155) |
| Anti-FAM19A5 ("13B4") | QVQLQESGPGLVKPSGTLSLNCAVSGGSISSSNWWSWVRQPPGKGLEWIGEIYHGGTTNY NPSLKGRVTMSVDKTKNQFSLRLSSVTAVDTAVYYCARWQLVGGLDVWGQGTTVTVSS (SEQ ID NO: 156) |
| Anti-FAM19A5 ("13F7") | QVQLQEWGAGLLKPSETLSLTCAINAESFNGYSWTWIRQTPGKGLEWIGEISHFGSANYN PSLKSRATISADKSKNQFSLKLTSVTAVDTAVYYCARALRGTYSRFYYGMDVWGQGTTVT VSS (SEQ ID NO: 157) |
| Anti-FAM19A5 ("15A9") | QVQLQESGPGLVKPSETLSLTCTVSGGSISSYYWSWIRQPPGKGLEWIGYIYPSGSTNYN PSLKSRVTISVDTSKNQFSLNLSVTAVDTAVYYCARVNPFGYYYAMDVWGQGTTVTVSS (SEQ ID NO: 158) |
| Anti-FAM19A5 ("P1-A03") | QSVEESGGRLVTPGTPLTLTCTVSGFSLSSDYMSWVRQAPGEGLEWIGIIYPSTTTYYAS WAKGRFTISKTSSTTVELKMTSLTTEDTATYFCARGSNWSSGMNLWGPGTLVTVSS (SEQ ID NO: 159) |

TABLE 4-continued

Variable heavy chain amino acid sequence

| Antibody | VH Amino Acid Sequence (SEQ ID NO) |
|---|---|
| Anti-FAM19A5 ("P1-A08") | QSLEESGGRLVTPGTPLTLTCTASGFSLSTYYMSWVRQAPGKGLEWIGIVYPSGTTYYAN WAKGRFTISTASTTVDLMITSPTTEDTATYFCARGDSFGYGLWGPGTLVTVSS (SEQ ID NO: 160) |
| Anti-FAM19A5 ("P1-F02") | QSLEESGGRLVTPGTPLTLTCTASGFSLSNYYMGWVRQAPGEGLEWIGIIYASGSTYYAS WAKGRFTISKTSTTVDLKMTSLTTEDTATYFCARIDIGVGDYGWAYDRLDLWGQGTLVTV SS (SEQ ID NO: 161) |
| Anti-FAM19A5 ("P2-A01") | QEQLVESGGRLVTPGTPLTLSCTASGFFLSGYYMSWVRQAPGKGLEWIGIIYPSGSTDYA SWAKGRFTISKTSTTVDLKITTPTTEDTATYFCARVAGYVGYGYETFFDIWGPGTLVTVS L (SEQ ID NO: 162) |
| Anti-FAM19A5 ("P2-A03") | QSVEESGGRLVTPGTPLTLTCTVSGFSLNNYDMSWVRQAPGKGLEYIGFMDTDGSAYYAT WAKGRFTISRTSTTVDLKMTSPTTEDTATYFCARRGSSYYGGIDIWGPGTPVTVSL (SEQ ID NO: 163) |
| Anti-FAM19A5 ("P2-F07") | QSLEESGGRLVTPGTPLTLTCTASGFSLSSYYMNWVRQAPGKGLEWIGIIYPSGTTYYAG WAKGRFTISKTSTTVDLKITSPTSEDTATYFCARTVSGYFDIWGPGTLVTVSL (SEQ ID NO: 164) |
| Anti-FAM19A5 ("P2-F11") | QEQLVESGGRLVTPGTTLTLTCTVSGFSLSSYGVSWVRQAPGKGLEWIGYIANNYNPHYA SWAKGRFTISKTSSTTVDLKMTSLTTEDTATYFCARDNYGMDPWGPGTLVTVSS (SEQ ID NO: 165) |
| Anti-FAM19A5 ("SS01-13") | AVTLDESGGGLQTPGGALSLSCKASGFTFSSYQMGWVRQAPGKGLEWVGVINKSGSDTSY GSAVKGRATISRDNGQSTLYLQMNNLRAEDTAVYFCAKGSASYITAATIDAWGHGTEVIV SS (SEQ ID NO: 232) |
| Anti-FAM19A5 ("SS01-13-S5") | AVTLDESGGGLQTPGGALRLSCKASGFTFSSYQMGWVRQAPGKGLEWVSAINKSGSDTSY GSAVKGRATISRDNGQSTLYLQMNSLRAEDTAVYFCAKGSASYITAATIDAWGHGTEVIV SS (SEQ ID NO: 233) |
| Anti-FAM19A5 ("S5-2.GKNG") | AVTLDESGGGLQTPGGALRLSCKASGFTFSSYQMGWVRQAPGKGLEWVSAINKGGSDTSY GSAVKGRATISRDNGQSTLYLQMNSLRAEDTAVYFCAKGSASYITAATIDAWGHGTEVIV SS (SEQ ID NO: 234) |
| Anti-FAM19A5 ("1-7A-IT") | AVTLDESGGGLQTPGGALRLSCKASGFTFSSFNMFWVRQAPGKGLEYVSQISSSGSSTNY APAVKGRATISRDNGQSTLYLQMNSLRAEDTGTYYCAKSSYDCPYGHCSSGVDSAGEIDA WGHGTEVIVSS (SEQ ID NO: 235) |
| Anti-FAM19A5 ("Low-PI") | AVTLDESGGGLQTPGGALRLSCKASGFDFESFNMFWVRQAPGKGLEYVSQISSSEEDENY APAVKGRATISRDNGQSTLYLQMNSLRAEDTGTYYCAKSSYDCPYGHCSSGVDSAGEIDA WGHGTEVIVSS (SEQ ID NO: 236) |
| Anti-FAM19A5 ("1-30") | AVTLDESGGGLQTPGGALRLSCKASGFDFESFNMFWVRQAPGKGLEYVSQISSSEEDENY APAVKGRATISRDNGQSTLYLQMNSLRAEDTGTYYCAKSSYDCPYGHCSSGVDSAGEIDA WGHGTEVIVSS (SEQ ID NO: 236) |
| Anti-FAM19A5 ("1-17") | AVTLDESGGGLQTPGGALRLSCKASGFDFESFNMFWVRQAPGKGLEYVSQISSSEEDENY APAVKGRATISRDNGQSTLYLQMNSLRAEDTGTYYCAKSSYDCPYGHCSSGVDSAGEIDA WGHGTEVIVSS (SEQ ID NO: 236) |
| Anti-FAM19A5 ("1-32") | AVTLDESOGGLQTPGGALRLSCKASGEDFESFNMFWVFQAPGKGIEYVSQISSSEEDENY APAVKGRATTSRDNGQSTLYLWNSLRAEDTGTYYCAKSSYDCPYGHCSSGVDSAGETDA WGHGTEVIVSS (SEQ ID NO: 236) |
| Anti-FAM19A5 ("4-11") | AVTLDESGGGLQTPGGALRLSCKASGEDFESNMFWVROAPGKGLEYVSQISSSEEDENY APAVKGRATISRDNWSTLYLWNSLRAEDTGTTYCAKSSYDCPYGHCSSGVDSAGEIDA WGHGTEVIVSS (SEQ ID NO: 236) |
| Anti-FAM19A5 ("6-10") | AVTLDESGGGLQTPGGALRLSCKASGEDFESENMFWVIZQAPGKGLEYVSQSSSEEDENY APAVKGRALLTISRDNGQSTYOMNSLRAAEDTGTYYCAKSSYDCPYGHCSSGVDSAGEID WGHGTEVIVSS (SEQ ID NO: 236) |
| Anti-FAM19A5 ("2-13D") | AVTLDESGGGLQTPGGALRLSCSASGFTESSHGMFWVRQAPGKGLEYVSEITNDGSGTNY GSAVKGRATISRDNGQSTLYLQMNSLRAEDTGTYFCARSTYECPGGFSCWGDTGQIDAWG HGTEVIVSS (SEQ ID NO: 237) |
| Anti-FAM19A5 ("2-13D-37") | AVTLDESGGGLQTPGGALRLSCSASGEDFSSHGMFWVRQAPGKGLEYVSEITNDGSGTNY GSAVKGRATISRDNGQSTLYLQMNSLRAEDTGTYFCARSTYECPGGFSCWGDTGQIDAWG HGTEVIVSS (SEQ ID NO: 238) |
| Anti-FAM19A5 | AVTLDESGGGLQTPGGALRLSCSASGEDFSSHGMFWVRQAPGKGLEYVSEITNDGSGTNY GSAVKGRATISRDNGQSTLYLQMNSLRAEDTGTYFCARSSYVCPGGFSCWGDTGQIDAWG |

TABLE 4-continued

Variable heavy chain amino acid sequence

| Antibody | VH Amino Acid Sequence (SEQ ID NO) |
|---|---|
| ("2-13D-37-1.5W-41") | HGTEVIVSS (SEQ ID NO: 239) |
| Anti-FAM19A5 ("2-13D-37-3W-16") | AVTLDESGGGLQTPGGALRLSCSASGEDFSSHGMFWVRQAPGKGLEYVSEITNDGSGTNY GSAVKGRATISRDNGQSTLYLQMNSLRAEDTGTYFCARSNYACPGGFSCWGDTGQIDAWG HGTEVIVSS (SEQ ID NO: 240) |

TABLE 5

Variable light chain amino acid sequence

| Antibody | VL Amino Acid Sequence (SEQ ID NO) |
|---|---|
| Anti-FAM19A5 ("2-13") | ALTQPSSVSANPGETVKITCSGGSYSYGWFQQKSPGSALVTVIYWDDERPSDIPSRFSGA LSGSTNTLTITGVQADDEAVYFCGTEDISGTAGVFGAGTTLTVL (SEQ ID NO: 39) |
| Anti-FAM19A5 ("3-2") | ALTQPSSVSANPGETVKITCSGGGSYAGSYYYGWYQQKAPGSAPVTLIYESNKRPSDIPS RFSGSTSGSTATLTITGVQADDEAIYYCGSWDSSNGGIFGAGTTLTVL (SEQ ID NO: 40) |
| Anti-FAM19A5 ("1-65") | ALTQPSSVSANPGETVKITCSGGGSSGYGYGWYQQKSPSSAPLTVIYWNDKRPSDIPSRF SGSKSGSTHTLTITGVQAEDEAVYFCGNDDYSSDSGYVGVFGAGTTLTVL (SEQ ID NO: 41) |
| Anti-FAM19A5 ("1-28) | ALTQPSSVSANLEGTVEITCSGSGYGYGWYQQKSPGSAPVTVIYQNDKRPSDIPSRFSGS KSGSTGTLTITGVQVEDEAVYYCGSEDSSTLAGIFGAGTTLTVL (SEQ ID NO: 42) |
| Anti-FAM19A5 ("P2-C12") | ELDMTQTPSSVSAAVGGTVTIKCQASQSISSYLSWYQQKPGQPPKLLIYEASKLASGVPS RFSGSGYGTEFTLTISDLECADAATYYCQQGYSSTNVWNAFGGGTNVEIK (SEQ ID NO: 166) |
| Anti-FAM19A5 ("13B4") | SYELTQPLSVSVSPGQTASITCSGDKLGNVYASWYQQKPGQSPTLVIYQDNKRPSGIPER FSGSNSGKTATLTISGTQALDEADYYCQAWDSSTAVFGGGTKLTVL (SEQ ID NO: 167) |
| Anti-FAM19A5 ("13F7") | DIVMTQTPLSLPVAPGEPASISCRSSQSLLHSNGYNYLDWYVQKPGQPPQLLIYLGSNRA SGVPDRFSGSGSGTDFTLKISRVEAEDVGVYYCMQARQTPLTFGGGTKVEIK (SEQ ID NO: 168) |
| Anti-FAM19A5 ("15A9") | DIQMTQSPSSLSASVGDRITISCRASQSISTSLNWYQQTPGKAPRLLIYGASTLQSGVPS RFSGGGSGTDFSLTITSLQPEDFATYYCQESASIPRTFGQGTKLDIK (SEQ ID NO: 169) |
| Anti-FAM19A5 ("P1-A03") | ELVMTQTPPSLSASVGETVRIRCLASEDIYSGISWYQQKPEKPPTLLISGASNLESGVPP RFSGSGSGTDYTLTIGGVQAEDAATYYCLGGYSYSSTGLTFGAGTNVEIK (SEQ ID NO: 170) |
| Anti-FAM19A5 ("P1-A08") | ELVLTQSPSVQVNLGQTVSLTCTADTLSRSYASWYQQKPGQAPVLLIYRDTSRPSGVPDR FSGSSSGNTATLTISGAQAGDEADYYCATSDGSGSNYQYVFGGGTQLTVT (SEQ ID NO: 171) |
| Anti-FAM19A5 ("P1-F02") | ELDMTQTPPSLSASVGETVRIRCLASEDIYSGISWYQQKPGKPPTLLIYGASNLESGVPP RFSGSGSGTDYTLTIGGVQAEDAATYYCLGGYSYSSITFGAGTNVEIK (SEQ ID NO: 172) |
| Anti-FAM19A5 ("P2-A01") | ELVMTQTPPSLSASVGETVRIRCLASEDIYSGISWYQQKPGKPPTLLIYGASNLESGVPP RFSGSGSGSDYTLTIGGVQAEDAATYYCLGGVTYSSTGTHLTFGAGTNVEIK (SEQ ID NO: 173) |
| Anti-FAM19A5 ("P2-A03") | ELDLTQTPASVSEPVGGTVTIKCQASQSIGGNLAWYQQKPGQPPKLLIYRASTLASGVPS RFKGSGSGTDFTLTISDLECADAATYYCQSPAYDPAAYVGNAFGGGTELEIL (SEQ ID NO: 174) |
| Anti-FAM19A5 ("P2-F07") | ELDLTQPPSLSASVGGTVTINCLASEDIYSALAWYQQKPGKPPTLLISGTSNLESGVPP RFSGSGSGTDYTLTIGGVQAEDAATYFCQGYSSYPLTFGAGTNVEIK (SEQ ID NO: 175) |
| Anti-FAM19A5 ("P2-F11") | ELDLTQTPSSVSAAVGGTVTINCQASQSVYNNKNLAWYQQKPGQPPKLLIYAASTLASGV SSRFKGSGSGTQFTLTISDVQCDDAATYYCQGEFSCSSADCNAFGGGTELEIL (SEQ ID NO: 176) |

TABLE 5-continued

Variable light chain amino acid sequence

| Antibody | VL Amino Acid Sequence (SEQ ID NO) |
|---|---|
| Anti-FAM19A5 ("SS01-13") | ALTQPSSVSANPGETVRITCSGGASSGYGYGWYQQKPSSAPLTVIYKDDERPSDIPSRFS GSSSGSTHTLTITGVQAEDEAVYFCGNDDYSSDSGYVGVFGAGTTLTVL (SEQ ID NO: 241) |
| Anti-FAM19A5 ("SS01-13-S5") | ALTQPSSVSANPGETARITCSGGASSGYGYGWYQQKPSSAPLTVIYKDSERPSDIPSRFS GSSSGSTHTLTISGVQAEDEAVYFCGNDDYSSDSGYVGVFGAGTTLTVL (SEQ ID NO: 242) |
| Anti-FAM19A5 ("S5-2.GKNG") | ALTQPSSVSANPGETARITCSGGASSGYGYGWYQQKPSSAPLTVIYKDSERPSDIPSRFS GSSSGSTHTLTISGVQAEDEAVYFCGNDDYSSDSGYVGVFGAGTTLTVL (SEQ ID NO: 242) |
| Anti-FAM19A5 ("1-7A-IT") | ALTQPSSVSANPGETVKITCSGGGSYAGSYYYGWYQQKPGSAPVTLIYENNKRPSDIPSR FSGSTSGSTATLTITGVQAGDEADYYCGSWDSSNGGIFGAGTTLTVL (SEQ ID NO: 243) |
| Anti-FAM19A5 ("Low-PI") | ALTQPSSVSANPGETVKITCSGGGSEEEQYYYGWYQQKPGSAPVTLIYEDEERPSDIPSR FSGSTSGSTATLTITGVQAGDEADYYCGSWDSEDEDHFGAGTTLTVL (SEQ ID NO: 244) |
| Anti-FAM19A5 ("1-30") | ALTQPSSVSANPGETVKITCSGGGSEEEQYYYGWYQQKPGSAPVTLIYQDEERPSDIPSR FSGSTSGSTATLTITGVQAGDEADYYCGSWDSEDEDHFGAGTTLTVL (SEQ ID NO: 245) |
| Anti-FAM19A5 ("1-17") | ALTQPSSVSANPGETVKITCSGGGSYAGSYYYGWYQQKPGSAPVTLIYEDEQRPSDIPSR FSGSTSGSTATLTITGVQAGDEADYYCGSWDSEDEDHFGAGTTLTVL (SEQ ID NO: 246) |
| Anti-FAM19A5 ("1-32") | ALTQPSSVSANPGETVKITCSGGGSYAGSYYYGWYQQKPGSAPVTLIYQDEERPSDIPSR FSGSTSGSTATLTITGVQAGDEADYYCGSWDSEDEDHFGAGTTLTVL (SEQ ID NO: 247) |
| Anti-FAM19A5 ("4-11") | ALTQPSSVSANPGETVKITCSGGGSYAGSYYYGWYQQKPGSAPVTLIYEDHERPSDIPSR FSGSTSGSTATLTITGVQAGDEADYYCGSWDSSDEDHFGAGTTLTVL (SEQ ID NO: 248) |
| Anti-FAM19A5 ("6-10") | ALTQPSSVSANPGETVKITCSGGGSYAGSYYYGWYQQKPGSAPVTLIYQDLLRPSDIPSR FSGSTSGSTATLTITGVQAGDEADYYCGSWDSLSSSHFGAGTTLTVL (SEQ ID NO: 249) |
| Anti-FAM19A5 ("2-13D") | ALTQPSSVSANPGETAKITCSGGVYSYGWFQQKPGSALVTVIYWDDERPSDIPSRFSGAL SGSTNTLTITGVQAEDEADYYCGTEDISGTAGVFGAGTTLTVL (SEQ ID NO: 250) |
| Anti-FAM19A5 ("2-13D-37") | ALTQPSSVSANPGETAKITCSGGVYSYGWFQQKPGSALVTVIYWDDERPSDIPSRFSGAL SGSTNTLTITGVQAEDEADYYCGTEDISGTAGVFGAGTTLTVL (SEQ ID NO: 250) |
| Anti-FAM19A5 ("2-13D-37-1.5W-41") | ALTQPSSVSANPGETAKITCSGGVYSYGWFQQKPGSALVTVIYWDDERPSDIPSRFSGAL SGSTNTLTITGVQAEDEADYYCGTEDISGTAGVFGAGTTLTVL (SEQ ID NO: 250) |
| Anti-FAM19A5 ("2-13D-37-3W-16") | ALTQPSSVSANPGETAKITCSGGVYSYGWFQQKPGSALVTVIYWDDERPSDIPSRFSGAL SGSTNTLTITGVQAEDEADYYCGTEDISGTAGVFGAGTTLTVL (SEQ ID NO: 250) |

Accordingly, provided herein is an isolated anti-FAM19A5 antibody, or an antigen-binding portion thereof, comprising heavy and light chain variable regions, wherein the heavy chain variable region comprises the amino acid sequence of SEQ ID NOs: 35-38, 155-165, or 232-240 (see Table 4). In other aspects, the isolated anti-FAM19A5 antibody, or an antigen binding portion thereof, comprises the CDRs of the heavy chain variable region selected from the group consisting of SEQ ID NOs: 35-38, 155-165, or 232-240 (see Table 4).

Also provided is an isolated anti-FAM19A5 antibody, or an antigen-binding portion thereof, comprising heavy and light chain variable regions, wherein the light chain variable region comprises the amino acid sequence of SEQ ID NOs: 39-42, 166-176, or 241-250 (see Table 5). In other aspects, the isolated anti-FAM19A5 antibody, or an antigen binding portion thereof, comprises the CDRs of the light chain variable region selected from the group consisting of SEQ ID NOs: 39-42, 166-176, or 241-250 (see Table 5).

In certain aspects, the isolated anti-FAM19A5 antibody, or an antigen binding portion thereof, comprises the CDRs of the heavy chain variable region selected from the group consisting of SEQ ID NOs: 35-38, 155-165, or 232-240 and the CDRs of the light chain variable region selected from the group consisting of SEQ ID NOs: 39-42, 166-176, or 241-250.

Also provided is an isolated anti-FAM19A5 antibody, or an antigen-binding portion thereof, comprising heavy and light chain variable regions, (i) wherein the heavy chain variable region comprises the amino acid sequence of SEQ ID NO: 35 and wherein the light chain variable region comprises the amino acid sequence of SEQ ID NO: 39; (ii) wherein the heavy chain variable region comprises the amino acid sequence of SEQ ID NO: 36 and wherein the light chain variable region comprises the amino acid sequence of SEQ ID NO: 40; (iii) wherein the heavy chain variable region comprises the amino acid sequence of SEQ ID NO: 37 and wherein the light chain variable region comprises the amino acid sequence of SEQ ID NO: 41; (iv) wherein the heavy chain variable region comprises the amino acid sequence of SEQ ID NO: 38 and wherein the light chain variable region comprises the amino acid sequence of SEQ ID NO: 42; (v) wherein the heavy chain variable region comprises the amino acid sequence of SEQ ID NO: 155 and wherein the light chain variable region comprises the amino acid sequence of SEQ ID NO: 166; (vi) wherein the heavy chain variable region comprises the amino acid sequence of SEQ ID NO: 156 and wherein the light chain variable region comprises the amino acid sequence of SEQ ID NO: 167; (vii) wherein the heavy chain variable region comprises the amino acid sequence of SEQ ID NO: 157 and wherein the light chain variable region comprises the amino acid sequence of SEQ ID NO: 168; (viii) wherein the heavy chain variable region comprises the amino acid sequence of SEQ ID NO: 158 and wherein the light chain variable region comprises the amino acid sequence of SEQ ID NO: 169; (ix) wherein the heavy chain variable region comprises the amino acid sequence of SEQ ID NO: 159 and wherein the light chain variable region comprises the amino acid sequence of SEQ ID NO: 170; (x) wherein the heavy chain variable region comprises the amino acid sequence of SEQ ID NO: 160 and wherein the light chain variable region comprises the amino acid sequence of SEQ ID NO: 171; (xi) wherein the heavy chain variable region comprises the amino acid sequence of SEQ ID NO: 161 and wherein the light chain variable region comprises the amino acid sequence of SEQ ID NO: 172; (xii) wherein the heavy chain variable region comprises the amino acid sequence of SEQ ID NO: 162 and wherein the light chain variable region comprises the amino acid sequence of SEQ ID NO: 173; (xiii) wherein the heavy chain variable region comprises the amino acid sequence of SEQ ID NO: 163 and wherein the light chain variable region comprises the amino acid sequence of SEQ ID NO: 174; (xiv) wherein the heavy chain variable region comprises the amino acid sequence of SEQ ID NO: 164 and wherein the light chain variable region comprises the amino acid sequence of SEQ ID NO: 175; and (xv) wherein the heavy chain variable region comprises the amino acid sequence of SEQ ID NO: 165 and wherein the light chain variable region comprises the amino acid sequence of SEQ ID NO: 176. In some aspects, an isolated anti-FAM19A5 antibody, or an antigen binding fragment thereof, comprises a heavy chain variable region (VH) and a light chain variable region (VL), wherein the VH comprises a VH sequence as set forth in Table 4, and the VL comprises a VL sequence as set forth in Table 5.

Provided herein is an isolated anti-FAM19A5 antibody, or an antigen-binding portion thereof, comprising a heavy chain variable region and a light chain variable region, wherein the heavy chain variable region comprises an amino acid sequence which is at least about 80%, at least about 85%, at least about 90%, at least about 95%, at least about 96%, at least about 97%, at least about 98%, at least about 99%, or about 100% identical to the amino acid sequence set forth as SEQ ID NOs: 35-38, 155-165, or 232-240 (see Table 4).

Also provided herein is an isolated anti-FAM19A5 antibody, or an antigen-binding portion thereof, comprising a heavy chain variable region and a light chain variable region, wherein the light chain variable region comprises an amino acid sequence which is at least about 80%, at least about 85%, at least about 90%, at least about 95%, at least about 96%, at least about 97%, at least about 98%, at least about 99%, or about 100% identical to the amino acid sequence set forth as SEQ ID NOs: 39-42, 166-176, or 241-250 (see Table 5).

Also provided is an isolated anti-FAM19A5 antibody, or an antigen-binding portion thereof, comprising heavy and light chain variable regions, wherein the heavy chain variable region comprises an amino acid sequence which is at least about 80%, at least about 85%, at least about 90%, at least about 95%, at least about 96%, at least about 97%, at least about 98%, at least about 99%, or about 100% identical to the amino acid sequence set forth as SEQ ID NOs: 35-38, 155-165, or 232-240 (see Table 4), and wherein the light chain variable region comprises an amino acid sequence which is at least about 80%, at least about 85%, at least about 90%, at least about 95%, at least about 96%, at least about 97%, at least about 98%, at least about 99%, or about 100% identical to the amino acid sequence set forth as SEQ ID NOs: 39-42, 166-176, or 241-250 (see Table 5).

In some aspects, the disclosure provides an isolated anti-FAM19A5 antibody, or an antigen-binding portion thereof, comprising:
  (a) heavy and light chain variable region sequences comprising SEQ ID NOs: 35 and 39, respectively;
  (b) heavy and light chain variable region sequences comprising SEQ ID NOs: 36 and 40, respectively;
  (c) heavy and light chain variable region sequences comprising SEQ ID NOs: 37 and 41, respectively;
  (d) heavy and light chain variable region sequences comprising SEQ ID NOs: 38 and 42, respectively;
  (e) heavy and light chain variable region sequences comprising SEQ ID NOs: 155 and 166, respectively;
  (f) heavy and light chain variable region sequences comprising SEQ ID NOs: 156 and 167, respectively;
  (g) heavy and light chain variable region sequences comprising SEQ ID NOs: 157 and 168, respectively;
  (h) heavy and light chain variable region sequences comprising SEQ ID NOs: 158 and 169, respectively;
  (i) heavy and light chain variable region sequences comprising SEQ ID NOs: 159 and 170, respectively;
  (j) heavy and light chain variable region sequences comprising SEQ ID NOs: 160 and 171, respectively;
  (k) heavy and light chain variable region sequences comprising SEQ ID NOs: 161 and 172, respectively;
  (l) heavy and light chain variable region sequences comprising SEQ ID NOs: 162 and 173, respectively;
  (m) heavy and light chain variable region sequences comprising SEQ ID NOs: 163 and 174, respectively;
  (n) heavy and light chain variable region sequences comprising SEQ ID NOs: 164 and 175, respectively;
  (o) heavy and light chain variable region sequences comprising SEQ ID NOs: 165 and 176, respectively;
  (p) heavy and light chain variable region sequences comprising SEQ ID NOs: 232 and 241, respectively;
  (q) heavy and light chain variable region sequences comprising SEQ ID NOs: 233 and 242, respectively;

(r) heavy and light chain variable region sequences comprising SEQ ID NOs: 234 and 242, respectively;
(s) heavy and light chain variable region sequences comprising SEQ ID NOs: 235 and 243, respectively;
(t) heavy and light chain variable region sequences comprising SEQ ID NOs: 236 and 244, respectively;
(u) heavy and light chain variable region sequences comprising SEQ ID NOs: 236 and 245, respectively;
(v) heavy and light chain variable region sequences comprising SEQ ID NOs: 236 and 246, respectively;
(w) heavy and light chain variable region sequences comprising SEQ ID NOs: 236 and 247, respectively;
(x) heavy and light chain variable region sequences comprising SEQ ID NOs: 236 and 248, respectively;
(y) heavy and light chain variable region sequences comprising SEQ ID NOs: 236 and 249, respectively;
(z) heavy and light chain variable region sequences comprising SEQ ID NOs: 237 and 250, respectively;
(aa) heavy and light chain variable region sequences comprising SEQ ID NOs: 238 and 250, respectively;
(bb) heavy and light chain variable region sequences comprising SEQ ID NOs: 239 and 250, respectively; or
(cc) heavy and light chain variable region sequences comprising SEQ ID NOs: 240 and 250, respectively.

In certain aspects, the anti-FAM19A5 antibody or antigen-binding portion thereof of the present disclosure comprises (i) the heavy chain CDR1, CDR2 and CDR3 of 2-13, or combinations thereof, and/or the light chain CDR1, CDR2, and CDR3 of 2-13, or any combinations thereof; (ii) the heavy chain CDR1, CDR2 and CDR3 of 3-2, or combinations thereof, and/or the light chain CDR1, CDR2, and CDR3 of 3-2, or any combinations thereof; (iii) the heavy chain CDR1, CDR2 and CDR3 of 1-65, or combinations thereof, and/or the light chain CDR1, CDR2, and CDR3 of 1-65, or any combinations thereof; (iv) the heavy chain CDR1, CDR2 and CDR3 of 1-28, or combinations thereof, and/or the light chain CDR1, CDR2, and CDR3 of 1-28, or any combinations thereof; (v) the heavy chain CDR1, CDR2, and CDR3 of P2-C12, or combinations thereof, and/or the light chain CDR1, CDR2, and CDR3 of P2-C12, or any combinations thereof; (vi) the heavy chain CDR1, CDR2, and CDR3 of 13B4, or combinations thereof, and/or the light chain CDR1, CDR2, and CDR3 of 13B4, or any combinations thereof; (vii) the heavy chain CDR1, CDR2, and CDR3 of 13F7, or combinations thereof, and/or the light chain CDR1, CDR2, and CDR3 of 13F7, or any combinations thereof; (viii) the heavy chain CDR1, CDR2, and CDR3 of 15A9, or combinations thereof, and/or the light chain CDR1, CDR2, and CDR3 of 15A9, or any combinations thereof; (ix) the heavy chain CDR1, CDR2, and CDR3 of P1-A03, or combinations thereof, and/or the light chain CDR1, CDR2, and CDR3 of P1-A03, or any combinations thereof; (x) the heavy chain CDR1, CDR2, and CDR3 of P1-A08, or combinations thereof, and/or the light chain CDR1, CDR2, and CDR3 of P1-A08, or any combinations thereof; (xi) the heavy chain CDR1, CDR2, and CDR3 of P1-F02, or combinations thereof, and/or the light chain CDR1, CDR2, and CDR3 of P1-F02, or any combinations thereof; (xii) the heavy chain CDR1, CDR2, and CDR3 of P2-A01, or combinations thereof, and/or the light chain CDR1, CDR2, and CDR3 of P2-A01, or any combinations thereof; (xiii) the heavy chain CDR1, CDR2, and CDR3 of P2-A03, or combinations thereof, and/or the light chain CDR1, CDR2, and CDR3 of P2-A03, or any combinations thereof; (xiv) the heavy chain CDR1, CDR2, and CDR3 of P2-F07, or combinations thereof, and/or the light chain CDR1, CDR2, and CDR3 of P2-F07, or any combinations thereof; (xv) the heavy chain CDR1, CDR2, and CDR3 of P2-F11, or combinations thereof, and/or the light chain CDR1, CDR2, and CDR3 of F2-F11, or any combinations thereof; (xvi) the heavy chain CDR1, CDR2, and CDR3 of SS01-13, or combinations thereof, and/or the light chain CDR1, CDR2, and CDR3 of SS01-13, or any combinations thereof; (xvii) the heavy chain CDR1, CDR2, and CDR3 of SS01-13-s5, or combinations thereof, and/or the light chain CDR1, CDR2, and CDR3 of SS01-13-s5, or any combinations thereof; (xviii) the heavy chain CDR1, CDR2, and CDR3 of S5-2.GKNG, or combinations thereof, and/or the light chain CDR1, CDR2, and CDR3 of S5-2.GKNG, or any combinations thereof; (xix) the heavy chain CDR1, CDR2, and CDR3 of 1-7A-IT, or combinations thereof, and/or the light chain CDR1, CDR2, and CDR3 of 1-7A-IT, or any combinations thereof; (xx) the heavy chain CDR1, CDR2, and CDR3 of Low-PI, or combinations thereof, and/or the light chain CDR1, CDR2, and CDR3 of Low-PI, or any combinations thereof; (xxi) the heavy chain CDR1, CDR2, and CDR3 of 1-30, or combinations thereof, and/or the light chain CDR1, CDR2, and CDR3 of 1-30, or any combinations thereof; (xxii) the heavy chain CDR1, CDR2, and CDR3 of 1-17, or combinations thereof, and/or the light chain CDR1, CDR2, and CDR3 of 1-17, or any combinations thereof; (xxiii) the heavy chain CDR1, CDR2, and CDR3 of 1-32, or combinations thereof, and/or the light chain CDR1, CDR2, and CDR3 of 1-32, or any combinations thereof; (xxiv) the heavy chain CDR1, CDR2, and CDR3 of 4-11, or combinations thereof, and/or the light chain CDR1, CDR2, and CDR3 of 4-11, or any combinations thereof; (xxv) the heavy chain CDR1, CDR2, and CDR3 of 6-10, or combinations thereof, and/or the light chain CDR1, CDR2, and CDR3 of 6-10, or any combinations thereof; (xxvi) the heavy chain CDR1, CDR2, and CDR3 of 2-13D, or combinations thereof, and/or the light chain CDR1, CDR2, and CDR3 of 2-13D, or any combinations thereof; (xxvii) the heavy chain CDR1, CDR2, and CDR3 of 2-13D-37, or combinations thereof, and/or the light chain CDR1, CDR2, and CDR3 of 2-13D-37, or any combinations thereof; (xxviii) the heavy chain CDR1, CDR2, and CDR3 of 2-13D-37-1.5W-41, or combinations thereof, and/or the light chain CDR1, CDR2, and CDR3 of 2-13D-37-1.5W-41, or any combinations thereof; or (xxiv) the heavy chain CDR1, CDR2, and CDR3 of 2-13D-37-3W-16, or combinations thereof, and/or the light chain CDR1, CDR2, and CDR3 of 2-13D-3W-16, or any combinations thereof. The amino acid sequences of the VH CDR1, CDR2, and CDR3 for the different anti-FAM19A5 antibodies disclosed herein are provided in Table 2. The amino acid sequences of the VL CDR1, CDR2, and CDR3 for the different anti-FAM19A5 antibodies disclosed herein are provided in Table 3.

In some aspects, the anti-FAM19A5 antibody or antigen-binding portion thereof of the disclosure, which specifically binds to human FAM19A5, comprises:

(a) a VH CDR1 comprising the amino acid sequence of SEQ ID NO: 11; and/or
(b) a VH CDR2 comprising the amino acid sequence of SEQ ID NO: 12; and/or
(c) a VH CDR3 comprising the amino acid sequence of SEQ ID NO: 13.

In specific aspects, the antibody or antigen-binding portion thereof comprises one, two, or all three of the VH CDRs above.

In some aspects, the anti-FAM19A5 antibody or antigen-binding portion thereof, which specifically binds to human FAM19A5, comprises:

(a) a VL CDR1 comprising the amino acid sequence of SEQ ID NO: 23; and/or
(b) a VL CDR2 comprising the amino acid sequence of SEQ ID NO: 24; and/or
(c) a VL CDR3 comprising the amino acid sequence of SEQ ID NO: 25.

In specific aspects, the antibody or antigen-binding portion thereof comprises one, two, or all three of the VL CDRs above.

In some aspects, the anti-FAM19A5 antibody or antigen-binding portion thereof, which specifically binds to human FAM19A5, comprise:
(a) a VH CDR1 comprising the amino acid sequence of SEQ ID NO: 11;
(b) a VH CDR2 comprising the amino acid sequence of SEQ ID NO: 12;
(c) a VH CDR3 comprising the amino acid sequence of SEQ ID NO: 13;
(d) a VL CDR1 comprising the amino acid sequence of SEQ ID NO: 23;
(e) a VL CDR2 comprising the amino acid sequence of SEQ ID NO: 24; and/or
(f) a VL CDR3 comprising the amino acid sequence of SEQ ID NO: 25.

In some aspects, the anti-FAM19A5 antibody or antigen-binding portion thereof of the disclosure, which specifically binds to human FAM19A5, comprises:
(a) a VH CDR1 comprising the amino acid sequence of SEQ ID NO: 14; and/or
(b) a VH CDR2 comprising the amino acid sequence of SEQ ID NO: 15; and/or
(c) a VH CDR3 comprising the amino acid sequence of SEQ ID NO: 16.

In specific aspects, the antibody or antigen-binding portion thereof comprises one, two, or all three of the VH CDRs above.

In some aspects, the anti-FAM19A5 antibody or antigen-binding portion thereof, which specifically binds to human FAM19A5, comprises:
(a) a VL CDR1 comprising the amino acid sequence of SEQ ID NO: 26; and/or
(b) a VL CDR2 comprising the amino acid sequence of SEQ ID NO: 27; and/or
(c) a VL CDR3 comprising the amino acid sequence of SEQ ID NO: 28.

In specific aspects, the antibody or antigen-binding portion thereof comprises one, two, or all three of the VL CDRs above.

In some aspects, the anti-FAM19A5 antibody or antigen-binding portion thereof, which specifically binds to human FAM19A5, comprise:
(a) a VH CDR1 comprising the amino acid sequence of SEQ ID NO: 14;
(b) a VH CDR2 comprising the amino acid sequence of SEQ ID NO: 15;
(c) a VH CDR3 comprising the amino acid sequence of SEQ ID NO: 16;
(d) a VL CDR1 comprising the amino acid sequence of SEQ ID NO: 26;
(e) a VL CDR2 comprising the amino acid sequence of SEQ ID NO: 27; and/or
(f) a VL CDR3 comprising the amino acid sequence of SEQ ID NO: 28.

In some aspects, the anti-FAM19A5 antibody or antigen-binding portion thereof of the disclosure, which specifically binds to human FAM19A5, comprises:
(a) a VH CDR1 comprising the amino acid sequence of SEQ ID NO: 17; and/or
(b) a VH CDR2 comprising the amino acid sequence of SEQ ID NO: 18; and/or
(c) a VH CDR3 comprising the amino acid sequence of SEQ ID NO: 19.

In specific aspects, the antibody or antigen-binding portion thereof comprises one, two, or all three of the VH CDRs above.

In some aspects, the anti-FAM19A5 antibody or antigen-binding portion thereof, which specifically binds to human FAM19A5, comprises:
(a) a VL CDR1 comprising the amino acid sequence of SEQ ID NO: 29; and/or
(b) a VL CDR2 comprising the amino acid sequence of SEQ ID NO: 30; and/or
(c) a VL CDR3 comprising the amino acid sequence of SEQ ID NO: 31.

In specific aspects, the antibody or antigen-binding portion thereof comprises one, two, or all three of the VL CDRs above.

In some aspects, the anti-FAM19A5 antibody or antigen-binding portion thereof, which specifically binds to human FAM19A5, comprises:
(a) a VH CDR1 comprising the amino acid sequence of SEQ ID NO: 17;
(b) a VH CDR2 comprising the amino acid sequence of SEQ ID NO: 18;
(c) a VH CDR3 comprising the amino acid sequence of SEQ ID NO: 19;
(d) a VL CDR1 comprising the amino acid sequence of SEQ ID NO: 29;
(e) a VL CDR2 comprising the amino acid sequence of SEQ ID NO: 30; and/or
(f) a VL CDR3 comprising the amino acid sequence of SEQ ID NO: 31.

In some aspects, the anti-FAM19A5 antibody or antigen-binding portion thereof of the disclosure, which specifically binds to human FAM19A5, comprises:
(a) a VH CDR1 comprising the amino acid sequence of SEQ ID NO: 20; and/or
(b) a VH CDR2 comprising the amino acid sequence of SEQ ID NO: 21; and/or
(c) a VH CDR3 comprising the amino acid sequence of SEQ ID NO: 22.

In specific aspects, the antibody or antigen-binding portion thereof comprises one, two, or all three of the VH CDRs above.

In some aspects, the anti-FAM19A5 antibody or antigen-binding portion thereof, which specifically binds to human FAM19A5, comprises:
(a) a VL CDR1 comprising the amino acid sequence of SEQ ID NO: 32; and/or
(b) a VL CDR2 comprising the amino acid sequence of SEQ ID NO: 33; and/or
(c) a VL CDR3 comprising the amino acid sequence of SEQ ID NO: 34.

In specific aspects, the antibody or antigen-binding portion thereof comprises one, two, or all three of the VL CDRs above.

In some aspects, the anti-FAM19A5 antibody or antigen-binding portion thereof, which specifically binds to human FAM19A5, comprise:
(a) a VH CDR1 comprising the amino acid sequence of SEQ ID NO: 20;
(b) a VH CDR2 comprising the amino acid sequence of SEQ ID NO: 21;

(c) a VH CDR3 comprising the amino acid sequence of SEQ ID NO: 22;
(d) a VL CDR1 comprising the amino acid sequence of SEQ ID NO: 32;
(e) a VL CDR2 comprising the amino acid sequence of SEQ ID NO: 33; and/or
(f) a VL CDR3 comprising the amino acid sequence of SEQ ID NO: 34.

In specific aspects, the anti-FAM19A5 antibody or antigen-binding portion thereof comprises one, two, three, four, five, or six of the CDRs above.

A VH domain, or one or more CDRs thereof, described herein can be linked to a constant domain for forming a heavy chain, e.g., a full length heavy chain. Similarly, a VL domain, or one or more CDRs thereof, described herein can be linked to a constant domain for forming a light chain, e.g., a full length light chain. A full length heavy chain and full length light chain combine to form a full length antibody.

Accordingly, in specific aspects, provided herein is an antibody comprising an antibody light chain and heavy chain, e.g., a separate light chain and heavy chain. With respect to the light chain, in a specific aspect, the light chain of an antibody described herein is a kappa light chain. In another specific aspect, the light chain of an antibody described herein is a lambda light chain. In yet another specific aspect, the light chain of an antibody described herein is a human kappa light chain or a human lambda light chain. In a particular aspect, an antibody described herein, which specifically binds to a FAM19A5 polypeptide (e.g., human FAM19A5) comprises a light chain which comprises any VL or VL CDR amino acid sequences described herein, and wherein the constant region of the light chain comprises the amino acid sequence of a human kappa light chain constant region. In a particular aspect, an antibody described herein, which specifically binds to a FAM19A5 polypeptide (e.g., human FAM19A5) comprises a light chain which comprises a VL or VL CDR amino acid sequences described herein, and wherein the constant region of the light chain comprises the amino acid sequence of a human lambda light chain constant region. Non-limiting examples of human constant region sequences have been described in the art, e.g., see U.S. Pat. No. 5,693,780 and Kabat E A et al, (1991) supra.

With respect to the heavy chain, in some aspects, the heavy chain of an antibody described herein can be an alpha (α), delta (δ), epsilon (ε), gamma (γ) or mu (μ) heavy chain. In another specific aspect, the heavy chain of an antibody described can comprise a human alpha (α), delta (δ), epsilon (ε), gamma (γ) or mu (μ) heavy chain. In one aspect, an antibody described herein, which specifically binds to FAM19A5 (e.g., human FAM19A5), comprises a heavy chain which comprises a VH or VH CDR amino acid sequence described herein, and wherein the constant region of the heavy chain comprises the amino acid sequence of a human gamma (γ) heavy chain constant region. In another aspect, an antibody described herein, which specifically binds to FAM19A5 (e.g., human FAM19A5), comprises a heavy chain which comprises a VH or VH CDR amino acid sequence disclosed herein, and wherein the constant region of the heavy chain comprises the amino acid of a human heavy chain described herein or known in the art. Non-limiting examples of human constant region sequences have been described in the art, e.g., see U.S. Pat. No. 5,693,780 and Kabat E A et al., (1991) supra.

In some aspects, an antibody described herein, which specifically binds to FAM19A5 (e.g., human FAM19A5) comprises a VL domain and a VH domain comprising the VH or VH CDRs and VL and VL CDRs described herein, and wherein the constant regions comprise the amino acid sequences of the constant regions of an IgG, IgE, IgM, IgD, IgA or IgY immunoglobulin molecule, or a human IgG, IgE, IgM, IgD, IgA or IgY immunoglobulin molecule. In another specific aspect, an antibody described herein, which specifically binds to FAM19A5 (e.g., human FAM19A5) comprises a VL domain and a VH domain comprising any amino acid sequences described herein, and wherein the constant regions comprise the amino acid sequences of the constant regions of an IgG, IgE, IgM, IgD, IgA or IgY immunoglobulin molecule, any subclass (e.g., IgG1, IgG2, IgG3, IgG4, IgA1 and IgA2) of immunoglobulin molecule. In some aspects, the constant regions comprise the amino acid sequences of the constant regions of a human IgG, which are naturally-occurring, including subclasses (e.g., IgG1, IgG2, IgG3 or IgG4), and allotypes (e.g., G1m, G2m, G3m, and nG4m) and variants thereof. See, e.g., Vidarsson G. et al. *Front Immunol.* 5:520 (published online Oct. 20, 2014) and Jefferis R. and Lefranc M P, *mAbs* 1:4, 1-7(2009). In some aspects, the constant regions comprise the amino acid sequences of the constant regions of a human IgG1, IgG2, IgG3, or IgG4, or variants thereof.

In certain aspects, the anti-FAM19A5 antibody or antigen-binding portion thereof disclosed herein does not have Fc effector functions, e.g., complement-dependent cytotoxicity (CDC) and/or antibody-dependent cellular phagocytosis (ADCP). Effector functions are mediated by the Fc region and the residues most proximal to the hinge region in the CH2 domain of the Fc region are responsible for effector functions of antibodies as it contains a largely overlapping binding site for C1q (complement) and IgG-Fc receptors (FcγR) on effector cells of the innate immune system. Also, IgG2 and IgG4 antibodies have lower levels of Fc effector functions than IgG1 and IgG3 antibodies. Effector functions of an antibody can be reduced or avoided by different approaches known in the art, including (1) using antibody fragments lacking the Fc region (e.g., such as a Fab, F(ab')$_2$, single chain Fv (scFv), or a sdAb consisting of a monomeric VH or VL domain); (2) generating aglycosylated antibodies, which can be generated by, for example, deleting or altering the residue the sugar is attached to, removing the sugars enzymatically, producing the antibody in cells cultured in the presence of a glycosylation inhibitor, or by expressing the antibody in cells unable to glycosylate proteins (e.g., bacterial host cells, see, e.g., U.S. Pub. No. 20120100140); (3) employing Fc regions from an IgG subclass that have reduced effector function (e.g., a Fc region from IgG2 or IgG4 antibodies or a chimeric Fc region comprising a CH2 domain from IgG2 or IgG4 antibodies, see, e.g., U.S. Pub. No. 20120100140 and Lau C. et al. *J. Immunol.* 191:4769-4777 (2013)); and (4) generating a Fc region with mutations that result in reduced or no Fc functions. See e.g., U.S. Pub. No. 20120100140 and U.S. and PCT applications cited therein and An et al. *mAbs* 1:6, 572-579 (2009).

Thus, in some aspects, the anti-FAM19A5 antibody or antigen-binding portion thereof disclosed herein is a Fab, a Fab', a F(ab')2, a Fv, a single chain Fv (scFv), or sdAb consisting of a monomeric VH or VL domain. Such antibody fragments are well known in the art and are described supra.

In some aspects, the anti-FAM19A5 antibody or antigen-binding portion thereof disclosed herein comprises a Fc region with reduced or no Fc effector function. In some aspects, the constant regions comprise the amino acid sequences of the Fc region of a human IgG2 or IgG4, in some aspects, the anti-FAM19A5 antibody is of an IgG2/IgG4 isotype. In some aspects, the anti-FAM19A5 antibody comprises a chimeric Fc region which comprises a CH2 domain from an IgG antibody of the IgG4 isotype and a CH3 domain from an IgG antibody of the IgG1 isotype, or a chimeric Fc region which comprises a hinge region from IgG2 and a CH2 region from IgG4, or a Fc region with mutations that result in reduced or no Fc functions. Fc regions with reduced or no Fc effector function include those known in the art. See e.g., Lau C. et al. *J. Immunol.* 191:4769-4777 (2013); An et al., *mAbs* 1:6, 572-579 (2009); and U.S. Pub. No. 20120100140 and the U.S. patents and publications and PCT publications cited therein. Also Fc regions with reduced or no Fc effector function can be readily made by a person of ordinary skill in the art.

V. Nucleic Acid Molecules

Another aspect described herein pertains to one or more nucleic acid molecules that encode any one of the antibodies or antigen-binding portions thereof described herein. The nucleic acids can be present in whole cells, in a cell lysate, or in a partially purified or substantially pure form. A nucleic acid is "isolated" or "rendered substantially pure" when purified away from other cellular components or other contaminants, e.g., other cellular nucleic acids (e.g., other chromosomal DNA, e.g., the chromosomal DNA that is linked to the isolated DNA in nature) or proteins, by standard techniques, including alkaline/SDS treatment, CsCl banding, column chromatography, restriction enzymes, agarose gel electrophoresis and others well known in the art. See, F. Ausubel, et al., ed. (1987) Current Protocols in Molecular Biology, Greene Publishing and Wiley Interscience, New York. A nucleic acid described herein can be, for example, DNA or RNA and can or cannot contain intronic sequences. In certain aspects, the nucleic acid is a cDNA molecule.

Nucleic acids described herein can be obtained using standard molecular biology techniques. For antibodies expressed by hybridomas (e.g., hybridomas prepared from transgenic mice carrying human immunoglobulin genes as described further below), cDNAs encoding the light and heavy chains of the antibody made by the hybridoma can be obtained by standard PCR amplification or cDNA cloning techniques. For antibodies obtained from an immunoglobulin gene library (e.g., using phage display techniques), nucleic acid encoding the antibody can be recovered from the library.

Certain nucleic acids molecules described herein are those encoding the VH and VL sequences of the various anti-FAM19A5 antibodies of the present disclosure. Exemplary DNA sequences encoding the VH sequence of such antibodies are set forth in SEQ ID NOs: 43-46 and 177. Exemplary DNA sequences encoding the VL sequences of such antibodies are set forth in SEQ ID NOs: 47-50 and 178.

TABLE 6

| Variable heavy chain polynucleotide sequence | |
|---|---|
| Antibody | Variable Heavy Chain Polynucleotide Sequence (SEQ ID NO) |
| Anti-FAM19A5 (2-13) | GCCGTGACGTTGGACGAGTCCGGGGGCGGCCTCCAGACGCCCGGAGGAGCGCTCAGCCTC GTCTGCAAGGCCTCCGGGTTCACCTTCAGCAGCCATGGCATGTTCTGGGTGCGACAGACG CCCGGCAAGGGGTTGGAATATGTCGCTGAAATTACCAATGATGGTAGTGGCACAAACTAC GGGTCGGCGGTGAAGGGCCGTGCCACCATCTCGAGGGACAACGGGCAGAGCACAGTGAGG CTGCAGCTGAACAACCTCAGGGCTGAGGACACCGGCACCTACTTCTGCGCCAGATCTACT TATGAATGTCCTGGTGGTTTTAGTTGTTGGGGTGATACTGGTCAAATAGACGCATGGGGC CACGGGACCGAAGTCATCGTCTCCTCCA (SEQ ID NO: 43) |
| Anti-FAM19A5 (3-2) | GCCGTGACGTTGGACGAGTCCGGGGGCGGCCTCCAGACGCCCGGAGGAGCGCTCAGCCTC GTCTGCAAGGCCTCCGGGTTCACCTTCAGCAGCTTCAACATGTTCTGGGTGCGACAGGCG CCCGGCAAGGGGCTGGAATACGTCGCTCAAATTAGCAGCAGTGGTAGTAGCACAAACTAC GCACCCGCGGTGAGGGGCCGTGCCACCATCTCGAGGGACAACGGGCAGAGCACAGTGAGG CTGCAGCTGAACAACCCCGGGGCTGAAGACACCGGCACCTACTACTGCGCCAAAAGTAGT TATGACTGTCCTTACGGTCATTGTAGTAGTGGTGTTGATAGTGCTGGTGAGATCGACGCA TGGGGCCACGGGACCGAAGTCATCGTCTCCTCCA (SEQ ID NO: 44) |
| Anti-FAM19A5 (1-65) | GCCGTGACACTGGACGAATCTGGGGGAGGGCTGCAGACTCCAGGCGGAGCTCTGAGCCTG GTGTGCAAGGCATCCGGGTTCACCTTTAGCTCCTACCAGATGGGATGGGTGCGGCAGGCA CCAGGGAAGGGCCTGGAGTGGGTCGGAGTGATCAACAAATCTGGGAGTGACACAAGCTAC GGCAGCGCCGTGAAGGGAAGGGCCACCATCAGCAGGGACAATGGCCAGAGTACCGTGCGG CTGCAGCTGAACAATCTGCGCGCTGAGGACACTGGCACCTACTTCTGTGCTAAGGGATCA GCAAGCTATATCACAGCCGCTACTATTGATGCATGGGGACACGGGACAGAAGTCATCGTG TCTAGT (SEQ ID NO: 45) |
| Anti-FAM19A5 (1-28) | GCCGTGACGTTGGACGAGTCCGGGGGCGGCCTCCAGACGCCCGGAGGAGCGCTCAGCCTC GTCTGCAAGGCCTCCGGGTTCGACTTCAGCGATTATGGCATGGGTTGGGTGCGACAGGCT CCAGGCAAGGGGCTGGAGTGGGTTGCTGCTATTAGAAGTGATGGTAGTAACCCATCATAC GGGTCGGCGGTGAAGGGCCGTGCCACCATCTCGAAGGACAACGGGCGAAGCACAGTGAGG CTGCAGCTGAACAACCTCAGGGCTGAGGACACCGCCACCTACTACTGCGCCAAGGATGGT AATGGTTACTGTGCTCTCGATGCTTATCGTAGTGGTGGTTATAGTTGTGGTGTTTATCCT GGTAGCATCGACGCATGGGGCCACGGGACCGAAGTCATCGTCTCCTCC (SEQ ID NO: 46) |
| Anti-FAM19A5 (P2-C12) | CAGTCGCTGGAGGAGTCCGGGGGTCGCCTGGTCACGCCTGGGACACCCCTGACACTCACC TGCACCGTCTCTGGATTCTCCCTCAGTACCTATGCAGTGACCTGGGTCCGCCAGGCTCCA GGGAAGGGGCTGGAATGGATCGGATACATTAATTGGCGTGGTGGGGACATCCTACGCGAAC TGGGCGAAAGGCCGATTCACCATCTCCAAAACCTCGTCGACCACGGTGGATCTGAAAATG ACCAGTCCGACAACCGAGGACACGGCCACCTATTTCTGTGCCAGAGATGCTAGTAGTGGT GCTGCTTTTGGGTCTTACGGCATGGACCCCTGGGGCCCAGGGACCCTCGTCACCGTCTCT TCA (SEQ ID NO: 177) |

TABLE 6-continued

Variable heavy chain polynucleotide sequence

| Antibody | Variable Heavy Chain Polynucleotide Sequence (SEQ ID NO) |
|---|---|
| Anti-FAM19A5 (SS01-13) | GCCGTGACGTTGGACGAGTCCGGGGGCGGCCTCCAGACGCCCGGAGGAGCGCTCTCTCTC<br>TCTTGCAAAGCCTCCGGGTTCACCTTCAGCAGCTATCAGATGGGCTGGGTGCGACAGGCG<br>CCCGGCAAGGGGCTGGAATGGGTCGGTGTTATTAACAAGTCTGGTAGTGACACATCATAC<br>GGGTCGGCGGTGAAGGGCCGTGCCACCATCTCGAGGGACAACGGGCAGAGCACACTGTAC<br>CTGCAGATGAACAACCTCAGGGCTGAGGACACCGCTGTTTACTTCTGCGCCAAAGGTTCT<br>GCTAGTTACATAACTGCTGCTACCATCGACGCATGGGGCCACGGGACCGAAGTCATCGTC<br>TCCTCC (SEQ ID NO: 273) |
| Anti-FAM19A5 (SS01-13-S5) | GCCGTGACGTTGGACGAGTCCGGGGGCGGCCTCCAGACGCCCGGAGGAGCGCTCCGCCTC<br>TCTTGCAAGGCCTCCGGGTTCACCTTCAGCAGCTATCAGATGGGCTGGGTGCGACAGGCG<br>CCCGGCAAGGGGCTGGAATGGGTCAGCGCGATTAATAAGAGCGGTAGTGACACATCATAC<br>GGGTCGGCGGTGAAGGGCCGTGCCACCATCTCGAGGGACAACGGGCAGAGCACACTGTAC<br>CTGCAGATGAACAGCCTCAGGGCTGAGGACACCGCTGTTTACTTCTGCGCCAAAGGTTCT<br>GCTAGTTACATAACTGCTGCTACCATCGACGCATGGGGCCACGGGACCGAAGTCATCGTC<br>TCCTCC (SEQ ID NO: 205) |
| Anti-FAM19A5 ("S5-2.GKNG") | GCCGTGACGTTGGACGAGTCCGGGGGCGGCCTCCAGACGCCCGGAGGAGCGCTCCGCCTC<br>TCTTGCAAGGCCTCCGGGTTCACCTTCAGCAGCTATCAGATGGGCTGGGTGCGACAGGCG<br>CCCGGCAAGGGGCTGGAATGGGTCAGCGCGATTAATAAGGGCGGTAGTGACACATCATAC<br>GGGTCGGCGGTGAAGGGCCGTGCCACCATCTCGAGGGACAACGGGCAGAGCACACTGTAC<br>CTGCAGATGAACAGCCTCAGGGCTGAGGACACCGCTGTTTACTTCTGCGCCAAAGGTTCT<br>GCTAGTTACATAACTGCTGCTACCATCGACGCATGGGGCCACGGGACCGAAGTCATCGTC<br>TCCTCC (SEQ ID NO: 255) |
| Anti-FAM19A5 ("1-7A-IT") | GCCGTGACGTTGGATGAATCCGGGGGCGGCCTCCAGACGCCCGGAGGAGCGCTCCGCCTC<br>AGCTGCAAGGCCTCTGGGTTCACCTTCAGCAGCTTCAACATGTTCTGGGTGCGACAGGCG<br>CCCGGCAAGGGGCTGGAATACGTCTCGCAGATTAGCAGCAGTGGTAGTAGCACAAACTAC<br>GCACCCGCGGTGAAAGGCCGTGCCACCATCTCGAGGGACAACGGGCAGAGCACACTGTAT<br>CTGCAGATGAACAGCCTGCGCGCTGAAGACACCGGCACCTACTACTGCGCCAAAAGTAGT<br>TATGACTGTCCTTACGGTCATTGTAGTAGTGGTGTTGATAGTGCTGGTGAGATCGACGCA<br>TGGGGCCACGGGACCGAAGTCATCGTCTCCTCC (SEQ ID NO: 235) |
| Anti-FAM19A5 ("Low-PI") | GCCGTGACGTTGGATGAATCCGGGGGCGGCCTCCAGACGCCCGGAGGAGCGCTCCGCCTC<br>AGCTGCAAGGCCTCTGGGTTCACCTTCAGCAGCTTCAACATGTTCTGGGTGCGACAGGCG<br>CCCGGCAAGGGGCTGGAATACGTCTCGCAGATTAGCAGCAGTGGTAGTAGCACAAACTAC<br>GCACCCGCGGTGAAAGGCCGTGCCACCATCTCGAGGGACAACGGGCAGAGCACACTGTAT<br>CTGCAGATGAACAGCCTGCGCGCTGAAGACACCGGCACCTACTACTGCGCCAAAAGTAGT<br>TATGACTGTCCTTACGGTCATTGTAGTAGTGGTGTTGATAGTGCTGGTGAGATCGACGCA<br>TGGGGCCACGGGACCGAAGTCATCGTCTCCTCC (SEQ ID NO: 236) |
| Anti-FAM19A5 ("1-30") | GCCGTGACGTTGGATGAATCCGGGGGCGGCCTCCAGACGCCCGGAGGAGCGCTCCGCCTC<br>AGCTGCAAGGCCTCTGGCTTTGATTTTGAAAGCTTCAACATGTTCTGGGTGCGACAGGCG<br>CCCGGCAAGGGGCTGGAATACGTCTCGCAGATTAGCAGCAGTGAAGAAGATGAAAACTAC<br>GCACCCGCGGTGAAAGGCCGTGCCACCATCTCGAGGGACAACGGGCAGAGCACACTGTAT<br>CTGCAGATGAACAGCCTGCGCGCTGAAGACACCGGCACCTACTACTGCGCCAAAAGTAGT<br>TATGACTGTCCTTACGGTCATTGTAGTAGTGGTGTTGATAGTGCTGGTGAGATCGACGCA<br>TGGGGCCACGGGACCGAAGTCATCGTCTCCTCC (SEQ ID NO: 237) |
| Anti-FAM19A5 ("1-17") | GCCGTGACGTTGGATGAATCCGGGGGCGGCCTCCAGACGCCCGGAGGAGCGCTCCGCCTC<br>AGCTGCAAGGCCTCTGGCTTTGATTTTGAAAGCTTCAACATGTTCTGGGTGCGACAGGCG<br>CCCGGCAAGGGGCTGGAATACGTCTCGCAGATTAGCAGCAGTGAAGAAGATGAAAACTAC<br>GCACCCGCGGTGAAAGGCCGTGCCACCATCTCGAGGGACAACGGGCAGAGCACACTGTAT<br>CTGCAGATGAACAGCCTGCGCGCTGAAGACACCGGCACCTACTACTGCGCCAAAAGTAGT<br>TATGACTGTCCTTACGGTCATTGTAGTAGTGGTGTTGATAGTGCTGGTGAGATCGACGCA<br>TGGGGCCACGGGACCGAAGTCATCGTCTCCTCC (SEQ ID NO: 238) |
| Anti-FAM19A5 ("1-32") | GCCGTGACGTTGGATGAATCCGGGGGCGGCCTCCAGACGCCCGGAGGAGCGCTCCGCCTC<br>AGCTGCAAGGCCTCTGGCTTTGATTTTGAAAGCTTCAACATGTTCTGGGTGCGACAGGCG<br>CCCGGCAAGGGGCTGGAATACGTCTCGCAGATTAGCAGCAGTGAAGAAGATGAAAACTAC<br>GCACCCGCGGTGAAAGGCCGTGCCACCATCTCGAGGGACAACGGGCAGAGCACACTGTAT<br>CTGCAGATGAACAGCCTGCGCGCTGAAGACACCGGCACCTACTACTGCGCCAAAAGTAGT<br>TATGACTGTCCTTACGGTCATTGTAGTAGTGGTGTTGATAGTGCTGGTGAGATCGACGCA<br>TGGGGCCACGGGACCGAAGTCATCGTCTCCTCC (SEQ ID NO: 239) |
| Anti-FAM19A5 ("4-11") | GCCGTGACGTTGGATGAATCCGGGGGCGGCCTCCAGACGCCCGGAGGAGCGCTCCGCCTC<br>AGCTGCAAGGCCTCTGGCTTTGATTTTGAAAGCTTCAACATGTTCTGGGTGCGACAGGCG<br>CCCGGCAAGGGGCTGGAATACGTCTCGCAGATTAGCAGCAGTGAAGAAGATGAAAACTAC<br>GCACCCGCGGTGAAAGGCCGTGCCACCATCTCGAGGGACAACGGGCAGAGCACACTGTAT<br>CTGCAGATGAACAGCCTGCGCGCTGAAGACACCGGCACCTACTACTGCGCCAAAAGTAGT<br>TATGACTGTCCTTACGGTCATTGTAGTAGTGGTGTTGATAGTGCTGGTGAGATCGACGCA<br>TGGGGCCACGGGACCGAAGTCATCGTCTCCTCC (SEQ ID NO: 240) |
| Anti-FAM19A5 ("6-10") | GCCGTGACGTTGGATGAATCCGGGGGCGGCCTCCAGACGCCCGGAGGAGCGCTCCGCCTC<br>AGCTGCAAGGCCTCTGGCTTTGATTTTGAAAGCTTCAACATGTTCTGGGTGCGACAGGCG<br>CCCGGCAAGGGGCTGGAATACGTCTCGCAGATTAGCAGCAGTGAAGAAGATGAAAACTAC<br>GCACCCGCGGTGAAAGGCCGTGCCACCATCTCGAGGGACAACGGGCAGAGCACACTGTAT |

TABLE 6-continued

Variable heavy chain polynucleotide sequence

| Antibody | Variable Heavy Chain Polynucleotide Sequence (SEQ ID NO) |
|---|---|
| | CTGCAGATGAACAGCCTGCGCGCTGAAGACACCGGCACCTACTACTGCGCCAAAAGTAGT<br>TATGACTGTCCTTACGGTCATTGTAGTAGTGGTGTTGATAGTGCTGGTGAGATCGACGCA<br>TGGGGCCACGGGACCGAAGTCATCGTCTCCTCC (SEQ ID NO: 241) |
| Anti-FAM19A5<br>("2-13D") | GCCGTGACGTTGGACGAGTCCGGGGGCGGCCTCCAGACGCCCGGAGGAGCGCTCCGCCTT<br>AGCTGCAGCGCCTCCGGGTTCACCTTCAGCAGCCATGGCATGTTCTGGGTGCGACAGGCG<br>CCCGGCAAGGGGTTGGAATATGTCTCGGAGATTACCAATGATGGTAGTGGCACAAACTAC<br>GGGTCGGCGGTGAAGGGCCGTGCCACCATCTCGAGGGACAACGGGCAGAGCACACTGTAT<br>CTGCAGATGAACAGCCTCAGGGCTGAGGACACCGGCACCTACTTCTGCGCCAGATCTACT<br>TATGAATGTCCTGGTGGTTTTAGTTGTTGGGGTGATACTGGTCAAATAGACGCATGGGGC<br>CACGGGACCGAAGTCATCGTCTCCTCC (SEQ ID NO: 242) |
| Anti-FAM19A5<br>("2-13D-37") | GCCGTGACGTTGGACGAGTCCGGGGGCGGCCTCCAGACGCCCGGAGGAGCGCTCCGCCTT<br>AGCTGCAGCGCCTCCGGGTTCGATTTCAGCAGCCATGGCATGTTCTGGGTGCGACAGGCG<br>CCCGGCAAGGGGTTGGAATATGTCTCGGAGATTACCAATGATGGTAGTGGCACAAACTAC<br>GGGTCGGCGGTGAAGGGCCGTGCCACCATCTCGAGGGACAACGGGCAGAGCACACTGTAT<br>CTGCAGATGAACAGCCTCAGGGCTGAGGACACCGGCACCTACTTCTGCGCCAGATCTACT<br>TATGAATGTCCTGGTGGTTTTAGTTGTTGGGGTGATACTGGTCAAATAGACGCATGGGGC<br>CACGGGACCGAAGTCATCGTCTCCTCC (SEQ ID NO: 276) |
| Anti-FAM19A5<br>("2-13D-37-<br>1.5W-41") | GCCGTGACGTTGGACGAGTCCGGGGGCGGCCTCCAGACGCCCGGAGGAGCGCTCCGCCTT<br>AGCTGCAGCGCCTCCGGGTTCGATTTCAGCAGCCATGGCATGTTCTGGGTGCGACAGGCG<br>CCCGGCAAGGGGTTGGAATATGTCTCGGAGATTACCAATGATGGTAGTGGCACAAACTAC<br>GGGTCGGCGGTGAAGGGCCGTGCCACCATCTCGAGGGACAACGGGCAGAGCACACTGTAT<br>CTGCAGATGAACAGCCTCAGGGCTGAGGACACCGGCACCTACTTCTGCGCCAGATCTTCT<br>TATGTTTGTCCTGGTGGTTTTAGTTGTTGGGGTGATACTGGTCAAATAGACGCATGGGGC<br>CACGGGACCGAAGTCATCGTCTCCTCC (SEQ ID NO: 243) |
| Anti-FAM19A5<br>("2-13D-37-3W-<br>16") | GCCGTGACGTTGGACGAGTCCGGGGGCGGCCTCCAGACGCCCGGAGGAGCGCTCCGCCTT<br>AGCTGCAGCGCCTCCGGGTTCGATTTCAGCAGCCATGGCATGTTCTGGGTGCGACAGGCG<br>CCCGGCAAGGGGTTGGAATATGTCTCGGAGATTACCAATGATGGTAGTGGCACAAACTAC<br>GGGTCGGCGGTGAAGGGCCGTGCCACCATCTCGAGGGACAACGGGCAGAGCACACTGTAT<br>CTGCAGATGAACAGCCTCAGGGCTGAGGACACCGGCACCTACTTCTGCGCCAGATCTAAT<br>TATGCTTGTCCTGGTGGTTTTAGTTGTTGGGGTGATACTGGTCAAATAGACGCATGGGGC<br>CACGGGACCGAAGTCATCGTCTCCTCC (SEQ ID NO: 258) |

TABLE 7

Variable light chain polynucleotide sequence

| Antibody | Variable Light Chain Polynucleotide Sequence (SEQ ID NO) |
|---|---|
| Anti-FAM19A5<br>(2-13) | GGCCCTGACTCAGCCGTCCTCGGTGTCAGCAAACCCAGGAGAAACCGTCAAGATAACCTG<br>CTCCGGGGGTAGCTATAGCTATGGCTGGTTCCAGCAGAAGTCTCCTGGCAGTGCCCTTGT<br>CACTGTGATCTACTGGGATGATGAGAGACCCTCGGACATCCCTTCACGATTCTCCGGTGC<br>CCTATCCGGCTCCACAAACACATTAACCATCACTGGGGTCCAAGCCGACGACGAGGCTGT<br>CTATTTCTGTGGGACTGAAGACATCAGCGGCACTGCTGGTGTATTTGGGGCCGGGACAAC<br>CCTGACCGTCCTGGG (SEQ ID NO: 47) |
| Anti-FAM19A5<br>(3-2) | GGCCCTGACTCAGCCGTCCTCGGTGTCAGCAAACCCAGGAGAAACCGTCAAGATCACCTG<br>CTCCGGGGGTGGCAGCTATGCTGGAAGTTACTATTATGGCTGGTACCAGCAGAAGGCACC<br>TGGCAGTGCCCCTGTCACTCTGATCTATGAAAGCAACAAGAGACCCTCGGACATCCCTTC<br>ACGATTCTCCGGTTCCACATCTGGCTCCACAGCCACACTAACCATCACTGGGGTCCAAGC<br>CGATGACGAGGCTATCTATTACTGTGGGAGCTGGGACAGTAGCAATGGTGGTATATTTGG<br>GGCCGGGACAACCCTGACCGTCCTAGG (SEQ ID NO: 48) |
| Anti-FAM19A5<br>(1-65) | GCCCTGACTCAGCCCTCTTCCGTGTCAGCCAACCCTGGAGAAACTGTGAAGATCACCTGC<br>AGCGGAGGAGGGAGCTCCGGATACGGATATGGGTGGTATCAGCAGAAATCCCCATCTAGT<br>GCCCCCCTGACTGTGATCTATTGGAACGACAAGAGGCCTAGTGATATTCCATCAAGATTC<br>AGTGGATCAAAAAGCGGGTCCACTCACACCCTGACAATCACTGGCGTGCAGGCAGAGGAC<br>GAAGCCGTCTACTTCTGCGGAAATGACGATTACTCAAGCGATTCTGGCTATGTGGGCGTC<br>TTTGGCGCAGGAACCACACTGACAGTGCTG (SEQ ID NO: 49) |
| Anti-FAM19A5<br>(1-28) | GCCCTGACTCAGCCGTCCTCGGTGTCAGCAAACCTGGAAGGAACCGTCGAGATCACCTGC<br>TCCGGGAGTGGCTATGGTTATGGCTGGTATCAGCAGAAGTCTCCTGGCAGTGCCCCTGTC<br>ACTGTGATCTATCAGAACGACAAGAGACCCTCGGACATCCCTTCACGATTCTCCGGTTCC<br>AAATCCGGCTCCACGGGCACATTAACCATCACTGGGGTCCAAGTCGAGGACGAGGCTGTC<br>TATTACTGTGGGAGTGAAGACAGCAGCACTCTTGCTGGTATATTTGGGGCCGGGACAACC<br>CTGACCGTCCTA (SEQ ID NO: 50) |
| Anti-FAM19A5<br>(P2-C12) | GAGCTCGATATGACCCAGACTCCATCCTCCGTGTCTGCAGCTGTGGGAGGCACAGTCACC<br>ATCAAGTGCCAGGCCAGTCAGAGCATTAGTAGCTACTTATCCTGGTATCAGCAGAAACCA<br>GGGCAGCCTCCCAAGCTCCTGATCTATGAAGCATCCAAACTGGCCTCTGGGGTCCCATCG |

TABLE 7-continued

Variable light chain polynucleotide sequence

| Antibody | Variable Light Chain Polynucleotide Sequence (SEQ ID NO) |
|---|---|
| | CGGTTCAGCGGCAGTGGATATGGGACAGAGTTCACTCTCACCATCAGCGACCTGGAGTGT<br>GCCGATGCTGCCACTTACTACTGTCAACAGGGTTATAGTAGTACTAATGTTTGGAATGCT<br>TTCGGCGGAGGCACCAATGTGGAAATCAAA (SEQ ID NO: 178) |
| Anti-FAM19A5<br>(SS01-13) | GCCCTGACTCAGCCGTCCTCGGTGTCAGCAAACCCTGGGGAAACTGTTCGTATCACCTGC<br>TCCGGGGGTGCTAGCAGTGGCTATGGTTATGGCTGGTATCAGCAGAAGCCTAGCAGTGCC<br>CCTCTCACTGTGATCTACAAAGACGACGAAAGACCCTCGGACATCCCTTCACGATTCTCC<br>GGTTCCTCTTCCGGCTCCACACACACATTAACCATCACTGGGGTCCAAGCCGAGGACGAG<br>GCTGTATATTTCTGTGGGAATGATGACTACAGCAGTGATAGTGGATATGTCGGTGTATTT<br>GGGGCCGGGACAACCCTGACCGTCCTA (SEQ ID NO: 274) |
| Anti-FAM19A5<br>(SS01-13-S5) | GCCCTGACTCAGCCGTCCTCGGTGTCAGCAAACCCTGGGGAAACTGCGCGTATCACCTGC<br>TCCGGTGGTGCTAGCAGTGGCTATGGTTATGGCTGGTATCAGCAGAAGCCTAGCAGTGCC<br>CCTCTCACTGTGATCTACAAAGACTCTGAAAGACCCTCGGACATCCCTTCACGATTCTCC<br>GGTTCCTCTTCCGGCTCCACACACACATTAACCATCAGCGGGGTCCAAGCCGAGGACGAG<br>GCTGTATATTTCTGTGGGAATGATGACTACAGCAGTGATAGTGGATATGTCGGTGTATTT<br>GGGGCCGGGACAACCCTGACCGTCCTA (SEQ ID NO: 206) |
| Anti-FAM19A5<br>("S5-2.GKNG") | GCCCTGACTCAGCCGTCCTCGGTGTCAGCAAACCCTGGGGAAACTGCGCGTATCACCTGC<br>TCCGGTGGTGCTAGCAGTGGCTATGGTTATGGCTGGTATCAGCAGAAGCCTAGCAGTGCC<br>CCTCTCACTGTGATCTACAAAGACTCTGAAAGACCCTCGGACATCCCTTCACGATTCTCC<br>GGTTCCTCTTCCGGCTCCACACACACATTAACCATCAGCGGGGTCCAAGCCGAGGACGAG<br>GCTGTATATTTCTGTGGGAATGATGACTACAGCAGTGATAGTGGATATGTCGGTGTATTT<br>GGGGCCGGGACAACCCTGACCGTCCTA (SEQ ID NO: 256) |
| Anti-FAM19A5<br>("1-7A-IT") | GCCCTGACTCAGCCGTCCTCGGTGTCAGCAAACCCAGGAGAAACCGTCAAGATCACCTGC<br>TCCGGGGGTGGCAGCTATGCTGGAAGTTACTATTATGGCTGGTATCAGCAGAAGCCTGGC<br>AGTGCCCCTGTCACTCTGATCTATGAAAACAACAAGAGACCCTCGGACATCCCTTCACGA<br>TTCTCCGGTTCCACATCTGGCTCCACAGCCACACTAACCATCACTGGGGTCCAAGCCGGC<br>GACGAGGCTGATTATTACTGTGGGAGCTGGGACAGTAGCAATGGTGGTATATTTGGGGCC<br>GGGACAACCCTGACCGTCCTA (SEQ ID NO: 244) |
| Anti-FAM19A5<br>("Low-PI") | GCCCTGACTCAGCCGTCCTCGGTGTCAGCAAACCCAGGAGAAACCGTCAAGATCACCTGC<br>TCCGGGGGTGGCAGCTATGCTGGAAGTTACTATTATGGCTGGTATCAGCAGAAGCCTGGC<br>AGTGCCCCTGTCACTCTGATCTATGAAAACAACAAGAGACCCTCGGACATCCCTTCACGA<br>TTCTCCGGTTCCACATCTGGCTCCACAGCCACACTAACCATCACTGGGGTCCAAGCCGGC<br>GACGAGGCTGATTATTACTGTGGGAGCTGGGACAGTAGCAATGGTGGTATATTTGGGGCC<br>GGGACAACCCTGACCGTCCTA (SEQ ID NO: 245) |
| Anti-FAM19A5<br>("1-30") | GCCCTGACTCAGCCGTCCTCGGTGTCAGCAAACCCAGGAGAAACCGTCAAGATCACCTGC<br>TCCGGGGGTGGCAGCGAAGAAGAACAGTACTATTATGGCTGGTATCAGCAGAAGCCTGGC<br>AGTGCCCCTGTCACTCTGATCTATCAGGATGAAGAAAGACCCTCGGACATCCCTTCACGA<br>TTCTCCGGTTCCACATCTGGCTCCACAGCCACACTAACCATCACTGGGGTCCAAGCCGGC<br>GACGAGGCTGATTATTACTGTGGGAGCTGGGACAGTGAAGATGAAGATCATTTTGGGGCC<br>GGGACAACCCTGACCGTCCTA (SEQ ID NO: 246) |
| Anti-FAM19A5<br>("1-17") | GCCCTGACTCAGCCGTCCTCGGTGTCAGCAAACCCAGGAGAAACCGTCAAGATCACCTGC<br>TCCGGGGGTGGCAGCTATGCTGGAAGTTACTATTATGGCTGGTATCAGCAGAAGCCTGGC<br>AGTGCCCCTGTCACTCTGATCTATGAAGATGAACAGAGACCCTCGGACATCCCTTCACGA<br>TTCTCCGGTTCCACATCTGGCTCCACAGCCACACTAACCATCACTGGGGTCCAAGCCGGC<br>GACGAGGCTGATTATTACTGTGGGAGCTGGGACAGTGAAGATGAAGATCATTTTGGGGCC<br>GGGACAACCCTGACCGTCCTA (SEQ ID NO: 247) |
| Anti-FAM19A5<br>("1-32") | GCCCTGACTCAGCCGTCCTCGGTGTCAGCAAACCCAGGAGAAACCGTCAAGATCACCTGC<br>TCCGGGGGTGGCAGCTATGCTGGAAGTTACTATTATGGCTGGTATCAGCAGAAGCCTGGC<br>AGTGCCCCTGTCACTCTGATCTATCAGGATGAAGAAAGACCCTCGGACATCCCTTCACGA<br>TTCTCCGGTTCCACATCTGGCTCCACAGCCACACTAACCATCACTGGGGTCCAAGCCGGC<br>GACGAGGCTGATTATTACTGTGGGAGCTGGGACAGTGAAGATGAAGATCATTTTGGGGCC<br>GGGACAACCCTGACCGTCCTA (SEQ ID NO: 248) |
| Anti-FAM19A5<br>("4-11") | GCCCTGACTCAGCCGTCCTCGGTGTCAGCAAACCCAGGAGAAACCGTCAAGATCACCTGC<br>TCCGGGGGTGGCAGCTATGCTGGAAGTTACTATTATGGCTGGTATCAGCAGAAGCCTGGC<br>AGTGCCCCTGTCACTCTGATCTATGAAGACCACGAGAGACCCTCGGACATCCCTTCACGA<br>TTCTCCGGTTCCACATCTGGCTCCACAGCCACACTAACCATCACTGGGGTCCAAGCCGGC<br>GACGAGGCTGATTATTACTGTGGGAGCTGGGACAGTAGCGATGAAGATCATTTTGGGGCC<br>GGGACAACCCTGACCGTCCTA (SEQ ID NO: 249) |
| Anti-FAM19A5<br>("6-10") | GCCCTGACTCAGCCGTCCTCGGTGTCAGCAAACCCAGGAGAAACCGTCAAGATCACCTGC<br>TCCGGGGGTGGCAGCTATGCTGGAAGTTACTATTATGGCTGGTATCAGCAGAAGCCTGGC<br>AGTGCCCCTGTCACTCTGATCTATCAGGATCTGCTGAGACCCTCGGACATCCCTTCACGA<br>TTCTCCGGTTCCACATCTGGCTCCACAGCCACACTAACCATCACTGGGGTCCAAGCCGGC<br>GACGAGGCTGATTATTACTGTGGGAGCTGGGACAGTCTGAGCAGCAGCCATTTTGGGGCC<br>GGGACAACCCTGACCGTCCTA (SEQ ID NO: 250) |
| Anti-FAM19A5<br>("2-13D") | GCCCTGACTCAGCCGTCCTCGGTGTCAGCAAACCCAGGAGAAACCGCGAAGATAACCTGC<br>TCCGGGGGTGTGTATAGCTATGGCTGGTTCCAGCAGAAGCCTGGCAGTGCCCTTGTCACT |

TABLE 7-continued

Variable light chain polynucleotide sequence

| Antibody | Variable Light Chain Polynucleotide Sequence (SEQ ID NO) |
|---|---|
| | GTGATCTACTGGGATGATGAGAGACCCTCGGACATCCCTTCACGATTCTCCGGTGCCCTA<br>TCCGGCTCCACAAACACATTAACCATCACTGGGGTCCAAGCCGAAGACGAGGCTGATTAT<br>TATTGTGGGACTGAAGACATCAGCGGCACTGCTGGTGTATTTGGGGCCGGGACAACCCTG<br>ACCGTCCTG (SEQ ID NO: 251) |
| Anti-FAM19A5<br>("2-13D-37") | GCCCTGACTCAGCCGTCCTCGGTGTCAGCAAACCCAGGAGAAACCGCGAAGATAACCTGC<br>TCCGGGGGTGTGTATAGCTATGGCTGGTTCCAGCAGAAGCCTGGCAGTGCCCTTGTCACT<br>GTGATCTACTGGGATGATGAGAGACCCTCGGACATCCCTTCACGATTCTCCGGTGCCCTA<br>TCCGGCTCCACAAACACATTAACCATCACTGGGGTCCAAGCCGAAGACGAGGCTGATTAT<br>TATTGTGGGACTGAAGACATCAGCGGCACTGCTGGTGTATTTGGGGCCGGGACAACCCTG<br>ACCGTCCTG (SEQ ID NO: 277) |
| Anti-FAM19A5<br>("2-13D-37-<br>1.5W-41") | GCCCTGACTCAGCCGTCCTCGGTGTCAGCAAACCCAGGAGAAACCGCGAAGATAACCTGC<br>TCCGGGGGTGTGTATAGCTATGGCTGGTTCCAGCAGAAGCCTGGCAGTGCCCTTGTCACT<br>GTGATCTACTGGGATGATGAGAGACCCTCGGACATCCCTTCACGATTCTCCGGTGCCCTA<br>TCCGGCTCCACAAACACATTAACCATCACTGGGGTCCAAGCCGAAGACGAGGCTGATTAT<br>TATTGTGGGACTGAAGACATCAGCGGCACTGCTGGTGTATTTGGGGCCGGGACAACCCTG<br>ACCGTCCTG (SEQ ID NO: 252) |
| Anti-FAM19A5<br>("2-13D-37-3W-<br>16") | GCCCTGACTCAGCCGTCCTCGGTGTCAGCAAACCCAGGAGAAACCGCGAAGATAACCTGC<br>TCCGGGGGTGTGTATAGCTATGGCTGGTTCCAGCAGAAGCCTGGCAGTGCCCTTGTCACT<br>GTGATCTACTGGGATGATGAGAGACCCTCGGACATCCCTTCACGATTCTCCGGTGCCCTA<br>TCCGGCTCCACAAACACATTAACCATCACTGGGGTCCAAGCCGAAGACGAGGCTGATTAT<br>TATTGTGGGACTGAAGACATCAGCGGCACTGCTGGTGTATTTGGGGCCGGGACAACCCTG<br>ACCGTCCTG (SEQ ID NO: 259) |

A method for making an anti-FAM19A5 antibody as disclosed herewith can comprise expressing the relevant heavy chain and light chain of the antibody in a cell line comprising the nucleotide sequences encoding the heavy and light chains with a signal peptide, e.g., SEQ ID NOs: 43 and 47, SEQ ID NOs: 44 and 48, SEQ ID NOs: 45 and 49, SEQ ID NOs: 46 and 50, SEQ ID NOs: 177 and 178, respectively. Host cells comprising these nucleotide sequences are encompassed herein.

Once DNA fragments encoding VH and VL segments are obtained, these DNA fragments can be further manipulated by standard recombinant DNA techniques, for example to convert the variable region genes to full-length antibody chain genes, to Fab fragment genes or to a scFv gene. In these manipulations, a VL- or VH-encoding DNA fragment is operatively linked to another DNA fragment encoding another protein, such as an antibody constant region or a flexible linker. The term "operatively linked", as used in this context, is intended to mean that the two DNA fragments are joined such that the amino acid sequences encoded by the two DNA fragments remain in-frame.

The isolated DNA encoding the VH region can be converted to a full-length heavy chain gene by operatively linking the VH-encoding DNA to another DNA molecule encoding heavy chain constant regions (hinge, CH1, CH2 and/or CH3). The sequences of human heavy chain constant region genes are known in the art (see, e.g., Kabat, E. A., et al. (1991) Sequences of Proteins of Immunological Interest, Fifth Edition, U.S. Department of Health and Human Services, NIH Publication No. 91-3242) and DNA fragments encompassing these regions can be obtained by standard PCR amplification. The heavy chain constant region can be an IgG1, IgG2, IgG3, IgG4, IgA, IgE, IgM or IgD constant region, for example, an IgG2 and/or IgG 4 constant region. For a Fab fragment heavy chain gene, the VH-encoding DNA can be operatively linked to another DNA molecule encoding only the heavy chain CH1 constant region.

The isolated DNA encoding the VL region can be converted to a full-length light chain gene (as well as a Fab light chain gene) by operatively linking the VL-encoding DNA to another DNA molecule encoding the light chain constant region, CL. The sequences of human light chain constant region genes are known in the art (see, e.g., Kabat, E. A., et al. (1991) Sequences of Proteins of Immunological Interest, Fifth Edition, U.S. Department of Health and Human Services, NIH Publication No. 91-3242) and DNA fragments encompassing these regions can be obtained by standard PCR amplification. The light chain constant region can be a kappa or lambda constant region.

To create a scFv gene, the VH- and VL-encoding DNA fragments are operatively linked to another fragment encoding a flexible linker, e.g., encoding the amino acid sequence (Gly4-Ser)3, such that the VH and VL sequences can be expressed as a contiguous single-chain protein, with the VL and VH regions joined by the flexible linker (see, e.g., Bird et al. (1988) Science 242:423-426; Huston et al. (1988) Proc. Natl. Acad. Sci. USA 85:5879-5883; McCafferty et al., (1990) Nature 348:552-554).

In some aspects, the present disclosure provides a vector comprising an isolated nucleic acid molecule comprising a nucleotide sequence encoding an antibody or antigen-binding portion thereof. In other aspects, the vectors can be used for gene therapy.

Suitable vectors for the disclosure include expression vectors, viral vectors, and plasmid vectors. In one aspect, the vector is a viral vector.

As used herein, an expression vector refers to any nucleic acid construct which contains the necessary elements for the transcription and translation of an inserted coding sequence, or in the case of an RNA viral vector, the necessary elements for replication and translation, when introduced into an appropriate host cell. Expression vectors can include plasmids, phagemids, viruses, and derivatives thereof.

Expression vectors of the disclosure can include polynucleotides encoding the antibody or antigen-binding portion thereof described herein. In one aspect, the coding sequences for the antibody or antigen-binding portion thereof is operably linked to an expression control sequence.

As used herein, two nucleic acid sequences are operably linked when they are covalently linked in such a way as to permit each component nucleic acid sequence to retain its functionality. A coding sequence and a gene expression control sequence are said to be operably linked when they are covalently linked in such a way as to place the expression or transcription and/or translation of the coding sequence under the influence or control of the gene expression control sequence. Two DNA sequences are said to be operably linked if induction of a promoter in the 5' gene expression sequence results in the transcription of the coding sequence and if the nature of the linkage between the two DNA sequences does not (1) result in the introduction of a frame-shift mutation, (2) interfere with the ability of the promoter region to direct the transcription of the coding sequence, or (3) interfere with the ability of the corresponding RNA transcript to be translated into a protein. Thus, a gene expression sequence would be operably linked to a coding nucleic acid sequence if the gene expression sequence were capable of effecting transcription of that coding nucleic acid sequence such that the resulting transcript is translated into the desired antibody or antigen-binding portion thereof.

Viral vectors include, but are not limited to, nucleic acid sequences from the following viruses: retrovirus, such as Moloney murine leukemia virus, Harvey murine sarcoma virus, murine mammary tumor virus, and Rous sarcoma virus; lentivirus; adenovirus; adeno-associated virus; SV40-type viruses; polyomaviruses; Epstein-Barr viruses; papilloma viruses; herpes virus; vaccinia virus; polio virus; and RNA virus such as a retrovirus. One can readily employ other vectors well-known in the art. Certain viral vectors are based on non-cytopathic eukaryotic viruses in which non-essential genes have been replaced with the gene of interest. Non-cytopathic viruses include retroviruses, the life cycle of which involves reverse transcription of genomic viral RNA into DNA with subsequent proviral integration into host cellular DNA. Retroviruses have been approved for human gene therapy trials. Most useful are those retroviruses that are replication-deficient (i.e., capable of directing synthesis of the desired proteins, but incapable of manufacturing an infectious particle). Such genetically altered retroviral expression vectors have general utility for the high efficiency transduction of genes in vivo. Standard protocols for producing replication-deficient retroviruses (including the steps of incorporation of exogenous genetic material into a plasmid, transfection of a packaging cell line with plasmid, production of recombinant retroviruses by the packaging cell line, collection of viral particles from tissue culture media, and infection of the target cells with viral particles) are provided in Kriegler, M., Gene Transfer and Expression, A Laboratory Manual, W.H. Freeman Co., New York (1990) and Murry, E. J., Methods in Molecular Biology, Vol. 7, Humana Press, Inc., Cliffton, N.J. (1991).

In one aspect, the virus is an adeno-associated virus, a double-stranded DNA virus. The adeno-associated virus can be engineered to be replication-deficient and is capable of infecting a wide range of cell types and species. It further has advantages such as heat and lipid solvent stability; high transduction frequencies in cells of diverse lineages, including hematopoietic cells; and lack of superinfection inhibition thus allowing multiple series of transductions. Reportedly, the adeno-associated virus can integrate into human cellular DNA in a site-specific manner, thereby minimizing the possibility of insertional mutagenesis and variability of inserted gene expression characteristic of retroviral infection. In addition, wild-type adeno-associated virus infections have been followed in tissue culture for greater than 100 passages in the absence of selective pressure, implying that the adeno-associated virus genomic integration is a relatively stable event. The adeno-associated virus can also function in an extrachromosomal fashion.

In other aspects, the vector is derived from lentivirus. In certain aspects, the vector is a vector of a recombinant lentivirus capable of infecting non-dividing cells.

The lentiviral genome and the proviral DNA typically have the three genes found in retroviruses: gag, pol and env, which are flanked by two long terminal repeat (LTR) sequences. The gag gene encodes the internal structural (matrix, capsid and nucleocapsid) proteins; the pol gene encodes the RNA-directed DNA polymerase (reverse transcriptase), a protease and an integrase; and the env gene encodes viral envelope glycoproteins. The 5' and 3' LTR's serve to promote transcription and polyadenylation of the virion RNA's. The LTR contains all other cis-acting sequences necessary for viral replication. Lentiviruses have additional genes including vif, vpr, tat, rev, vpu, nef and vpx (in HIV-1, HIV-2 and/or SIV).

Adjacent to the 5' LTR are sequences necessary for reverse transcription of the genome (the tRNA primer binding site) and for efficient encapsidation of viral RNA into particles (the Psi site). If the sequences necessary for encapsidation (or packaging of retroviral RNA into infectious virions) are missing from the viral genome, the cis defect prevents encapsidation of genomic RNA.

However, the resulting mutant remains capable of directing the synthesis of all virion proteins. The disclosure provides a method of producing a recombinant lentivirus capable of infecting a non-dividing cell comprising transfecting a suitable host cell with two or more vectors carrying the packaging functions, namely gag, pol and env, as well as rev and tat. As will be disclosed herein below, vectors lacking a functional tat gene are desirable for certain applications. Thus, for example, a first vector can provide a nucleic acid encoding a viral gag and a viral pol and another vector can provide a nucleic acid encoding a viral env to produce a packaging cell. Introducing a vector providing a heterologous gene, herein identified as a transfer vector, into that packaging cell yields a producer cell which releases infectious viral particles carrying the foreign gene of interest.

According to the above-indicated configuration of vectors and foreign genes, the second vector can provide a nucleic acid encoding a viral envelope (env) gene. The env gene can be derived from nearly any suitable virus, including retroviruses. In some aspects, the env protein is an amphotropic envelope protein which allows transduction of cells of human and other species.

Examples of retroviral-derived env genes include, but are not limited to: Moloney murine leukemia virus (MoMuLV or MMLV), Harvey murine sarcoma virus (HaMuSV or HSV), murine mammary tumor virus (MuMTV or MMTV), gibbon ape leukemia virus (GaLV or GALV), human immunodeficiency virus (HIV) and Rous sarcoma virus (RSV). Other env genes such as Vesicular stomatitis virus (VSV) protein G (VSV G), that of hepatitis viruses and of influenza also can be used.

The vector providing the viral env nucleic acid sequence is associated operably with regulatory sequences described elsewhere herein.

In certain aspects, the vector includes a lentiviral vector in which the HIV virulence genes env, vif, vpr, vpu and nef were deleted without compromising the ability of the vector to transduce non-dividing cells.

In some aspects, the vector includes a lentiviral vector which comprises a deletion of the U3 region of the 3' LTR. The deletion of the U3 region can be the complete deletion or a partial deletion.

In some aspects, the lentiviral vector of the disclosure comprising the FVIII nucleotide sequence described herein can be transfected in a cell with (a) a first nucleotide sequence comprising a gag, a pol, or gag and pol genes and (b) a second nucleotide sequence comprising a heterologous env gene; wherein the lentiviral vector lacks a functional tat gene. In other aspects, the cell is further transfected with a fourth nucleotide sequence comprising a rev gene. In certain aspects, the lentiviral vector lacks functional genes selected from vif, vpr, vpu, vpx and nef, or a combination thereof.

In certain aspects, a lentiviral vector comprises one or more nucleotide sequences encoding a gag protein, a Rev-response element, a central polypurine track (cPPT), or any combination thereof.

Examples of the lentiviral vectors are disclosed in WO9931251, WO9712622, WO9817815, WO9817816, and WO9818934, which are incorporated herein by reference in their entireties.

Other vectors include plasmid vectors. Plasmid vectors have been extensively described in the art and are well-known to those of skill in the art. See, e.g., Sambrook et al., Molecular Cloning: A Laboratory Manual, Second Edition, Cold Spring Harbor Laboratory Press, 1989. In the last few years, plasmid vectors have been found to be particularly advantageous for delivering genes to cells in vivo because of their inability to replicate within and integrate into a host genome. These plasmids, however, having a promoter compatible with the host cell, can express a peptide from a gene operably encoded within the plasmid. Some commonly used plasmids available from commercial suppliers include pBR322, pUC18, pUC19, various pcDNA plasmids, pRC/CMV, various pCMV plasmids, pSV40, and pBlueScript. Additional examples of specific plasmids include pcDNA3.1, catalog number V79020; pcDNA3.1/hygro, catalog number V87020; pcDNA4/myc-His, catalog number V86320; and pBudCE4.1, catalog number V53220, all from Invitrogen (Carlsbad, Calif.). Other plasmids are well-known to those of ordinary skill in the art. Additionally, plasmids can be custom designed using standard molecular biology techniques to remove and/or add specific fragments of DNA.

VI. Antibody Production

Antibodies or fragments thereof that immunospecifically bind to FAM19A5 (e.g., human FAM19A5) can be produced by any method known in the art for the synthesis of antibodies, for example, by chemical synthesis or by recombinant expression techniques. The methods described herein employs, unless otherwise indicated, conventional techniques in molecular biology, microbiology, genetic analysis, recombinant DNA, organic chemistry, biochemistry, PCR, oligonucleotide synthesis and modification, nucleic acid hybridization, and related fields within the skill of the art. These techniques are described, for example, in the references cited herein and are fully explained in the literature. See, e.g., Maniatis T et al., (1982) Molecular Cloning: A Laboratory Manual, Cold Spring Harbor Laboratory Press; Sambrook J et al., (1989), Molecular Cloning: A Laboratory Manual, Second Edition, Cold Spring Harbor Laboratory Press; Sambrook J et al., (2001) Molecular Cloning: A Laboratory Manual, Cold Spring Harbor Laboratory Press, Cold Spring Harbor, N.Y.; Ausubel F M et al., Current Protocols in Molecular Biology, John Wiley & Sons (1987 and annual updates); Current Protocols in Immunology, John Wiley & Sons (1987 and annual updates) Gait (ed.) (1984) Oligonucleotide Synthesis: A Practical Approach, IRL Press; Eckstein (ed.) (1991) Oligonucleotides and Analogues: A Practical Approach, IRL Press; Birren B et al., (eds.) (1999) Genome Analysis: A Laboratory Manual, Cold Spring Harbor Laboratory Press.

In a specific aspect, an antibody described herein is an antibody (e.g., recombinant antibody) prepared, expressed, created or isolated by any means that involves creation, e.g., via synthesis, genetic engineering of DNA sequences. In certain aspects, such antibody comprises sequences (e.g., DNA sequences or amino acid sequences) that do not naturally exist within the antibody germline repertoire of an animal or mammal (e.g., human) in vivo.

VII. Pharmaceutical Compositions

Provided herein are compositions comprising an antibody or antigen-binding portion thereof described herein having the desired degree of purity in a physiologically acceptable carrier, excipient or stabilizer (Remington's Pharmaceutical Sciences (1990) Mack Publishing Co., Easton, Pa.). Acceptable carriers, excipients, or stabilizers are nontoxic to recipients at the dosages and concentrations employed, and include buffers such as phosphate, citrate, and other organic acids; antioxidants including ascorbic acid and methionine; preservatives (such as octadecyldimethylbenzyl ammonium chloride; hexamethonium chloride; benzalkonium chloride, benzethonium chloride; phenol, butyl or benzyl alcohol; alkyl parabens such as methyl or propyl paraben; catechol; resorcinol; cyclohexanol; 3-pentanol; and m-cresol); low molecular weight (less than about 10 residues) polypeptides; proteins, such as serum albumin, gelatin, or immunoglobulins; hydrophilic polymers such as polyvinylpyrrolidone; amino acids such as glycine, glutamine, asparagine, histidine, arginine, or lysine; monosaccharides, disaccharides, and other carbohydrates including glucose, mannose, or dextrins; chelating agents such as EDTA; sugars such as sucrose, mannitol, trehalose or sorbitol; salt-forming counter-ions such as sodium; metal complexes (e.g., Zn-protein complexes); and/or non-ionic surfactants such as TWEEN™, PLURONICS™ or polyethylene glycol (PEG).

In some aspects, pharmaceutical compositions comprise an antibody or antigen-binding portion thereof, a bispecific molecule, or a immunoconjugate described herein, and optionally one or more additional prophylactic or therapeutic agents, in a pharmaceutically acceptable carrier. In some aspects, pharmaceutical compositions comprise an effective amount of an antibody or antigen-binding portion thereof described herein, and optionally one or more additional prophylactic of therapeutic agents, in a pharmaceutically acceptable carrier. In some aspects, the antibody is the only active ingredient included in the pharmaceutical composition. Pharmaceutical compositions described herein can be useful in reducing a FAM19A5 activity and thereby treat an ocular disease, disorder, or condition, such as a glaucoma.

Pharmaceutically acceptable carriers used in parenteral preparations include aqueous vehicles, nonaqueous vehicles, antimicrobial agents, isotonic agents, buffers, antioxidants, local anesthetics, suspending and dispersing agents, emulsifying agents, sequestering or chelating agents and other pharmaceutically acceptable substances. Examples of aqueous vehicles include Sodium Chloride Injection, Ringers Injection, Isotonic Dextrose Injection, Sterile Water Injection, Dextrose and Lactated Ringers Injection. Nonaqueous parenteral vehicles include fixed oils of vegetable origin, cottonseed oil, corn oil, sesame oil and peanut oil. Antimicrobial agents in bacteriostatic or fungistatic concentrations can be added to parenteral preparations packaged in multiple-dose containers which include phenols or cresols, mercurials, benzyl alcohol, chlorobutanol, methyl and propyl p-hydroxybenzoic acid esters, thimerosal, benzalkonium chloride and benzethonium chloride. Isotonic agents include sodium chloride and dextrose. Buffers include phosphate and citrate. Antioxidants include sodium bisulfate. Local anesthetics include procaine hydrochloride. Suspending and dispersing agents include sodium carboxymethylceluose, hydroxypropyl methylcellulose and polyvinylpyrrolidone. Emulsifying agents include Polysorbate 80 (TWEEN® 80). A sequestering or chelating agent of metal ions includes EDTA. Pharmaceutical carriers also include ethyl alcohol, polyethylene glycol and propylene glycol for water miscible vehicles; and sodium hydroxide, hydrochloric acid, citric acid or lactic acid for pH adjustment.

A pharmaceutical composition of the present disclosure can be formulated for any route of administration to a subject. In some aspects, pharmaceutical compositions disclosed herein can be delivered via any route that can deliver the composition to a sub-Tenon, subconjunctival, suprachoroidal, intravitreal, and like locations within the eye. In certain aspects, a pharmaceutical composition disclosed herein is delivered to a subject via ocular administration. In some aspects, ocular administration comprises intravitreal administration. Parenteral administration, characterized by either subcutaneous, intramuscular, intraperitoneal, or intravenous injection, is also contemplated herein. Injectables can be prepared in conventional forms, either as liquid solutions or suspensions, solid forms suitable for solution or suspension in liquid prior to injection, or as emulsions. The injectables, solutions and emulsions also contain one or more excipients. Suitable excipients are, for example, water, saline, dextrose, glycerol or ethanol. In addition, if desired, the pharmaceutical compositions to be administered can also contain minor amounts of non-toxic auxiliary substances such as wetting or emulsifying agents, pH buffering agents, stabilizers, solubility enhancers, and other such agents, such as for example, sodium acetate, sorbitan monolaurate, triethanolamine oleate and cyclodextrins.

Preparations for parenteral administration of an antibody include sterile solutions ready for injection, sterile dry soluble products, such as lyophilized powders, ready to be combined with a solvent just prior to use, including hypodermic tablets, sterile suspensions ready for injection, sterile dry insoluble products ready to be combined with a vehicle just prior to use and sterile emulsions. The solutions can be either aqueous or nonaqueous.

If administered intravenously, suitable carriers include physiological saline or phosphate buffered saline (PBS), and solutions containing thickening and solubilizing agents, such as glucose, polyethylene glycol, and polypropylene glycol and mixtures thereof.

Topical mixtures comprising an antibody are prepared as described for the local and systemic administration. The resulting mixture can be a solution, suspension, emulsions or the like and can be formulated as creams, gels, ointments, emulsions, solutions, elixirs, lotions, suspensions, tinctures, pastes, foams, aerosols, irrigations, sprays, suppositories, bandages, dermal patches or any other formulations suitable for topical administration.

An antibody or antigen-binding portion thereof described herein can be formulated as an aerosol for topical application, such as by inhalation (see, e.g., U.S. Pat. Nos. 4,044, 126, 4,414,209 and 4,364,923, which describe aerosols for delivery of a steroid useful for treatment of inflammatory diseases, particularly asthma). These formulations for administration to the respiratory tract can be in the form of an aerosol or solution for a nebulizer, or as a microfine powder for insufflations, alone or in combination with an inert carrier such as lactose. In such a case, the particles of the formulation will, in one aspect, have diameters of less than 50 microns, in one aspect less than 10 microns.

An antibody or antigen-binding portion thereof described herein can be formulated for local or topical application, such as for topical application to the skin and mucous membranes, such as in the eye, in the form of gels, creams, and lotions and for application to the eye or for intracisternal or intraspinal application. Topical administration is contemplated for transdermal delivery and also for administration to the eyes or mucosa, or for inhalation therapies. Nasal solutions of the antibody alone or in combination with other pharmaceutically acceptable excipients can also be administered.

Transdermal patches, including iontophoretic and electrophoretic devices, are well known to those of skill in the art, and can be used to administer an antibody. For example, such patches are disclosed in U.S. Pat. Nos. 6,267,983, 6,261,595, 6,256,533, 6,167,301, 6,024,975, 6,010715, 5,985,317, 5,983,134, 5,948,433, and 5,860,957.

In certain aspects, a pharmaceutical composition comprising an antibody or antigen-binding portion thereof described herein is a lyophilized powder, which can be reconstituted for administration as solutions, emulsions and other mixtures. It can also be reconstituted and formulated as solids or gels. The lyophilized powder is prepared by dissolving an antibody or antigen-binding portion thereof described herein, or a pharmaceutically acceptable derivative thereof, in a suitable solvent. In some aspects, the lyophilized powder is sterile. The solvent can contain an excipient which improves the stability or other pharmacological component of the powder or reconstituted solution, prepared from the powder. Excipients that can be used include, but are not limited to, dextrose, sorbitol, fructose, corn syrup, xylitol, glycerin, glucose, sucrose or other suitable agent. The solvent can also contain a buffer, such as citrate, sodium or potassium phosphate or other such buffer known to those of skill in the art at, in one aspect, about neutral pH. Subsequent sterile filtration of the solution followed by lyophilization under standard conditions known to those of skill in the art provides the desired formulation. In one aspect, the resulting solution will be apportioned into vials for lyophilization. Each vial will contain a single dosage or multiple dosages of the compound. The lyophilized powder can be stored under appropriate conditions, such as at about 4° C. to room temperature.

Reconstitution of this lyophilized powder with water for injection provides a formulation for use in parenteral administration. For reconstitution, the lyophilized powder is added to sterile water or other suitable carrier. The precise amount depends upon the selected compound. Such amount can be empirically determined.

The antibodies or antigen-binding portions thereof, the bispecific molecule, or the immunoconjugate described herein and other compositions provided herein can also be formulated to be targeted to a particular tissue, receptor, or other area of the body of the subject to be treated. Many such targeting methods are well known to those of skill in the art. All such targeting methods are contemplated herein for use in the instant compositions. For non-limiting examples of targeting methods, see, e.g., U.S. Pat. Nos. 6,316,652, 6,274,552, 6,271,359, 6,253,872, 6,139,865, 6,131,570, 6,120,751, 6,071,495, 6,060,082, 6,048,736, 6,039,975, 6,004,534, 5,985,307, 5,972,366, 5,900,252, 5,840,674, 5,759,542 and 5,709,874. In a specific aspect, the anti-FAM19A5 antibody or antigen-binding portion thereof described herein can be used to treat a glaucoma and/or reduce, ameliorate, or inhibit inflammation associated with a glaucoma.

The compositions to be used for in vivo administration can be sterile. This is readily accomplished by filtration through, e.g., sterile filtration membranes.

VIII. Kits

Provided herein are kits comprising one or more antibodies described herein, or antigen-binding portions thereof, bispecific molecules, or immunoconjugates thereof. In a specific aspect, provided herein is a pharmaceutical pack or kit comprising one or more containers filled with one or more of the ingredients of the pharmaceutical compositions described herein, such as one or more antibodies provided herein or an antigen-binding portion thereof, optional an instructing for use. In some aspects, the kits contain a pharmaceutical composition described herein and any prophylactic or therapeutic agent, such as those described herein.

EXAMPLES

Example 1

Evaluation of the Retinal Potential Difference After In Vivo Administration of Anti-FAM19A5 Antibody in a Mouse Model of Diabetic Retinopathy To begin assessing the effect of anti-FAM19A5 antibody treatment on diabetic retinopathy, type 2 diabetic db/db mice (B6.BKS(D)-Leprdb/j) (25-week old) were used. Briefly, the mice were stabilized for one week, and then, either human IgG control antibody or an anti-FAM19A5 antibody (1-65 or 3-2 clones) were intravitreally administered to the mice (total of 7 doses at 4 µg/eye every 2 weeks) using a micro pump system. Normal (i.e., non-diabetic wild-type) mice were used as controls. Then, the retinal potential was assessed using electroretinography (ERG).

ERG is a diagnostic test that measures the electrical activity generated by various cells in the retina (i.e., retinal potential), including the photoreceptors (rods and cones), inner retinal cells (bipolar and amacrine cells), and the ganglion cells. Generally, upon a bright stimulus flash, the ERG of a healthy eye will exhibit a complex waveform consisting of an initial negative deflection ("A-wave") followed by a B-wave with an increasingly steeper rise and faster peak upon which are superimposed higher-frequency oscillations known as "oscillatory potentials" (OPs). The A-wave is dominated by the collective response of the rods and the scotopic B-wave by the response of rod bipolar neurons. The OPs arise within the inner plexiform layer, where the bipolar, amacrine, and ganglion cells interact. Wilsey et al., *Curr Opin Ophthalmol* 27(2): 118-124 (2016). By assessing these values, it is possible to assess the health of the different cells found within the retina.

To evaluate retinal potential using ERG, the pupil of the eyes of the animals from the different treatment groups were enlarged with a topical treatment of 2.5% phenylephrine hydrochloride. The animals were then shaved, anesthetized (using ketamine (80 mg/kg) and xylazine (16 mg/kg), followed by 0.5% paracaine), and electrodes were attached to the skin, tail, and the cornea. The retina was stimulated with a single flash of white light (0.9 log cd sec/m$^2$). To assess the electrical activity (i.e., "retinal potential difference") within the eyes from the different animals, the values of the amplitude for the A-wave (from the trough of the A-wave to the baseline), B-wave (from the trough of the A-wave to the peak of the B-wave), and the oscillatory potential (OP) (amplitude and time of the small oscillations observed on the ascending limb of the B-wave) were measured.

Figure 1B:
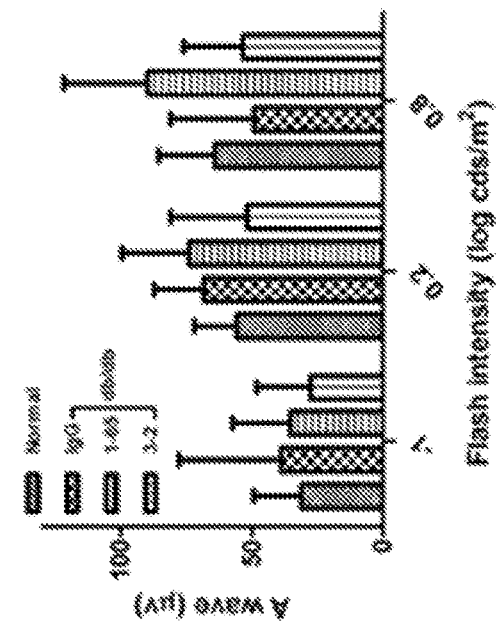
Figure 1C:
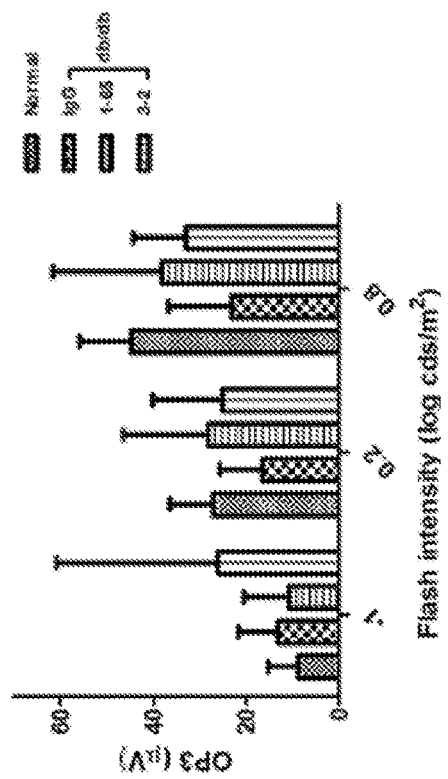

As shown in FIGS. 1A-1C, mice that received the anti-FAM19A5 antibody (either clone 1-65 or 3-2) had improved A-wave, B-wave, and oscillatory potential compared to mice that received the control IgG antibody. This indicated that the animals that received the anti-FAM19A5 antibody had recovered normal retina function.

Example 2

Evaluation of the Morphological Changes After Anti-FAM19A5 Antibody Treatment in a Mouse Model of Diabetic Retinopathy To assess whether anti-FAM19A5 antibody treatment resulted in morphological changes of the retina, the type 2 diabetic db/db mice from Example 1 were sacrificed and both of the eyes were harvested from the animals.

Once harvested, one of the eyes from each of the animals were fixed in 10% neutral formalin for one day. Afterwards, the cornea, lens, and sclera were removed, and the remaining eye tissues were washed five time with distilled water for one hour while shaking. After the last wash, the distilled water was removed, and the eye tissues were incubated in 3% trypsin dissolved in 0.1 M Tris buffer for 2 hours at 37° C. Next, the retinal vessels were separated from the rest of the retinal tissue and attached to slides for staining with periodic acid-Schiff (PAS) to assess retinal microvessels for characteristic markers of early diabetic retinopathy (e.g., pericyte loss and acellular capillary formation).

The remaining eye from each of the animals were pre-fixed in 4% glutaraldehyde and then fixed in 10% formalin for 3 days. The eyes were then placed in disposable cassettes and embedded in paraffin blocks. Then, the frozen tissues were sliced and mounted on slides for further analysis. H&E, TUNEL assay, and IHC analysis were performed to analyze vascular congestion, vascular marker (CD31 and VEGF), and retinal cell protection effect.

Figure 2A:
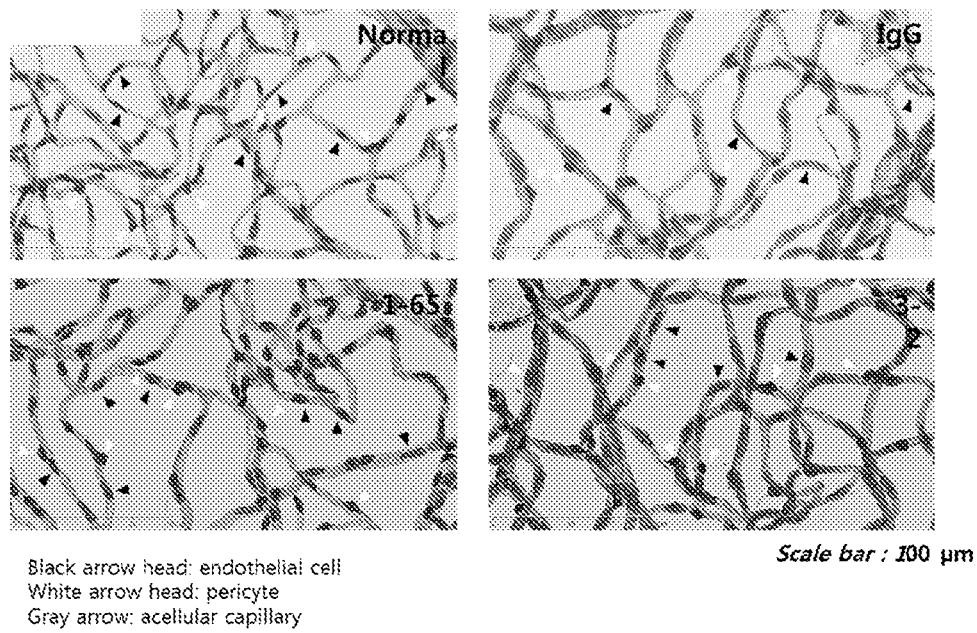
FIGS. 2A and 2B show the retinal microvascular protection effect of anti-FAM19A5 antibody in 25-week old db/db mice. The mice were treated with either human IgG control antibody ("IgG") or anti-FAM19A5 antibody (clones "1-65" or "3-2"). Normal (i.e., non-diabetic) healthy mice were used as controls.
Figure 2B:
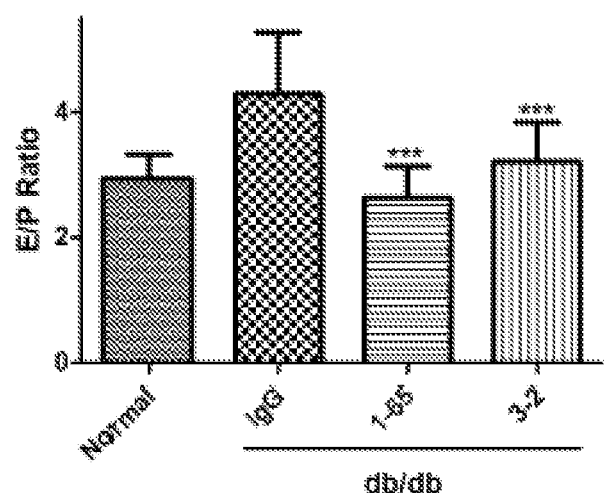
Figure 2C:
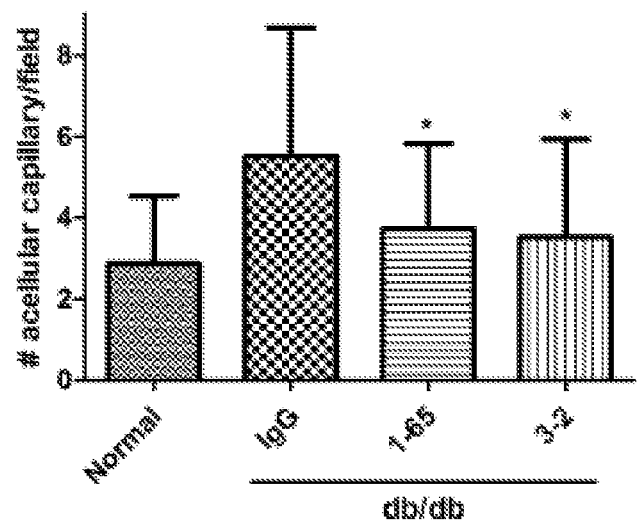
FIG. 2C shows a comparison of the number of acellular capillary observed within the entire analyzed retinal area of mice from the different treatment groups. Data are shown as mean±S.D. "*" above the bars indicates a statistically significant difference (p<0.05) compared to IgG-treated group.
Figure 2D:
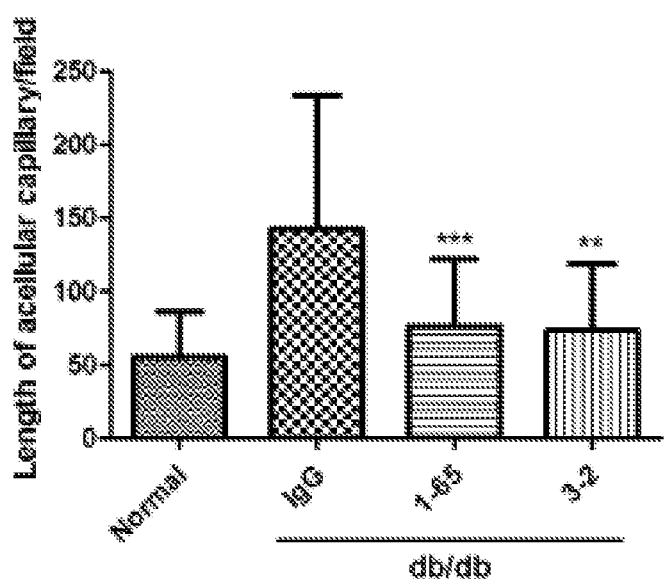
FIG. 2D shows a comparison of the length of the acellular capillaries observed. Data are shown as mean±S.D. "" and "*" above the bars indicate a statistically significant difference (p<0.01, and p<0.001, respectively) compared to IgG-treated group.

FIG. 2A provides a microscopic image (100× magnification) of a representative region of the retina from animals belonging to the different treatment groups. In mice that received the anti-FAM19A5 antibody (clone 1-65 or 3-2), both the ratio of the endothelial cells to pericytes (E/P ratio) and the frequency and length of the acellular capillaries detected were similar to that of the normal healthy animals. FIGS. 2B-2D. In contrast, mice treated with the human IgG control antibody had a much higher E/P ratio, suggesting pericyte loss. FIG. 2B. Human IgG control mice also had greater number of acellular capillary formation (FIG. 2C) and the acellular capillaries were much longer (FIG. 2D). This result suggested that anti-FAM19A5 antibody can prevent pericyte loss and protect retinal microvessels from acellular capillary formation in a diabetic retinopathy model.

Figure 3:
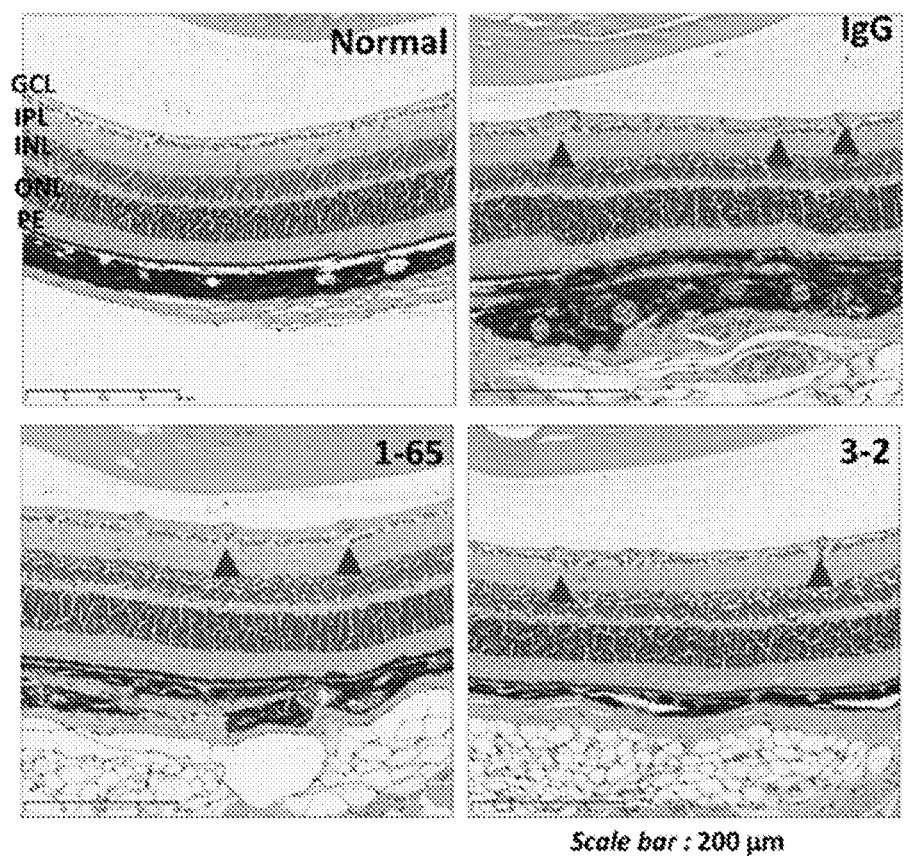
FIG. 3 shows the effect of anti-FAM19A5 antibody treatment on vascular congestion within the retina of 25-week old db/db mice using H&E staining. The mice were treated with either human IgG control antibody ("IgG," upper right panel) or anti-FAM19A5 antibody (clone "1-65," bottom left panel, or clone "3-2," bottom right panel). Normal (i.e., non-diabetic) healthy mice (upper left panel) were used as controls. The arrowheads indicate examples of vascular congestion. The different retinal layers shown include: (i) ganglion cell layer (GCL), (ii) inner plexiform layer (IPL), (iii) inner nuclear layer (INL), (iv) outer nuclear layer (ONL), and (v) retinal pigment epithelium (PE).
Figure 4:
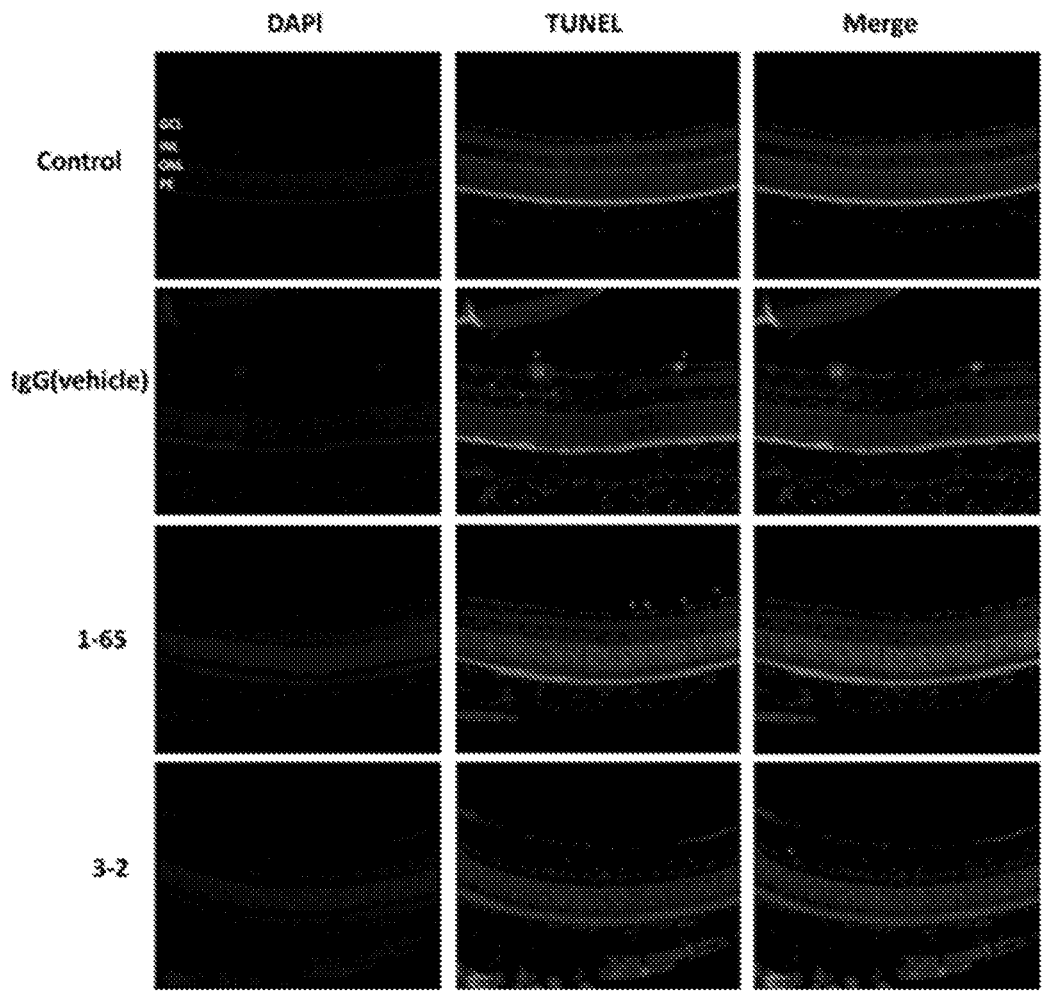
FIG. 4 shows the retinal cell protection effect of anti-FAM19A5 antibody treatment in 25-week old db/db mice using TUNEL assay. The mice were treated with either human IgG control antibody ("IgG") or anti-FAM19A5 antibody (clones "1-65" or "3-2"). Normal (i.e., non-diabetic) healthy mice were used as controls. The red arrowheads under the middle column ("TUNEL") indicate retinal cells undergoing apoptosis. The intensity of the TUNEL staining correlates with degree of apoptosis (e.g., reduced intensity indicates partial apoptosis). The different retinal layers shown include: (i) ganglion cell layer (GCL), (ii) inner nuclear layer (INL), (iii) outer nuclear layer (ONL), and (iv) retinal pigment epithelium (PE).

Moreover, as shown in FIG. 3, mice treated with anti-FAM19A5 antibody (bottom two panels) also had much reduced vascular congestion in the nerve fiber layer of the retina compared to mice that received the human IgG control antibody (upper right panel). The TUNEL assay demonstrated that the both the nerve fiber layer and the inner nuclear layer of retina from mice treated with anti-FAM19A5 antibody had less cells undergoing apoptosis, compared to the corresponding layers in the retina from mice treated with the human IgG control antibody. FIG. 4. This suggested that anti-FAM19A5 antibody can protect retinal cells from damage caused by diabetes.

Figure 5:
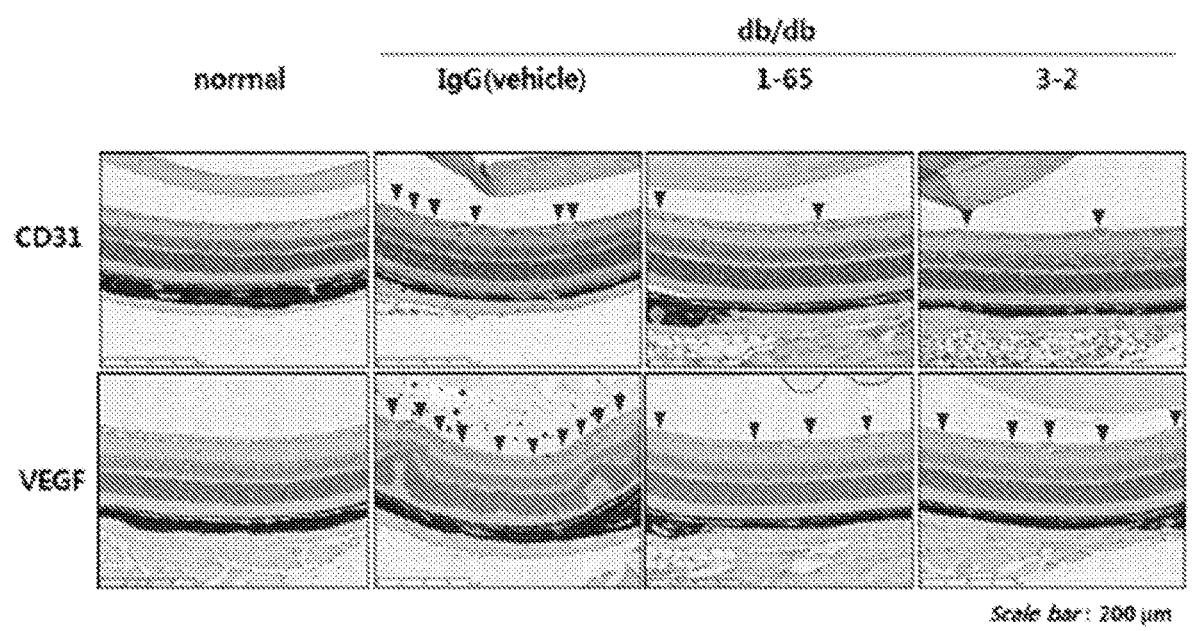
FIG. 5 shows the inhibitory effect of anti-FAM19A5 antibody on neovascularization within the retina of 25-week old db/db mice using immunohistochemistry to stain for CD31 and VEGF expression. The mice were treated with either human IgG control antibody ("IgG") or anti-FAM19A5 antibody (clones "1-65" or "3-2"). Normal (i.e., non-diabetic) healthy mice were used as controls. The arrowheads indicate positive CD31 (top row) or positive VEGF (bottom row) staining.

Lastly, as shown in FIG. 5, the nerve fiber layer of mice treated with the human IgG control antibody had extensive CD31 and VEGF staining, indicating neovascularization, which is a hallmark of more advanced stages of diabetic retinopathy. In contrast, mice treated with anti-FAM19A5 antibody (clone 1-65 or 3-2) had much reduced CD31 and VEGF staining. This result suggested that anti-FAM19A5 antibody can effectively block neovascularization in a diabetic retinopathy model.

Collectively, the above data demonstrated that anti-FAM19A5 antibody can improve many of the underlying pathologies associated with retinopathies, such as diabetic retinopathy, and thereby, treat the diseases.

Example 3

Figure 6A:
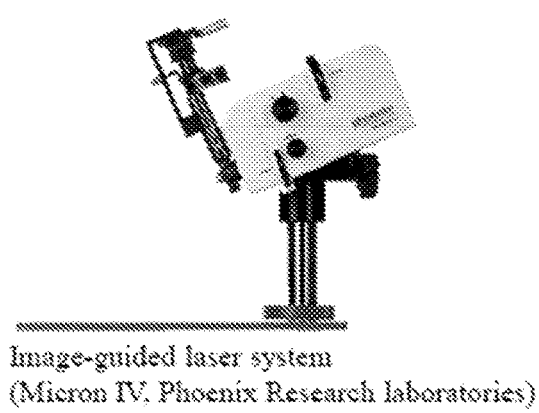
FIG. 6A shows a picture of an image-guided laser system, such as that used in Example 8.
Figure 6B:
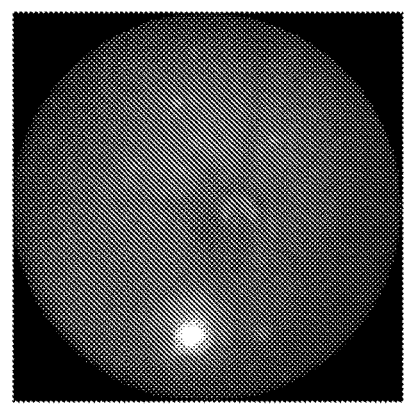
FIG. 6B shows an exemplary image of a retina exposed to the laser from the image-guided laser system shown in FIG. 6A.

Evaluation of the Effect of Anti-FAM19A5 Antibody on Choroidal Neovascularization in Age-Related Macular Degeneration Mouse Model To assess the effect of anti-FAM19A5 antibody treatment on age-related macular degeneration, a mouse induced choroidal neovascularization (CNV) model was used. More specifically, the CNV model is an animal model of human wet age-related macular degeneration. Briefly, after stabilizing C57BL/6 mice for one week, the pupils of the eyes of the animals were enlarged (with a topical treatment of 2.5% phenylephrine hydrochloride). Then, the animals were treated intraperitoneally with 2% Fluorescein (Sigma) to stain the blood vessels. Approximately 3-5 minutes after Fluorescein injection, the mice were anesthetized, and using a Phoenix green laser photocoagulator, wet AMD-like lesions were induced at four areas of the optic nerve with a laser (240 mW, 70 ms duration). FIG. 6. Afterwards, either human IgG control antibody or anti-FAM19A5 antibody were intravitreally administered to the mice (4 µg/eye) on the day of CNV induction (i.e., day 0) and on days 3 and 7 post CNV induction. At day 13 post CNV induction, the degree of choroidal neovascularization was measured using a Fundus fluorescein angiography (FFA) and an image J program to calculate the corrected total fluorescence (CTF=integrated density−(area of selected lesion×mean fluorescence of background reading)) value. Retinal tomography was also performed using image guided optical coherence tomography (OCT) equipment to measure the degree of neovascular lesions. The neovascular lesions were quantified using the image J program.

Figure 7A:
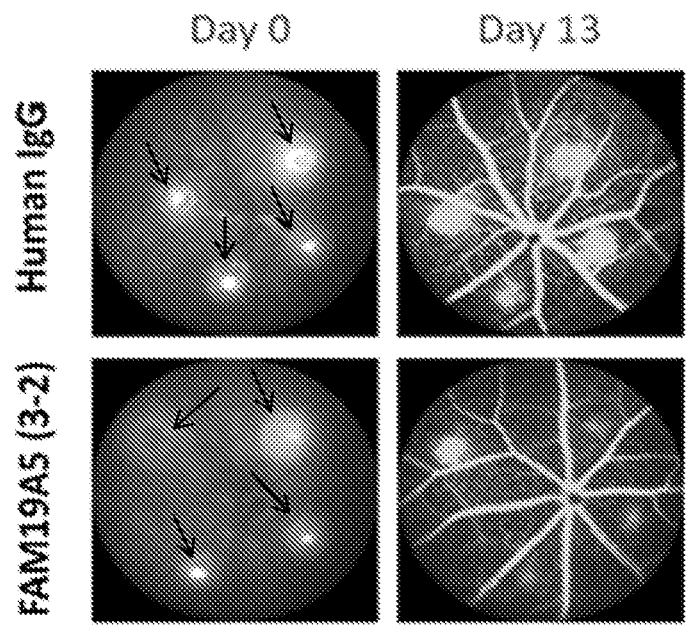
FIGS. 7A and 7B show the inhibitory effect of anti-FAM19A5 antibody (clone 3-2) on choroidal neovascularization (CNV) using Fundus fluorescein angiography (FFA) analysis. CNV-induced mice that received human IgG antibody were used as controls.
Figure 7B:
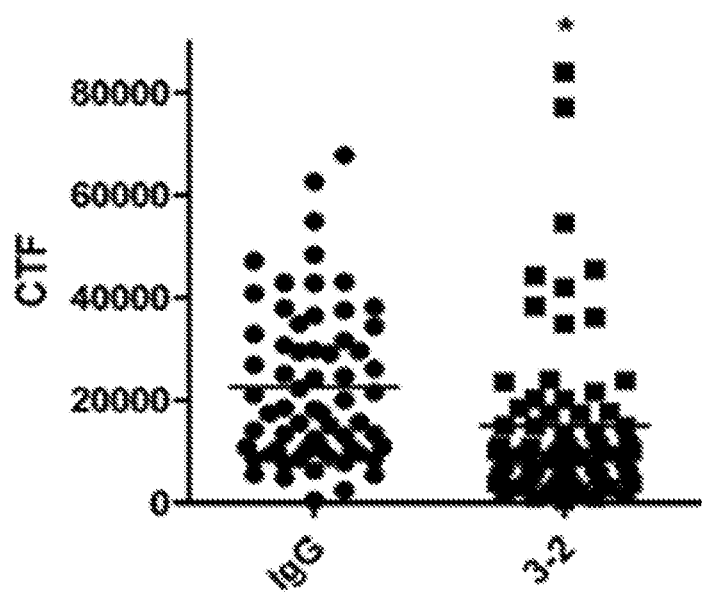
Figure 8A:
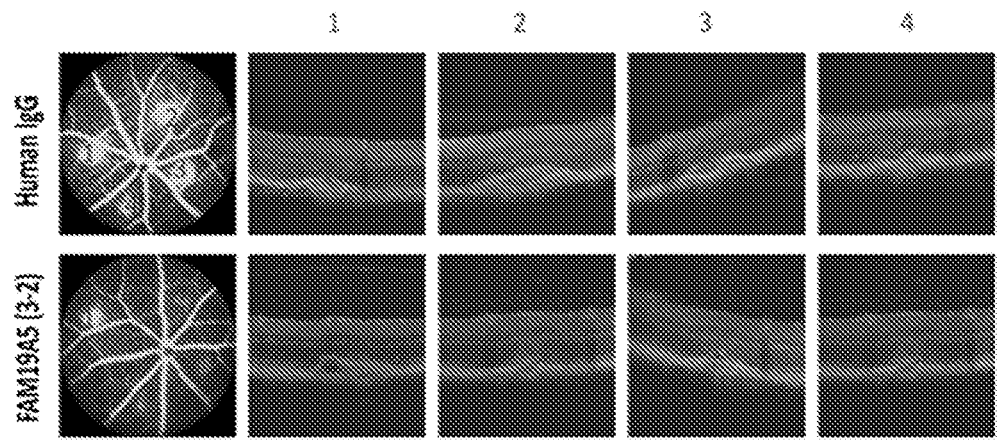
FIGS. 8A, 8B, and 8C show the inhibitory effect of anti-FAM19A5 antibody (clone 3-2) on choroidal neovascularization (CNV) using optical coherence tomography (OCT) analysis. CNV-induced mice that received human IgG antibody were used as controls.
Figure 8B:
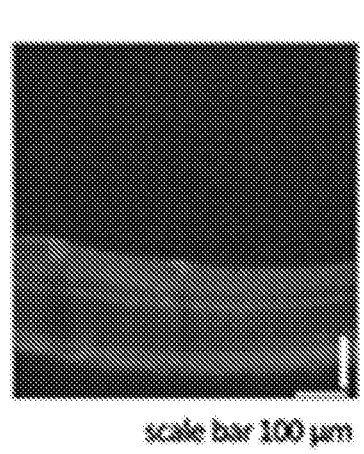
Figure 8C:
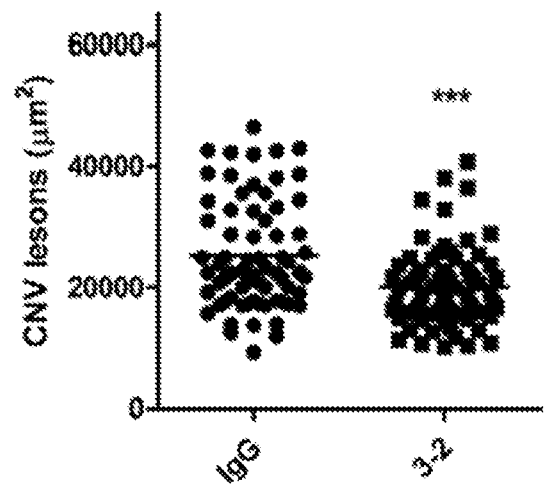

As shown in FIG. 7A, immediately after CNV induction and prior to antibody treatment (day 0, left column), the fluorescence intensity observed at the four areas exposed to the laser (indicated by arrows) were similar for both treatment groups. However, at day 13 post CNV induction, mice that were treated with anti-FAM19A5 antibody had statistically lower CTF value compared to mice treated with human IgG control antibody. FIG. 7B. This effect was confirmed with both image guided optical coherence tomography (OCT) (see FIGS. 8A-8C) and H&E staining (see FIG. 10B). These results demonstrated that anti-FAM19A5 antibody can inhibit and/or reduce choroidal neovascularization caused by the laser.

Example 4

Evaluation of the Retinal Potential Difference After In Vivo Administration of Anti-FAM19A5 Antibody in a Mouse Model of Age-Related Macular Degeneration To further assess the effect of anti-FAM19A5 antibody treatment on age-related macular degeneration, retinal potential was assessed in the mice from Example 3 using electroretinography (ERG). Briefly, the pupil of the eyes of the animals from the different treatment groups were enlarged with a topical treatment of 2.5% phenylephrine hydrochloride. The animals were then anesthetized, and electrodes were attached to the skin, tail, and the cornea. The retina was stimulated with a single flash of white light (0.9 log cd sec/m$^2$). To assess the electrical activity (i.e., "retinal potential difference") within the eyes from the different animals, the B-wave values were measured as described earlier in Example 1.

Figure 9:
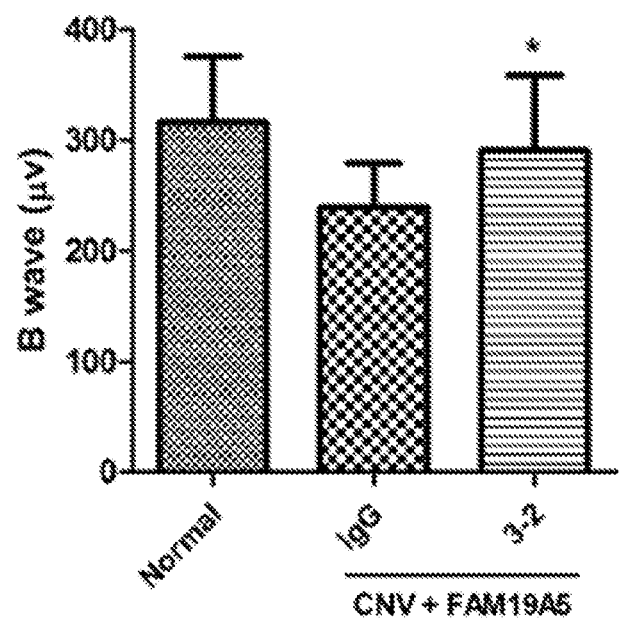
FIG. 9 shows the effect of anti-FAM19A5 antibody on recovery of B-wave value in CNV-induced mice. The CNV-induce mice were treated with either human IgG control antibody ("IgG") or anti-FAM19A5 antibody (clone "3-2"). Normal (i.e., non-diabetic) mice were used as controls. Data are shown as mean±S.D. "*" indicates a statistically significant difference (p<0.05) compared to the IgG-treated group.

As shown in FIG. 9, CNV-induced mice treated with anti-FAM19A5 antibody had improved B-wave retinal potential compared to mice from the human IgG antibody group. This result suggested that the administration of anti-FAM19A5 antibody to the CNV-induced mice had recovered normal retina function.

Example 5

Evaluation of the Morphological Changes After Anti-FAM19A5 Antibody Treatment in a Mouse Model of Age-Related Macular Degeneration Next, to assess whether the administration of anti-FAM19A5 antibody resulted in morphological changes within the retina, the CNV-induced mice from Examples 3 and 4 were sacrificed and both of the eyes were harvested from the animals. The eyes were then fixed in 10% neutral formalin for 48 hours. Afterwards, the fixed eyes were embedded in paraffin blocks and H&E and IHC analysis were performed. H&E was used to confirm the inhibitory effect of anti-FAM19A5 antibody on choroidal neovascularization shown in Example 3. IHC was used to stain for the expression of platelet derived growth factor (PDGF). PDGF is known to be secreted from retinal nerve cells and plays an important role in the formation of astrocytes and in choroidal neovascularization.

Figure 10A:
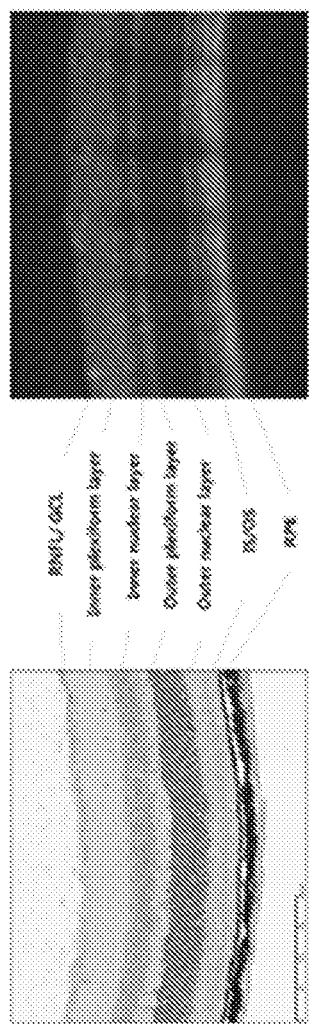
FIGS. 10A and 10B show the inhibitory effect of anti-FAM19A5 antibody (clone 3-2) on choroidal neovascularization (CNV).
Figure 10B:
Figure 10B:
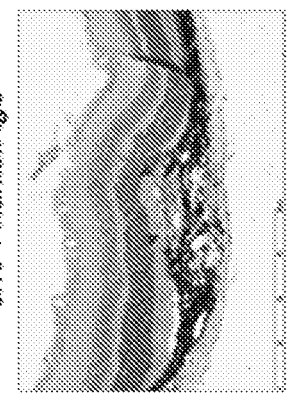
Figure 10B:
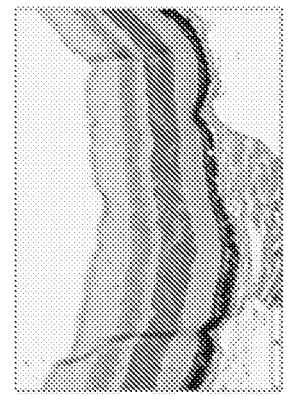
Figure 11:
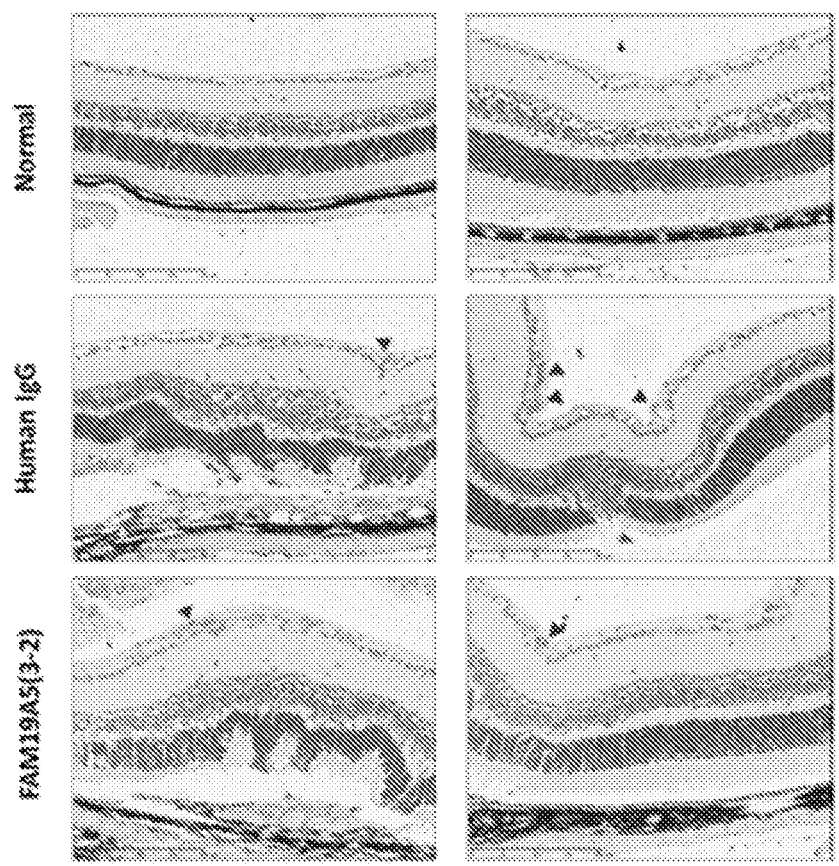
FIG. 11 shows the inhibitory effect of anti-FAM19A5 antibody on PDGF expression within both the nerve fiber layer and the ganglion cell layer of the retina using IHC analysis. The CNV-induce mice were treated with either human IgG control antibody ("IgG") or anti-FAM19A5 antibody (clone "3-2"). Normal (i.e., non-diabetic) mice were used as controls. The arrowheads indicate positive PDGF staining.

As shown in FIGS. 10A and 10B, in CNV-induced mice that were treated with anti-FAM19A5 antibody, compared to the human IgG-treated group, the choroidal neovascularization was significantly reduced in size by day 13 post CNV induction. This result confirmed the earlier data (see Example 3) demonstrating the inhibitory effect of anti-FAM19A5 on choroidal neovascularization. And, as shown in FIG. 11, CNV-induced mice that were treated with anti-FAM19A5 antibody had significantly less PDGF staining within both the nerve fiber layer and ganglion cell layer of the retina, compared to the IgG-treated group.

Example 6

Evaluation of the Inhibitory Effects of Anti-FAM19A5 Antibody on the Generation of Drusen As described supra, drusen are tiny yellow or white accumulations of extracellular material (primarily proteins and lipids) that build up between Bruch's membrane and the retinal pigment epithelium (RPE) of the eye. To assess whether the administration of anti-FAM19A5 antibody can inhibit drusen formation, male APP/PS-1/tau transgenic dementia mice (C57BL/6; 4 months old) were used. Briefly, an anti-FAM19A5 antibody was intravenously administered to the mice at a dose of 0.7 mg/kg, twice a week, for a total of 8 weeks. Age-matched non-treated naïve wild-type C57BL/6 and APP/PS-1/tau transgenic mice were used as controls. At 8 weeks post initial antibody administration, the animals were sacrificed and the eyes harvested from the animals. Once harvested, the eyes were fixed in 4% paraformaldehyde (PFA) for 24 hours at 4° C. Afterwards, the eyes were placed in plastic molds with OCT compound (Lot no. 686794, Sigma, USA) and frozen. The frozen eye tissues were then sliced (25 μm thickness) using a microtome at −20° C. (Cryostats CM1860, Leica, Germany). The sliced tissue sections were then mounted onto slides and stained with oligomeric Aβ and Alexa 647 phalloidin to observe for drusen formation.

Figure 12:
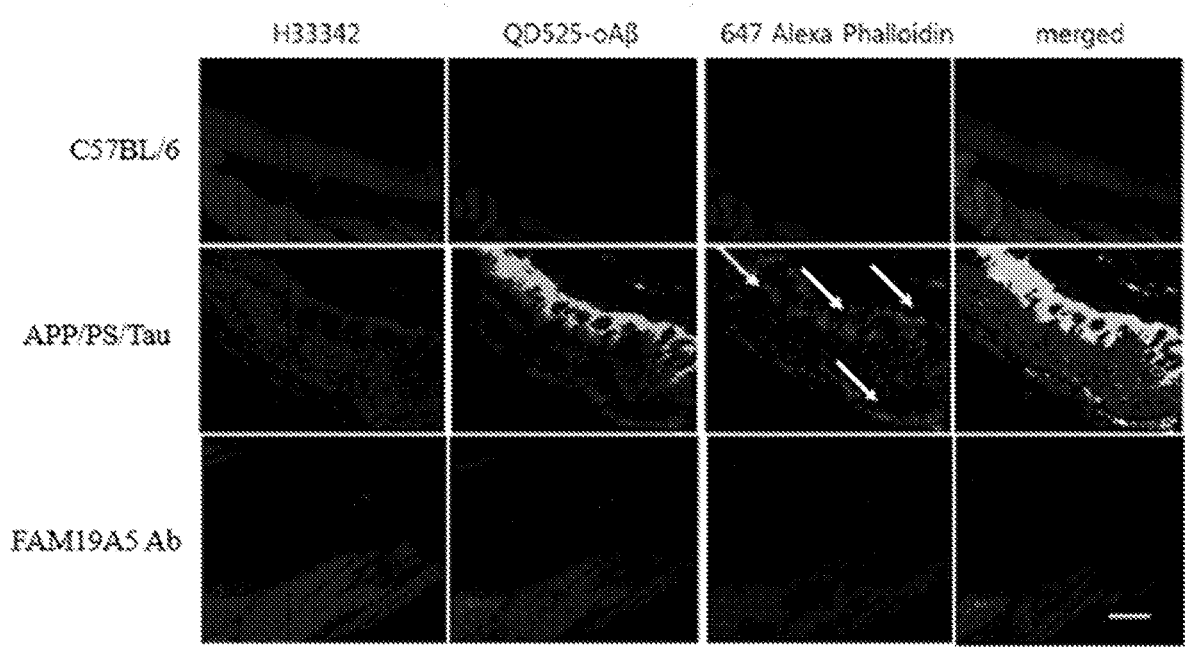
FIG. 12 shows the inhibitory effect of anti-FAM19A5 antibody on the formation of oligomeric Aβ and drusen in APP/PS-1/tau transgenic mice (model for dementia) using immunofluorescence microscopy. The APP/PS-1/tau transgenic mice were untreated (middle row) or treated with anti-FAM19A5 antibody (bottom row). Naïve wild-type C57BL/6 mice were used as a negative control (top row). Column labeled "H33342" (stains for nucleic acid) shows the cells within the retinal tissue. Column labeled "QD525-oAβ" shows oligomeric Aβ. Column labeled "647 Alexa Phalloidin" shows drusen formation, with exemplary drusen indicated by the arrows. Column labeled "merged" shows merged images of the above three columns for each of treatment groups.

As shown in FIG. 12, in the untreated APP/PS-1/tau transgenic mice, oligomeric Aβ was strongly expressed within the periphery of the visual pigment cells, while drusen (as evidenced by positive phalloidin staining) were strongly expressed within the periphery of the retina tissue, cone cells, and ganglion cell layer. In contrast, in APP/PS-1/tau transgenic mice treated with anti-FAM19A5 antibody, there was negligible oligomeric Aβ and drusen staining, similar to that of naïve wild-type C57BL/6 control mice.

The above result confirmed that anti-FAM19A5 antibody can inhibit the formation of oligomeric Aβ and drusen within the retina, including the surrounding tissues.

Collectively, the above data demonstrated that anti-FAM19A5 antibody can also improve many of the underlying pathologies associated with macular degeneration, such as age-related macular degeneration, and thereby, treat the disease.

Example 7

Evaluation of the Inhibitory Effects of Anti-FAM19A5 Antibody on Diabetic Retinopathy After Intravenous Administration To assess the therapeutic effects of anti-FAM19A5 antibody on diabetic retinopathy after intravenous administration, type 2 diabetic db/db mice (e.g., those described in Example 1) were used. Briefly, animals were stabilized and then treated with one of the following: (i) human IgG antibody, (ii) aflibercept (EYLEA®, Regeneron Pharmaceuticals), or (iii) anti-FAM19A5 antibody (clone 1-30). The human IgG antibody and aflibercept were used as negative and positive controls, respectively. Naïve (i.e., animals without diabetic retinopathy) were used as an additional control. The different treatment regimens were administered either intravitreally to the vitreous cavity of the mice using a micro pump system (total of 7 doses at 2 μL/eye every 2 weeks) or intravenously via tail vein injection (total of 7 doses at 100 μL every 2 weeks). The treatment groups are set forth below in Table 8.

TABLE 8

Treatment Groups

| Group | Drug | Concentration | Dose | Route of Administration | Number of Animals |
|---|---|---|---|---|---|
| Naïve | — | — | — | | 10 |
| Negative control | Human IgG | — | — | Intravitreal injection | 10 |
| Positive control | Aflibercept | 20 mg/mL | 40 μL/eye | Intravitreal injection | 10 |
| Test Group 1 | anti-FAM19A5 | 4 mg/mL | 8 μg/eye (2 μL volume) | Intravitreal injection | 10 |
| Test Group 2 | anti-FAM19A5 | 2 mg/mL | 5 mg/kg (100 μL volume) | Intravenous injection | 10 |
| Total | | | | | 50 |

The animals were monitored periodically for their overall health, e.g., by measuring blood glucose level in the serum and/or body weight. After the last administration, the mice were euthanized and both of the eyes were harvested from the animals. Once harvested, the eyes were prepared on an OCT block, and then fixed for trypsin digest analysis, Hematoxylin-Eosin Dyeing (H&E staining), TUNEL analysis, and immunofluorescence staining, as described in Example 2 and detailed further below. Trypsin digest analysis was performed to assess the microvessels for pericytes loss and acellular capillary formation (i.e., markers of early diabetic retinopathy). H&E staining, TUNEL analysis, and immunofluorescence staining was performed to analyze vascular congestion, vascular marker (CD31 and VEGF), and retinal cell protection effect.

H&E Analysis

After the frozen tissues were sliced and mounted on slides (see Example 2), the slides were dried at room temperature for about an hour. The slides were then stained with hematoxylin for 3-5 minutes and washed with Hcl solution for 30 seconds. Then, the slides were dipped in eosin solution for one minute and washed again in the Hcl solution. Next, the slides were washed in 80% to 100% ethanol for three minutes and reacted with carboxylene and xylene for five minutes each. The stained slides were observed using a microscope (NanoZoomer 2.0 RS, Hamamatsu).

TUNEL Analysis

The slides with mounted frozen tissue section (see Example 2) were dried at room temperature for about an hour. Once dried, the slides were bathed in 1% paraformaldehyde for 10 minutes, and then washed twice for 5 minutes with PBS. Next, the slides were submerged in equilibration buffer for 10 minutes. Then, in a humidified chamber, the tissue samples were processed with TdT enzyme at 37° C. for two hours. The slides were then washed four times for two minutes with PBS. The stained slides were allowed to completely dry at room temperature. Once dried, the tissue samples were stained with DAPI and observed with a fluorescent microscope (LEICA DM 2500).

Immunofluorescence Analysis

The slides with mounted frozen tissue section (see Example 2) were dried at room temperature for about an hour. Once dried, the tissue sample was treated with 5% (v/v) Triton X-100 solution dissolved in PBS, and washed three times for five minutes with PBS. Next, the tissues were blocked with normal donkey serum and 3% (v/v) BSA, 0.5% Triton X-100 solution for one hour. Afterwards, the tissues were stained with anti-VEGF and/or anti-CD31 primary antibodies (diluted 1:300 in PBS with 3% (v/v) BSA and 0.5% triton X-100 solution) overnight at 4° C. Next day, the samples were washed three times for five minutes with PBS. Then, the tissue samples were incubated with the secondary antibody (Alexa Fluor 555 Donkey anti-Rabbit IgG, diluted 1:500 in PBS with 3% (v/v) BSA and 0.5% triton X-100 solution) for one hour at room temperature. The samples were subsequently washed three times for five minutes with PBS and stained with DAPI, and observed with a fluorescence microscope (LEICA DM 2500).

Results

Figure 13A:
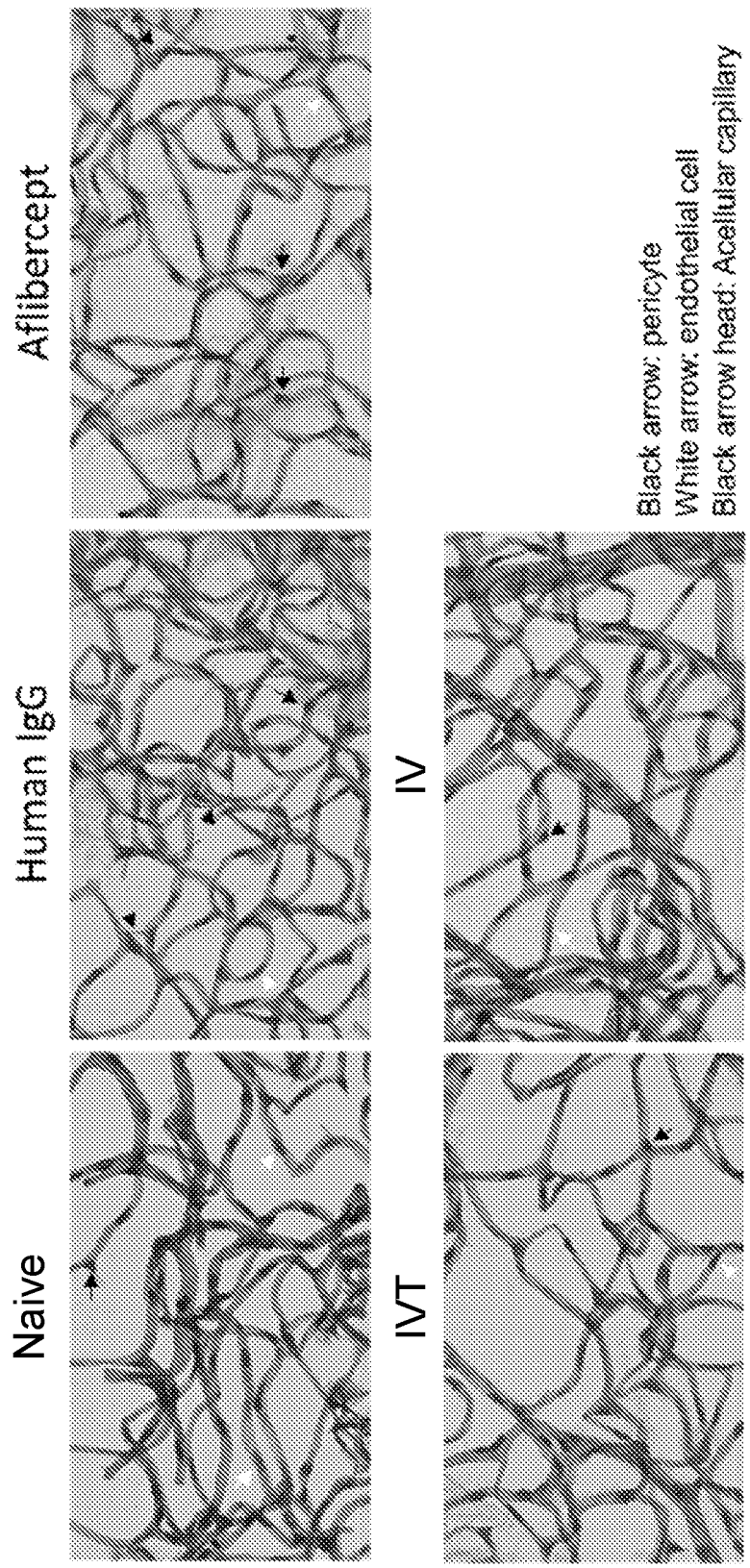
FIGS. 13A-13C show a comparison of the retinal microvascular protection effect of anti-FAM19A5 antibody (clone 1-30) after intravitreal or intravenous administration in a diabetic retinopathy mouse model. The mice were administered with one of the following: (i) human IgG control antibody ("human IgG"), (ii) aflibercept, (iii) anti-FAM19A5 antibody intravitreally ("IVT"), or (iv) anti-FAM19A5 antibody intravenously ("IV"). Normal (i.e., non-diabetic) healthy mice were used as controls.
Figure 13B:
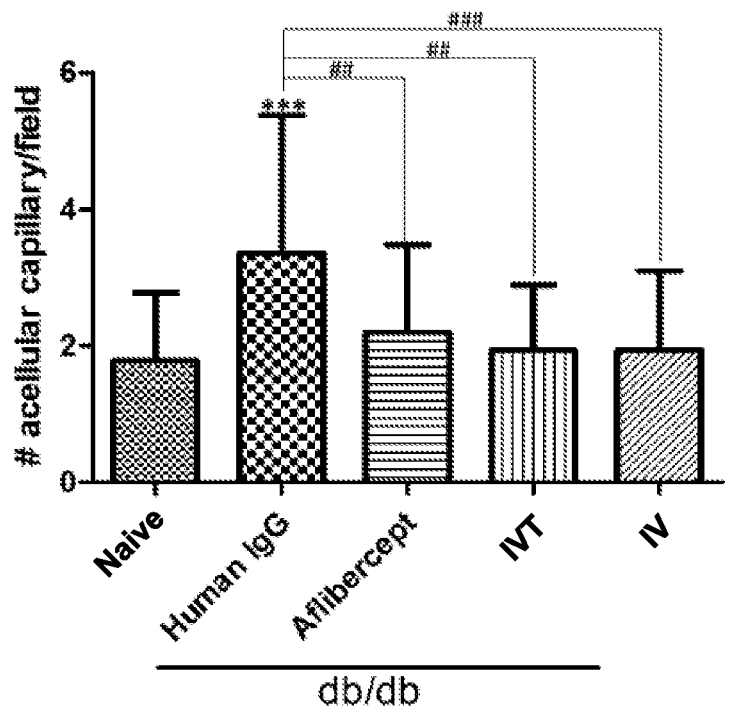
Figure 13C:
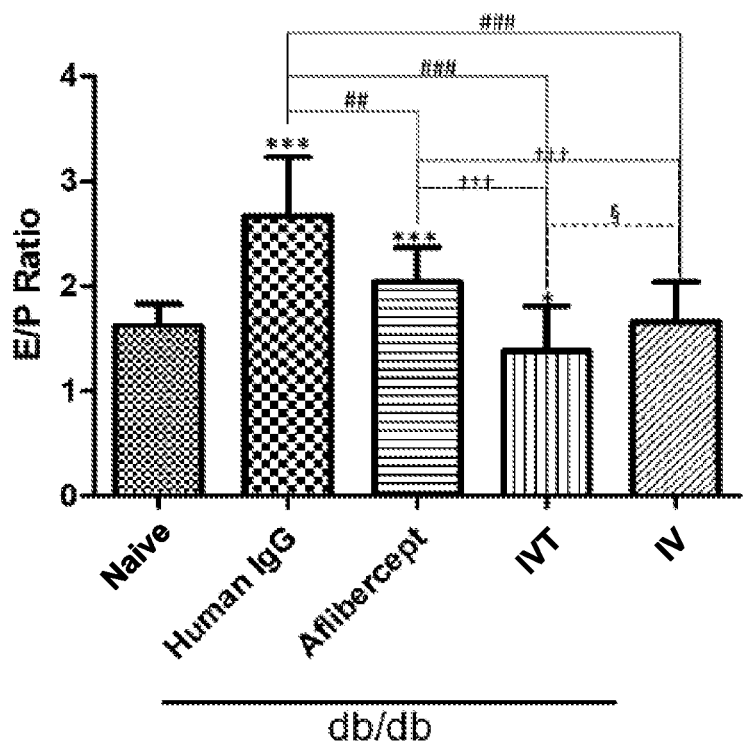

As shown in Table 9 (below) and FIGS. 13A and 13C (and in agreement with the data provided in Example 2), the E/P ratio (i.e., ratio of endothelial cells to pericytes) in animals treated with anti-FAM19A5 antibody (in both the intravenous and intravitreal administration groups) was lower compared to animals treated with anti-human IgG alone ("negative control"). Anti-FAM19A5 administration appeared to have greater effect on the E/P ratio even when compared to the positive control group (i.e., animals treated with aflibercept) and resembled ratios observed in naïve (i.e., healthy) animals. The greatest effect was observed with intravitreal administration but noticeable therapeutic effect was also observed with intravenous administration. Similar results were observed when the number of acellular capillaries were measured in the eyes of the animals (see Table 9 and FIG. 13B).

TABLE 9

Histological Analysis

| Treatment Group | EP Ratio | Average AC |
| --- | --- | --- |
| Naïve | 1.62 ± 0.20 | 1.78 ± 1.00 |
| Negative control | 2.66 ± 0.56 | 3.36 ± 2.02 |
| Positive control | 2.04 ± 0.33 | 2.20 ± 1.28 |
| Anti-FAM19A5 antibody (intravitreal administration) | 1.38 ± 0.43 | 1.97 ± 0.97 |
| Anti-FAM19A5 antibody (intravenous administration) | 1.66 ± 0.38 | 1.94 ± 1.17 |

Figure 14:
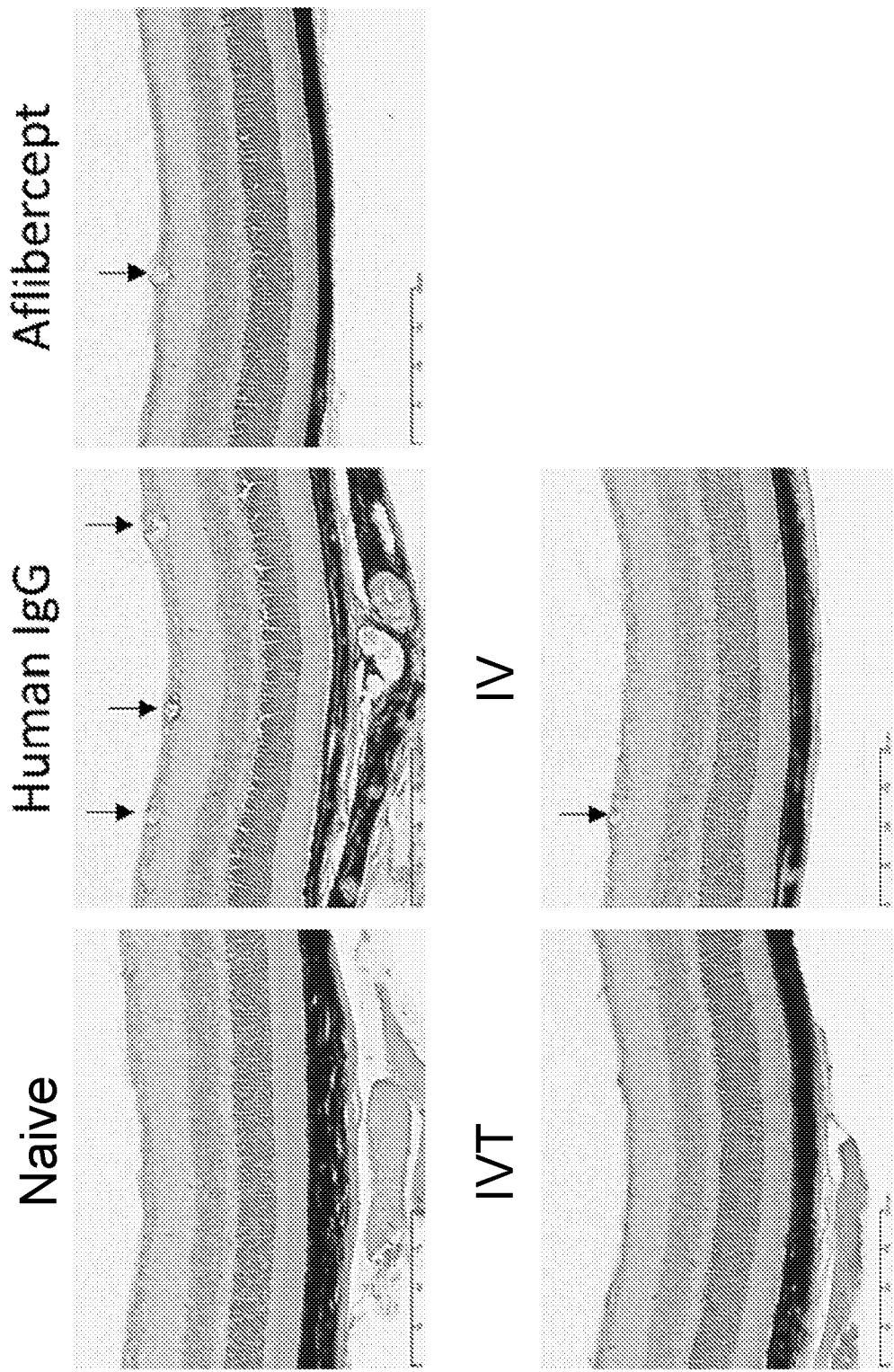
FIG. 14 shows the inhibitory effect of anti-FAM19A5 antibody on vascular congestion formation within the retina of diabetic retinopathy mice after intravenous and intravitreal administration. The treatment groups are the same as those described in FIGS. 13A-13C. The arrowheads indicate examples of vascular congestion.
Figure 15:
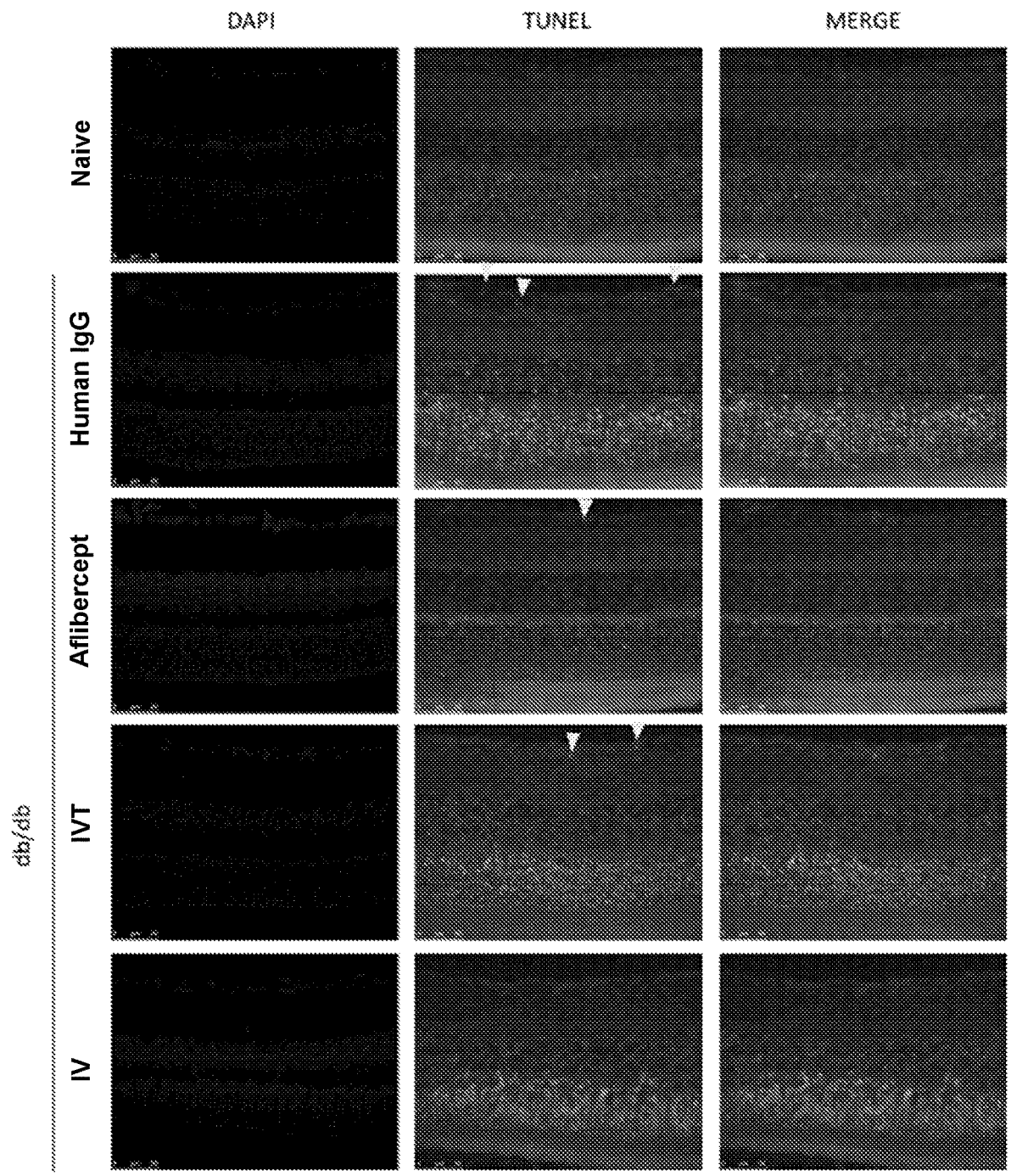
FIG. 15 shows the retinal cell protection effect of anti-FAM19A5 antibody when administered intravitreally or intravenously measured using TUNEL assay. The treatment groups are the same as those described in FIGS. 13A-13C. The arrowheads under the middle column ("TUNEL") indicate retinal cells undergoing apoptosis. The intensity of the TUNEL staining correlates with degree of apoptosis (e.g., reduced intensity indicates partial apoptosis).
Figure 16A:
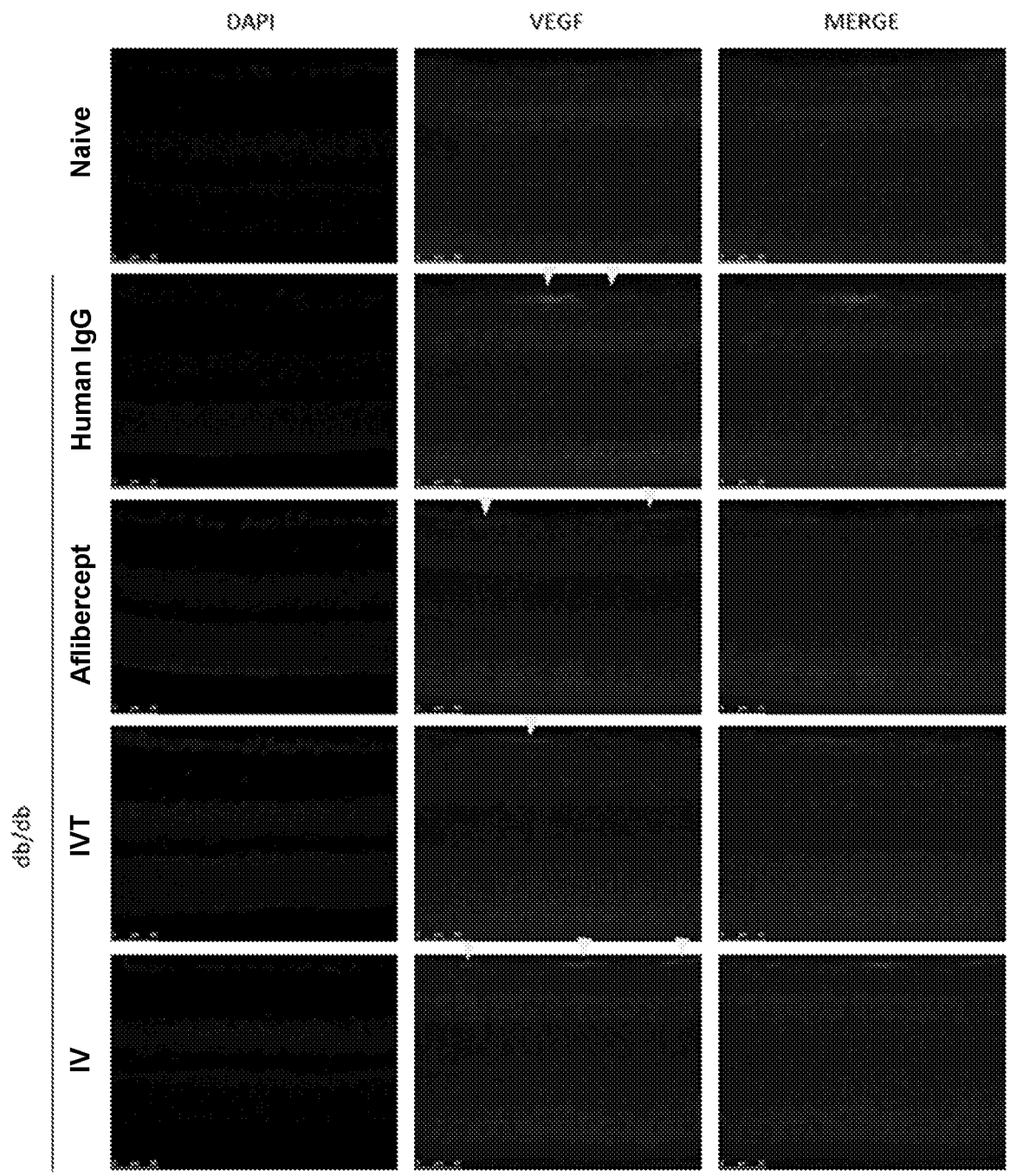
FIGS. 16A and 16B show the inhibitory effect of anti-FAM19A5 antibody on neovascularization within the retina of diabetic retinopathy mice after intravitreal and intravenous administration. The treatment groups are the same as those described in FIGS. 13A-13C. Neovascularization was measured using VEGF (FIG. 16A) and CD31 (FIG. 16B) expression. The arrowheads indicate positive VEGF or CD31 staining.
Figure 16B:
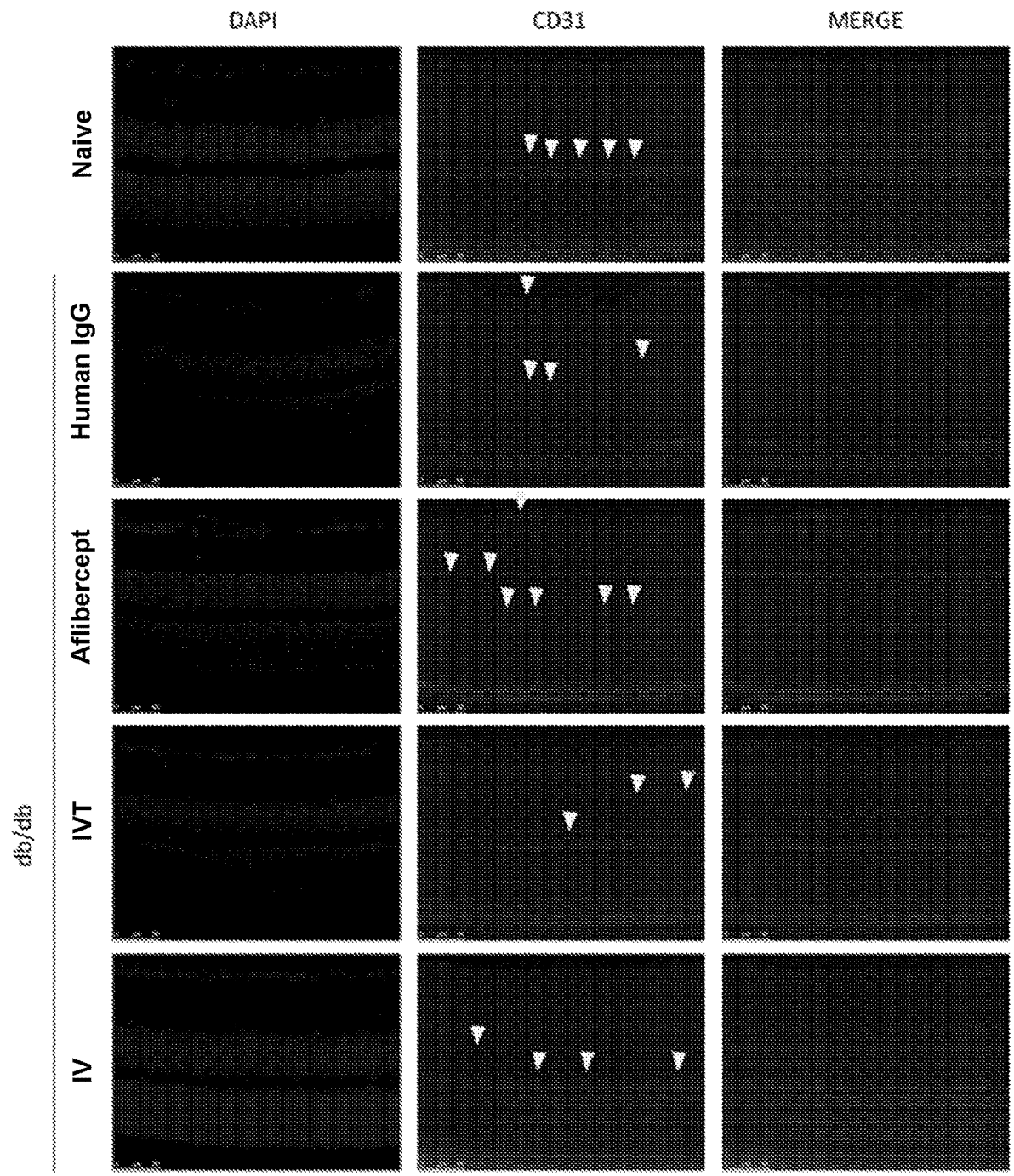

The route of administration also did not appear to have a significant impact on the ability of the anti-FAM19A5 antibody to reduce vascular congestion and to protect retinal cells from damage caused by diabetes (see FIG. 14). And, as shown in FIG. 15, the TUNEL assay showed that both the nerve fiber layer and the inner nuclear layer of retina from mice treated with anti-FAM19A5 antibody intravenously had less cells undergoing apoptosis, compared to the corresponding layers in the retina from mice treated with the human IgG control antibody. The effects were comparable to animals treated with anti-FAM19A5 antibody intravitreally (see FIGS. 14 and 15, IVT v. IV groups). Similar results were also observed when the expression of CD31 and VEGF (markers for neovascularization) was assessed. In both animals treated with anti-FAM19A5 antibody intravitreally or intravenously, there was much reduced CD31 and VEGF expression, compared to the control animals (i.e., animals treated with the human IgG control antibody alone) (see FIGS. 16A and 16B).

Collectively, the above data confirmed the results from Example 2 (i.e., with intravitreal administration) and further demonstrated that anti-FAM19A5 antibody can have therapeutic effects on diabetic retinopathy after both intravenous and intravitreal administration.

It is to be appreciated that the Detailed Description section, and not the Summary and Abstract sections, is intended to be used to interpret the claims. The Summary and Abstract sections can set forth one or more but not all exemplary aspects of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific aspects will so fully reveal the general nature of the disclosure that others can, by applying knowledge within the skill of the art, readily modify and/or adapt for various applications such specific aspects, without undue experimentation, without departing from the general concept of the present disclosure. Therefore, such adaptations and modifications are intended to be within the meaning and range of equivalents of the disclosed aspects, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present disclosure should not be limited by any of the above-described exemplary aspects, but should be defined only in accordance with the following claims and their equivalents.

All publications, patents, patent applications, internet sites, and accession numbers/database sequences (including both polynucleotide and polypeptide sequences) cited herein are hereby incorporated by reference in their entirety for all purposes to the same extent as if each individual publication, patent, patent application, internet site, or accession number/database sequence were specifically and individually indicated to be so incorporated by reference.

What is claimed is:

1. A method of improving a retinal potential in a retina of a subject in need thereof comprising administering to the subject an antibody, or an antigen-binding portion thereof, that specifically binds to a family with sequence similarity 19, member A5 (FAM19A5) protein (anti-FAM19A5 antibody);

wherein the anti-FAM19A5 antibody comprises a heavy chain CDR1, CDR2, and CDR3, and a light chain CDR1, CDR2, and CDR3, wherein the heavy chain CDR1, CDR2, and CDR3 comprises the amino acid sequence set forth in SEQ ID NOs: 212, 213, and 16, respectively, and the light chain CDR1, CDR2, and CDR3 comprises the amino acid sequence set forth in SEQ ID NOs: 222, 225, and 224, respectively; and wherein the subject has a disease or condition selected from a diabetic retinopathy, an age-related macular degeneration, or both.

2. The method of claim 1, wherein the diabetic retinopathy comprises a nonproliferative diabetic retinopathy (NPDR), a proliferative diabetic retinopathy, or both.

3. The method of claim 1, wherein the anti-FAM19A5 antibody comprises a heavy chain variable region (VH) comprising the amino acid sequence set forth in SEQ ID NO: 236, and a light chain variable region (VL) comprising the amino acid sequence set forth in SEQ ID NO: 245.

4. The method of claim 1, wherein the anti-FAM19A5 antibody comprises a Fab, Fab', F(ab')2, Fv, or single chain Fv (scFv).

5. A method of treating a retinopathy and/or maculopathy in a subject in need thereof comprising administering to the subject an antibody, or an antigen-binding portion thereof, that specifically binds to a family with sequence similarity 19, member A5 (FAM19A5) protein (anti-FAM19A5 antibody);

wherein the anti-FAM19A5 antibody comprises a heavy chain CDR1, CDR2, and CDR3, and a light chain CDR1, CDR2, and CDR3, wherein the heavy chain CDR1, CDR2, and CDR3 comprises the amino acid sequence set forth in SEQ ID NOs: 212, 213, and 16, respectively, and the light chain CDR1, CDR2, and CDR3 comprises the amino acid sequence set forth in SEQ ID NOs: 222, 225, and 224, respectively; and wherein: (i) the retinopathy comprises a diabetic retinopathy; (ii) the maculopathy comprises a diabetic macular edema; or (iii) both (i) and (ii).

6. The method of claim 5, wherein the anti-FAM19A5 antibody comprises a heavy chain variable region (VH) comprising the amino acid sequence set forth in SEQ ID NO: 236, and a light chain variable region (VL) comprising the amino acid sequence set forth in SEQ ID NO: 245.

7. The method of claim 5, wherein the anti-FAM19A5 antibody comprises a Fab, Fab', F(ab')2, Fv, or single chain Fv (scFv).

8. The method of claim 5, wherein the anti-FAM19A5 antibody is a chimeric antibody or a humanized antibody.

9. The method of claim 5, wherein the anti-FAM19A5 antibody is linked to a molecule having a second binding moiety, thereby forming a bispecific molecule.

10. The method of claim 5, wherein the anti-FAM19A5 antibody is linked to an agent, thereby forming an immunoconjugate.

11. The method of claim 5, wherein the anti-FAM19A5 antibody is administered via an intraocular administration, an intravenous administration, or both.

12. A method of treating a macular degeneration in a subject in need thereof comprising administering to the subject an antibody, or an antigen-binding portion thereof, that specifically binds to a family with sequence similarity 19, member A5 (FAM19A5) protein (anti-FAM19A5 antibody);

wherein the anti-FAM19A5 antibody comprises a heavy chain CDR1, CDR2, and CDR3, and a light chain CDR1, CDR2, and CDR3, and wherein the heavy chain CDR1, CDR2, and CDR3 comprises the amino acid sequence set forth in SEQ ID NOs: 212, 213, and 16, respectively, and the light chain CDR1, CDR2, and CDR3 comprises the amino acid sequence set forth in SEQ ID NOs: 222, 225, and 224, respectively.

13. The method of claim 12, wherein the macular degeneration comprises an age-related macular degeneration (AMD).

14. The method of claim 13, wherein the AMD comprises a dry macular degeneration, a wet macular degeneration, or both.

15. The method of claim 13, wherein the AMD comprises (i) an early AMD, (ii) an intermediate AMD, (iii) a late or advanced AMD, or (iv) a combination thereof.

16. The method of claim 12, wherein the anti-FAM19A5 antibody comprises a heavy chain variable region (VH) comprising the amino acid sequence set forth in SEQ ID NO: 236, and a light chain variable region (VL) comprising the amino acid sequence set forth in SEQ ID NO: 245.

17. The method of claim 12, wherein the anti-FAM19A5 antibody comprises a Fab, Fab', F(ab')2, Fv, or single chain Fv (scFv).

* * * * *